US012713828B2

(12) United States Patent
Jeon et al.

(10) Patent No.: US 12,713,828 B2
(45) Date of Patent: Aug. 18, 2026

(54) LIGHT-EMITTING DEVICE INCLUDING ORGANOMETALLIC COMPOUND, ELECTRONIC APPARATUS INCLUDING THE LIGHT-EMITTING DEVICE, AND THE ORGANOMETALLIC COMPOUND

(71) Applicant: Samsung Display Co., Ltd., Yongin-si (KR)

(72) Inventors: Mina Jeon, Yongin-si (KR); Soobyung Ko, Yongin-si (KR); Eunsoo Ahn, Yongin-si (KR); Jaesung Lee, Yongin-si (KR); Hyunjung Lee, Yongin-si (KR); Junghoon Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 786 days.

(21) Appl. No.: 18/160,207

(22) Filed: Jan. 26, 2023

(65) Prior Publication Data

US 2023/0309379 A1 Sep. 28, 2023

(30) Foreign Application Priority Data

Jan. 26, 2022 (KR) ........................ 10-2022-0011787

(51) Int. Cl.

| | |
|---|---|
| ***H01L 51/54*** | (2006.01) |
| ***C07F 15/00*** | (2006.01) |
| ***C09K 11/06*** | (2006.01) |
| ***H10K 85/30*** | (2023.01) |
| *H10K 50/11* | (2023.01) |
| *H10K 101/10* | (2023.01) |

(52) U.S. Cl.

CPC ....... *H10K 85/346* (2023.02); *C07F 15/0086* (2013.01); *C09K 11/06* (2013.01); *C09K 2211/1059* (2013.01); *C09K 2211/1074* (2013.01); *C09K 2211/185* (2013.01); *H10K 50/11* (2023.02); *H10K 2101/10* (2023.02)

(58) Field of Classification Search

None

See application file for complete search history.

(56) References Cited

U.S. PATENT DOCUMENTS

| | | | |
|---|---|---|---|
| 9,318,725 B2 | 4/2016 | Li | |
| 9,385,329 B2 | 7/2016 | Li et al. | |
| 9,673,409 B2 | 6/2017 | Li et al. | |
| 9,938,309 B2 | 4/2018 | Hara et al. | |
| 2017/0183368 A1* | 6/2017 | Hara | C09K 11/06 |
| 2018/0337342 A1 | 11/2018 | Su et al. | |
| 2020/0220090 A1 | 7/2020 | Chen et al. | |
| 2021/0305520 A1 | 9/2021 | Thompson et al. | |

FOREIGN PATENT DOCUMENTS

| | | |
|---|---|---|
| CN | 113121500 A | 7/2021 |
| JP | 2017-119866 A | 7/2017 |
| KR | 10-2015-0043225 A | 4/2015 |
| KR | 10-2018-0127236 A | 11/2018 |

* cited by examiner

*Primary Examiner* — Andrew K Bohaty

(74) *Attorney, Agent, or Firm* — Womble Bond Dickinson (US) LLP

(57) ABSTRACT

A light-emitting device including an organometallic compound represented by Formula 1, an electronic apparatus including the light-emitting device, and the organometallic compound are provided in the present application.

Formula 1

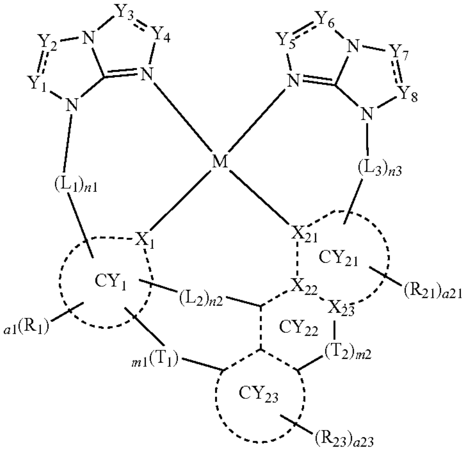

The detailed description of Formula 1 is the same as described in the present specification.

20 Claims, 3 Drawing Sheets

LIGHT-EMITTING DEVICE INCLUDING ORGANOMETALLIC COMPOUND, ELECTRONIC APPARATUS INCLUDING THE LIGHT-EMITTING DEVICE, AND THE ORGANOMETALLIC COMPOUND

CROSS-REFERENCE TO RELATED APPLICATION

This application claims priority to and the benefit of Korean Patent Application No. 10-2022-0011787, filed on Jan. 26, 2022, in the Korean Intellectual Property Office, the disclosure of which is incorporated herein by reference in its entirety.

BACKGROUND

1. Field

One or more embodiments relate to a light-emitting device including an organometallic compound, an electronic apparatus including the light-emitting device, and the organometallic compound.

2. Description of the Related Art

From among light-emitting devices, self-emissive devices have wide viewing angles, high contrast ratios, short response times, and/or excellent or suitable characteristics in terms of luminance, driving voltage, and/or response speed.

In a light-emitting device, a first electrode is located on a substrate, and a hole transport region, an emission layer, an electron transport region, and a second electrode are sequentially arranged on the first electrode. Holes provided from the first electrode move toward the emission layer through the hole transport region, and electrons provided from the second electrode move toward the emission layer through the electron transport region. Carriers, such as holes and electrons, recombine in the emission layer to produce excitons. These excitons are transitioned from an excited state to a ground state to thereby generate light.

SUMMARY

Aspects according to one or more embodiments of the present disclosure are directed toward a light-emitting device including an organometallic compound, an electronic apparatus including the light-emitting device, and the organometallic compound.

Additional aspects will be set forth in part in the description which follows and, in part, will be apparent from the description, or may be learned by practice of the presented embodiments of the disclosure.

According to one or more embodiments, a light-emitting device includes a first electrode, a second electrode facing the first electrode, an interlayer between the first electrode and the second electrode and including an emission layer, and an organometallic compound represented by Formula 1:

Formula 1

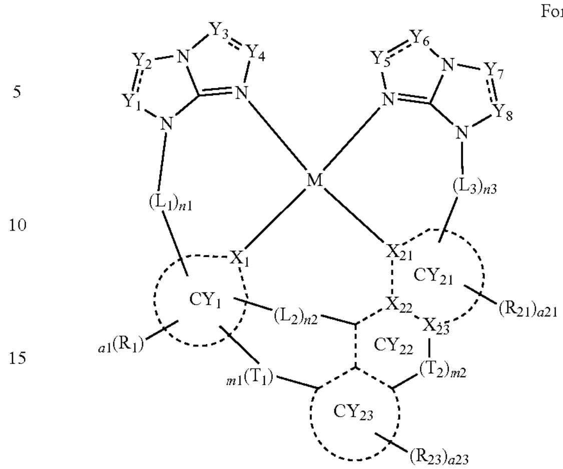

wherein, in Formula 1,

M may be platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm), ring $CY_1$, ring $CY_{21}$, and ring $CY_{23}$ may each independently be a $C_3$-$C_{30}$ carbocyclic group or a $C_1$-$C_{30}$ heterocyclic group, ring $CY_{22}$ may be a $C_1$-$C_{30}$ heterocyclic group, $X_1$, and $X_{21}$ to $X_{23}$ may each independently be C or N, $L_1$ to $L_3$ may each independently be a single bond, *—C($R_{1a}$)($R_{1b}$)—*', *—C($R_{1a}$)═*', *═C($R_{1a}$)—*', *—C($R_{1a}$)═C($R_{1b}$)—*', *—C(═)—*', *—C(═S)—*', *—C≡C—*', *—B($R_{1a}$)—*', *—N($R_{1a}$)—*', *—O—*', *—P($R_{1a}$)($R_{1b}$)—*', *—Si($R_{1a}$)($R_{1b}$)—*', *—P(═O)($R_{1a}$)—*', *—S*', *—S(═O)—*', *—S(═O)$_2$*', or *—Ge($R_{1a}$)($R_{1b}$)*', $T_1$ may be a single bond, *—C($R_{2a}$)($R_{2b}$)—*', *—C($R_{2a}$)═*', *═C($R_{2a}$)—*', *—C($R_{2a}$)═C($R_{2b}$)—*', *—C(═O)—*', *—C(═S)—*', *—C≡C—*', *—B($R_{2a}$)—*', *—N($R_{2a}$)—*', *—O—*',*—P($R_{2a}$)($R_{2b}$)—*', *—Si($R_{2a}$)($R_{2b}$)—*', *—P(═O)($R_{2a}$)—*', *—S—*', *—S(═O)—*', *—S(═O)$_2$—*', or *—Ge($R_{2a}$)($R_{2b}$)*', $T_2$ may be a single bond, *—C($R_{3a}$)($R_{3b}$)—*', *—C($R_{3a}$)═*', *═C($R_{3a}$)—*', *—C($R_{3a}$)═C($R_{3b}$)—*', *—C(═O)—*', *—C(═S)—*', *—C≡C—*', *—B($R_{3a}$)—*', *—N($R_{3a}$)—*', *—O—*',*—P($R_{3a}$)($R_{3b}$)—*', *—Si($R_{3a}$)($R_{3b}$)—*', *—P(═O)($R_{3a}$)—*', *—S—*', *—S(═O)—*', *—S(═O)$_2$—*', or *—Ge($R_{3a}$)($R_{3b}$)*',

* and *' each indicate a binding site to a neighboring atom, n1 to n3 may each independently be an integer selected from 1 to 5, m1 may be an integer selected from 0 to 2, wherein, when m1 is 0, $T_1$ does not exist and thus ring $CY_1$ and ring $CY_{23}$ may not be bound to each other, m2 may be 1 or 2, $Y_1$ may be C($Z_1$) or N, $Y_2$ may be C($Z_2$) or N, $Y_3$ may be C($Z_3$) or N, $Y_4$ may be C($Z_4$) or N, $Y_5$ may be C($Z_5$) or N, $Y_6$ may be C($Z_6$) or N, $Y_7$ may be C($Z_7$) or N, $Y_8$ may be $C(Z_8)$ or N, $R_1$, $R_{21}$, $R_{23}$, $Z_1$ to $Z_8$, $R_{1a}$, $R_{1b}$, $R_{2a}$, $R_{2b}$, $R_{3a}$, and $R_{3b}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, a1, a21 and a23 may each independently be an integer selected from 0 to 10,

 in Formula 1 indicates a single bond or a double bond, $Z_1$ and $Z_2$ may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $Z_3$ and $Z_4$ may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $Z_5$ and $Z_6$ may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $Z_7$ and $Z_8$ may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{2a}$ and $R_{2b}$ may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{3a}$ and $R_{3b}$ may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, one selected from among $R_{2a}$ and $R_{2b}$ and one of $R_1$(s) in the number of a1 may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, one selected from among $R_{2a}$ and $R_{2b}$ and one of $R_{23}$(s) in the number of a23 may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, one selected from among $R_{3a}$ and $R_{3b}$ and one of $R_{21}$(s) in the number of a21 may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, one selected from among $R_{3a}$ and $R_{3b}$ and one of $R_{23}$(s) in the number of a23 may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ may be deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof, a $C_3$-$C_{60}$ carbocyclic group, a $C_1$-$C_6$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof, or $Si(Q_{31})(Q_{32})(Q_{33})$, —$N(Q_{31})(Q_{32})$, —$B(Q_{31})(Q_{32})$, —$O(Q_{31})$, —$S(Q_{31})$, —$P(Q_{31})(Q_{32})$, —$C(=O)(Q_{31})$, —$S(=O)_2(Q_{31})$, or —$P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ may each independently be hydrogen, deuterium; —F; —Cl; —Br; —I; a hydroxyl group; a cyano group; a nitro group; a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, a cyano group, or any combination thereof; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroaryl alkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

One or more embodiments include an electronic apparatus including the light-emitting device.

One or more embodiments include an organometallic compound represented by Formula 1

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

Figure 1:
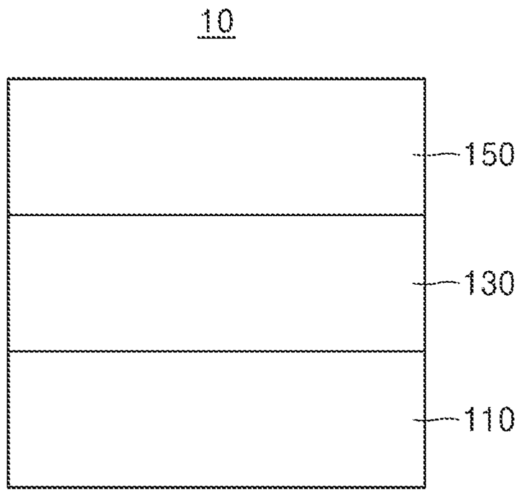
FIG. 1 shows a schematic cross-sectional view of a light-emitting device according to an embodiment.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Throughout the disclosure, the expression such as "at least one of a, b or c", "at least one selected from a, b, and c", "at least one selected from the group consisting of a, b, and c", etc., indicates only a, only b, only c, both (e.g., simultaneously) a and b, both (e.g., simultaneously) a and c, both (e.g., simultaneously) b and c, all of a, b, and c, or variations thereof.

According to embodiments of the present disclosure, a light-emitting device includes: a first electrode; a second electrode facing the first electrode; and an interlayer arranged between the first electrode and the second electrode and including an emission layer, wherein the light-emitting device includes an organometallic compound represented by Formula 1:

Formula 1

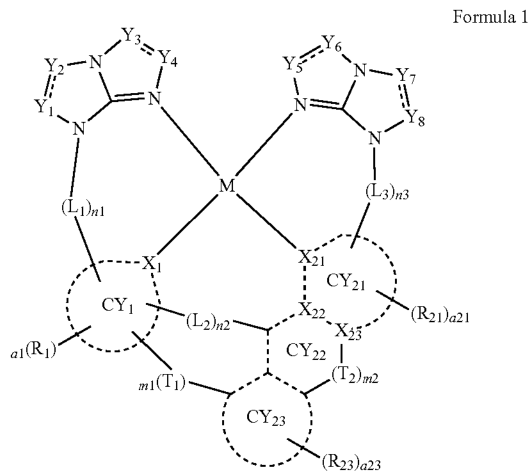

wherein, in Formula 1, M may be platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm).

In an embodiment, M may be Pt.

Ring $CY_1$, ring $CY_{21}$, and ring $CY_{23}$ in Formula 1 may each independently be a $C_3$-$C_{30}$ carbocyclic group or a $C_1$-$C_{30}$ heterocyclic group.

Ring $CY_{22}$ in Formula 1 may be a $C_1$-$C_{30}$ heterocyclic group.

In an embodiment, ring $CY_1$, ring $CY_{21}$, and ring $CY_{23}$ may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene-5-oxide group, a 9H-fluorene-9-one group, a dibenzothiophene-5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene-5-oxide group, an aza-9H-fluorene-9-one group, an azadibenzothiophene-5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In an embodiment, ring CY1 may be a benzene group, a naphthalene group, or a pyridine group.

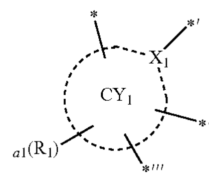

In an embodiment, a moiety represented by in Formula 1 may be, when m1 is 0, one selected from among the groups represented by Formulae CY1(1) to CY1(20):

CY1(1)

CY1(2)

CY1(3)

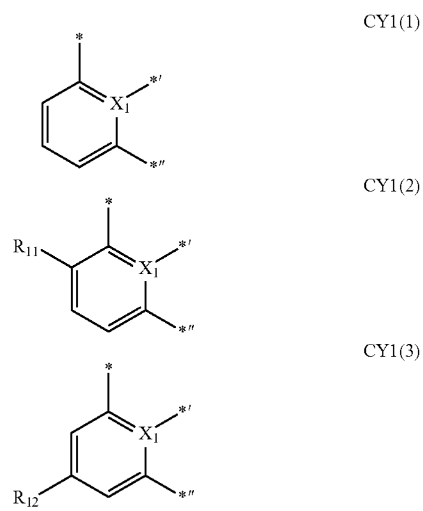

-continued
CY1(4)
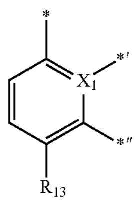
CY1(5)
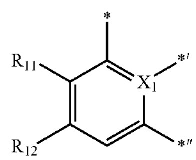
CY1(6)
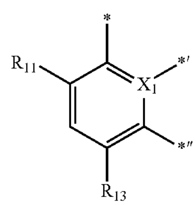
CY1(7)
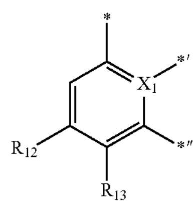
cY1(8)
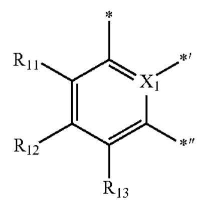
CY1(9)
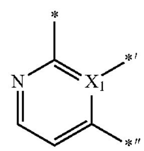
CY1(10)
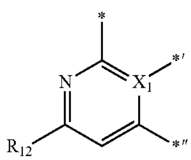
CY1(11)
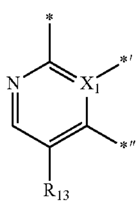
-continued
CY1(12)
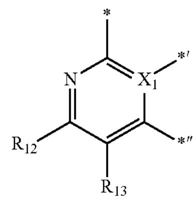
CY1(13)
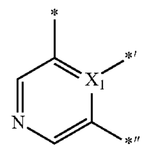
CY1(14)
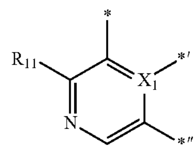
CY1(15)
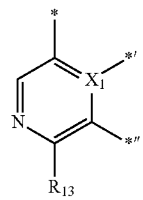
CY1(16)
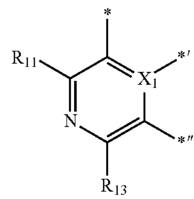
CY1(17)
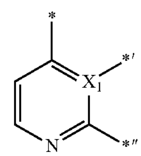
CY1(18)
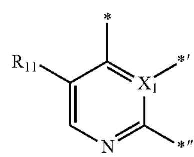
CY1(19)
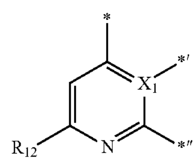
CY1(20)
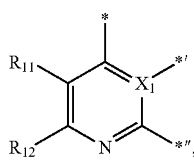
, wherein, in Formulae CY1(1) to CY1 (20), $R_{11}$ to $R_{13}$ may each independently be deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$),

*, *', and *" each indicate a binding site to a neighboring atom, and $X_1$, $R_{10a}$, and $Q_1$ to $Q_3$ are each the same as respectively described in the present specification.

In an embodiment, a moiety represented by

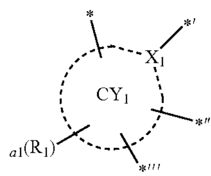

in Formula 1 may be, when m1 is 1, one selected from among the groups represented by Formulae $CY_1$(21) to $CY_1$(29):

CY1(21)

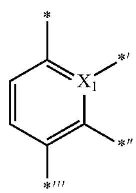

CY1(22)

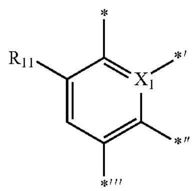

CY1(23)

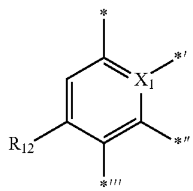

-continued

CY1(24)

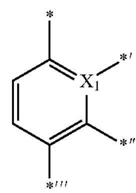

CY1(25)

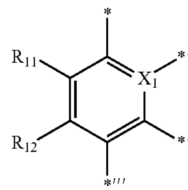

CY1(26)

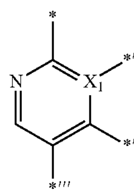

CY1(27)

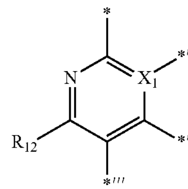

CY1(28)

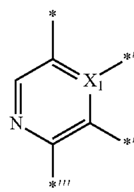

CY1(29)

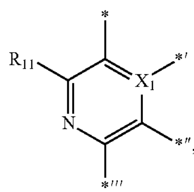

wherein, in Formulae CY1(21) to CY1(29), $R_{11}$ and $R_{12}$ may each independently be deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$),

*, *', *", and *"' each indicate a binding site to a neighboring atom, and $X_1$, $R_{10a}$, and $Q_1$ to $Q_3$ are each the same as respectively described in the present specification.

In an embodiment, $R_{11}$ to $R_{13}$ in Formula CY1(1) to CY1(29) may each independently be:

deuterium, —F, —Cl, —Br, —I, or a cyano group;

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$;

an n-propyl group, an isopropyl group, an n-butyl group, an isobutyl group, a sec-butyl group, or a tert-butyl group, each unsubstituted or substituted with deuterium; or a phenyl group, a biphenyl group, a terphenyl group, or a naphthalene group, each unsubstituted or substituted with at least one of deuterium, $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, $—CD_2CDH_2$, an n-propyl group, an isopropyl group, an n-butyl group, an isobutyl group, a sec-butyl group, or a tert-butyl group.

In an embodiment, $R_{12}$ in Formulae CY1(23), CY1(25), and CY1(27) may be bonded with one selected from among $R_{2a}$ and $R_{2b}$ (e.g., $R_{2a}$ or $R_{2b}$) in Formula 1 to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$. For example, $R_{12}$ in Formulae CY1(23), CY1(25), and CY1(27) may be bonded with one selected from among $R_{2a}$ and $R_{2b}$ (e.g., $R_{2a}$ or $R_{2b}$) in Formula 1 to form a 6-membered ring containing oxygen (O), boron(B), or any combination thereof.

In an embodiment, ring $CY_{21}$ may be a benzene group or a naphthalene group.

In an embodiment, ring $CY_{23}$ may be a benzene group, a naphthalene group, or a pyridine group.

$X_1$, and $X_{21}$ to $X_{23}$ in Formula 1 may each independently be C or N.

In an embodiment, $X_1$, and $X_{21}$ to $X_{23}$ may each be C.

$L_1$ to $L_3$ in Formula 1 may each independently be a single bond, $*—C(R_{1a})(R_{1b})—*'$, $*—C(R_{1a})=*'$, $*=C(R_{1a})—*'$, $*—C(R_{1a})=C(R_{1b})—*'$, $*—C(=O)—*'$, $*—C(=S)—*'$, $*—C≡C—*'$, $*—B(R_{1a})—*'$, $*—N(R_{1a})—*'$, $*—O—*'$, $*—P(R_{1a})(R_{1b})—*'$, $*—Si(R_{1a})(R_{1b})—*'$, $*—P(=O)(R_{1a})—*'$, $*—S—*'$, $*—S(=O)—*'$, $*—S(=O)_2*'$, or $*—Ge(R_{1a})(R_{1b})—*'$, and * and *' each indicate a binding site to a neighboring atom.

In an embodiment, $L_1$ and $L_3$ may each be a single bond.

n1 to n3 in Formula 1 may each independently be an integer selected from 1 to 5.

$T_1$ in Formula 1 may be a single bond, $*—C(R_{2a})(R_{2b})—*'$, $*—C(R_{2a})=*'$, $*=C(R_{2a})—*'$, $*—C(R_{2a})=C(R_{2b})—*'$, $*—C(=O)—*'$, $*—C(=S)*'$ $*—C≡C*'$, $*—B(R_{2a})—*'$, $*—N(R_{2a})—*'$, $*—O*'$, $*—P(R_{2a})(R_{2b})—*'$, $*—Si(R_{2a})(R_{2b})—*'$, $*—P(=O)(R_{2a})—*'$, $*—S—*'$, $*—S(=O)—*'$, $*—S(=O)_2—*'$ or $*—Ge(R_{2a})(R_{2b})*'$, and * and *' each indicate a binding site to a neighboring atom.

$T_2$ in Formula 1 may be a single bond, $*—C(R_{3a})(R_{3b})—*'$, $*—C(R_{3a})=*'$, $*=C(R_{3a})—*'$, $*—C(R_{3a})=C(R_{3b})—*'$, $*—C(=O)—*'$, $*—C(=S)*'$, $*—C≡C*'$, $*—B(R_{3a})—*'$, $*—N(R_{3a})—*'$, $*—O*'$, $*—P(R_{3a})(R_{3b})—*'$, $*—Si(R_{3a})(R_{3b})—*'$, $*—P(=O)(R_{3a})—*'$, $*—S—*'$, $*—S(=O)—*'$, $*—S(=O)_2—*'$, or $*—Ge(R_{3a})(R_{3b})*'$, and * and *' each indicate a binding site to a neighboring atom.

m1 in Formula 1 may be an integer selected from 0 to 2, wherein, when m1 is 0, $T_1$ does not exist and thus ring $CY_1$ and ring $CY_{23}$ may not be bound to each other.

m2 in Formula 1 may be 1 or 2.

In an embodiment, $T_1$ may be a single bond, $*—C(R_{2a})(R_{2b})—*'$, $*—B(R_{2a})—*'$, $*—N(R_{2a})—*$, $*—O—*'$, $*—P(R_{2a})(R_{2b})—*'$, $*—Si(R_{2a})(R_{2b})—*'$ or $*—S—*'$, and m1 may be 0 or 1.

In an embodiment, $T_2$ may be a single bond, $*—C(R_{3a})(R_{3b})—*'$, $*—B(R_{3a})—*'$, $*—N(R_{3a})—*$, $*—O—*'$, $*—P(R_{3a})(R_{3b})—*'$, $*—Si(R_{3a})(R_{3b})—*'$, or $*—S—*'$, and m2 may be 1.

In an embodiment, a moiety represented by

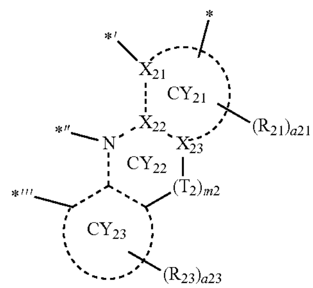

in Formula 1 may be, when m1 is 0, one selected from among the groups represented by Formulae CY2(1) to CY2(10):

CY2(1)

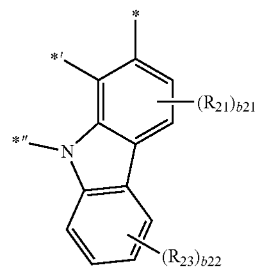

CY2(2)

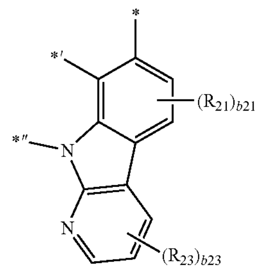

CY2(3)

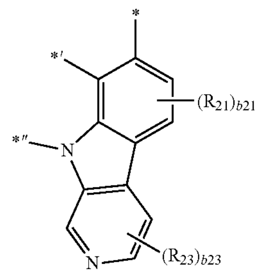

-continued

CY2(4)

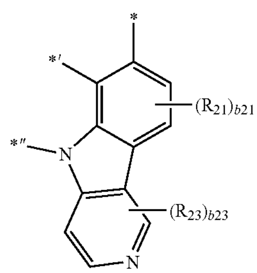

CY2(5)

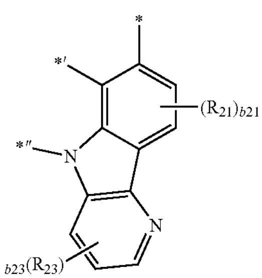

CY2(6)

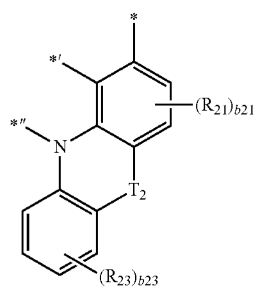

CY2(7)

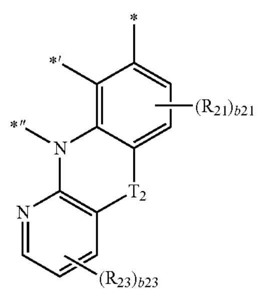

CY2(8)

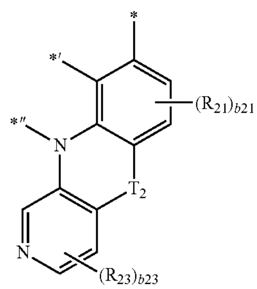

-continued

CY2(9)

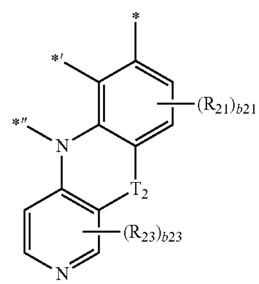

CY2(10)

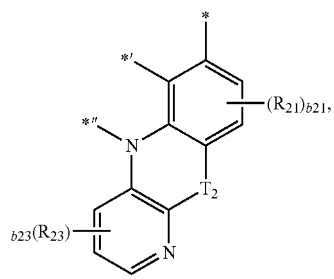

wherein, in Formulae $CY_2(1)$ to $CY_2(10)$, b21 may be an integer selected from 0 to 2, b22 may be an integer selected from 0 to 4, b23 may be an integer selected from 0 to 3,

*, *', and *" each indicate a binding site to a neighboring atom, and $R_{21}$, $R_{23}$, and $T_2$ may each independently be the same as described above.

In an embodiment, in Formulae CY2(6) to CY2(10), one selected from among $R_{3a}$ and $R_{3b}$ (e.g., $R_{3a}$ or $R_{3b}$) of $T_2$ may optionally be bonded with one of $R_{21}$(s) in the number of b21 to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$. For example, one selected from among $R_{3a}$ and $R_{3b}$ (e.g., $R_{3a}$ or $R_{3b}$) of $T_2$ may optionally be bonded with one of $R_{21}$(s) in the number of b21 to form a 6-membered ring containing oxygen (O), boron (B), or any combination thereof.

In an embodiment, in Formulae CY2(6) to CY2(10), one selected from among $R_{3a}$ and $R_{3b}$ (e.g., $R_{3a}$ or $R_{3b}$) of $T_2$ may optionally be bonded with one of $R_{23}$(s) in the number of b22 or b23 to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$. For example, one selected from among $R_{3a}$ and $R_{3b}$ (e.g., $R_{3a}$ or $R_{3b}$) of $T_2$ may optionally be bonded with one of $R_{23}$(s) in the number of b22 or b23 to form a 6-membered ring containing oxygen (O), boron (B), or any combination thereof.

In an embodiment, a moiety represented by

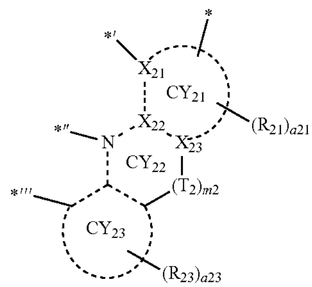

in Formula 1 may be, when m1 is 1, one selected from among the groups represented by Formulae CY2(11) to CY2(18):

CY2(11)

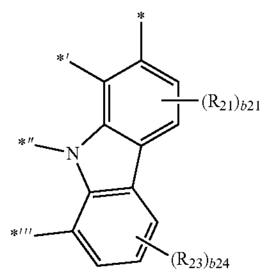

CY2(12)

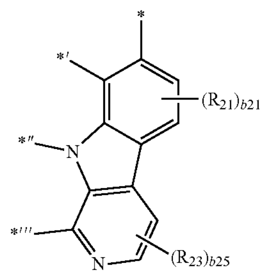

CY2(13)

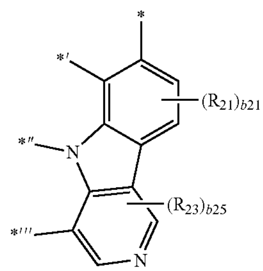

CY2(14)

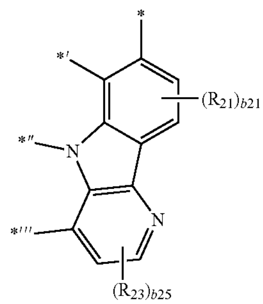

-continued

CY2(15)

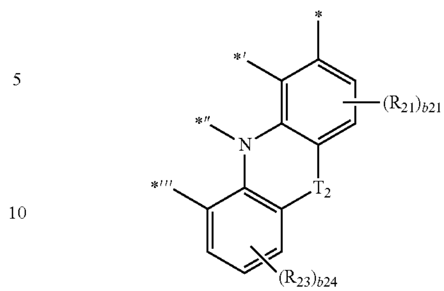

CY2(16)

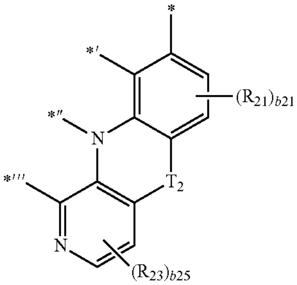

CY2(17)

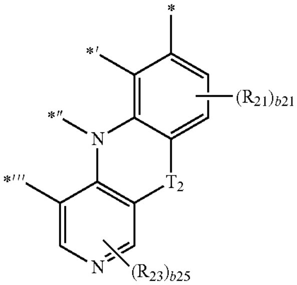

CY2(18)

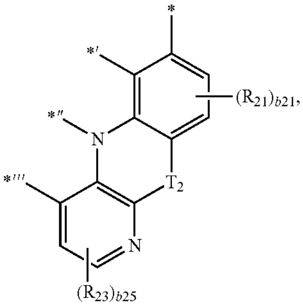

wherein, in Formulae $CY_2(11)$ to $CY_2(18)$, b21 may be an integer selected from 0 to 2, b24 may be an integer selected from 0 to 3, b25 may be an integer selected from 0 to 2,

*, *', *", and *'" each indicate a binding site to a neighboring atom, and $R_{21}$, $R_{23}$, and $T_2$ may each independently be the same as described above.

In an embodiment, in Formulae CY2(15) to CY2(18), one selected from among $R_{3a}$ and $R_{3b}$ (e.g., $R_{3a}$ or $R_{3b}$) of $T_2$ may optionally be bonded with one of $R_{21}$(s) in the number of b21 to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$. For example, one selected from among $R_{3a}$ and $R_{3b}$ (e.g., $R_{3a}$ or $R_{3b}$) of $T_2$ may optionally be bonded with one of $R_{21}$(s) in the number of b21 to form a 6-membered ring containing oxygen (O), boron (B), or any combination thereof.

In an embodiment, in Formulae CY2(15) to CY2(18), one selected from among $R_{3a}$ and $R_{3b}$ (e.g., $R_{3a}$ or $R_{3b}$) of $T_2$ may optionally be bonded with one of $R_{23}$(s) in the number of b24 or b25 to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$. For example, one selected from among $R_{3a}$ and $R_{3b}$ (e.g., $R_{3a}$ or $R_{3b}$) of $T_2$ may optionally be bonded with one of $R_{23}$(s) in the number of b24 or b25 to form a 6-membered ring containing oxygen (O), boron (B), or any combination thereof.

In Formula 1, $Y_1$ may be $C(Z_1)$ or N, $Y_2$ may be $C(Z_2)$ or N, $Y_3$ may be $C(Z_3)$ or N, $Y_4$ may be $C(Z_4)$ or N, $Y_5$ may be $C(Z_5)$ or N, $Y_6$ may be $C(Z_6)$ or N, $Y_7$ may be $C(Z_7)$ or N, and $Y_8$ may be $C(Z_8)$ or N. $Z_1$ to $Z_8$ may each independently be the same as described above.

In an embodiment, in Formula 1, $Y_1$ may be $C(Z_1)$, $Y_2$ may be $C(Z_2)$, $Y_3$ may be $C(Z_3)$, $Y_4$ may be $C(Z_4)$, $Y_5$ may be $C(Z_5)$, $Y_6$ may be $C(Z_6)$, $Y_7$ may be $C(Z_7)$, and Ya may be $C(Z_8)$.

 in Formula 1 indicates a single bond or a double bond.

A group represented by

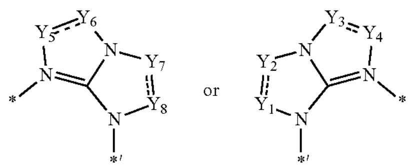

or in Formula 1 may each independently be any one of the groups represented by Formulae CYN(1) to CYN(21):

CYN(1)

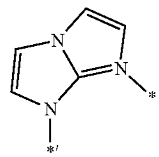

CYN(2)

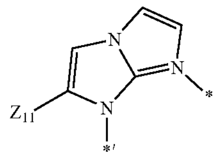

CYN(3)

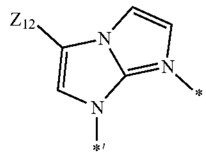

CYN(4)

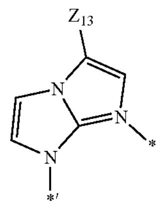

-continued

CYN(5)

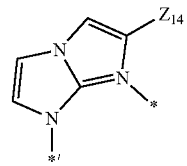

CYN(6)

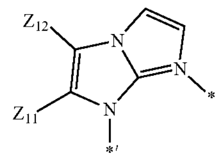

CYN(7)

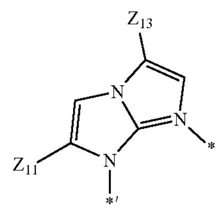

CYN(8)

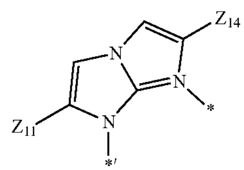

CYN(9)

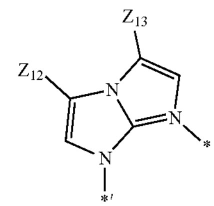

CYN(10)

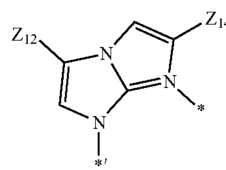

CYN(11)

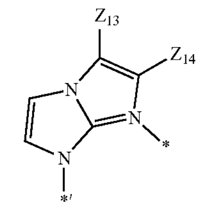

CYN(12)

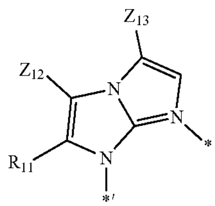

-continued

CYN(13)

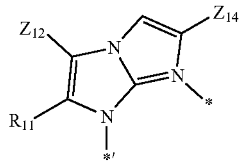

CYN(14)

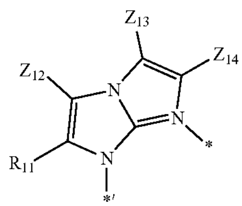

CYN(15)

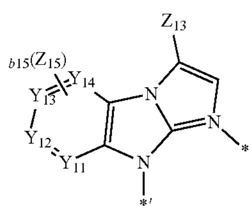

CYN(16)

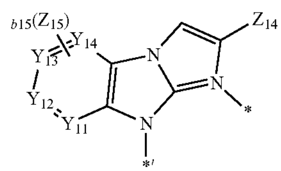

CYN(17)

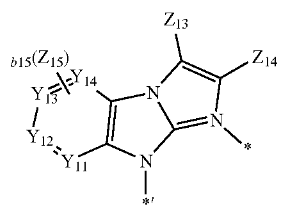

CYN(18)

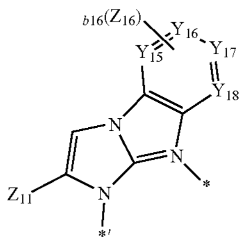

CYN(19)

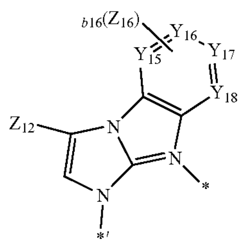

-continued

CYN(20)

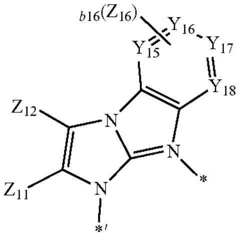

CYN(21)

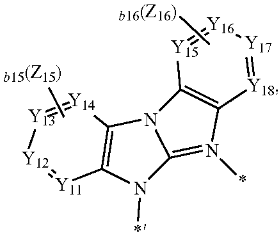

wherein, in Formulae CYN(1) to CYN(21), $Z_{11}$ to $Z_{16}$ may each independently be deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), b15 and b16 may each independently be an integer selected from 0 to 4, $Y_{11}$ to $Y_{18}$ may each independently be C or N,

* and *' each indicate a binding site to an adjacent atom, and $R_{10a}$ and $Q_1$ to $Q_3$ are each the same as described in the present specification.

In an embodiment, $Z_{11}$ to $Z_{16}$ may each independently be deuterium, —F, —Cl, —Br, —I, cyano group, a $C_1$-$C_{60}$ alkyl group unsubstituted or substituted with at least one $R_{10a}$, a $C_3$-$C_{60}$ carbocyclic group unsubstituted or substituted with at least one $R_{10a}$ or —Si($Q_1$)($Q_2$)($Q_3$).

In an embodiment, $Z_{11}$ to $Z_{16}$ may each independently be:

deuterium, —F, —Cl, —Br, —I, or a cyano group;

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$;

an n-propyl group, an isopropyl group, an n-butyl group, an isobutyl group, a sec-butyl group, or a tert-butyl group, each unsubstituted or substituted with deuterium;

a phenyl group, a biphenyl group, a terphenyl group, or a naphthalene group, each unsubstituted or substituted with at least one of deuterium, $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, —$CD_2CD_3$, —$CD_2CD_2H$, —$CD_2CDH_2$, an n-propyl group, an isopropyl group, an n-butyl group, an isobutyl group, a sec-butyl group, or a tert-butyl group; or $Si(Q_1)(Q_2)(Q_3)$.

In an embodiment, $Y_{11}$ to $Y_{14}$ may each be C.

In one or more embodiments, $Y_{11}$ may be N, and $Y_{12}$ to $Y_{14}$ may each be C;

$Y_{12}$ may be N, and $Y_{11}$, $Y_{13}$, and $Y_{14}$ may each be C; or $Y_{14}$ may be N, and $Y_{11}$ to $Y_{13}$ may each be C.

In an embodiment, $Y_{11}$ and $Y_{14}$ may each be N, and $Y_{12}$ and $Y_{13}$ may each be C.

In an embodiment, $Y_{15}$ to $Y_{18}$ may each be C.

In one or more embodiments, $Y_{15}$ may be N, and $Y_{16}$ to $Y_{18}$ may each be C; or $Y_{18}$ may be N, and $Y_{15}$ to $Y_{17}$ may each be C.

In an embodiment, $Y_{15}$ and $Y_{18}$ may each be N, and $Y_{16}$ and $Y_{17}$ may each be C.

$R_1$, $R_{21}$, $R_{23}$, $Z_1$ to $Z_8$, $R_{1a}$, $R_{1b}$, $R_{2a}$, $R_{2b}$, $R_{3a}$, and $R_{3b}$ in Formula 1 may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$. $R_{10a}$ and $Q_1$ to $Q_3$ may each be the same as described in the present specification.

For example, $R_1$, $R_{21}$, $R_{23}$, $Z_1$ to $Z_8$, $R_{1a}$, $R_{1b}$, $R_{2a}$, $R_{2b}$, $R_{3a}$, and $R_{3b}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, or a $C_1$-$C_{20}$ alkylthio group;

a $C_1$-$C_{20}$ alkyl group, a $C_1$-$C_{20}$ alkoxy group, or a $C_1$-$C_{20}$ alkylthio group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, or a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothienyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothienyl group, a benzocarbazolyl group, a dibenzocarbazolyl group, an imidazopyridinyl group, an imidazopyrimidinyl group, an azacarbazolyl group, an azadibenzofuranyl group, an azadibenzothienyl group, an azafluorenyl group, or an azadibenzosilolyl group, each unsubstituted or substituted with at least one of deuterium, —F, —Cl, —Br, —I, —$CD_3$, —$CD_2H$, $CDH_2$, —$CF_3$, —$CF_2H$, —$CFH_2$, a hydroxyl group, a cyano group, a nitro group, a $C_1$-$C_{20}$ alkyl group, a $C_1$-$C_{20}$ alkoxy group, a $C_1$-$C_{20}$ alkylthio group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothienyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothienyl group, a benzocarbazolyl group, a dibenzocarbazolyl group, an imidazopyridinyl group, an imidazopyrimidinyl group, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2(Q_{31})$, or —$P(=O)(Q_{31})(Q_{32})$; or —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, and $Q_1$ to $Q_3$ and $Q_{31}$ to $Q_{33}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with at least one of deuterium, a $C_1$-$C_{10}$ alkyl group, a phenyl group, a biphenyl group, a pyridinyl group, a pyrimidinyl group, a pyridazinyl group, a pyrazinyl group, or a triazinyl group.

In an embodiment, $R_1$, $R_{21}$, $R_{23}$, $Z_1$ to $Z_8$, $R_{1a}$, $R_{1b}$, $R_{2a}$, $R_{2b}$, $R_{3a}$, and $R_{3b}$ may each independently be hydrogen, deuterium, —F, —Cl, —Br, —I, a cyano group, a $C_1$-$C_{30}$ alkyl group unsubstituted or substituted with at least one $R_{10a}$, a $C_2$-$C_{30}$ alkenyl group unsubstituted or substituted with at least one $R_{10a}$, a $C_2$-$C_{30}$ alkynyl group unsubstituted or substituted with at least one $R_{10a}$, a $C_6$-$C_{30}$ aryl group unsubstituted or substituted with at least one $R_{10a}$, a $C_1$-$C_{30}$ heteroaryl group unsubstituted or substituted with at least one $R_{10a}$, a monovalent non-aromatic condensed polycyclic group which is unsubstituted or substituted with at least one $R_{10a}$, a monovalent non-aromatic condensed heteropolycyclic group unsubstituted or substituted with at least one $R_{10a}$, or —Si($Q_1$)($Q_2$)($Q_3$).

a1, a21, and a23 in Formula 1 may each independently be an integer selected from 0 to 10.

In an embodiment, $Z_1$ and $Z_2$ may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $Z_3$ and $Z_4$ may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $Z_5$ and $Z_6$ may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and $Z_7$ and $Z_8$ may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, $Z_1$ to $Z_8$ may each independently be:

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, a 2-methylbutyl group, a 2,2-dimethylpropyl group, a 1-ethylpropyl group, or a 1,2-dimethylpropyl group, each unsubstituted or substituted with deuterium, —F, —Cl, —Br, —I, a hydroxyl group, a cyano group, or a nitro group; or a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, a 2-methylbutyl group, a 2,2-dimethylpropyl group, a 1-ethylpropyl group, a 1,2-dimethylpropyl group, a phenyl group, a biphenyl group, or a naphthyl group, each unsubstituted or substituted with a phenyl group that is unsubstituted or substituted with deuterium, —F, —Cl, —Br, —I, a hydroxyl group, a cyano group, or a nitro group; or $Z_1$ and $Z_2$ may be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, or $Z_3$ and $Z_4$ may be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, or $Z_5$ and Ze may be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, or $Z_7$ and Za may be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, when components of each pair of $Z_1$ and $Z_2$, $Z_3$ and $Z_4$, $Z_5$ and $Z_6$, or $Z_7$ and $Z_8$ are bound to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, the $C_3$-$C_{60}$ carbocyclic group and the $C_1$-$C_{60}$ heterocyclic group may include a 6-membered ring.

In some embodiments,

The $C_3$-$C_{60}$ carbocyclic group formed by bonding components of each pair of $Z_1$ and $Z_2$, $Z_3$ and $Z_4$, $Z_5$ and $Z_6$ or $Z_7$ and $Z_8$ may be a phenyl group or a naphthyl group, and The $C_1$-$C_{60}$ heterocyclic group formed by bonding components of each pair of $Z_1$ and $Z_2$, $Z_3$ and $Z_4$, $Z_5$ and $Z_6$, or $Z_7$ and $Z_8$ may be a pyridine group, a pyrimidine group, or a pyrazine group.

In an embodiment, $R_{2a}$ and $R_{2b}$ may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$. For example, $R_{2a}$ and $R_{2b}$ may optionally be bonded with each other to form a fluorenyl group.

In an embodiment, $R_{3a}$ and $R_{3b}$ may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$. For example, $R_{3a}$ and $R_{3b}$ may optionally be bonded with each other to form a fluorenyl group.

In an embodiment, one selected from among $R_{2a}$ and $R_{2b}$ (e.g., $R_{2a}$ or $R_{2b}$) and one of $R_1$(s) in the number of a1 may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, one selected from among $R_{2a}$ and $R_{2b}$ (e.g., $R_{2a}$ or $R_{2b}$) and one of $R_1$(s) in the number of a1 may be bound to each other to form a 6-membered ring. For example, $R_{2a}$ may be bound to one of $R_1$(s) in the number of a1 to form a 6-membered ring containing oxygen(O) or boron(B), wherein $T_1$ may be *—B($R_{2a}$)—*'.

In an embodiment, one selected from among $R_{2a}$ and $R_{2b}$ (e.g., $R_{2a}$ or $R_{2b}$) and one of $R_{23}$(s) in the number of a23 may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, one selected from among $R_{2a}$ and $R_{2b}$ (e.g., $R_{2a}$ or $R_{2b}$) and one of $R_{23}$(s) in the number of a23 may be bound to each other to form a 6-membered ring. For example, $R_{2a}$ may be bound to one of $R_{23}$(s) in the number of a23 to form a 6-membered ring containing oxygen(O) or boron(B), wherein $T_1$ may be *—B($R_{2a}$)—*'.

In an embodiment, one selected from among $R_{3a}$ and $R_{3b}$ (e.g., $R_{3a}$ or $R_{3b}$) and one of $R_{21}$(s) in the number of a21 may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, one selected from among $R_{3a}$ and $R_{3b}$ (e.g., $R_{3a}$ or $R_{3b}$) may be bound to one of $R_{21}$(s) in the number of a21 to form a 6-membered ring. For example, $R_{3a}$ may be bound to one of $R_{21}$(s) in the number of a21 to form a 6-membered ring containing oxygen(O) or boron(B), wherein $T_2$ may be *—B($R_{3a}$)*'.

In an embodiment, one selected from among $R_{3a}$ and $R_{3b}$ (e.g., $R_{3a}$ or $R_{3b}$) and one of $R_{23}$(s) in the number of a23 may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, one selected from among $R_{3a}$ and $R_{3b}$ (e.g., $R_{3a}$ or $R_{3b}$) may be bound to one of $R_{23}$(s) in the number of a23 to form a 6-membered ring. For example, $R_{3a}$ may be bound to one of $R_{23}$(s) in the number of a23 to form a 6-membered ring containing oxygen(O) or boron(B), wherein $T_2$ may be *—B($R_{3a}$)*'.

In an embodiment, the organometallic compound may be represented by Formula 1-1 or 1-2:

Formula 1-1

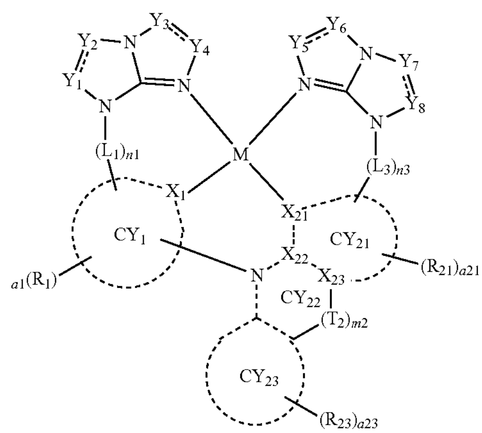

Formula 1-2

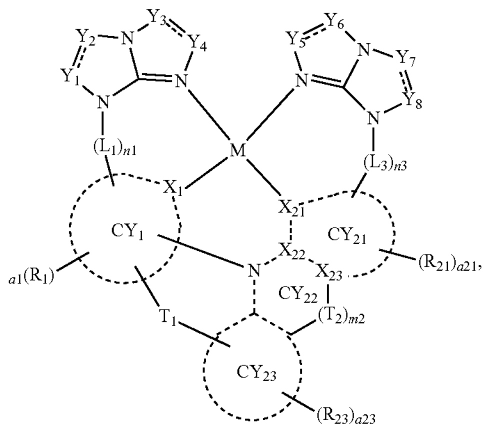

wherein, in Formulae 1-1 and 1-2,

M, ring $CY_1$, ring $CY_{21}$, to ring $CY_{23}$, $X_1$, $X_{21}$ to $X_{23}$, $L_1$, $L_3$, $T_1$, $T_2$, n1, n3, m2, $Y_1$ to $Y_8$, $R_1$, $R_{21}$, $R_{23}$, $Z_1$ to $Z_8$, a1, a21, and a23 are each the same as described in the present specification.

In an embodiment, the triplet ($T_1$) energy level of the organometallic compound represented by Formula 1 may be 2.6 eV or more.

In an embodiment, the triplet metal-to-ligand charge transfer state ($^3$MLCT) value of the organometallic compound represented by Formula 1 may be equal to or greater than 10%.

In an embodiment, the organometallic compound represented by Formula 1 may be one of Compounds 1 to 90:

1

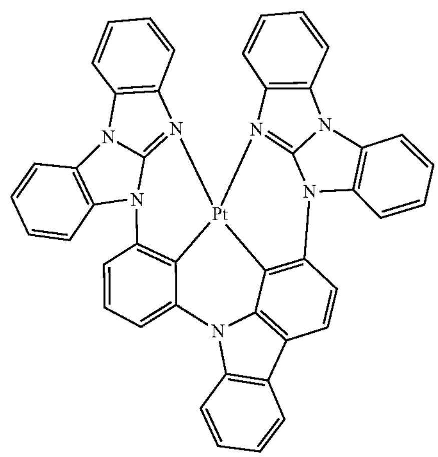

2

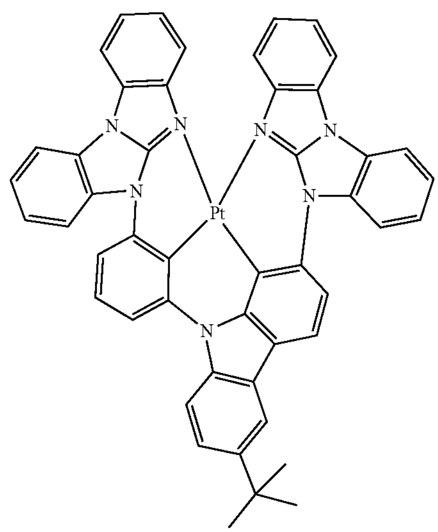

3

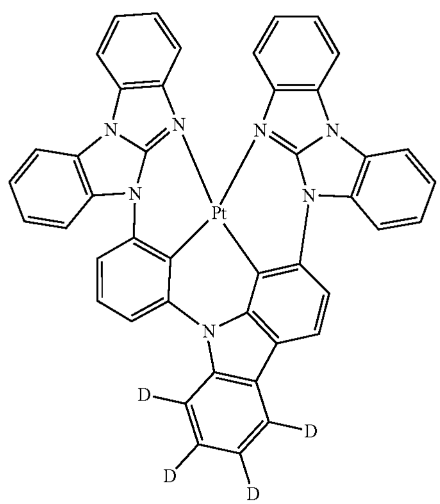

-continued
4
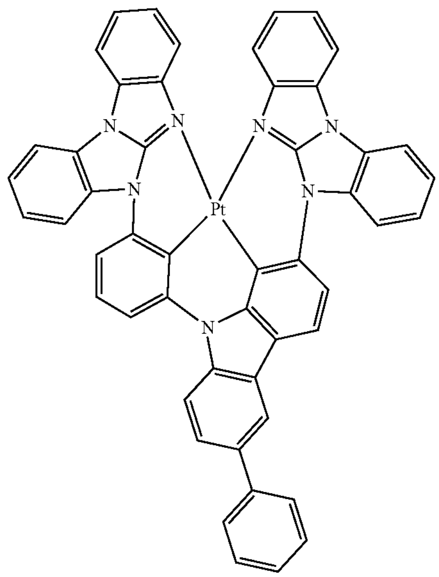
5
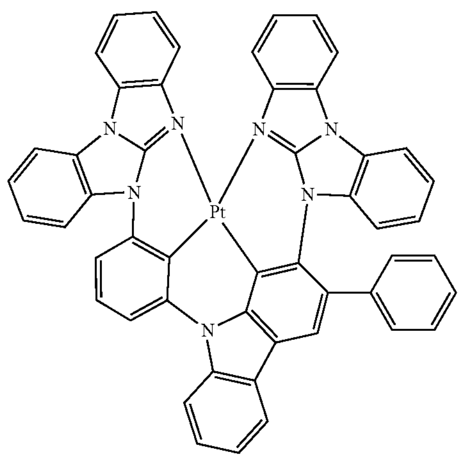
6
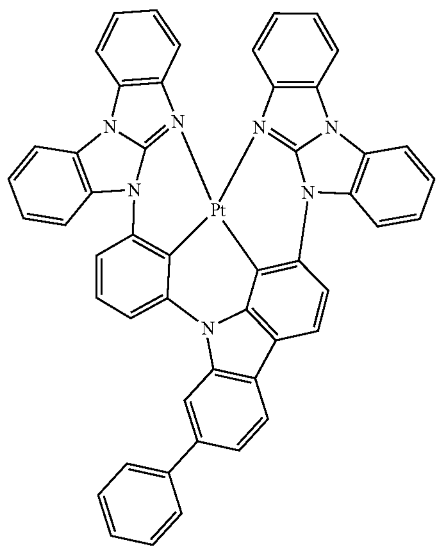
-continued
7
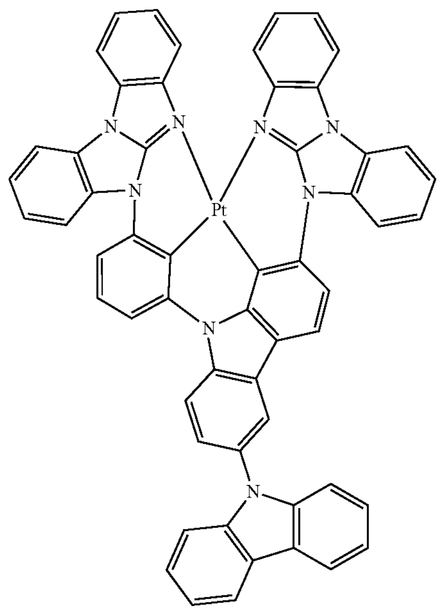
8
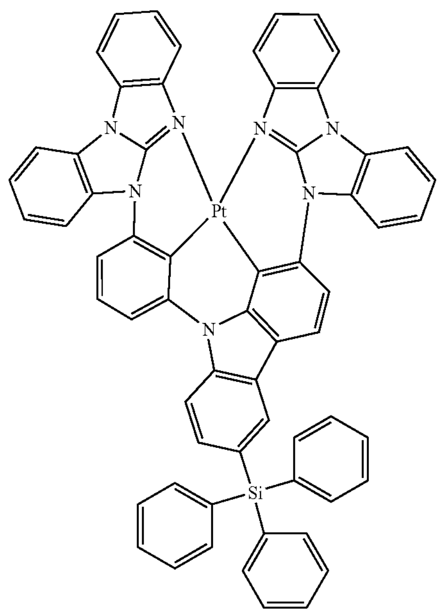

-continued
9
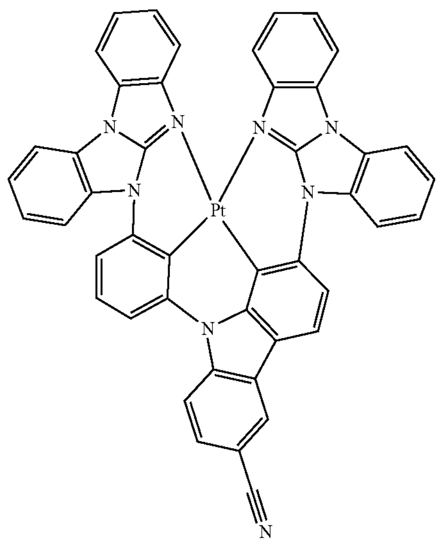
10
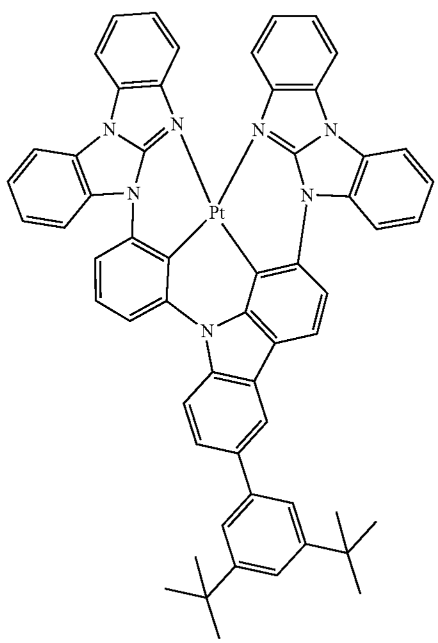
11
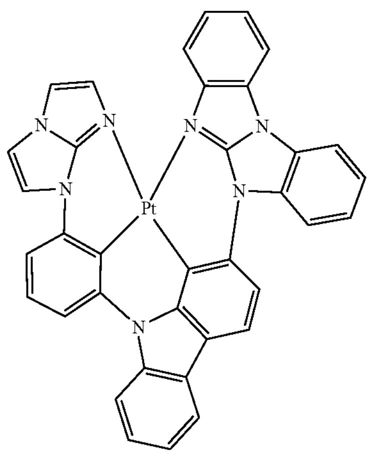
12
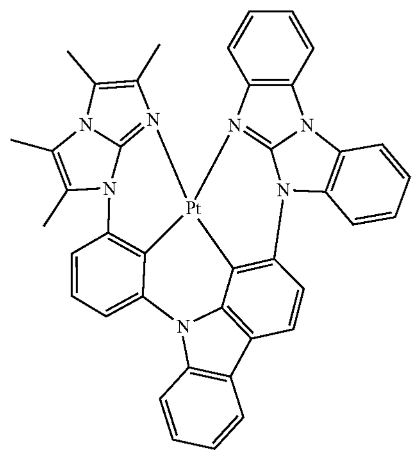
13
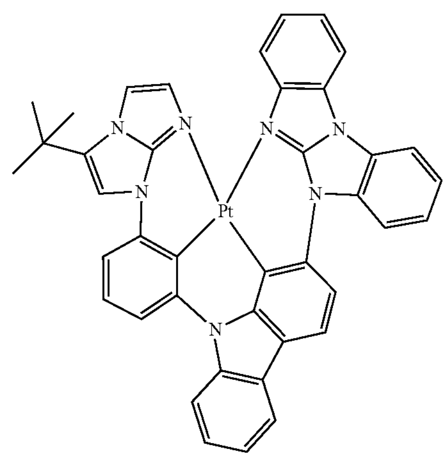
14
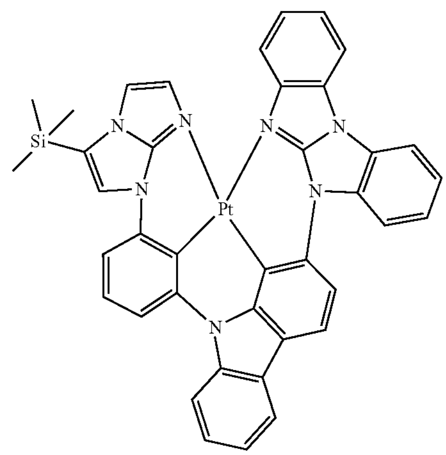

15
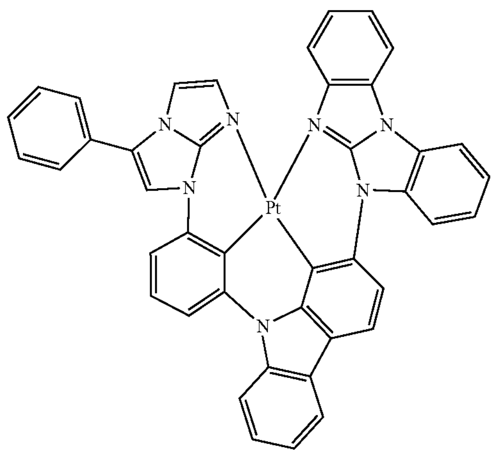
16
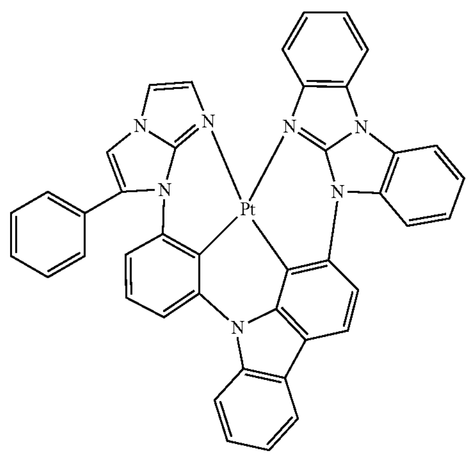
17
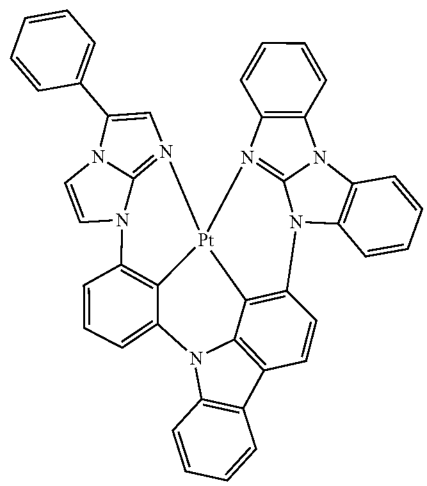
18
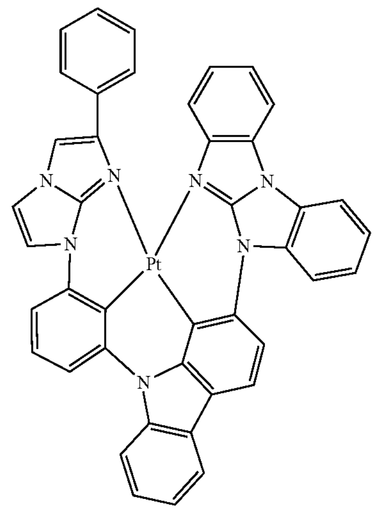
19
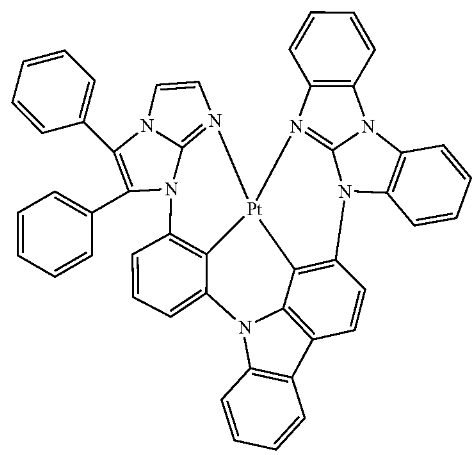
20
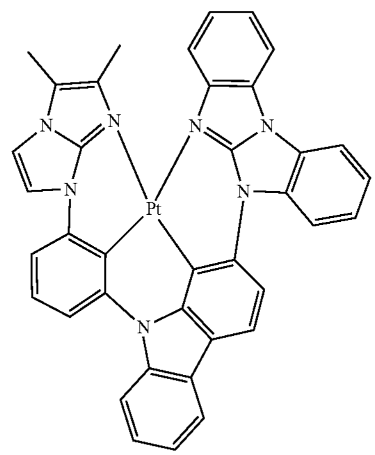

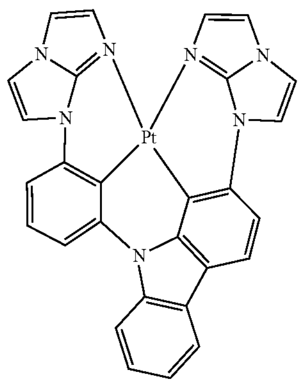
21
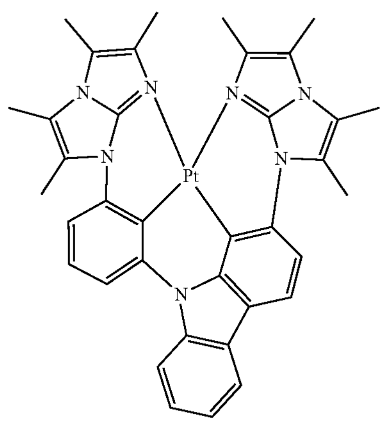
22
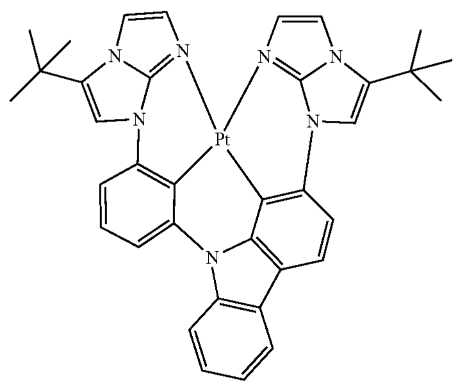
23
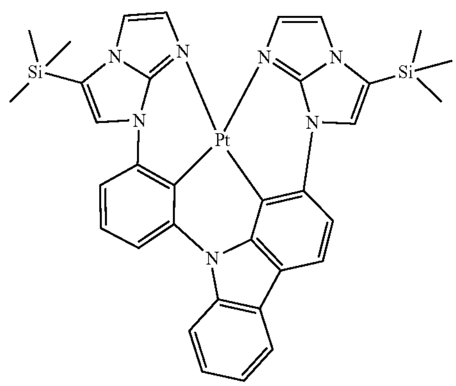
24
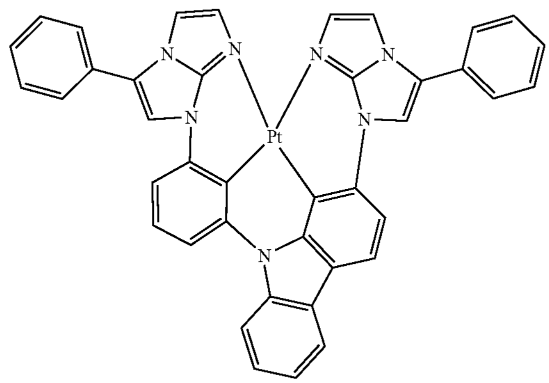
25
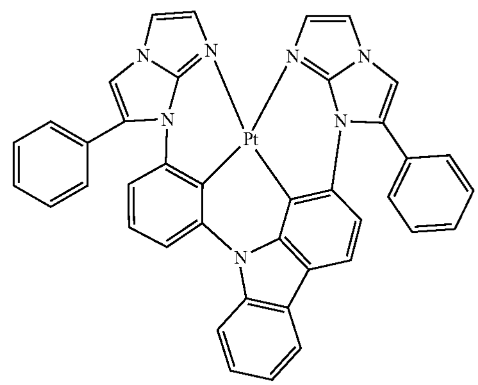
26
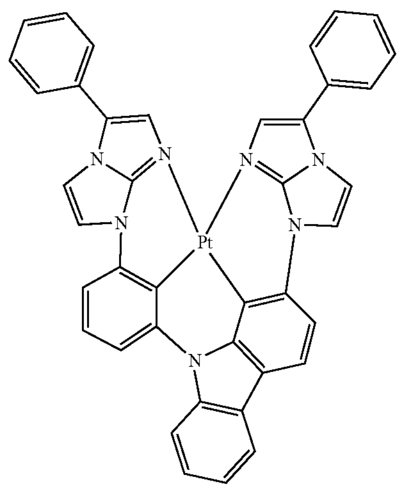
27

-continued
28
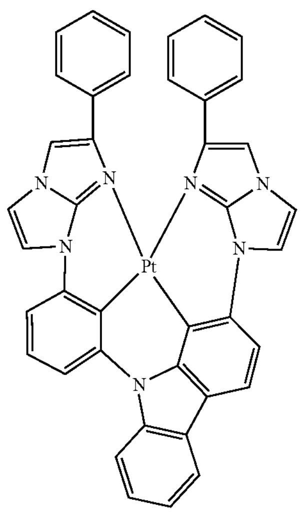
29
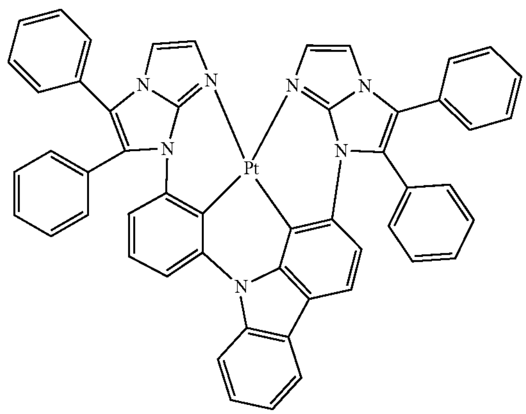
30
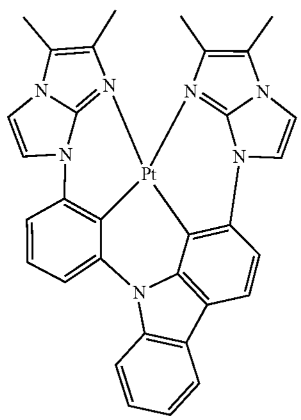
-continued
31
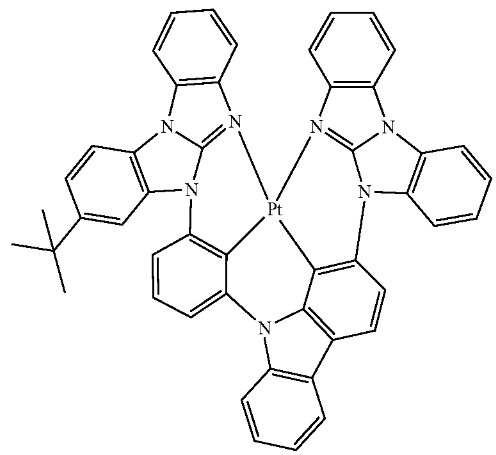
32
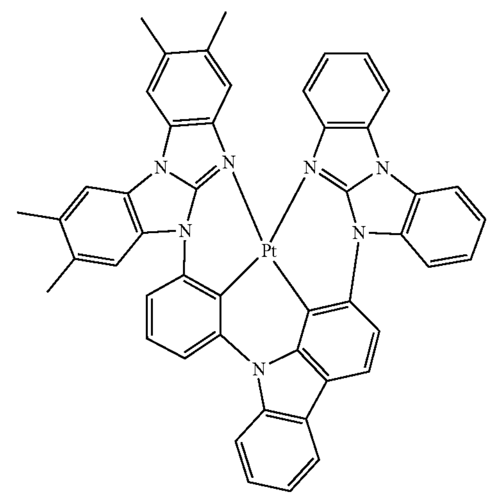
33
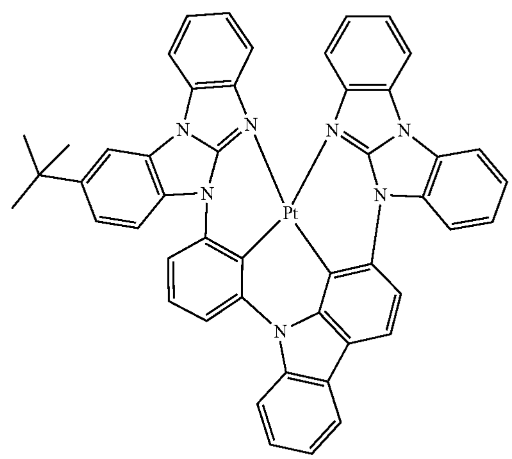

-continued
34
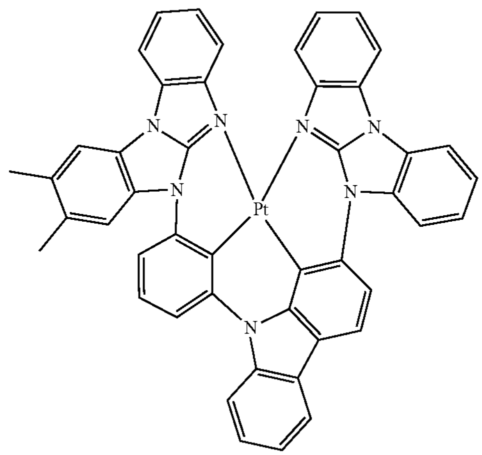
35
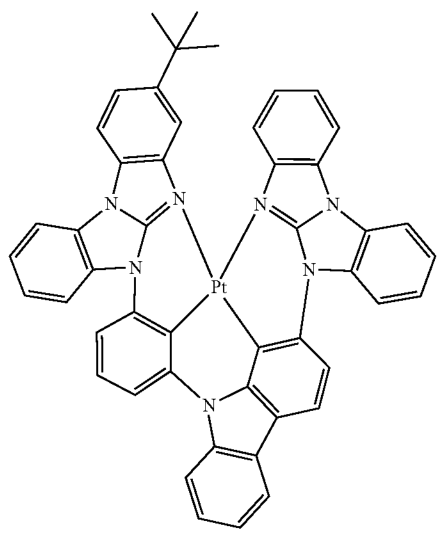
36
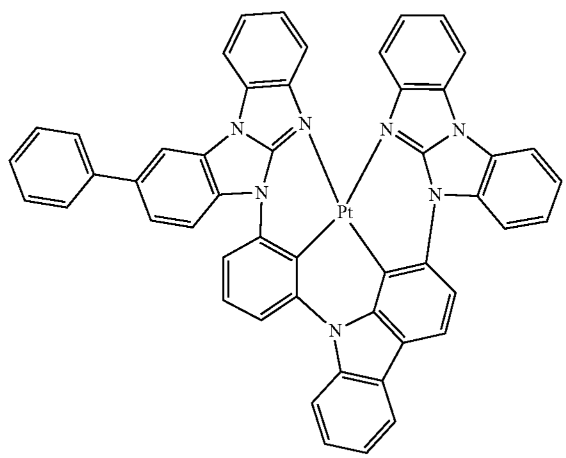
-continued
37
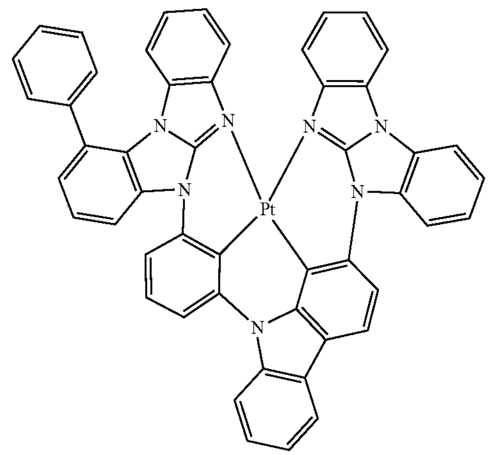
38
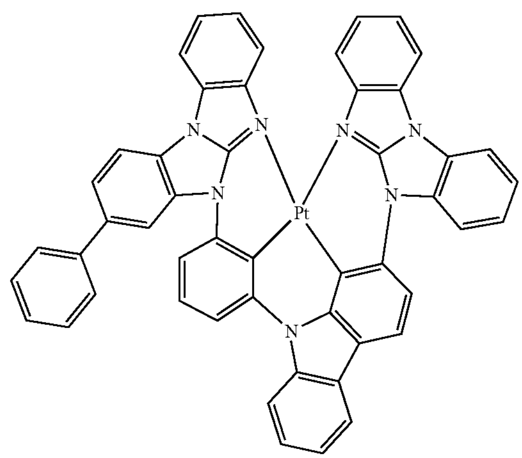
39
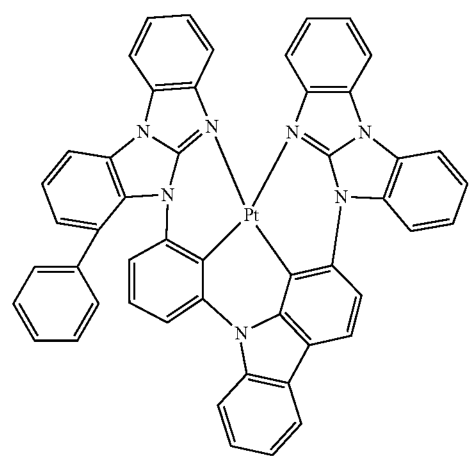

-continued
40
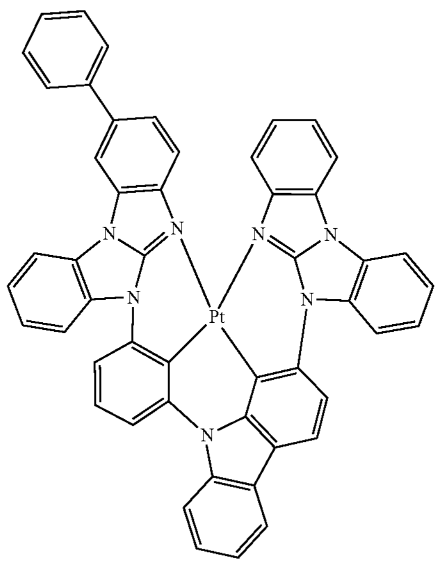
41
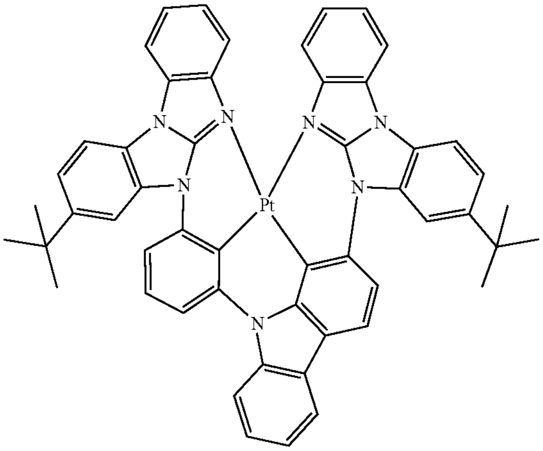
42
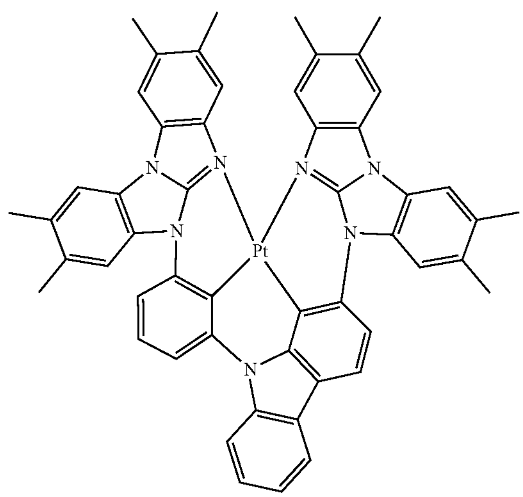
-continued
43
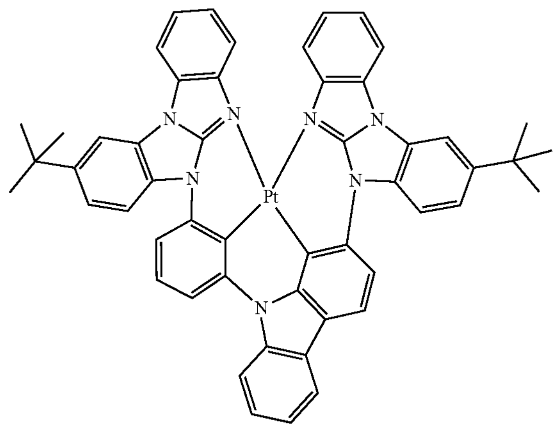
44
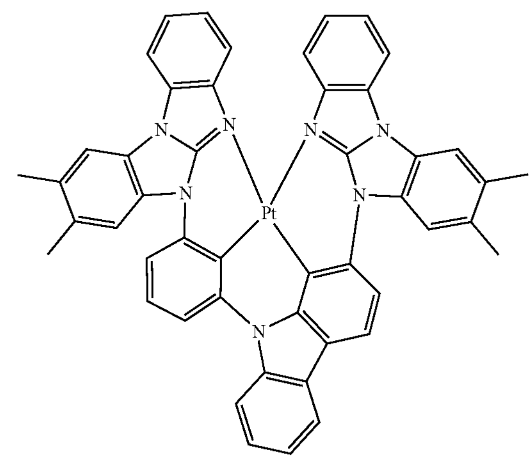
45
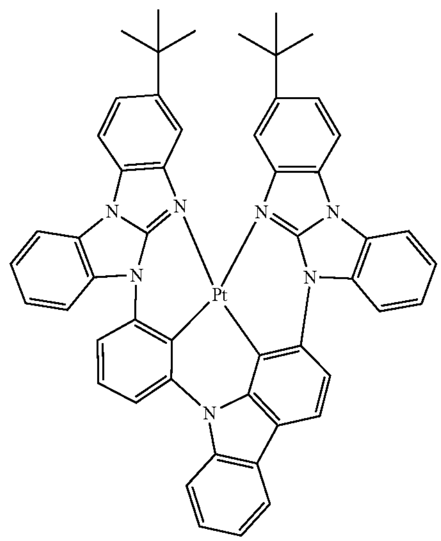

-continued
46
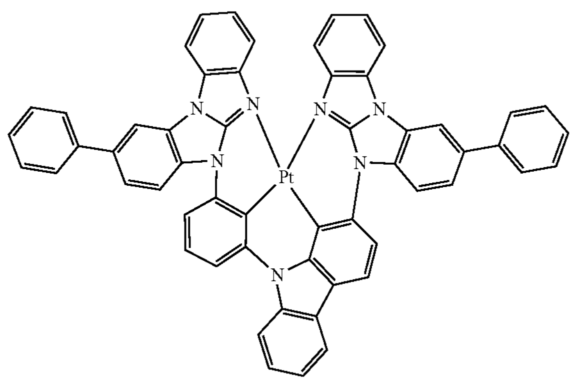
47
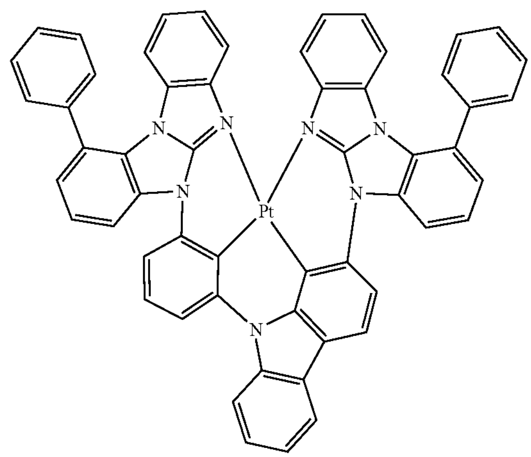
48
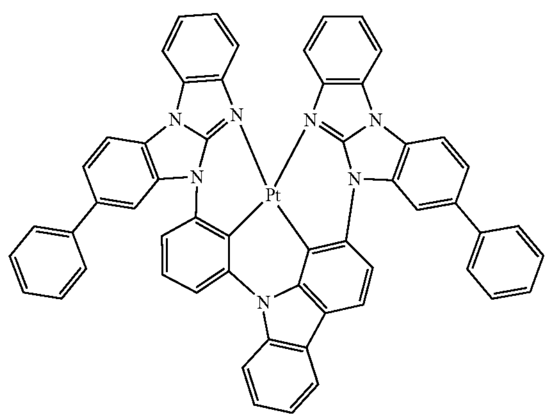
-continued
49
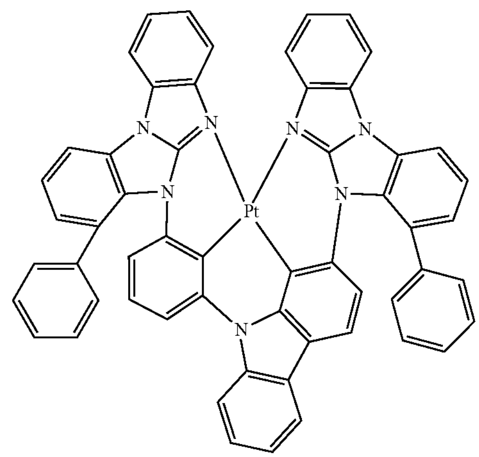
50
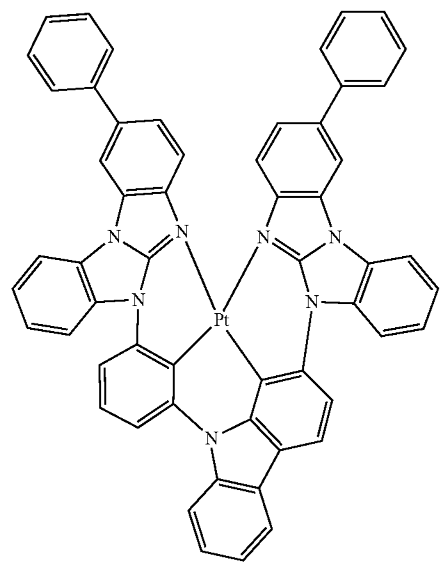
51
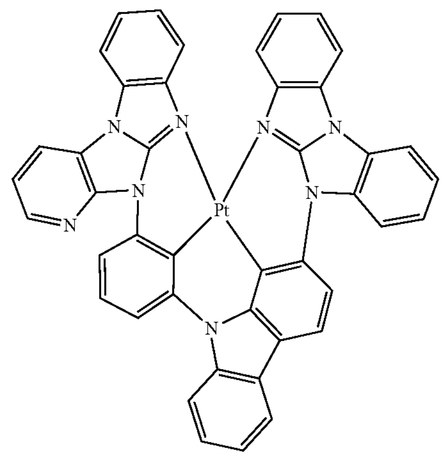

-continued
52
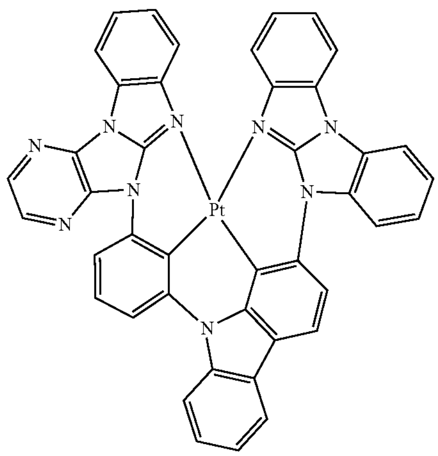
53
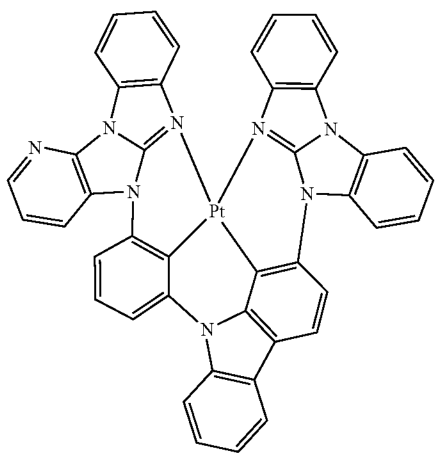
54
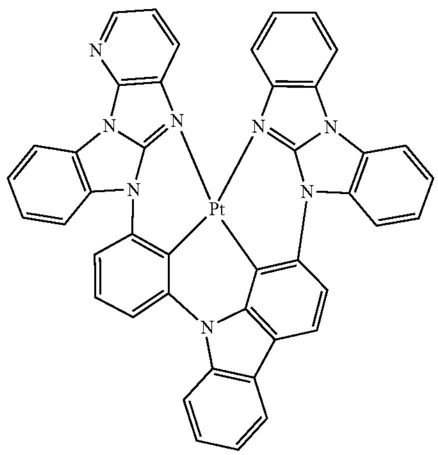
55
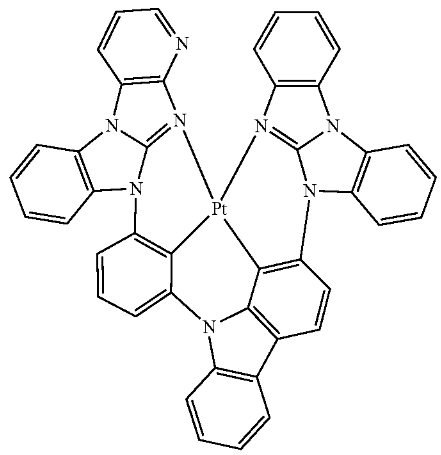
56
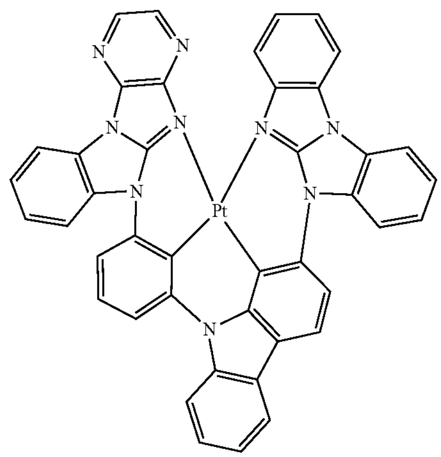
57
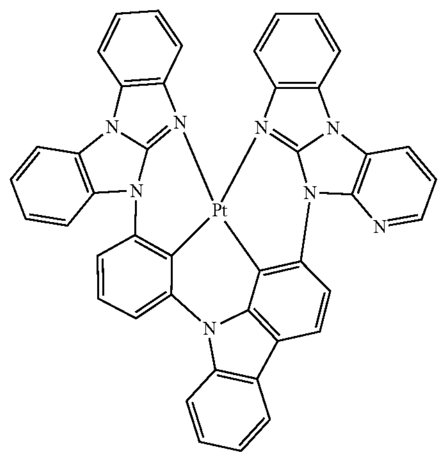

58
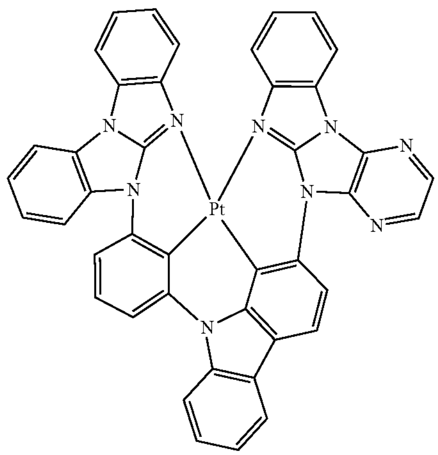
59
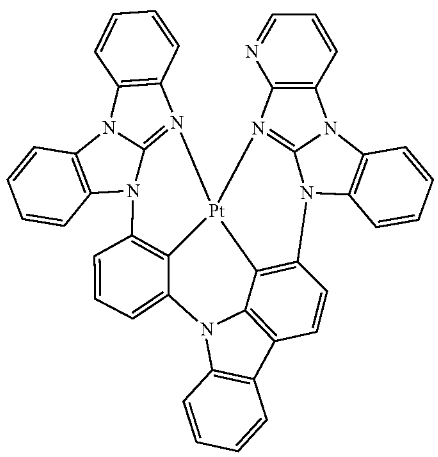
60
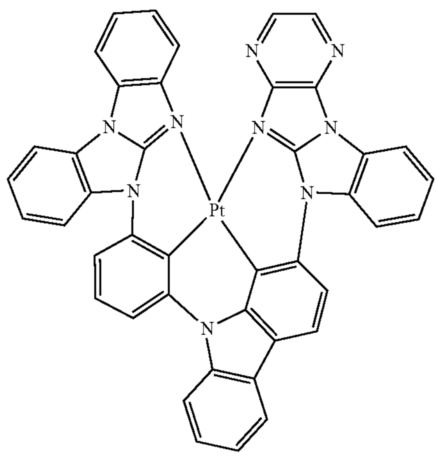
61
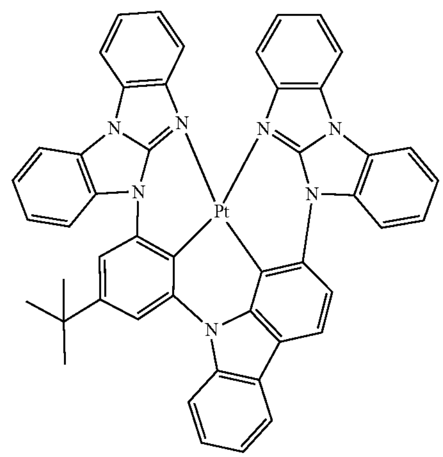
62
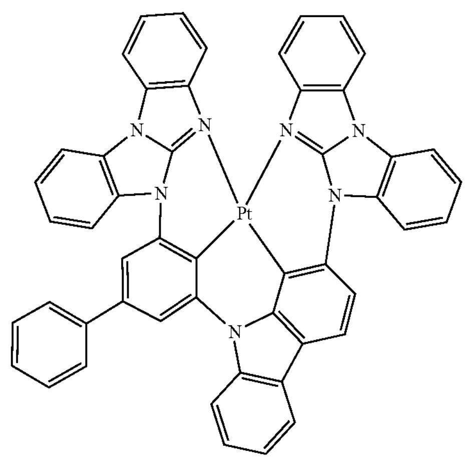
63
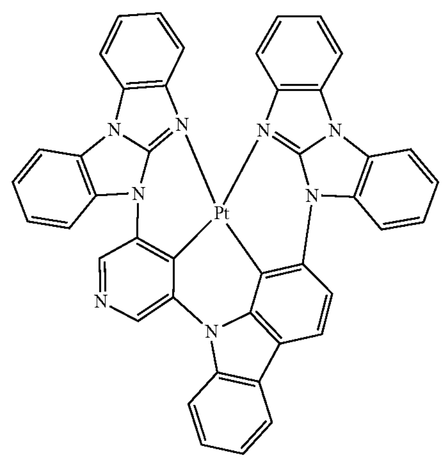

64
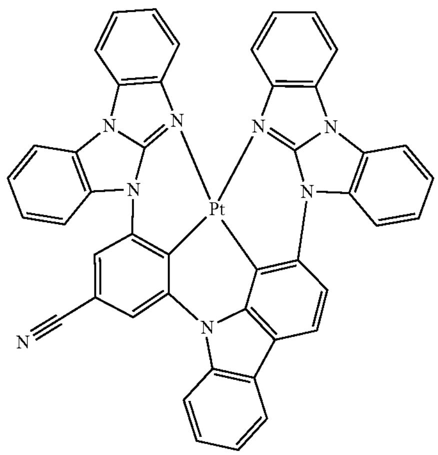
65
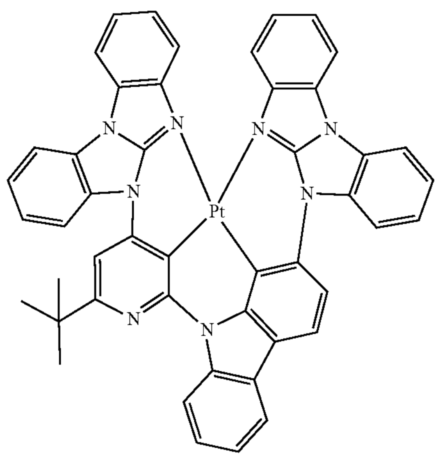
66
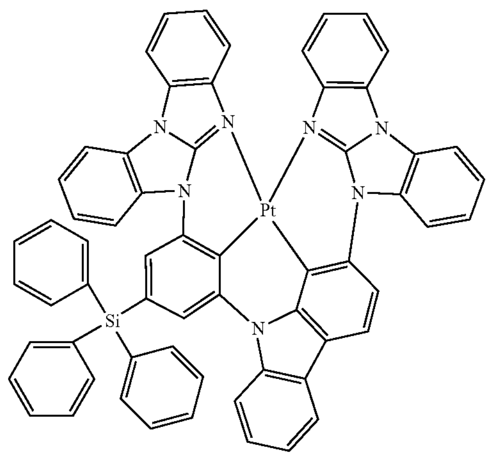
67
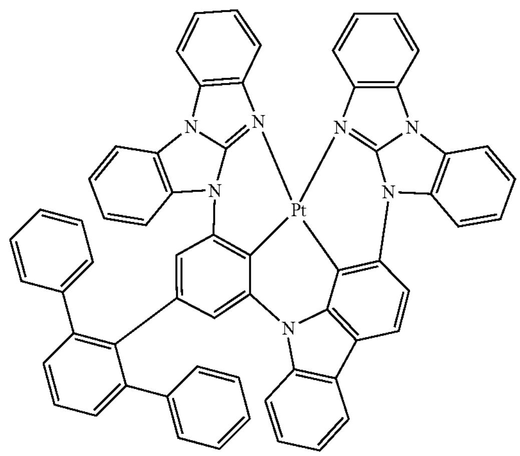
68
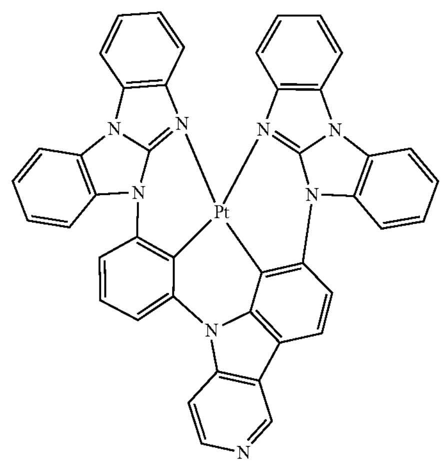
69
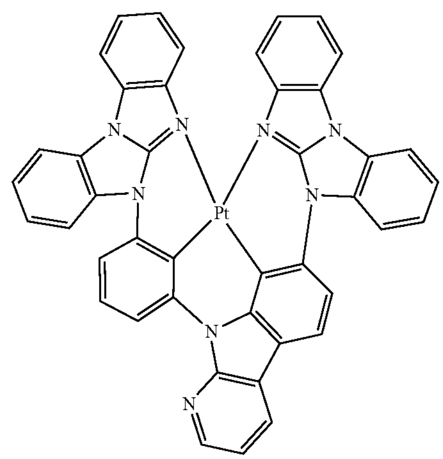

-continued
70
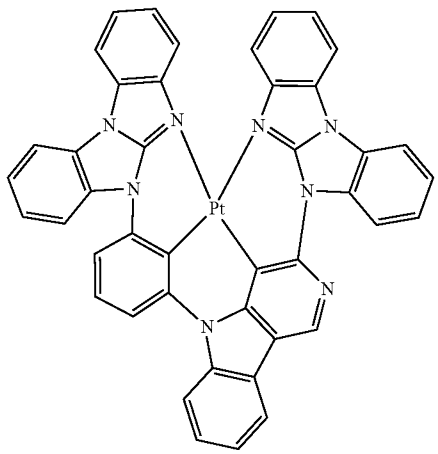
71
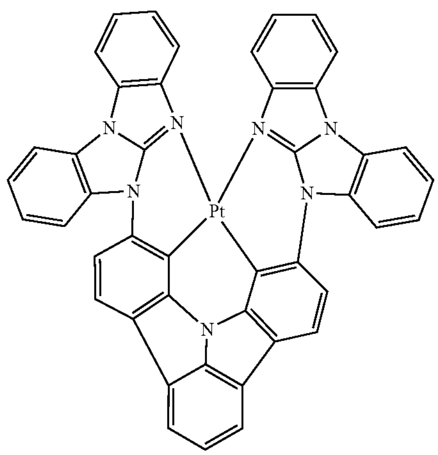
72
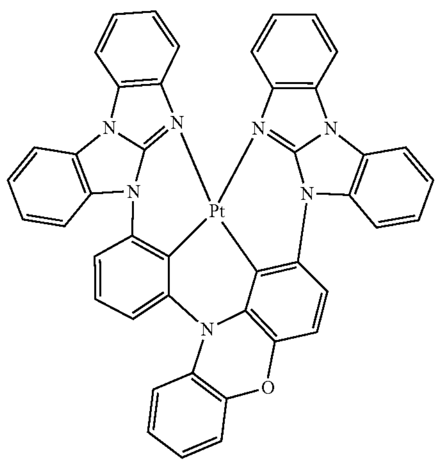
73
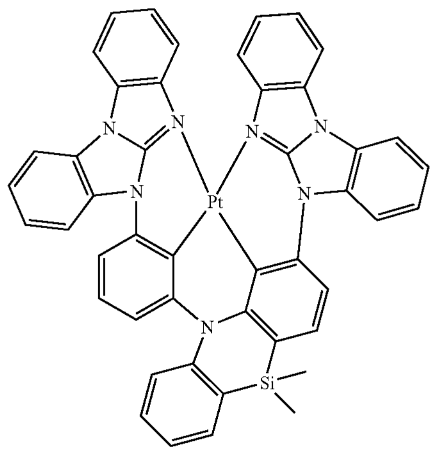
74
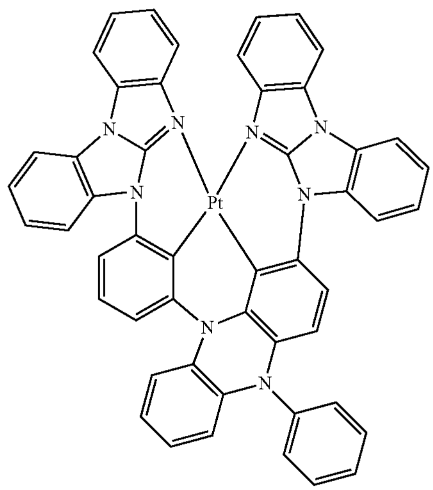
75
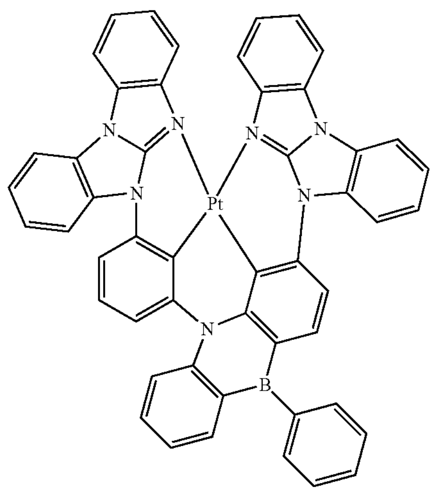

-continued
76
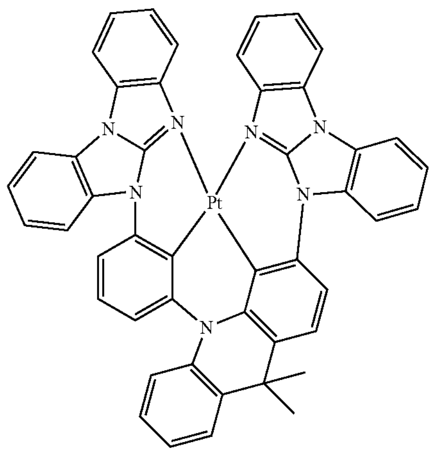
77
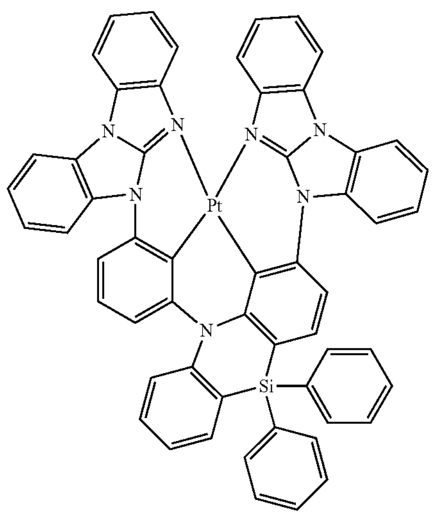
78
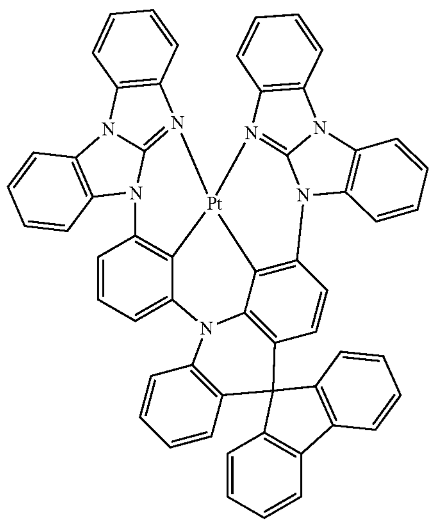
-continued
79
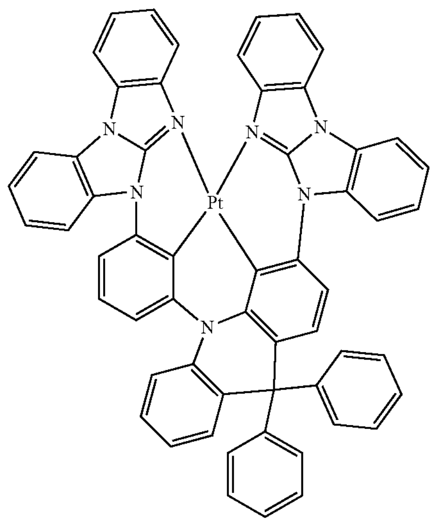
80
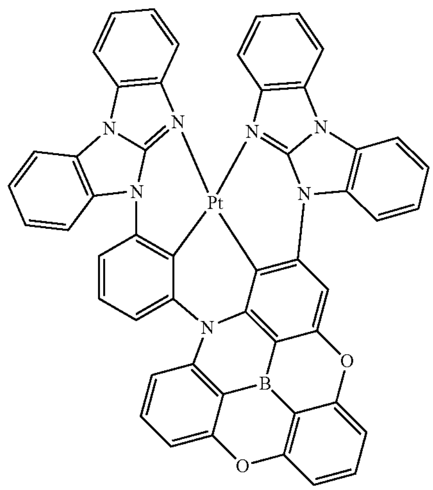
81
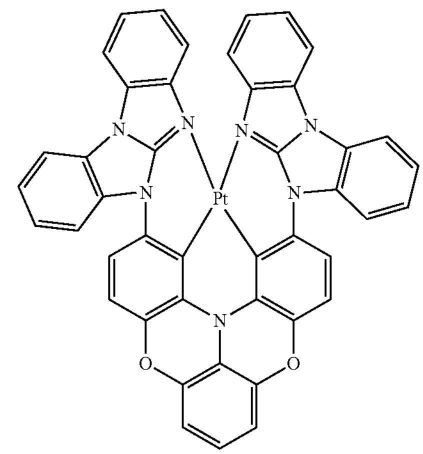

-continued
82
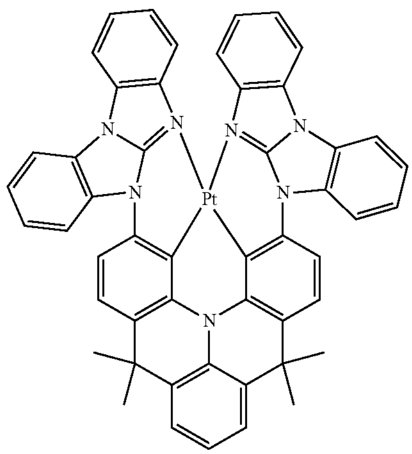
83
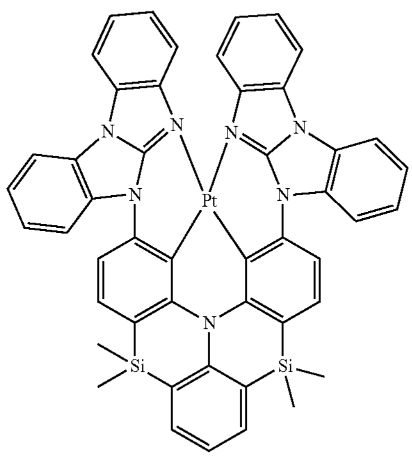
84
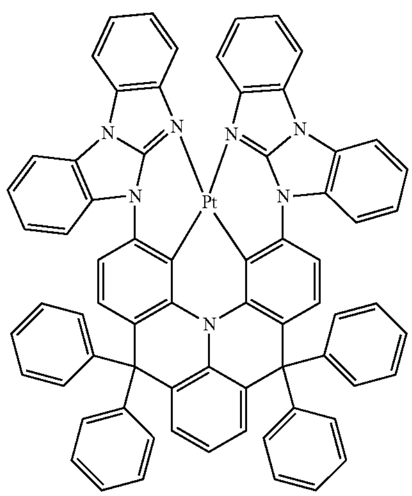
-continued
85
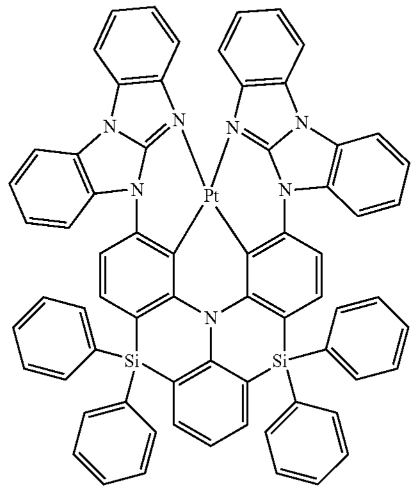
86
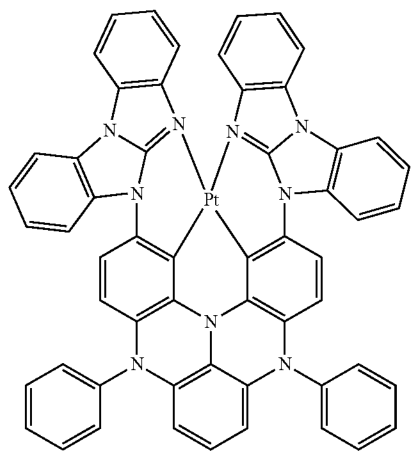
87
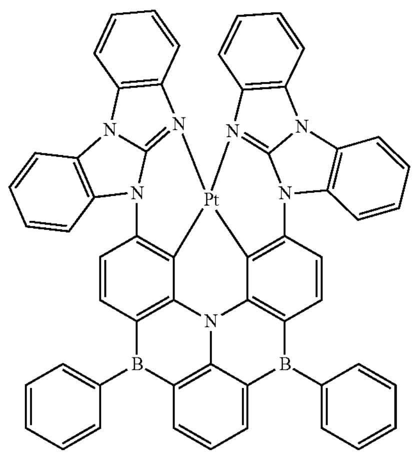

-continued

88

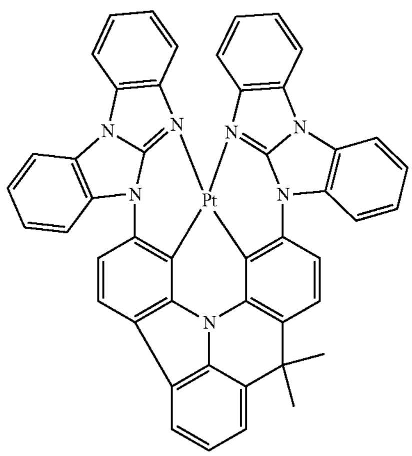

89

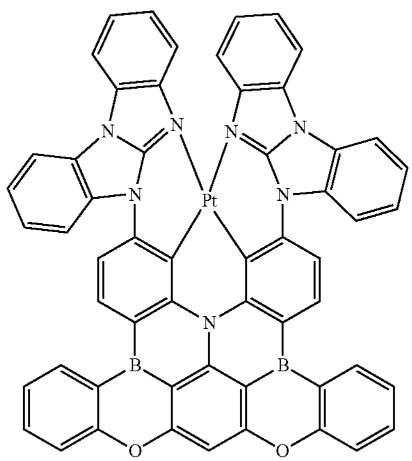

90

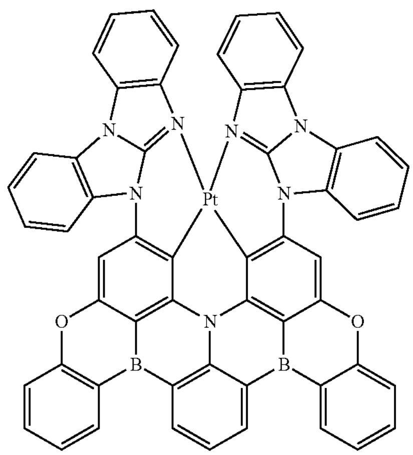

The organometallic compound represented by Formula 1 may include a group represented by Formula 1A or Formula 1B.

Formula 1A

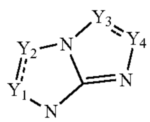

-continued

Formula 1B

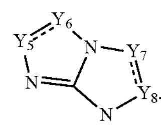

As a result, the rigidity of the organometallic compound represented by Formula 1 is improved, and thus, relatively excellent or suitable $^3$MLCT characteristics may be obtained.

In addition, Formula 1 may include a condensed cyclic linker linked through $L_2$ and $T_1$, and by including the condensed cyclic linker, the rigidity of the ligand is improved, and thus, relatively excellent or suitable $^3$MLCT characteristics may be obtained.

Therefore, by utilizing the organometallic compound represented by Formula 1, a light-emitting device (for example, an organic light-emitting device) having high efficiency and long lifespan may be implemented (e.g., achieved).

In addition, because the organometallic compound represented by Formula 1 includes the group represented by Formula 1A or Formula 1B, even when a moiety represented by

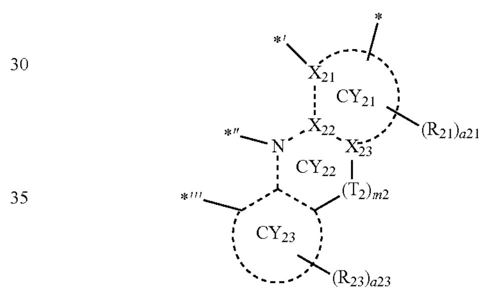

in Formula 1 (for example, a group represented by CY2(1) in the present specification) is included, blue emission may be obtained.

Methods of synthesizing the organometallic compound represented by Formula 1 may be easily understood to those of ordinary skill in the art by referring to Synthesis Examples and/or Examples described herein.

In some embodiments, the first electrode of the light-emitting device may be an anode, the second electrode of the light-emitting device may be a cathode, the interlayer may further include a hole transport region between the first electrode and the emission layer and an electron transport region between the emission layer and the second electrode, the hole transport region may include a hole injection layer, a hole transport layer, an emission auxiliary layer, an electron-blocking layer, or any combination thereof, and the electron transport region may include a buffer layer, a hole-blocking layer, an electron transport layer, an electron injection layer, an electron control layer, or any combination thereof.

In one or more embodiments, the interlayer of the light-emitting device may include the organometallic compound represented by Formula 1.

In one or more embodiments, the emission layer of the light-emitting device may include the organometallic compound represented by Formula 1.

In one or more embodiments, the emission layer may be to emit blue light. For example, the emission layer may be to emit blue light having a maximum emission wavelength in the range of about 410 nm to about 500 nm, about 410 nm to about 480 nm, about 420 nm to about 480 nm, or 430 nm to about 470 nm.

In one or more embodiments, the emission layer of the light-emitting device may include a dopant and a host, and the organometallic compound represented by Formula 1 may be included in the dopant. For example, the organometallic compound represented by Formula 1 may act (e.g., serve) as a dopant. The emission layer may be to emit, for example, blue light. The blue light may have a maximum emission wavelength in a range of, for example, about 430 nm to about 480 nm.

In one or more embodiments, the electron transport region of the light-emitting device may include a hole-blocking layer, and the hole-blocking layer may include a phosphine oxide-containing compound, a silicon-containing compound, or any combination thereof. In an embodiment, the hole-blocking layer may directly contact the emission layer.

In an embodiment, the interlayer in the light-emitting device may include: i) a first compound as the organometallic compound represented by Formula 1; and ii) a second compound including at least one π electron-deficient nitrogen-containing $C_1$-$C_{60}$ cyclic group, a third compound comprising a π electron-rich $C_3$-$C_{60}$ cyclic group or a pyridine group, a fourth compound capable of emitting delayed fluorescence, or any combination thereof, wherein the first compound, the second compound, the third compound, and the fourth compound may be different from one another.

In an embodiment, the interlayer in the light-emitting device may include: i) a first compound as the organometallic compound represented by Formula 1; and ii) a second compound including at least one π electron-deficient nitrogen-containing $C_1$-$C_{60}$ cyclic group, a third compound including a group represented by Formula 3, a fourth compound capable of emitting delayed fluorescence, wherein the first compound, the second compound, the third compound, and the fourth compound may be different from one another:

Formula 3

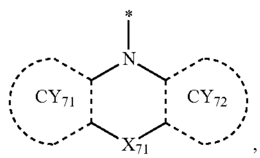

wherein, in Formula 3, ring $CY_{71}$ and ring $CY_{72}$ may each independently be a π electron-rich $C_3$-$C_{60}$ cyclic group or a pyridine group, $X_{71}$ in Formula 3 may be a single bond or a linking group including O, S, N, B, C, Si, or any combination thereof,

* in Formula 3 indicates a binding site to an adjacent atom in the third compound, and the following compounds may be excluded from the third compound:

CBP mCBP

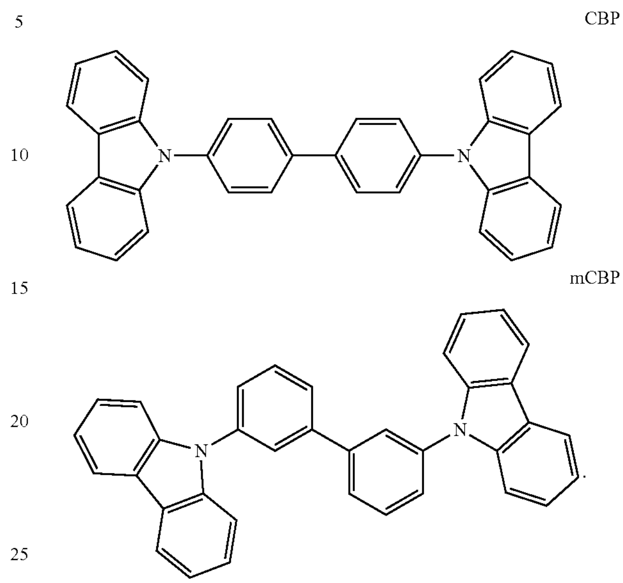

Descriptions of the second compound, the third compound, and the fourth compound may be the same as respectively described in the present specification.

In some embodiments, the light-emitting device may further include at least one of the second compound or the third compound, in addition to the first compound.

In some embodiments, the light-emitting device may further include the fourth compound, in addition to the first compound.

In some embodiments, the light-emitting device may include the first compound, the second compound, the third compound, and the fourth compound.

In some embodiments, the interlayer may include the second compound. The interlayer may further include, in addition to the first compound and the second compound, the third compound, the fourth compound, or any combination thereof.

The second compound may include a pyridine group, a pyrimidine group, a pyrazine group, a pyridazine group, a triazine group, or any combination thereof.

In some embodiments, a difference between the triplet energy level (electron Volts, eV) of the fourth compound and the singlet energy level (eV) of the fourth compound may be about 0 eV or higher and 0.5 eV or lower (or, about 0 eV or higher and about 0.3 eV or lower).

In some embodiments, the fourth compound may be a compound including at least one cyclic group including boron (B) and nitrogen (N) as ring-forming atoms.

In some embodiments, the fourth compound may be a $C_8$-$C_{60}$ polycyclic group-containing compound including at least two condensed cyclic groups that share a boron atom (B).

In some embodiments, the fourth compound may include a condensed ring in which at least one third ring may be condensed with at least one fourth ring, the third ring may be a cyclopentane group, a cyclohexane group, a cycloheptane group, a cyclooctane group, a cyclopentene group, a cyclohexene group, a cycloheptene group, a cyclooctene group, an adamantane group, a norbornene group, a norbornane group, a bicyclo[1.1.1]pentane group, a bicyclo[2.1.1]hexane group, a bicyclo[2.2.2]octane group, a benzene group, a pyridine group, a pyrimidine group, a pyridazine group, a pyrazine group, or a triazine group, and the fourth ring may be a 1,2-azaborinine group, a 1,3-azaborinine group, a 1,4-azaborinine group, a 1,2-dihydro-1,2-azaborinine group, a 1,4-oxaborinine group, a 1,4-thiaborinine group, or a 1,4-dihydroborinine group.

In one or more embodiments, the interlayer may include the fourth compound. The interlayer may include, in addition to the first compound and the fourth compound, the second compound, the third compound, or any combination thereof.

In one or more embodiments, the interlayer may include the third compound. For example, the third compound may not include (e.g., may exclude) compound CBP described herein and compound mCBP.

The emission layer in the interlayer may include i) the first compound; and ii) the second compound, the third compound, the fourth compound, or any combination thereof.

The emission layer may be to emit phosphorescence or fluorescence emitted from the first compound. In some embodiments, phosphorescence or fluorescence emitted from the first compound may be blue light.

In some embodiments, the emission layer in the light-emitting device may include the first compound and the second compound, and the first compound and the second compound may form an exciplex.

In one or more embodiments, the emission layer in the light-emitting device may include the first compound, the second compound, and the third compound, and the second compound and the third compound may form an exciplex.

In some embodiments, the emission layer in the light-emitting device may include the first compound and the fourth compound, and the fourth compound may serve to improve color purity, luminescence efficiency, and/or lifespan characteristics of the light-emitting device.

When a compound (for example, the fourth compound) including at least one cyclic group containing both B (boron) and N (nitrogen) as a ring-forming atom, and the organometallic compound represented by Formula 1 are included in the dopant, the organometallic compound represented by Formula 1 may act (e.g., serve) as a sensitizer. When the organometallic compound represented by Formula 1 acts as a sensitizer, the energy of excitons generated in the emission layer is transferred to the organometallic compound represented by Formula 1, and the energy is transferred from the organometallic compound represented by Formula 1 to the other dopant (for example, the fourth compound), and the other dopant may act (e.g., serve) as an emitter.

In some embodiments, the second compound may include a compound represented by Formula 2:

Formula 2

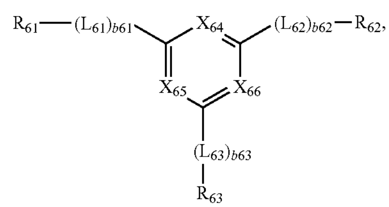

wherein, in Formula 2, $L_{61}$ to $L_{63}$ may each independently be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, b61 to b63 may each independently be an integer selected from 1 to 5, $X_{64}$ may be N or $C(R_{64})$, $X_{65}$ may be N or $C(R_{65})$, $X_{66}$ may be N or $C(R_{66})$, at least one of $X_{64}$ to $X_{66}$ may be N, $R_{61}$ to $R_{66}$ may respectively be understood by referring to the descriptions of $R_{61}$ to $R_{66}$ provided herein, and $R_{10a}$ may be understood by referring to the description of $R_{10a}$ provided herein.

In one or more embodiments, the third compound may include a compound represented by Formula 3-1, a compound represented by Formula 3-2, a compound represented by Formula 3-3, a compound represented by Formula 3-4, a compound represented by Formula 3-5, or any combination thereof:

Formula 3-1

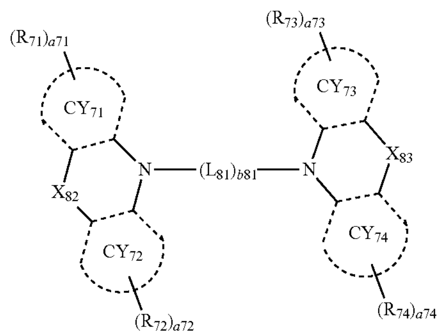

-continued

Formula 3-2

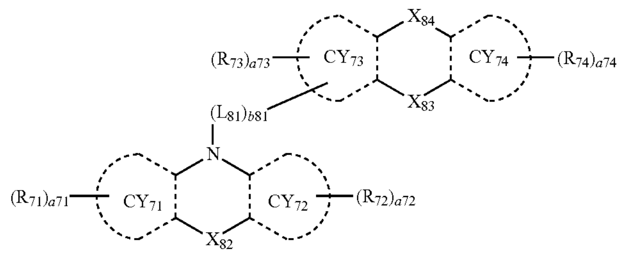

Formula 3-3

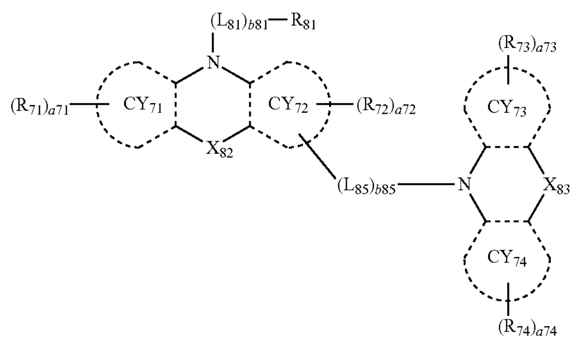

Formula 3-4

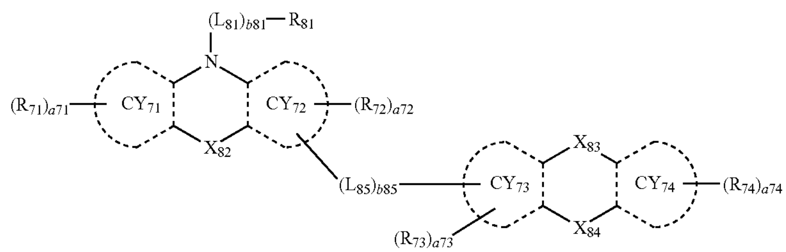

Formula 3-5

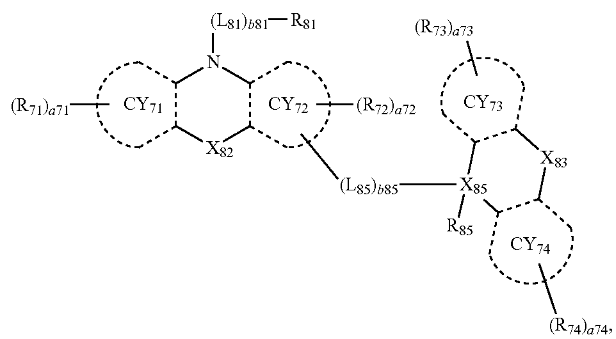

wherein, in Formulae 3-1 to 3-5, ring $CY_{71}$ to ring $CY_{74}$ may each independently be a π electron-rich $C_3$-$C_{60}$ cyclic group or a pyridine group, $X_{82}$ may be a single bond, B, O, S, $N[(L_{82})_{b82}$-$R_{82}]$, $C(R_{82a})(R_{82b})$, or $Si(R_{82a})(R_{82b})$, $X_{83}$ may be a single bond, B, O, S, $N[(L_{83})_{b83}$-$R_{83}]$, $C(R_{83a})(R_{83b})$, or $Si(R_{83a})(R_{83b})$, $X_{84}$ may be B, O, S, $N[(L_{84})_{b84}$-$R_{84}]$, $C(R_{84a})(R_{84b})$, or $Si(R_{84a})(R_{84b})$, $X_{85}$ may be C or Si, $L_{81}$ to $L_{85}$ may each independently be a single bond, *—$C(Q_4)(Q_5)$-*', *—$Si(Q_4)(Q_5)$-*', a π electron-rich $C_3$-$C_{60}$ cyclic group unsubstituted or substituted with at least one $R_{10a}$, or a pyridine group unsubstituted or substituted with at least one $R_{10a}$, wherein $Q_4$ and $Q_5$ may each be understood by referring to the description of $Q_1$ provided herein, b81 to b85 may each independently be an integer selected from 1 to 5, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ may respectively be understood by referring to the descriptions of $R_{71}$ to $R_{74}$, $R_{81}$ to $R_{85}$, $R_{82a}$, $R_{82b}$, $R_{83a}$, $R_{83b}$, $R_{84a}$, and $R_{84b}$ provided herein, a71 to a74 may each independently be an integer selected from 0 to 20, and $R_{10a}$ may be understood by referring to the description of $R_{10a}$ provided herein.

In some embodiments, the fourth compound may be a compound represented by Formula 502, a compound represented by Formula 503, or any combination thereof:

Formula 502

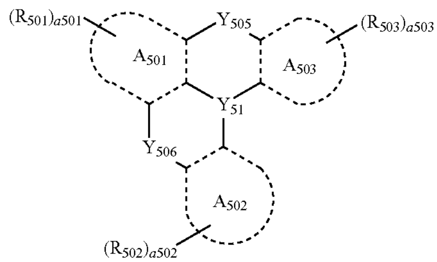

Formula 503

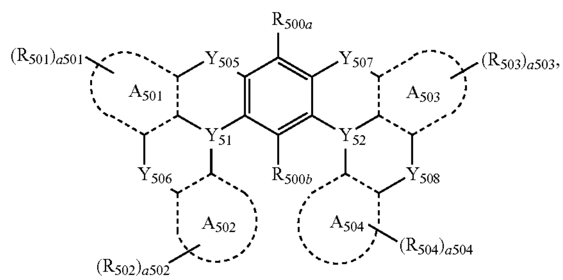

wherein, in Formulae 502 and 503, ring $A_{501}$ to ring $A_{504}$ may each independently be a $C_3$-$C_{60}$ carbocyclic group or a $C_1$-$C_{60}$ heterocyclic group, $Y_{505}$ may be O, S, $N(R_{505})$, $B(R_{505})$, $C(R_{505a})(R_{505b})$, or $Si(R_{505a})(R_{505b})$, $Y_{506}$ may be O, S, $N(R_{506})$, $B(R_{506})$, $C(R_{506a})(R_{506b})$, or $Si(R_{506a})(R_{506b})$, $Y_{507}$ may be O, S, $N(R_{507})$, $B(R_{507})$, $C(R_{507a})(R_{507b})$, or $Si(R_{507a})(R_{507b})$, $Y_{508}$ may be O, S, $N(R_{508})$, $B(R_{508})$, $C(R_{508a})(R_{508b})$, or $Si(R_{508a})(R_{508b})$, $Y_{51}$ and $Y_{52}$ may each independently be B, P(=O), or S(=O), $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ may respectively be understood by referring to the descriptions of $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ provided herein, a501 to a504 may each independently be an integer selected from 0 to 20, and $R_{10a}$ may be understood by referring to the description of $R_{10a}$ provided herein.

Description of Formulae 2, 3-1 to 3-5, 502 and 503

In Formula 2, b61 to b63 may respectively indicate the number of $L_{61}$(s) to $L_{63}$(s), and b61 to b63 may each be an integer selected from 1 to 5. When b61 is 2 or greater, at least two $L_{61}$(s) may be identical to or different from each other, when b62 is 2 or greater, at least two $L_{62}$(s) may be identical to or different from each other, and when b63 is 2 or greater, at least two $L_{63}$(s) may be identical to or different from each other. In some embodiments, b61 to b63 may each independently be 1 or 2.

$L_{61}$ to $L_{63}$ in Formula 2 may each independently be:

a single bond; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a dibenzooxacilline group, a dibenzothiacilline group, a dibenzodihydroazacilline group, a dibenzodihydrodicilline group, a dibenzodihydrocilline group, a dibenzodioxane group, a dibenzooxathiene group, a dibenzooxazine group, a dibenzopyran group, a dibenzodithiine group, a dibenzothiazine group, a dibenzothiopyran group, a dibenzocyclohexadiene group, a dibenzodihydropyridine group, or a dibenzodihydropyrazine group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothienyl group, a dibenzosilolyl group, a dimethyldibenzosilolyl group, a diphenyldibenzosilolyl group, $—O(Q_{31})$, $—S(Q_{31})$, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof, wherein $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In some embodiments, in Formula 2, a bond between $L_{61}$ and $R_{61}$, a bond between $L_{62}$ and $R_{62}$, a bond between $L_{63}$ and $R_{63}$, a bond between at least two $L_{61}$(s), a bond between at least two $L_{62}$(s), a bond between at least two $L_{63}$(s), a bond between $L_{61}$ and a carbon atom between $X_{64}$ and $X_{65}$ in Formula 2, a bond between $L_{62}$ and a carbon atom between $X_{64}$ and $X_{66}$ in Formula 2, and a bond between $L_{63}$ and a carbon atom between $X_{65}$ and $X_{66}$ in Formula 2 may each be a "carbon-carbon single bond".

In Formula 2, $X_{64}$ may be N or $C(R_{64})$, $X_{65}$ may be N or $C(R_{65})$, $X_{66}$ may be N or $C(R_{66})$, and at least one of $X_{64}$ to $X_{66}$ may be N. $R_{64}$ to $R_{66}$ may respectively be understood by referring to the descriptions of $R_{64}$ to $R_{66}$ provided herein. In some embodiments, two or three of $X_{64}$ to $X_{66}$ may each be N.

In Formulae 2, 3-1 to 3-5, 502 and 503, $R_{61}$ to $R_{66}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$. $Q_1$ to $Q_3$ may each independently be the same as described in the present specification.

For example, $R_{61}$ to $R_{66}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, $R_{508b}$, and $R_{10a}$ in Formulae 2, 3-1 to 3-5, 502, and 503 may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothienyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothienyl group, a benzocarbazolyl group, a dibenzocarbazolyl group, an imidazopyridinyl group, an imidazopyrimidinyl group, an azacarbazolyl group, an azadibenzofuranyl group, an azadibenzothienyl group, an azafluorenyl group, an azadibenzosilolyl group, or a group represented by Formula 91, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothienyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothienyl group, a benzocarbazolyl group, a dibenzocarbazolyl group, an imidazopyridinyl group, an imidazopyrimidinyl group, —$O(Q_{31})$, —$S(Q_{31})$, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2(Q_{31})$, —$P(=O)(Q_{31})(Q_{32})$, or any combination thereof; or —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, $Q_1$ to $Q_3$ and $Q_{31}$ to $Q_{33}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof:

Formula 91

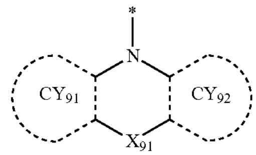

wherein, in Formula 91, ring $CY_{91}$ and ring $CY_{92}$ may each independently be a $C_3$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $X_{91}$ may be a single bond, O, S, $N(R_{91})$, $B(R_{91})$, $C(R_{91a})(R_{91b})$, or $Si(R_{91a})(R_{91b})$, $R_{91}$, $R_{91a}$, and $R_{91b}$ may respectively be understood by referring to the descriptions of $R_{82}$, $R_{82a}$, and $R_{82b}$ provided herein, $R_{10a}$ may be understood by referring to the description of $R_{10a}$ provided herein, and indicates a binding site to an adjacent atom.

For example, in Formula 91, ring $CY_{91}$ and ring $CY_{92}$ may each independently be a benzene group, a pyridine group, a pyrimidine group, a pyrazine group, a pyridazine group, or a triazine group, each unsubstituted or substituted with at least one $R_{10a}$, $R_{91}$, $R_{91a}$, and $R_{91b}$ may each independently be:

hydrogen or a $C_1$-$C_{10}$ alkyl group; or a phenyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof.

In an embodiment, $R_{61}$ to $R_{66}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, $R_{508b}$, and $R_{10a}$ in Formulae 2, 3-1 to 3-5, 502, and 503 may each independently be:

hydrogen, deuterium, —F, a cyano group, a nitro group, $—CH_3$, $—CD_3$, $—CD_2H$, $—CDH_2$, $—CF_3$, $—CF_2H$, $—CFH_2$, a group represented by one of Formulae 9-1 to 9-19, a group represented by one of Formulae 10-1 to 10-246, $—C(Q_1)(Q_2)(Q_3)$, $—Si(Q_1)(Q_2)(Q_3)$, or $—P(=O)(Q_1)(Q_2)$, wherein $Q_1$ to $Q_3$ may respectively be understood by referring to the descriptions of $Q_1$ to $Q_3$ provided herein:

9-1

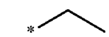

9-2

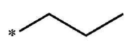

9-3

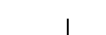

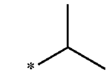

9-4

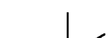

9-5

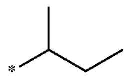

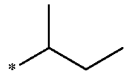

9-6

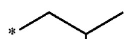

9-7

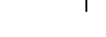

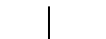

9-8

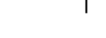

9-9

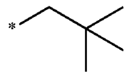

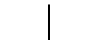

9-10

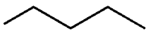

-continued 9-11

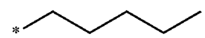

9-12

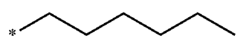

9-13

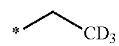

9-14

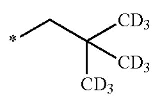

9-15

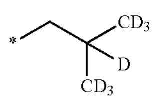

9-16

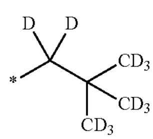

9-17

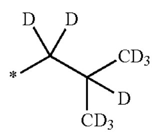

9-18

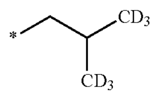

9-19

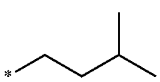

10-1

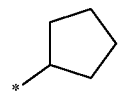

10-2

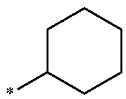

10-3

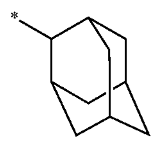

10-4

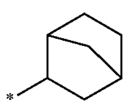

10-5

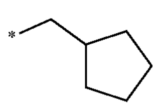

10-6

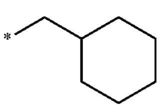

-continued
10-7
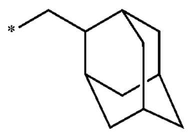
10-8
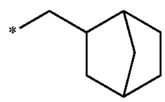
10-9
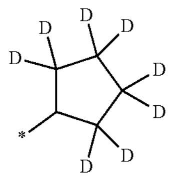
10-10
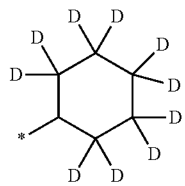
10-11
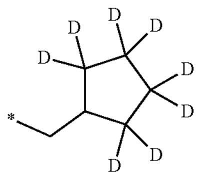
10-12
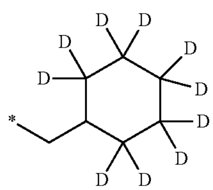
10-13
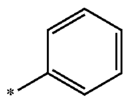
10-14
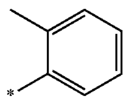
10-15
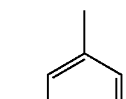
10-16
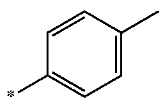
10-17
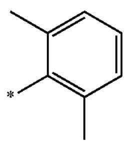
-continued
10-18
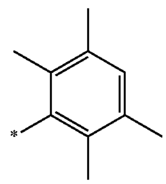
10-19
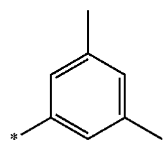
10-20
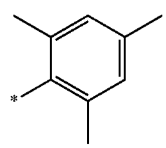
10-21
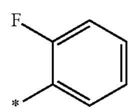
10-22
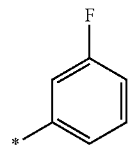
10-23
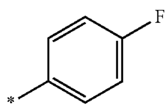
10-24
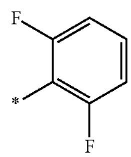
10-25
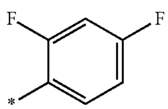
10-26
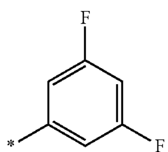
10-27
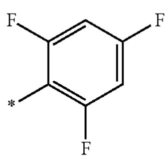
10-28
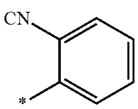

-continued
10-29
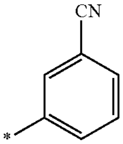
10-30
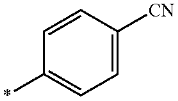
10-31
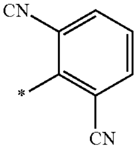
10-32
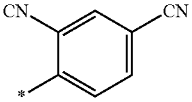
10-33
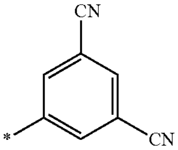
10-34
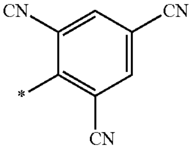
10-35
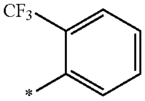
10-36
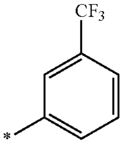
10-37
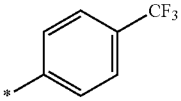
10-38
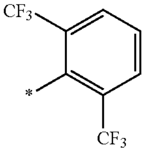
10-39
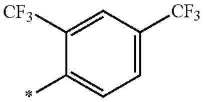
-continued
10-40
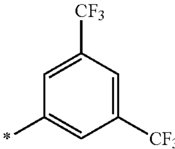
10-41
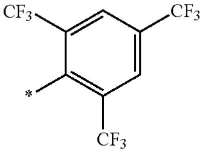
10-42
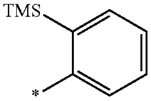
10-43
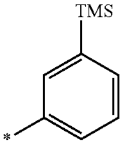
10-44
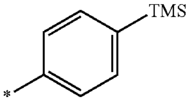
10-45
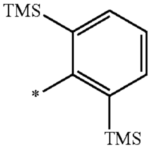
10-46
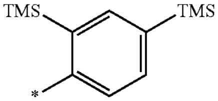
10-47
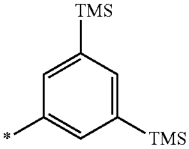
10-48
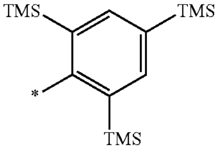
10-49
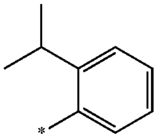

10-50
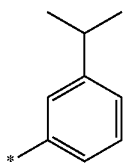
10-51
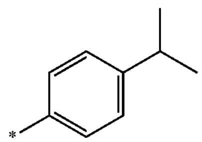
10-52
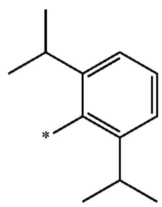
10-53
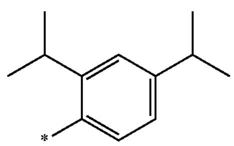
10-54
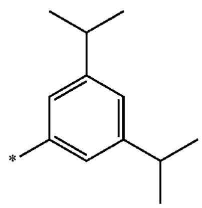
10-55
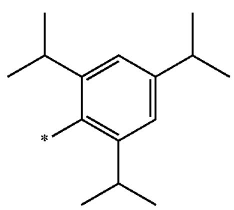
10-56
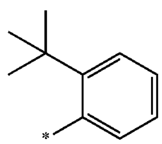
10-57
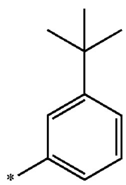
10-58
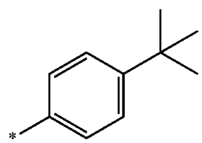
10-59
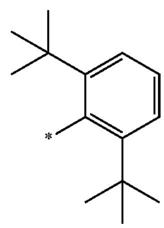
10-60
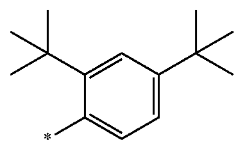
10-61
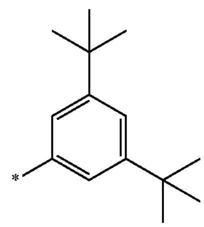
10-62
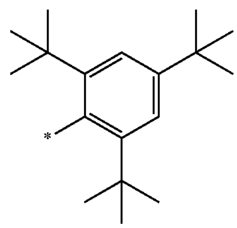
10-63
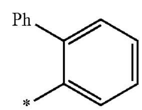
10-64
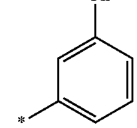
10-65
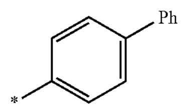
10-66
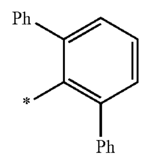
10-67
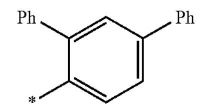

-continued
10-68
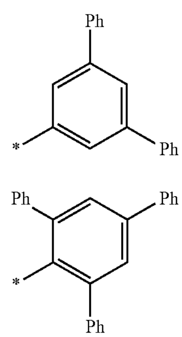
10-69
10-70
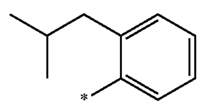
10-71
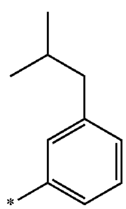
10-72
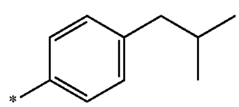
10-73
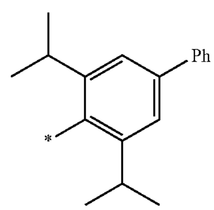
10-74
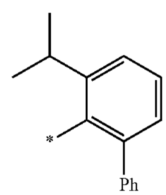
10-75
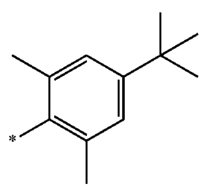
-continued
10-76
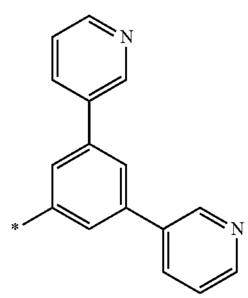
10-77
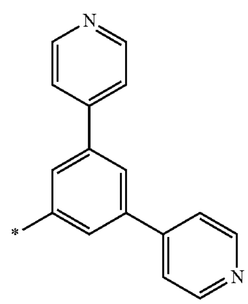
10-78
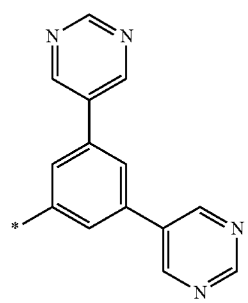
10-79
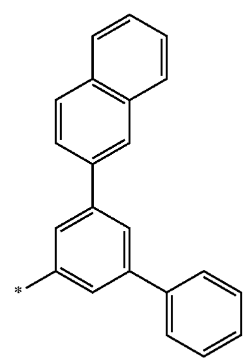
10-80
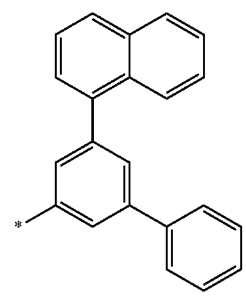

-continued
10-81
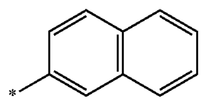
10-82
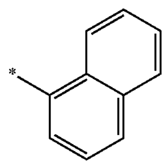
10-83
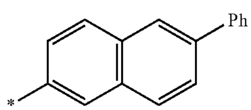
10-84
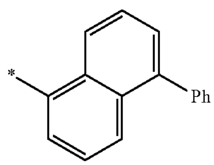
10-85
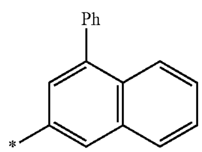
10-86
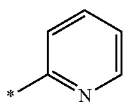
10-87
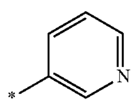
10-88
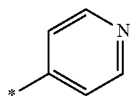
10-89
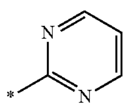
10-90
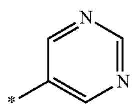
10-91
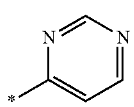
10-92
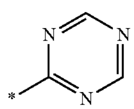
-continued
10-93
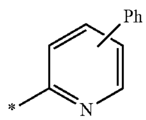
10-94
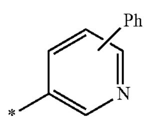
10-95
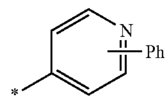
10-96
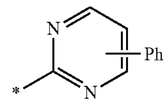
10-97
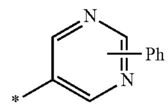
10-98
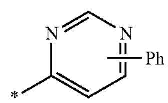
10-99
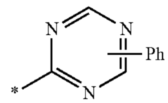
10-100
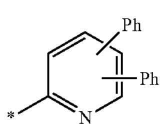
10-101
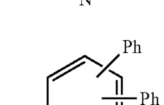
10-102
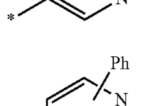
10-103
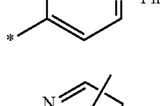
10-104
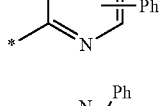
10-105
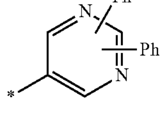
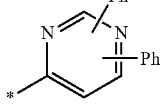

-continued
10-106
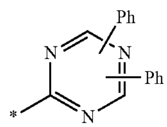
10-107
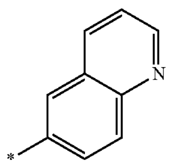
10-108
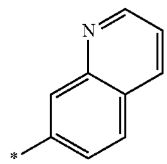
10-109
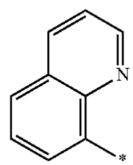
10-110
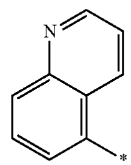
10-111
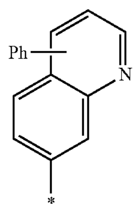
10-112
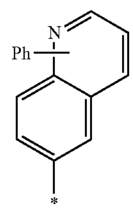
10-113
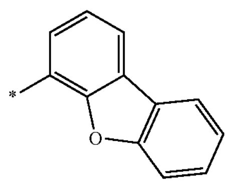
10-114
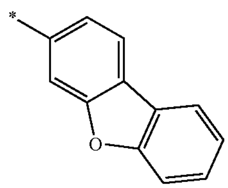
-continued
10-115
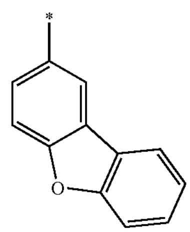
10-116
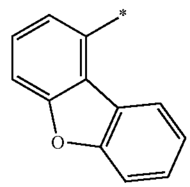
10-117
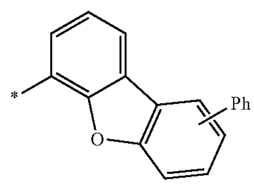
10-118
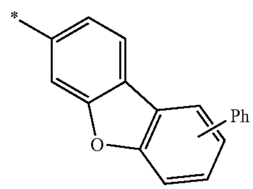
10-119
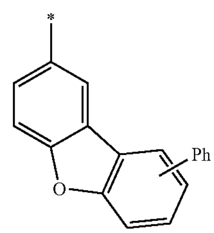
10-120
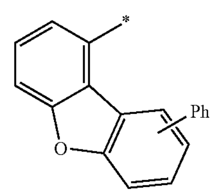
10-121
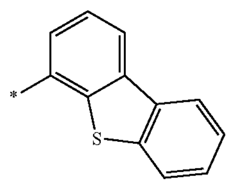
10-122
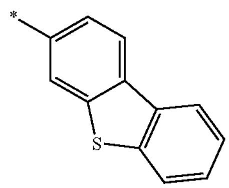

-continued
10-123
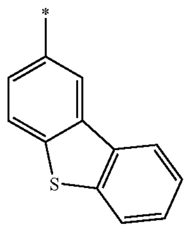
10-124
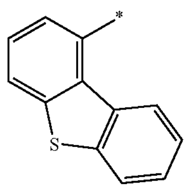
10-125
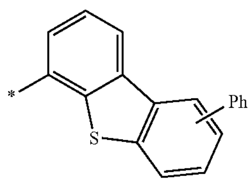
10-126
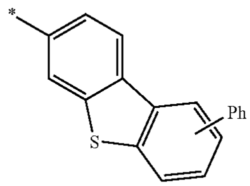
10-127
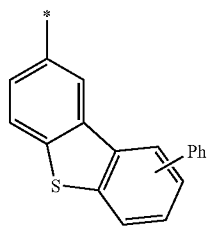
10-128
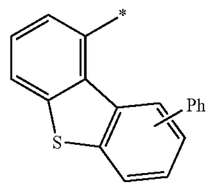
10-129
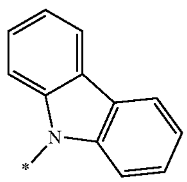
10-130
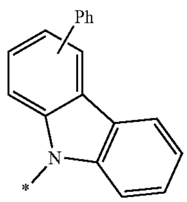
-continued
10-131
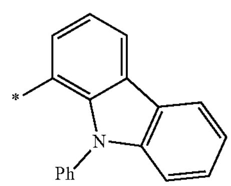
10-132
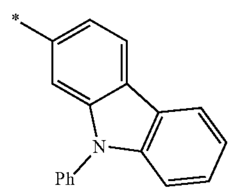
10-133
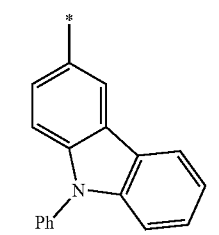
10-134
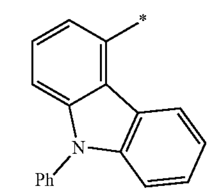
10-135
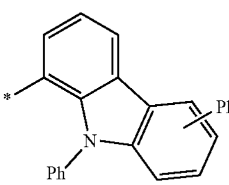
10-136
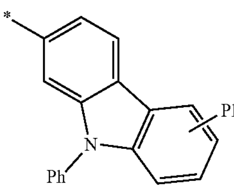
10-137
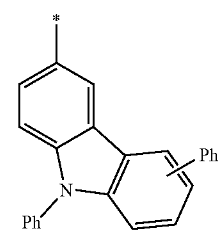
10-138
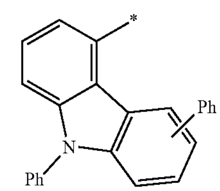

-continued
10-139
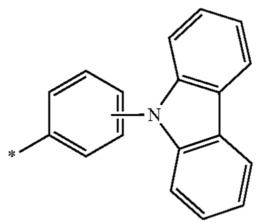
10-140
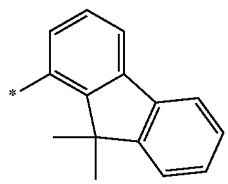
10-141
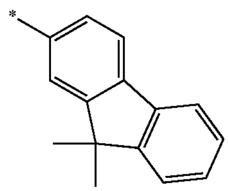
10-142
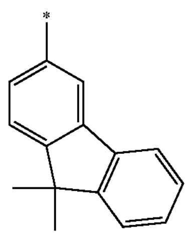
10-143
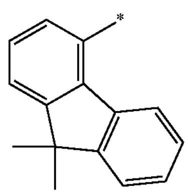
10-144
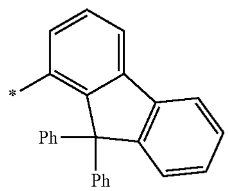
10-145
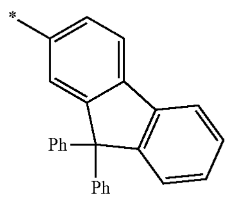
-continued
10-146
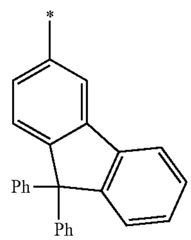
10-147
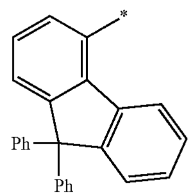
10-148
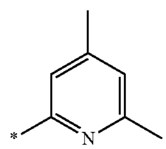
10-149
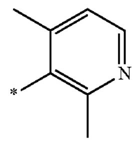
10-150
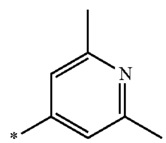
10-151
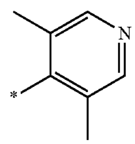
10-152
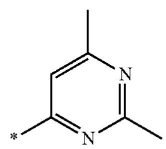
10-153
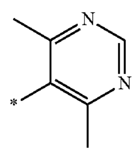
10-154
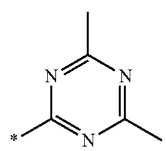
10-155
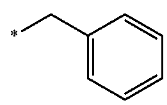

-continued
10-156
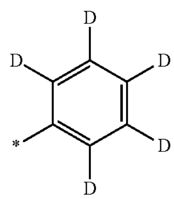
10-157
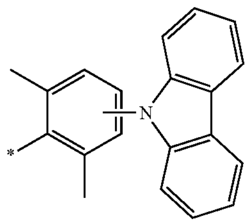
10-158
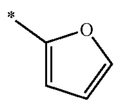
10-159
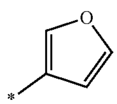
10-160
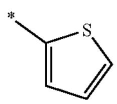
10-161
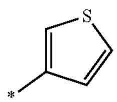
10-162
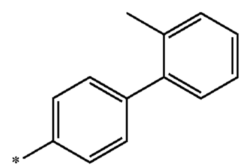
10-163
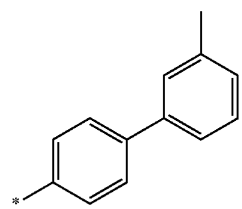
10-164
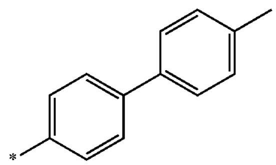
10-165
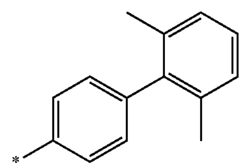
-continued
10-166
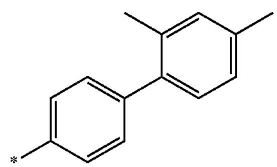
10-167
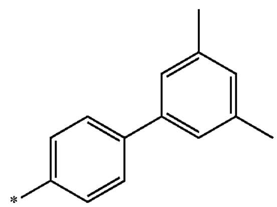
10-168
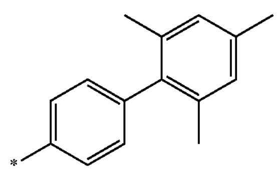
10-169
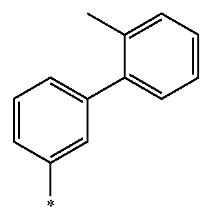
10-170
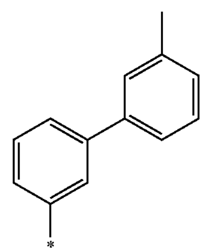
10-171
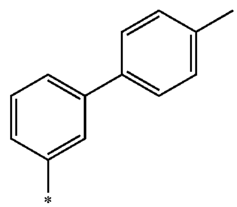
10-172
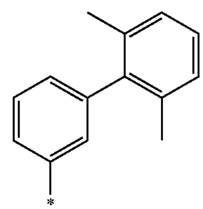

-continued
10-173
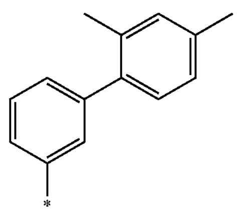
10-174
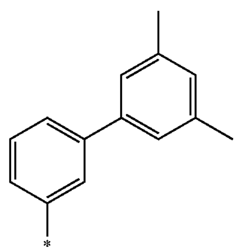
10-175
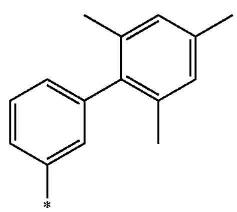
10-176
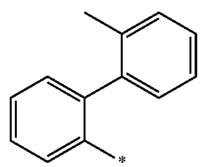
10-177
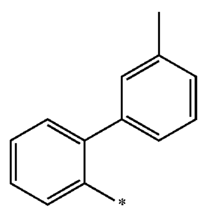
10-178
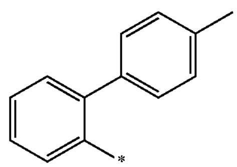
10-179
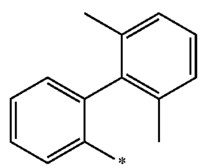
10-180
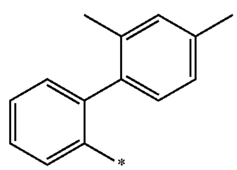
-continued
10-181
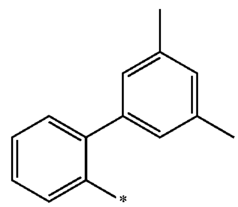
10-182
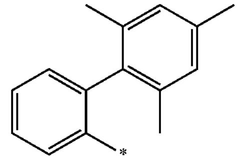
10-183
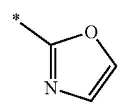
10-184
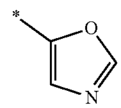
10-185
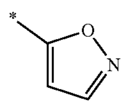
10-186
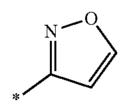
10-187
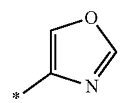
10-188
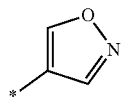
10-189
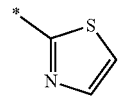
10-190
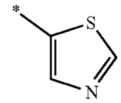
10-191
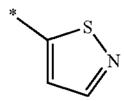
10-192
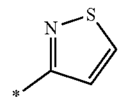
10-193
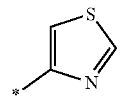

10-194
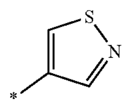
10-195
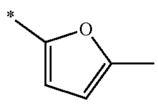
10-196
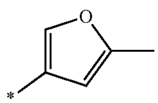
10-197
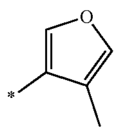
10-198
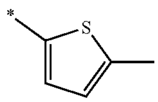
10-199
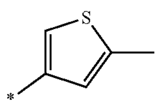
10-200
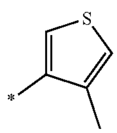
10-201
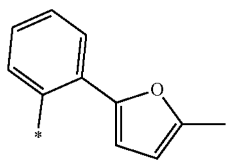
10-202
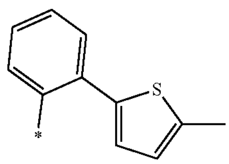
10-203
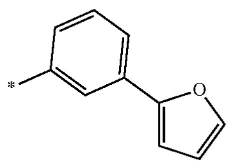
10-204
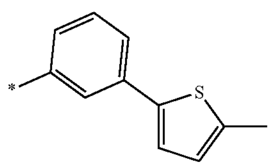
10-205
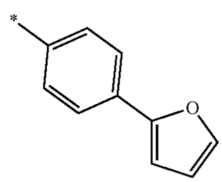
10-206
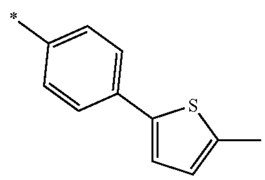
10-207
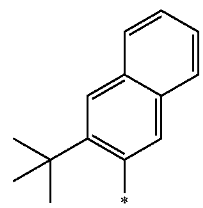
10-208
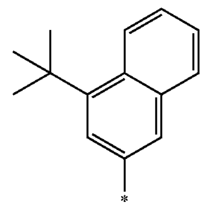
10-209
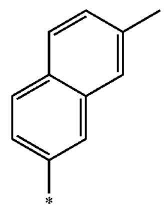
10-210
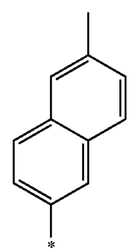
10-211
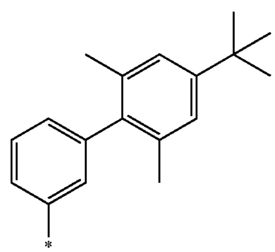

-continued
10-212
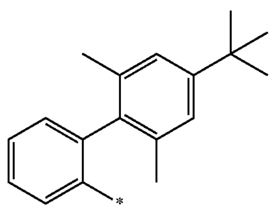
10-213
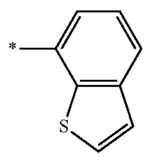
10-214
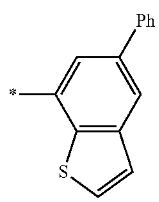
10-215
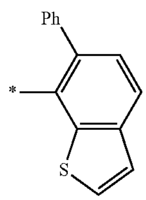
10-216
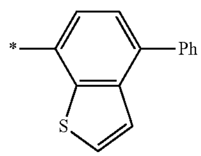
10-217
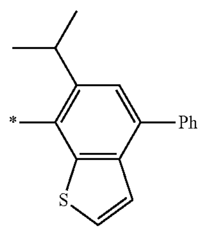
10-218
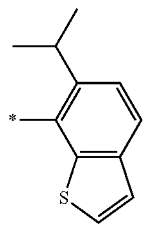
10-219
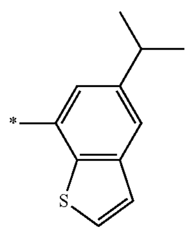
-continued
10-220
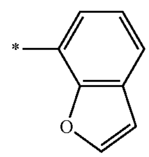
10-221
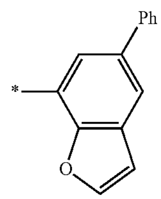
10-222
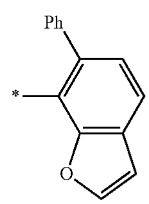
10-223
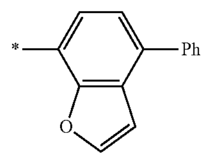
10-224
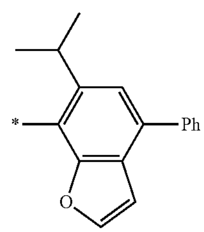
10-225
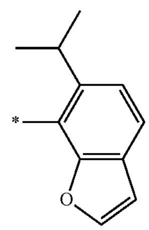
10-226
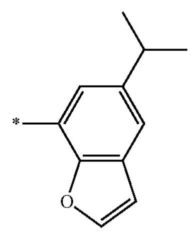

-continued
10-227
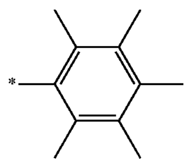
10-228
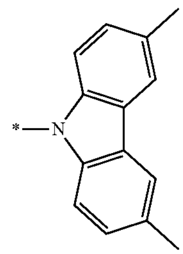
10-229
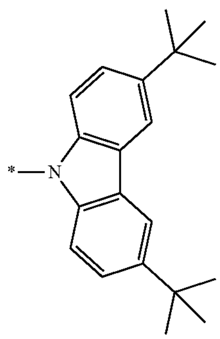
10-230
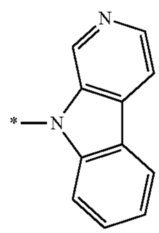
10-231
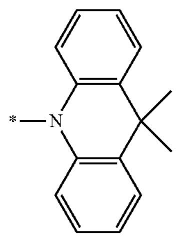
10-232
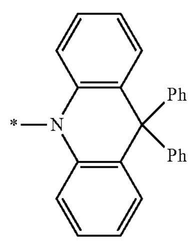
10-233
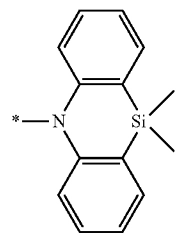
10-234
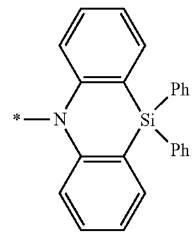
10-235
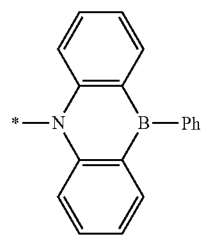
10-236
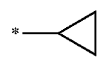
10-237
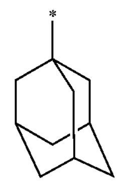
10-238
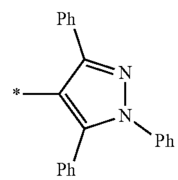
10-239
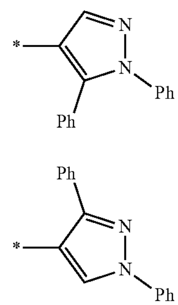
10-240
10-241
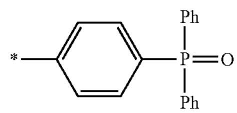

-continued 10-242

10-243

10-244

10-245

10-246

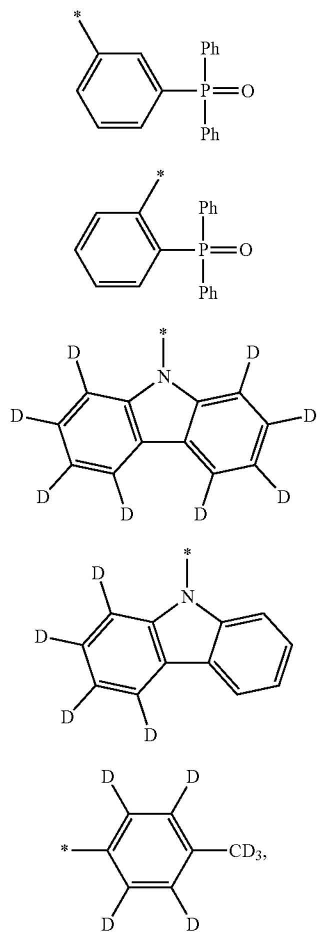

wherein, in Formulae 9-1 to 9-19 and 10-1 to 10-246, * indicates a binding site to an adjacent atom, "Ph" represents a phenyl group, and "TMS" represents a trimethylsilyl group.

In Formulae 3-1 to 3-5, 502, and 503, a71 to a74 and a501 to a504 may respectively indicate the number of $R_{71}$(s) to $R_{74}$(s) and $R_{501}$(s) to $R_{504}$(s), and a71 to a74 and a501 to a504 may each independently be an integer selected from 0 to 20. When a71 is 2 or greater, at least two $R_{71}$(s) may be identical to or different from each other, when a72 is 2 or greater, at least two $R_{72}$(S) may be identical to or different from each other, when a73 is 2 or greater, at least two $R_{73}$(s) may be identical to or different from each other, when a74 is 2 or greater, at least two $R_{74}$(s) may be identical to or different from each other, when a501 is 2 or greater, at least two $R_{501}$(s) may be identical to or different from each other, when a502 is 2 or greater, at least two $R_{502}$(s) may be identical to or different from each other, when a503 is 2 or greater, at least two $R_{503}$(s) may be identical to or different from each other, and when a504 is 2 or greater, at least two $R_{504}$(s) may be identical to or different from each other. a71 to a74 and a501 to a504 may each independently be an integer selected from 0 to 8.

In some embodiments, in Formula 2, the group represented by *-$(L_{61})_{b61}$-$R_{61}$ and the group represented by *-$(L_{62})_{b62}$-$R_{62}$ may not be a phenyl group.

In some embodiments, in Formula 2, the group represented by *-$(L_{61})_{b61}$-$R_{61}$ may be identical to the group represented by *-$(L_{62})_{b62}$-$R_{62}$.

In one or more embodiments, in Formula 2, the group represented by *-$(L_{61})_{b61}$-$R_{61}$ and the group represented by *-$(L_{62})_{b62}$-$R_{62}$ may be different from each other.

In one or more embodiments, in Formula 2, b61 and b62 may each be 1, 2, or 3, $L_{61}$ and $L_{62}$ may each independently be a benzene group, a pyridine group, a pyrimidine group, a pyridazine group, a pyrazine group, or a triazine group unsubstituted or substituted with at least one $R_{10a}$.

In some embodiments, in Formula 2, $R_{61}$ and $R_{62}$ may each independently be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), or —Si($Q_1$)($Q_2$)($Q_3$), wherein $Q_1$ to $Q_3$ may each independently be a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In some embodiments, in Formula 2, the group represented by *-$(L_{61})_{b61}$-$R_{61}$ may be a group represented by one of Formulae $CY_{51}$-1 to $CY_{51}$-26, and/or in Formula 2, the group represented by *-$(L_{62})_{b62}$-$R_{62}$ may be a group represented by one of Formulae $CY_{52}$-1 to $CY_{52}$-26, and/or in Formula 2, the group represented by *-$(L_{63})_{b63}$-$R_{63}$ may be a group represented by one of Formulae $CY_{53}$-1 to $CY_{53}$-27, —C($Q_1$)($Q_2$)($Q_3$), or —Si($Q_1$)($Q_2$)($Q_3$):

CY51-1

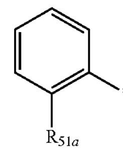

CY51-2

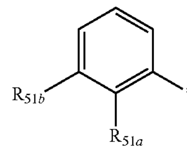

CY51-3

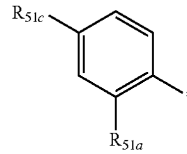

CY51-4

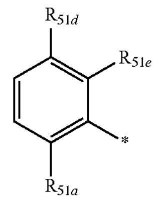

-continued
CY51-5
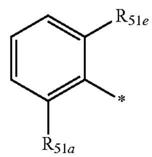
CY51-6
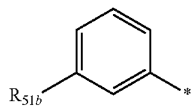
CY51-7
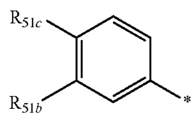
CY51-8
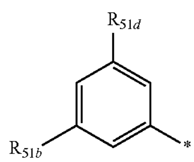
CY51-9
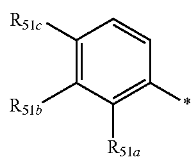
CY51-10
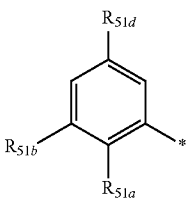
CY51-11
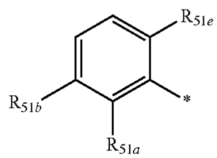
CY51-12
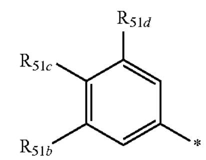
CY51-13
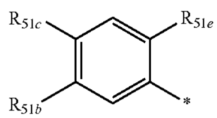
CY51-14
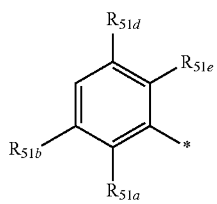
-continued
CY51-15
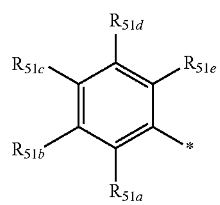
CY51-16
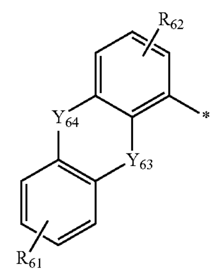
CY51-17
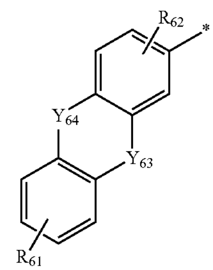
CY51-18
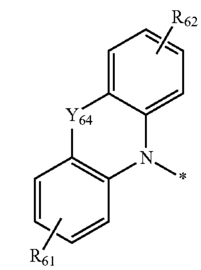
CY51-19
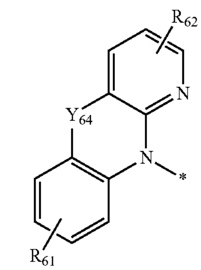
CY51-20
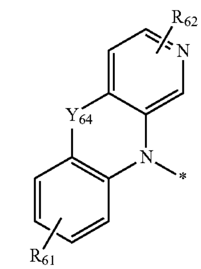

-continued
CY51-21
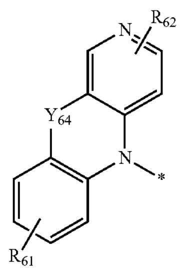
CY51-22
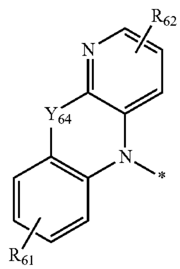
CY51-23
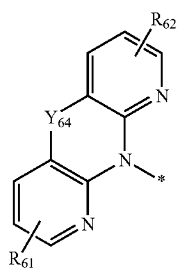
CY51-24
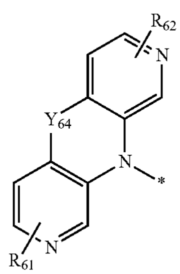
CY51-25
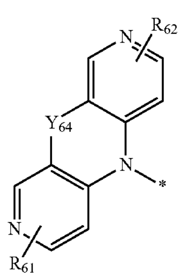
CY51-26
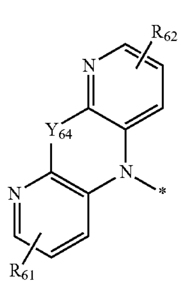
-continued
CY52-1
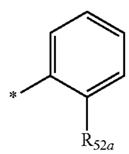
CY52-2
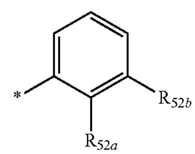
CY52-3
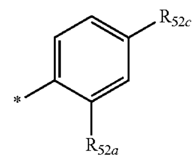
CY52-4
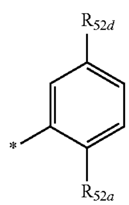
CY52-5
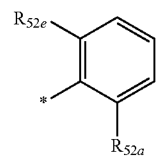
CY52-6
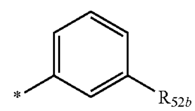
CY52-7
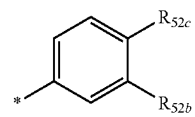
CY52-8
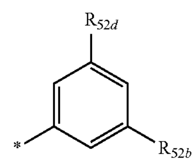
CY52-9
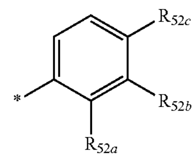
CY52-10
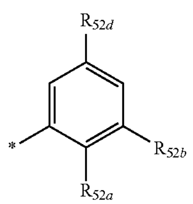

-continued
CY52-11
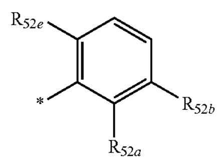
CY52-12
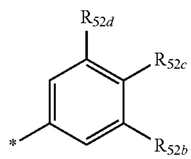
CY52-13
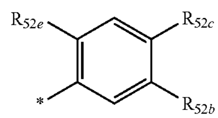
CY52-14
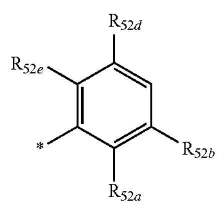
CY52-15
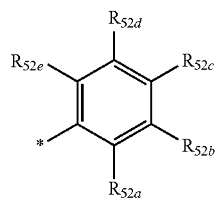
CY52-16
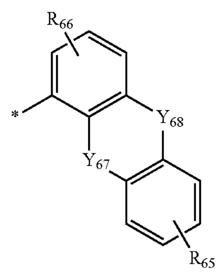
CY52-17
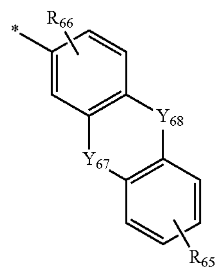
-continued
CY52-18
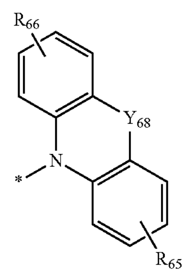
CY52-19
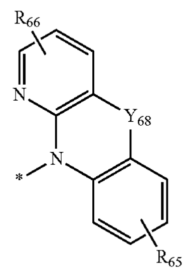
CY52-20
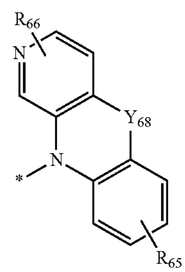
CY52-21
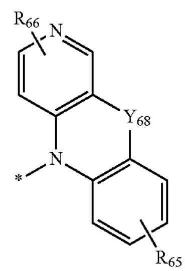
CY52-22
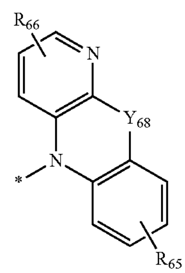
CY52-23
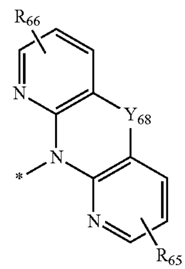

-continued
CY52-24
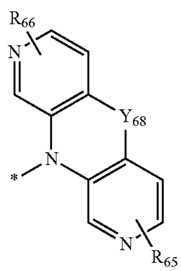
CY52-25
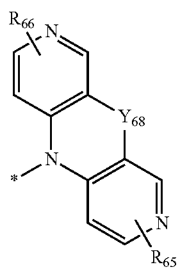
CY52-26
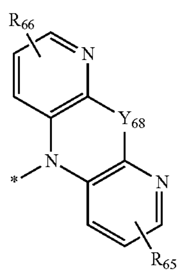
CY53-1
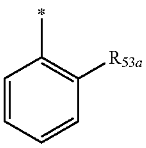
CY53-2
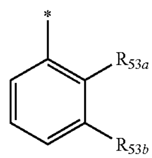
CY53-3
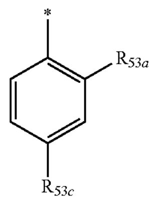
CY53-4
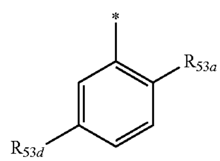
-continued
CY53-5
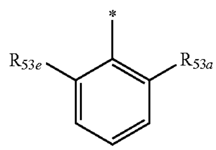
CY53-6
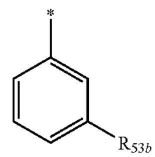
CY53-7
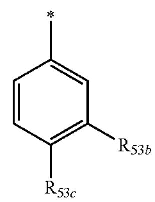
CY53-8
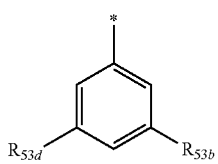
CY53-9
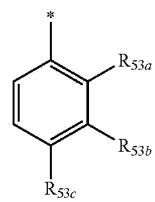
CY53-10
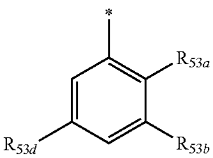
CY53-11
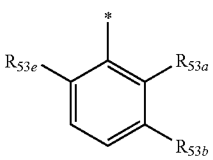
CY53-12
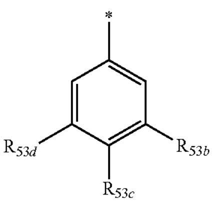

-continued
CY53-13
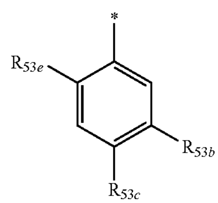
CY53-14
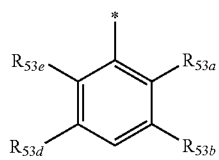
CY53-15
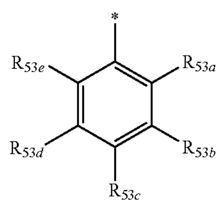
CY53-16
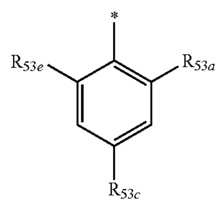
CY53-17
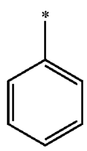
CY53-18
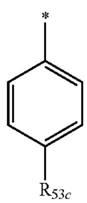
CY53-19
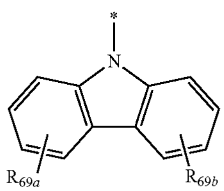
CY53-20
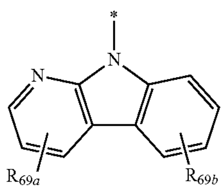
-continued
CY53-21
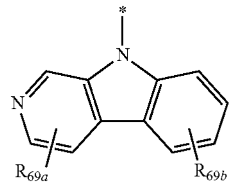
CY53-22
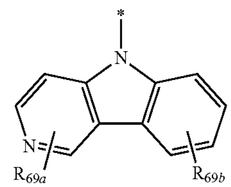
CY53-23
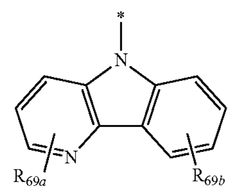
CY53-24
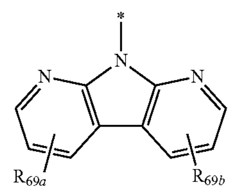
CY53-25
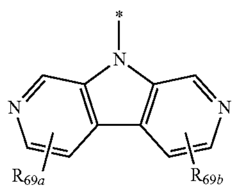
CY53-26
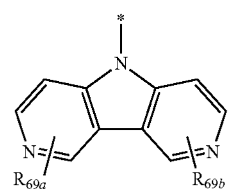
CY53-27
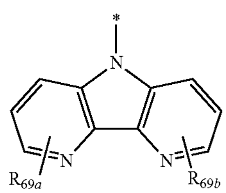
,
wherein, in Formulae CY51-1 to CY51-26, CY52-1 to CY52-26, and CY53-1 to CY53-27,
$Y_{63}$ may be a single bond, O, S, $N(R_{63})$, $B(R_{63})$, $C(R_{63a})(R_{63b})$, or $Si(R_{63a})(R_{63b})$,
$Y_{64}$ may be a single bond, O, S, $N(R_{64})$, $B(R_{64})$, $C(R_{64a})(R_{64b})$, or $Si(R_{64a})(R_{64b})$,
$Y_{67}$ may be a single bond, O, S, $N(R_{67})$, $B(R_{67})$, $C(R_{67a})(R_{67b})$, or $Si(R_{67a})(R_{67b})$,
$Y_{68}$ may be a single bond, O, S, $N(R_{68})$, $B(R_{68})$, $C(R_{68a})(R_{68b})$, or $Si(R_{68a})(R_{68b})$, each of $Y_{63}$ and $Y_{64}$ in Formulae CY51-16 and CY51-17 may not be a single bond, each of $Y_{67}$ and $Y_{68}$ in Formulae CY52-16 and CY52-17 may not be a single bond, $R_{51a}$ to $R_{51e}$, $R_{61}$ to $R_{64}$, $R_{63a}$, $R_{63b}$, $R_{64a}$, and $R_{64b}$ may each be understood by referring to the description of $R_{51}$, and $R_{51a}$ to $R_{51e}$ may not each be hydrogen, $R_{52a}$ to $R_{52e}$, $R_{65}$ to $R_{68}$, $R_{67a}$, $R_{67b}$, $R_{68a}$, and $R_{68b}$ may each be understood by referring to the description of $R_{52}$, and $R_{52a}$ to $R_{52e}$ may not each be hydrogen, $R_{53a}$ to $R_{53e}$, $R_{69a}$, and $R_{69b}$ may each be understood by referring to the description of $R_{53}$, and $R_{53a}$ to $R_{53e}$ may not each be hydrogen, and indicates a binding site to an adjacent atom.

For example, $R_{51a}$ to $R_{51e}$ and $R_{52a}$ to $R_{52e}$ in Formulae CY51-1 to CY51-26 and Formulae CY52-1 to CY52-26 may each independently be:

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothienyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothienyl group, a benzocarbazolyl group, a dibenzocarbazolyl group, an imidazopyridinyl group, an imidazopyrimidinyl group, an azacarbazolyl group, an azadibenzofuranyl group, an azadibenzothienyl group, an azafluorenyl group, an azadibenzosilolyl group, or a group represented by Formula 91, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothienyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothienyl group, a benzocarbazolyl group, a dibenzocarbazolyl group, an imidazopyridinyl group, an imidazopyrimidinyl group, or any combination thereof; or $—C(Q_1)(Q_2)(Q_3)$ or $—Si(Q_1)(Q_2)(Q_3)$, wherein $Q_1$ to $Q_3$ may each independently be a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof, in Formulae CY51-16 and CY51-17, i) $Y_{63}$ may be O or S and $Y_{64}$ may be $Si(R_{64a})(R_{64b})$, or ii) $Y_{63}$ may be $Si(R_{63a})(R_{63b})$ and $Y_{64}$ may be O or S, and in Formulae CY52-16 and CY52-17, i) $Y_{67}$ may be O or S, and Yes may be $Si(R_{68a})(R_{68b})$, or ii) $Y_{67}$ may be $Si(R_{67a})(R_{67b})$, and Yes may be O or S.

In Formulae 3-1 to 3-5, $L_{81}$ to $L_{85}$ may each independently be:

a single bond; or $*—C(Q_4)(Q_5)-*'$ or $*—Si(Q_4)(Q_5)-*'$; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothienyl group, a dibenzosilolyl group, a dimethyldibenzosilolyl group, a diphenyldibenzosilolyl group, $—O(Q_{31})$, $—S(Q_{31})$, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof, wherein $Q_4$, $Q_5$, and $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In some embodiments, in Formulae 3-1 and 3-2, a group represented by

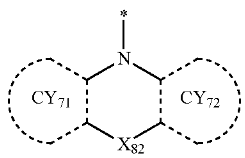

may be represented by one of Formulae CY71-1(1) to CY71-1(8), and/or in Formulae 3-1 and 3-3, a group represented by

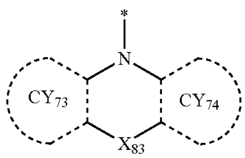

may be represented by one of Formulae CY71-2(1) to CY71-2(8), and/or in Formulae 3-2 and 3-4, a group represented by

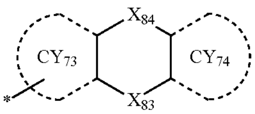

may be represented by one of Formulae CY71-3(1) to CY71-3(32), and/or in Formulae 3-3 to 3-5, a group represented by

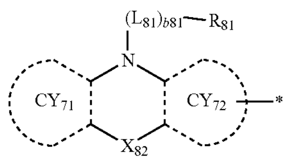

may be represented by one of Formulae CY71-4(1) to CY71-4(32), and/or in Formula 3-5, a group represented by

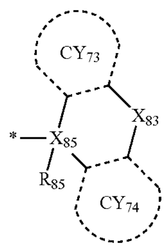

may be represented by one of Formulae CY71-5(1) to CY71-5(8):

CY71-1(1)

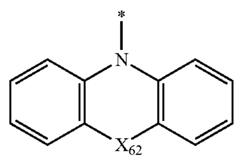

CY71-1(2)

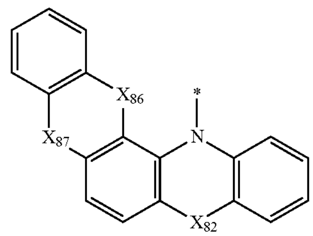

CY71-1(3)

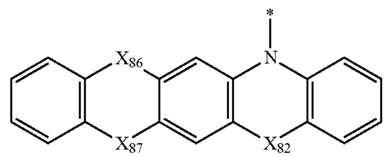

CY71-1(4)

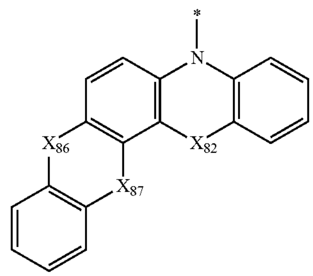

CY71-1(5)

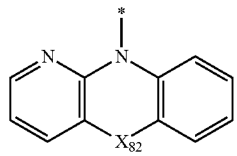

CY71-1(6)

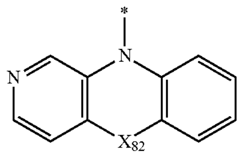

CY71-1(7)

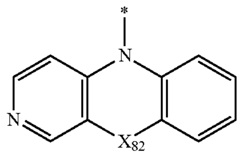

CY71-1(8)

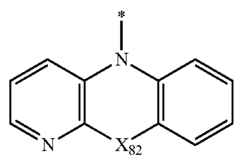

-continued
CY71-2(1)
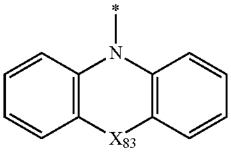
CY71-2(2)
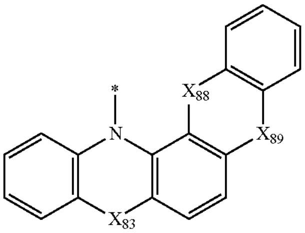
CY71-2(3)
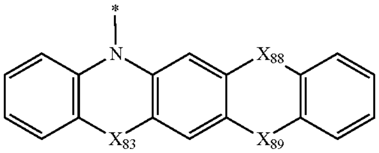
CY71-2(4)
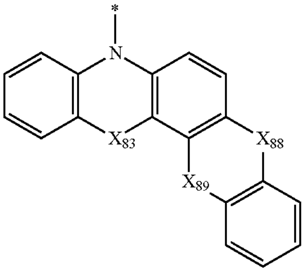
CY71-2(5)
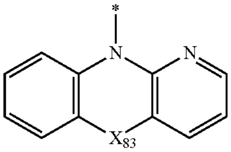
CY71-2(6)
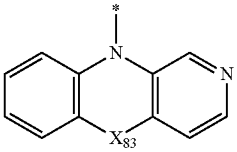
CY71-2(7)
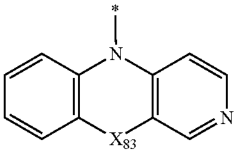
CY71-2(8)
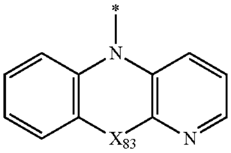
-continued
CY71-3(1)
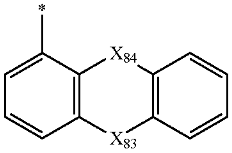
CY71-3(2)
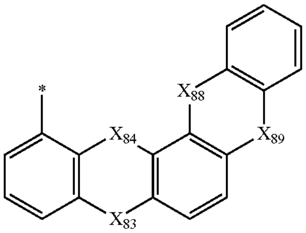
CY71-3(3)
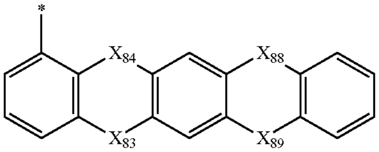
CY71-3(4)
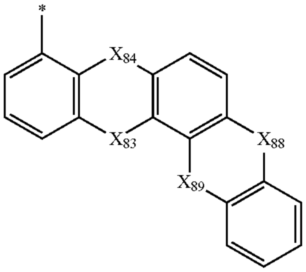
CY71-3(5)
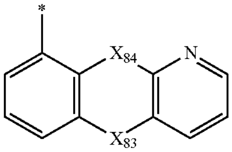
CY71-3(6)
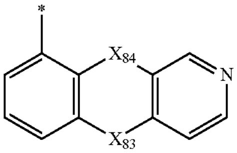
CY71-3(7)
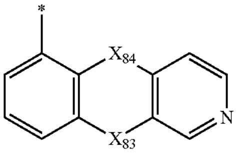
CY71-3(8)
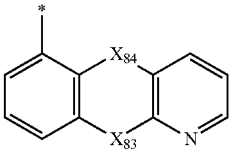
CY71-3(9)
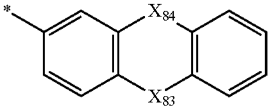

-continued
CY71-3(10)
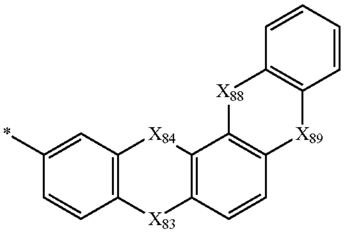
CY71-3(11)
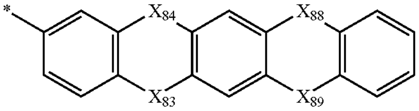
CY71-3(12)
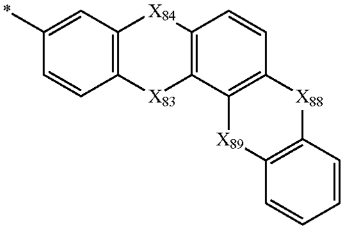
CY71-3(13)
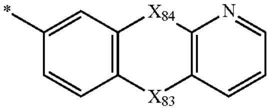
CY71-3(14)
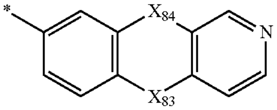
CY71-3(15)
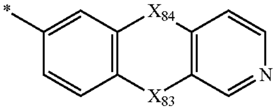
CY71-3(16)
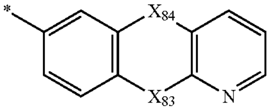
CY71-3(17)
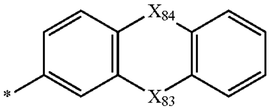
CY71-3(18)
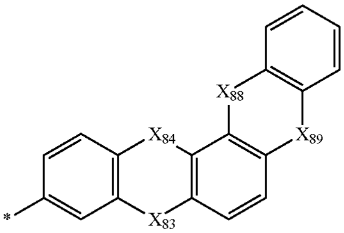
CY71-3(19)
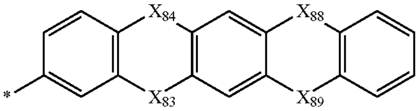
-continued
CY71-3(20)
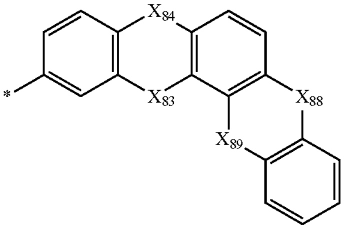
CY71-3(21)
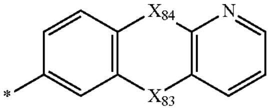
CY71-3(22)
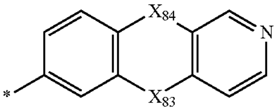
CY71-3(23)
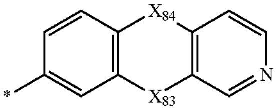
CY71-3(24)
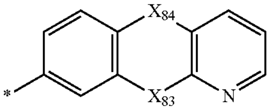
CY71-3(25)
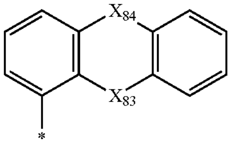
CY71-3(26)
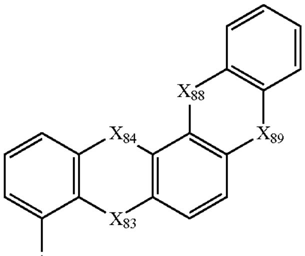
CY71-3(27)
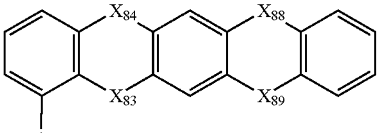
CY71-3(28)
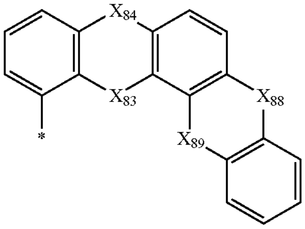

-continued
CY71-3(29)
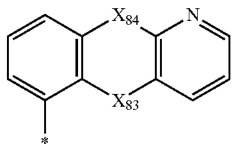
CY71-3(30)
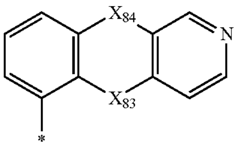
CY71-3(31)
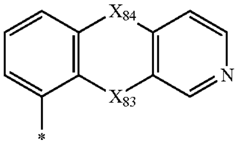
CY71-3(32)
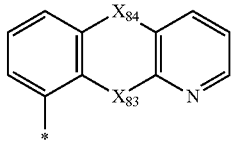
CY71-4(1)
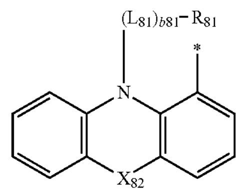
CY71-4(2)
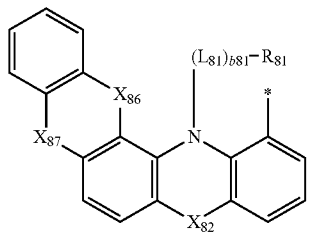
CY71-4(3)
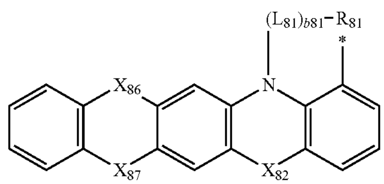
CY71-4(4)
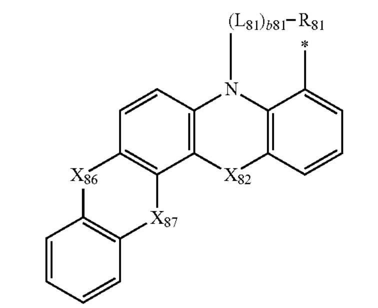
-continued
CY71-4(5)
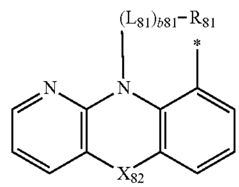
CY71-4(6)
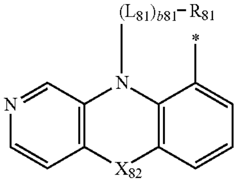
CY71-4(7)
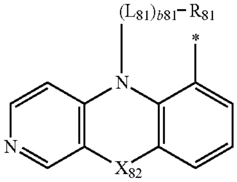
CY71-4(8)
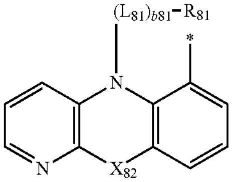
CY71-4(9)
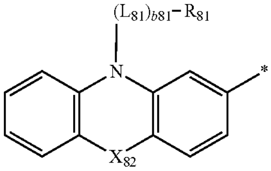
CY71-4(10)
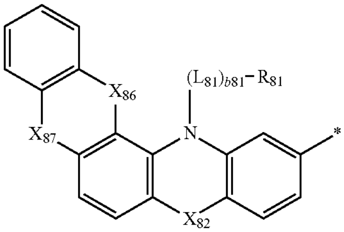
CY71-4(11)
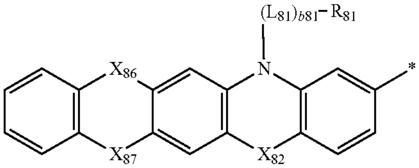

-continued
CY71-4(12)
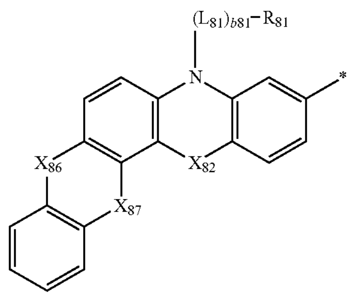
CY71-4(13)
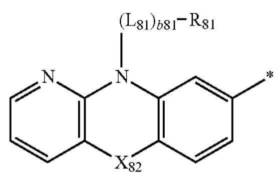
CY71-4(14)
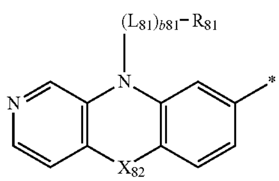
CY71-4(15)
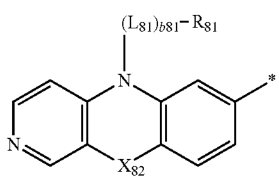
CY71-4(16)
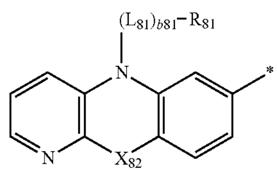
CY71-4(17)
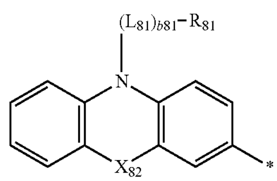
CY71-4(18)
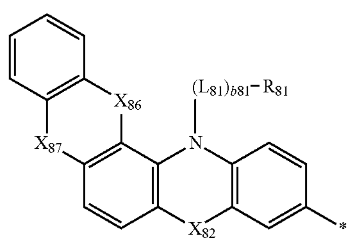
CY71-4(19)
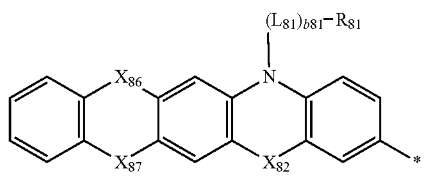
-continued
CY71-4(20)
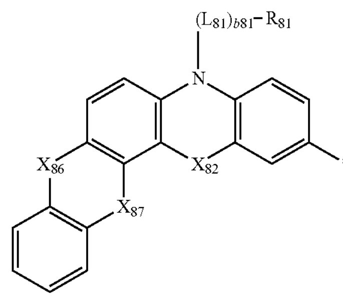
CY71-4(21)
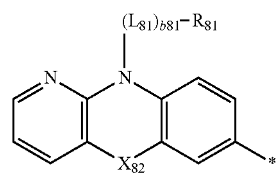
CY71-4(22)
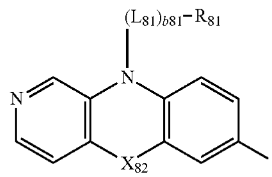
CY71-4(23)
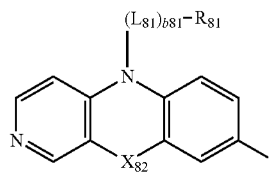
CY71-4(24)
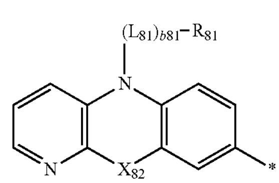
CY71-4(25)
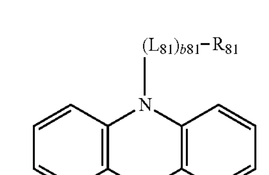
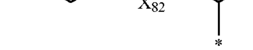
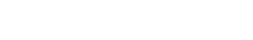
CY71-4(26)
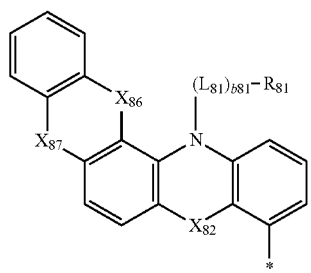

-continued

CY71-4(27)

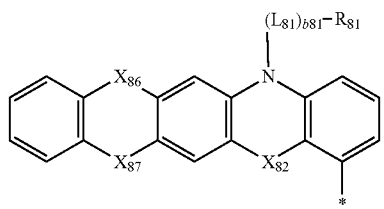

CY71-4(28)

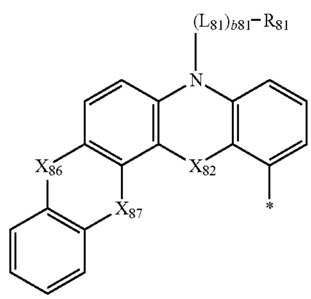

CY71-4(29)

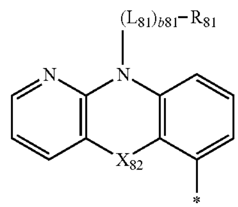

CY71-4(30)

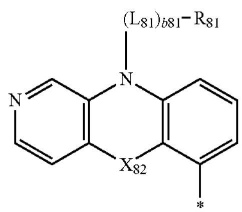

CY71-4(31)

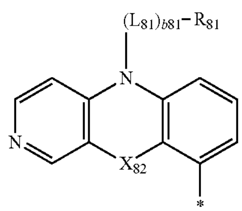

CY71-4(32)

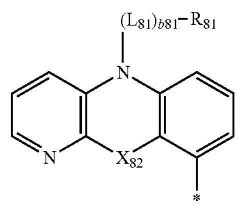

CY71-5(1)

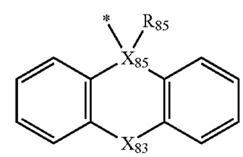

-continued

CY71-5(2)

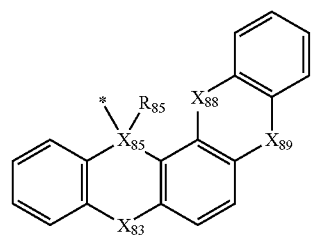

CY71-5(3)

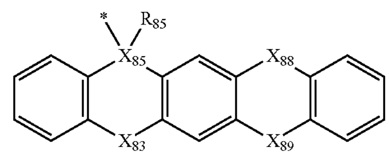

CY71-5(4)

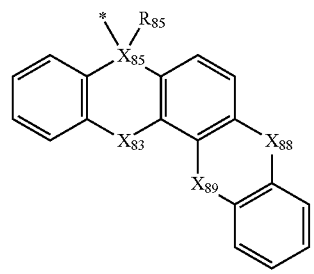

CY71-5(5)

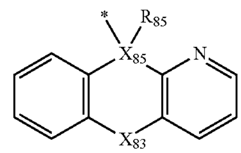

CY71-5(6)

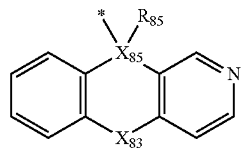

CY71-5(7)

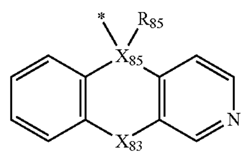

CY71-5(8)

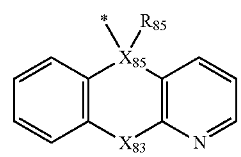

wherein, in Formulae $CY_{71}$-1(1) to $CY_{71}$-1(8), $CY_{71}$-2(1) to $CY_{71}$-2(8), $CY_{71}$-3(1) to $CY_{71}$-3(32), $CY_{71}$-4(1) to $CY_{71}$-4(32), and $CY_{71}$-5(1) to $CY_{71}$-5(8), $X_{82}$ to $X_{85}$, $L_{81}$, b81, $R_{81}$, and $R_{85}$ may respectively be understood by referring to the descriptions of $X_{82}$ to $X_{85}$, $L_{81}$, b81, $R_{81}$, and $R_{85}$ provided herein, $X_{86}$ may be a single bond, O, S, $N(R_{86})$, $B(R_{86})$, $C(R_{86a})(R_{86b})$, or $Si(R_{86a})(R_{86b})$, $X_{87}$ may be a single bond, O, S, $N(R_{87})$, $B(R_{87})$, $C(R_{87a})(R_{87b})$, or $Si(R_{87a})(R_{87b})$, in Formulae CY71-1(2) to CY71-1(4), CY71-4(2) to CY71-4(4), CY71-4(10) to CY71-4(12), CY71-4(18)

to CY71-4(20), and CY71-4(26) to CY71-4(28), $X_{86}$ and $X_{87}$ may not be a single bond at the same time, $X_{88}$ may be a single bond, O, S, N($R_{88}$), B($R_{88}$), C($R_{88a}$)($R_{88b}$), or Si($R_{88a}$)($R_{88b}$), $X_{89}$ may be a single bond, O, S, N($R_{89}$), B($R_{89}$), C($R_{89a}$)($R_{89b}$), or Si($R_{88a}$)($R_{88b}$), in Formulae CY71-2(2) to CY71-2(4), CY71-3(2) to CY71-3(4), CY71-3(10) to CY71-3(12), CY71-3(18) to CY71-3(20), CY71-3(26) to CY71-3(28) and CY71-5(2) to CY71-5(4), $X_{86}$ and $X_{87}$ may not be a single bond at the same time, and $R_{86}$ to $R_{89}$, $R_{86a}$, $R_{86b}$, $R_{87a}$, $R_{87b}$, $R_{88a}$, $R_{88b}$, $R_{89a}$, and $R_{89b}$ may each be understood by referring to the description of $R_{81}$ provided herein.

Examples of Second Compound, Third Compound, and Fourth Compound

In one or more embodiments, the second compound may include at least one of Compounds ETH1 to ETH84:

ETH1

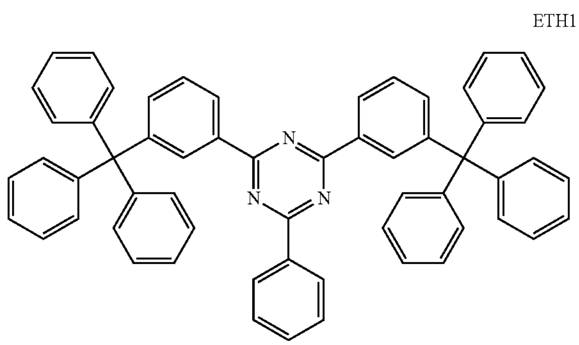

ETH2

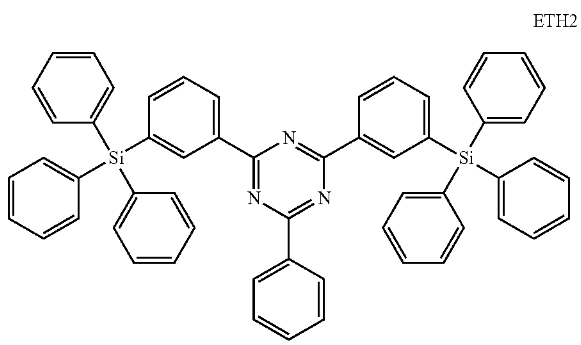

ETH3

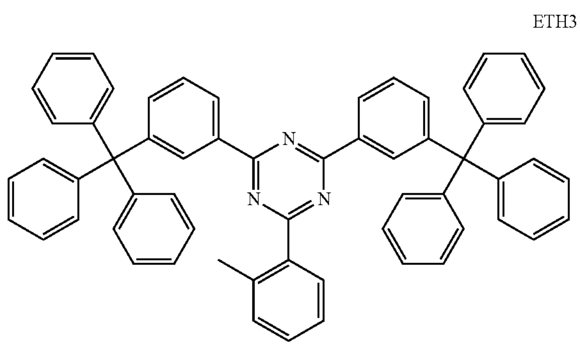

-continued

ETH4

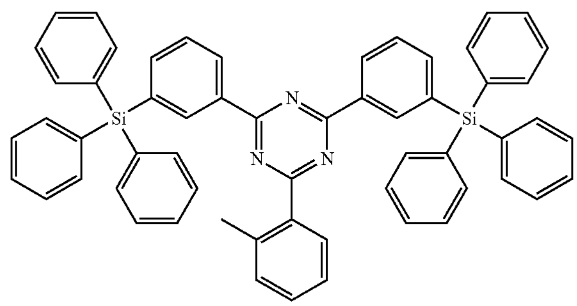

ETH5

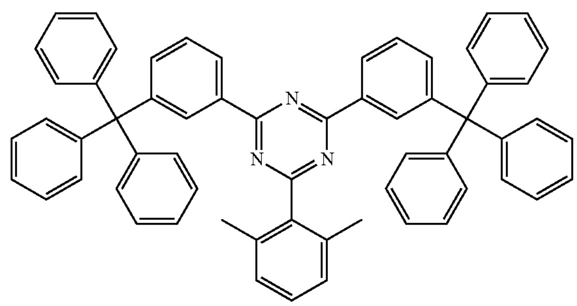

ETH6

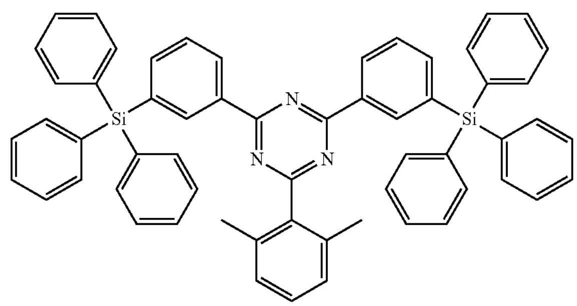

ETH7

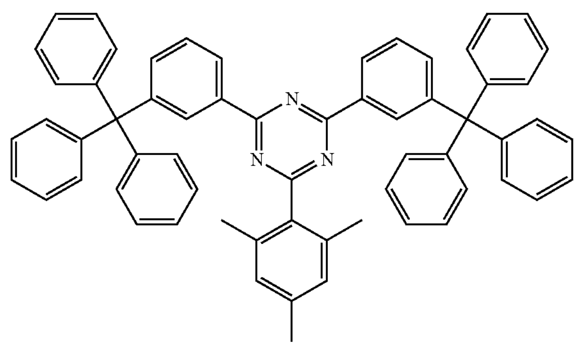

-continued
ETH8
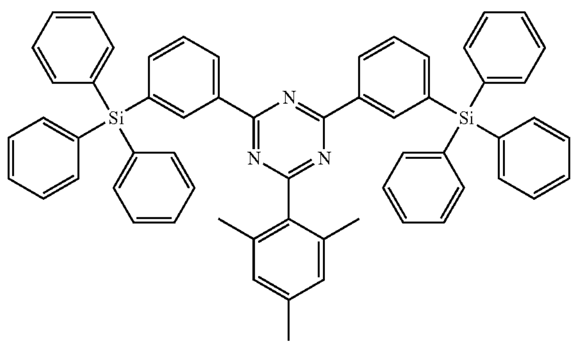
ETH9
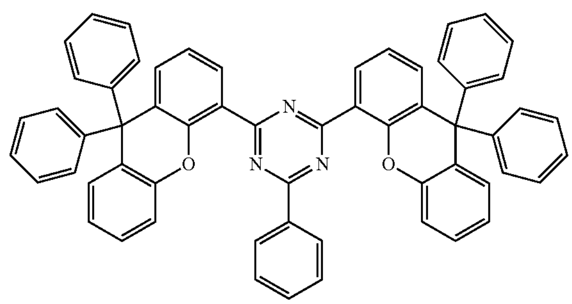
ETH10
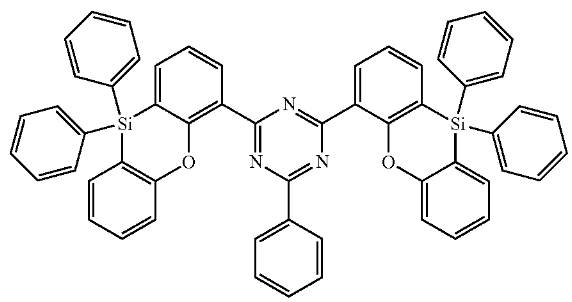
ETH11
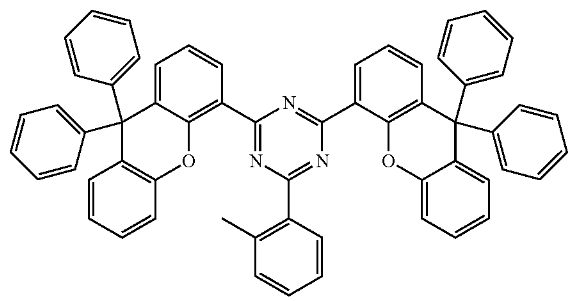
ETH12
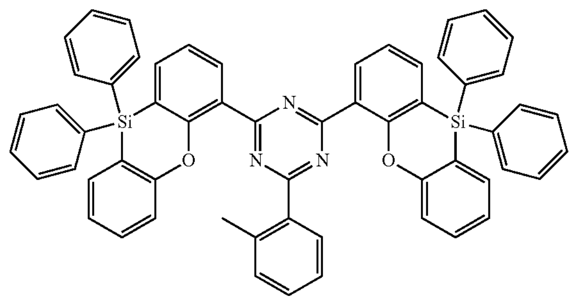
-continued
ETH13
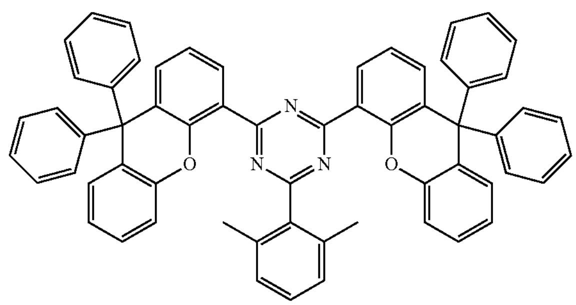
ETH14
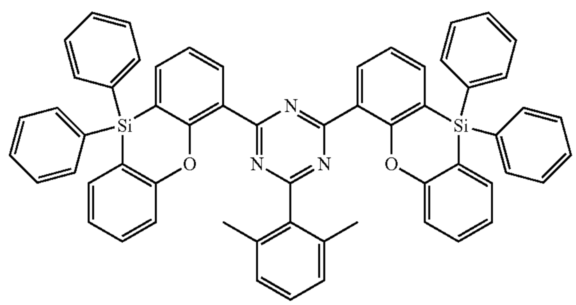
ETH15
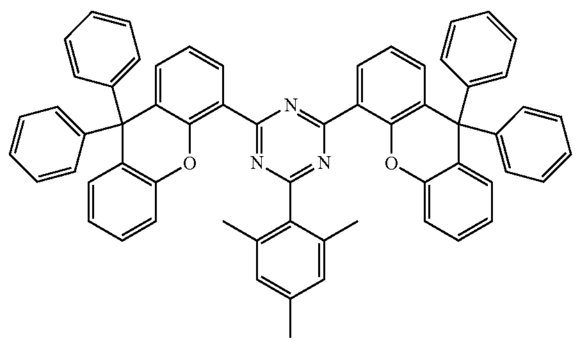
ETH16
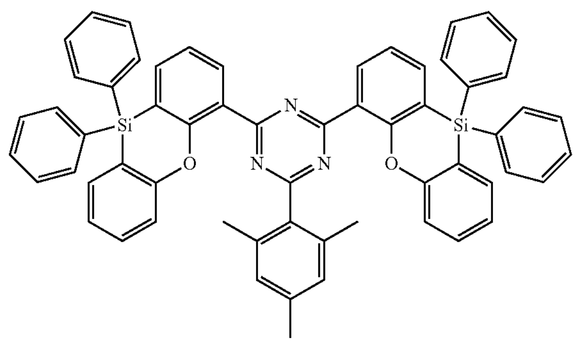

-continued
ETH17
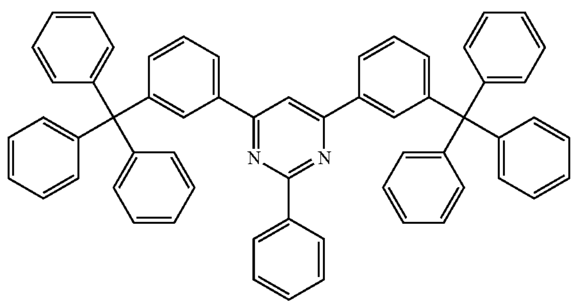
ETH18
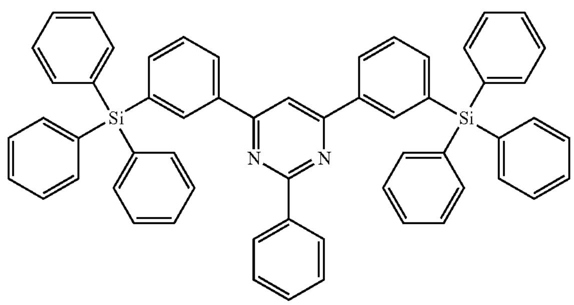
ETH19
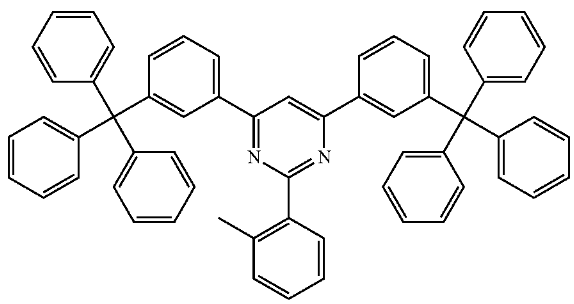
ETH20
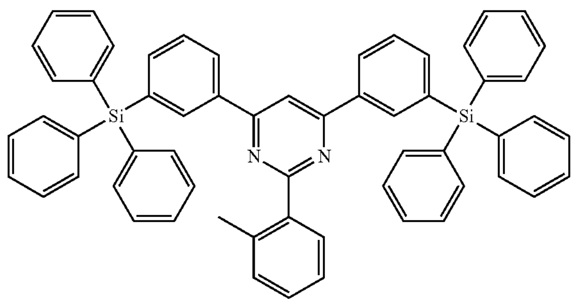
ETH21
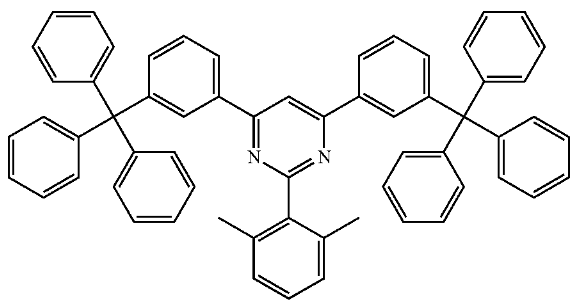
-continued
ETH22
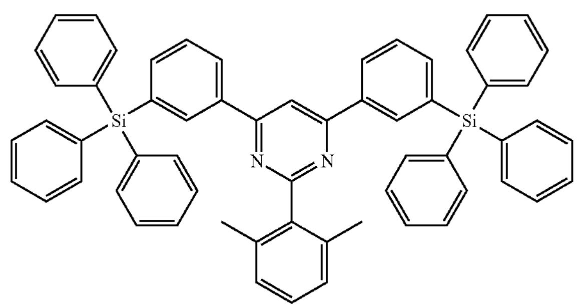
ETH23
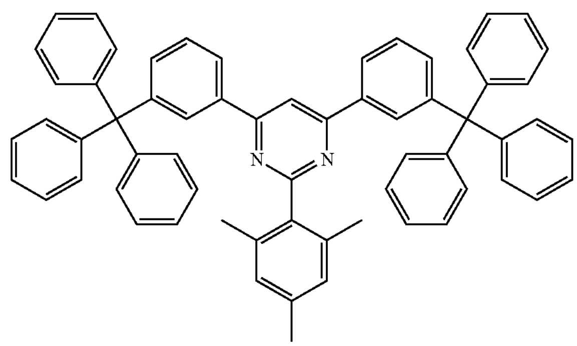
ETH24
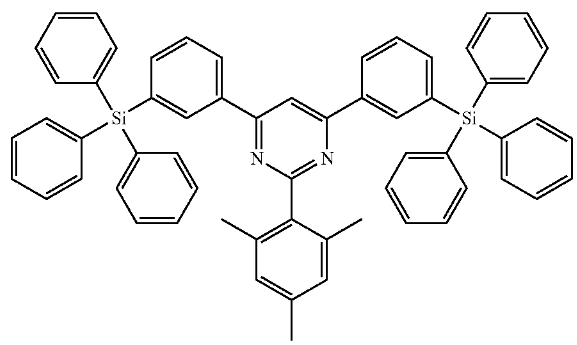
ETH25
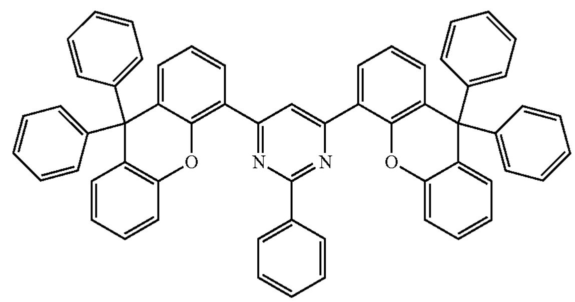

-continued
ETH26
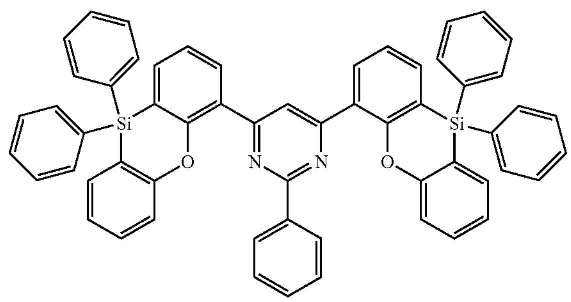
ETH27
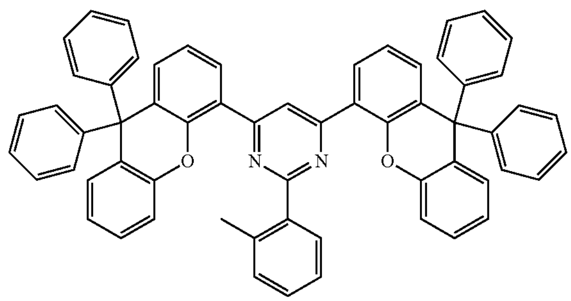
ETH28
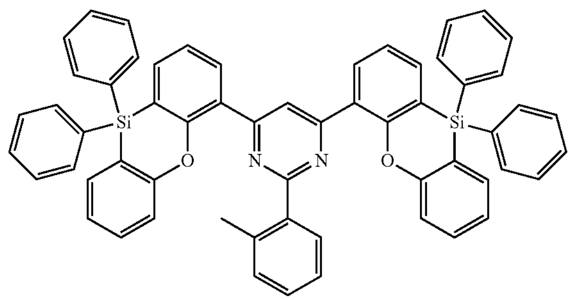
ETH29
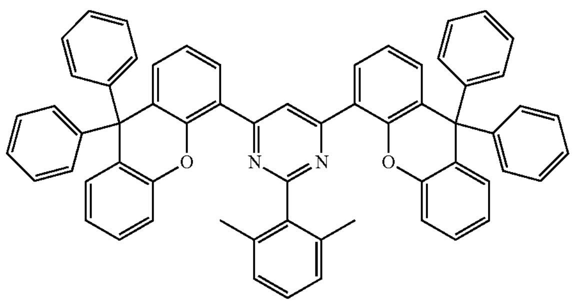
ETH30
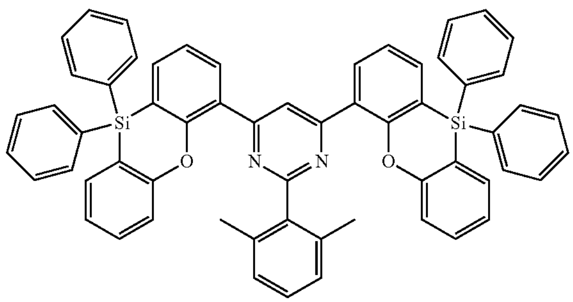
-continued
ETH31
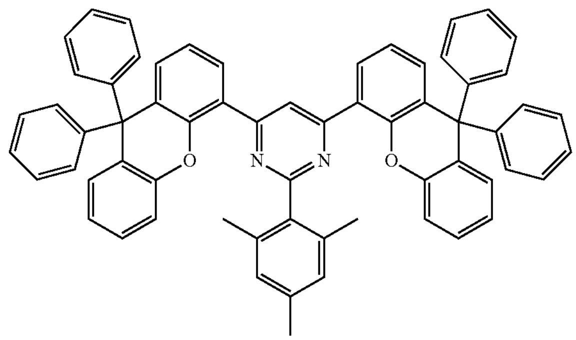
ETH32
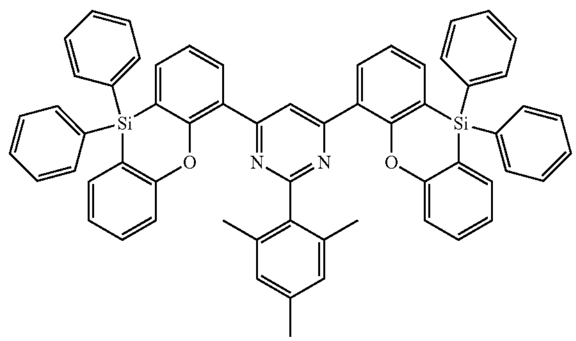
ETH33
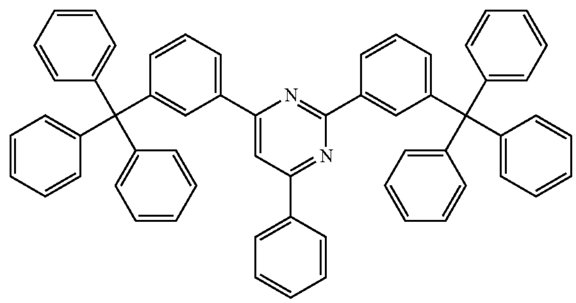
ETH34
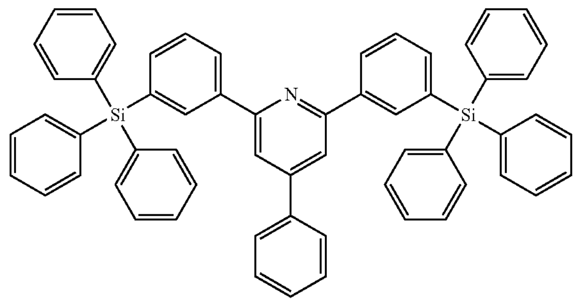

-continued
ETH35
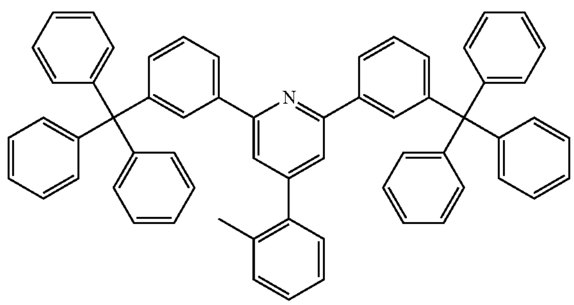
ETH36
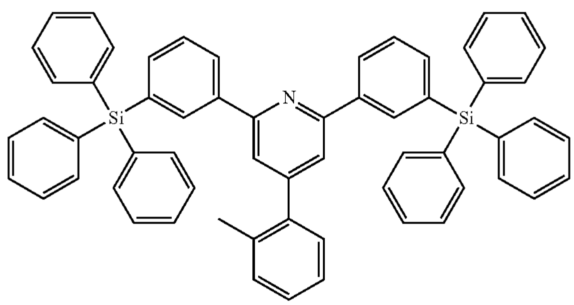
ETH37
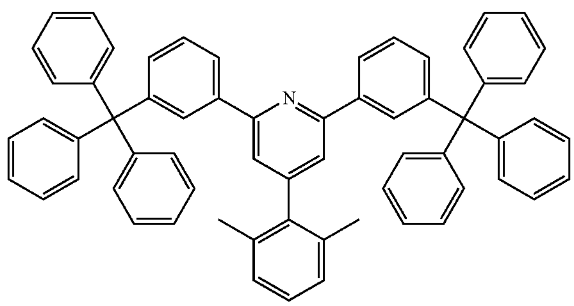
ETH38
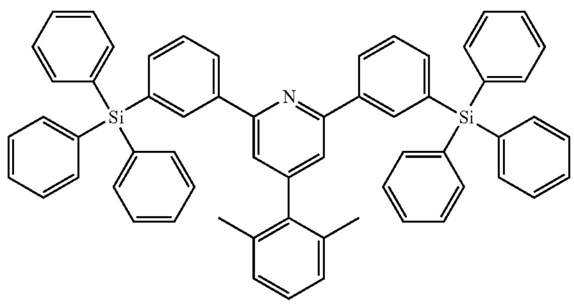
-continued
ETH39
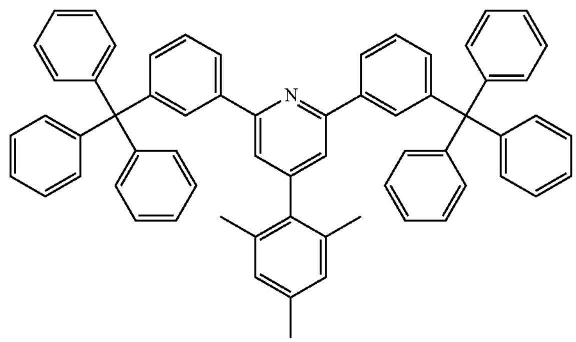
ETH40
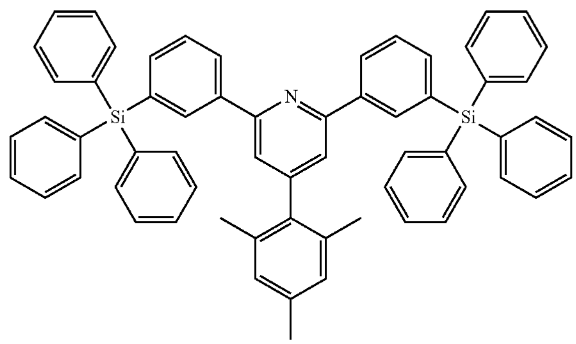
ETH41
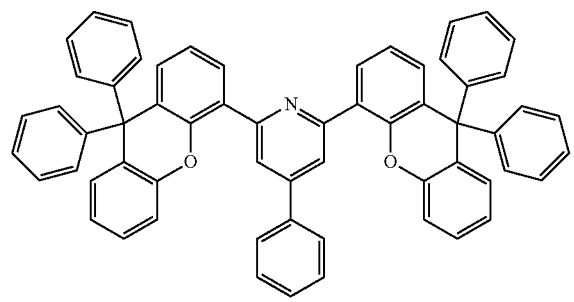
ETH42
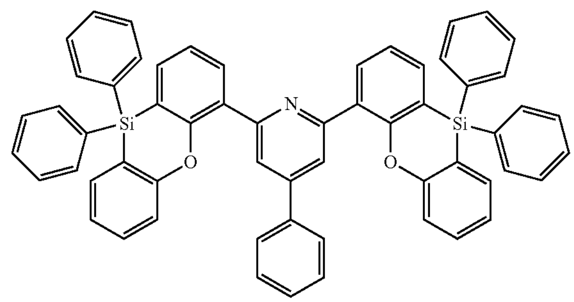

ETH43
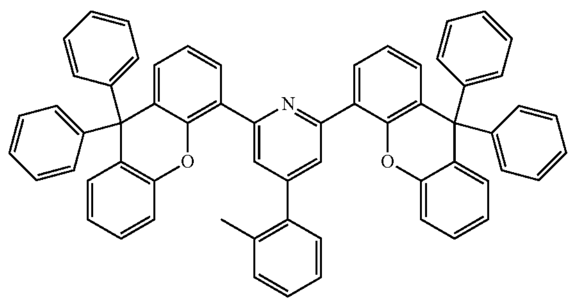
ETH44
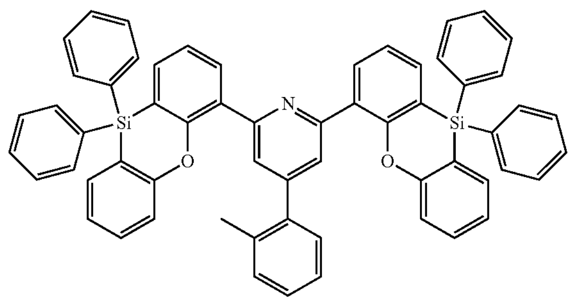
ETH45
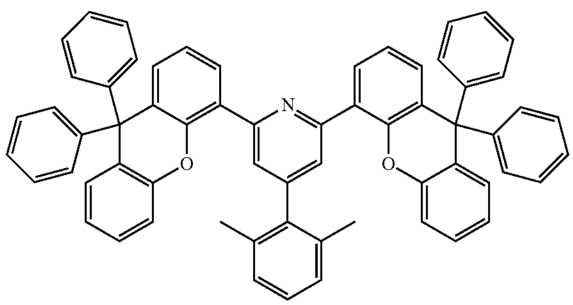
ETH46
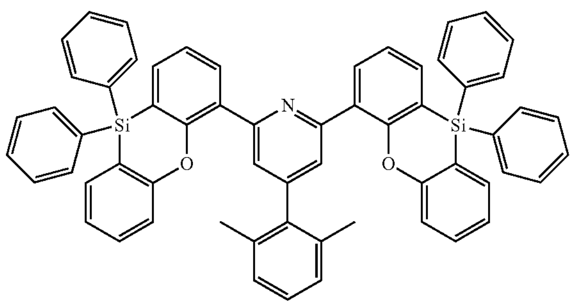
ETH47
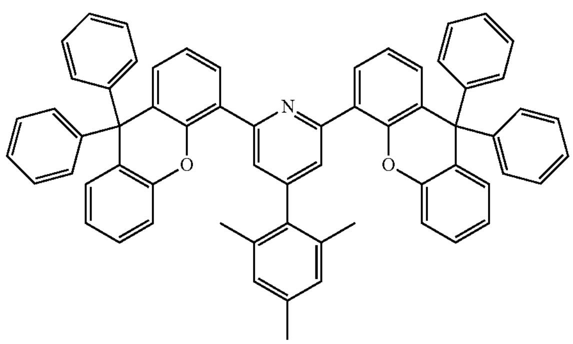
ETH48
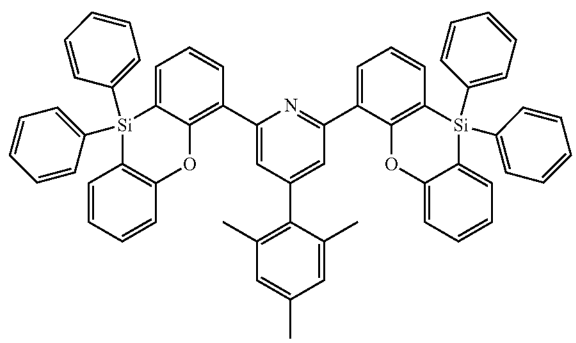
ETH49
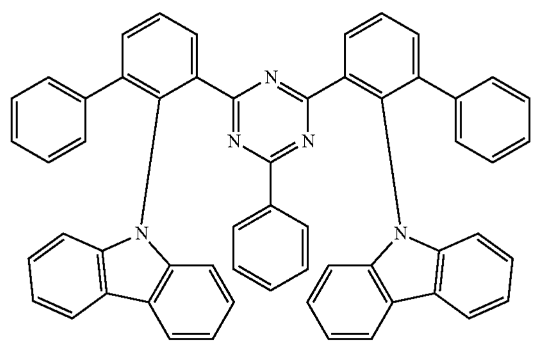
ETH50
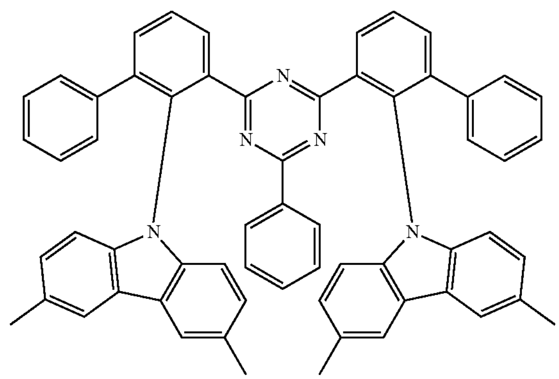
ETH51
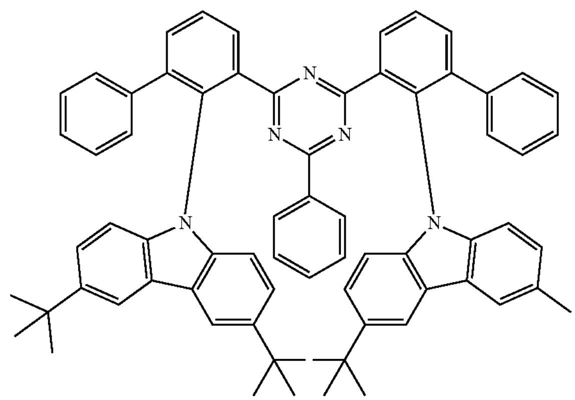

-continued
ETH52
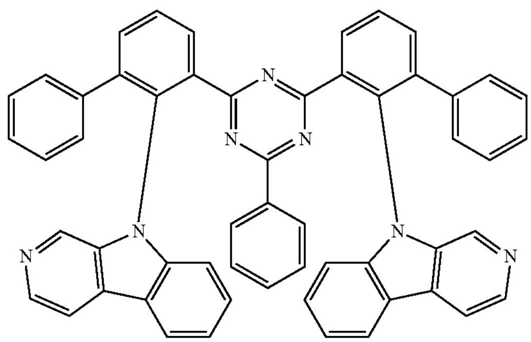
ETH53
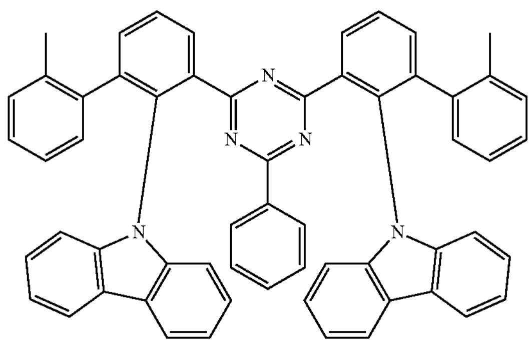
ETH54
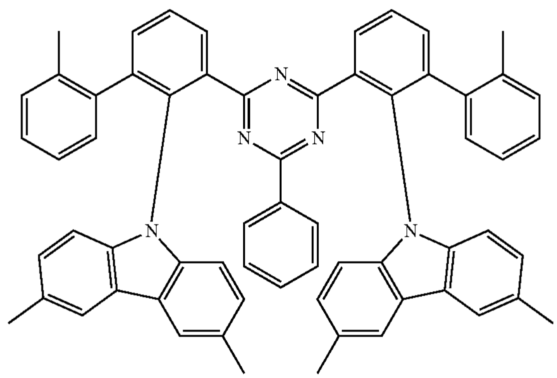
ETH55
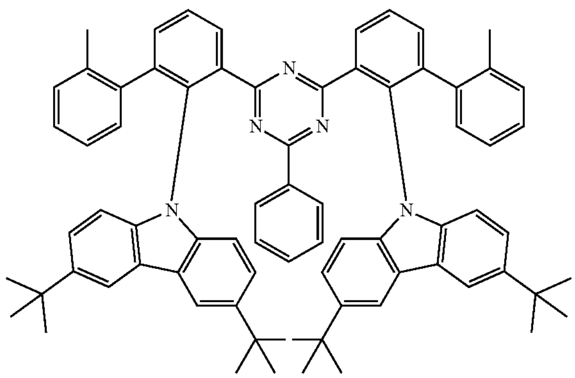
-continued
ETH56
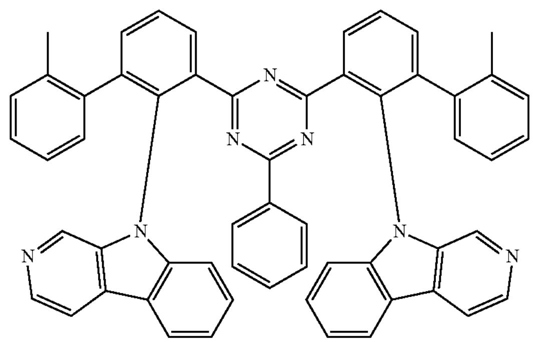
ETH57
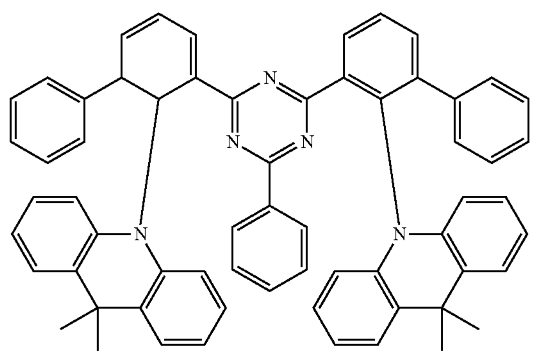
ETH58
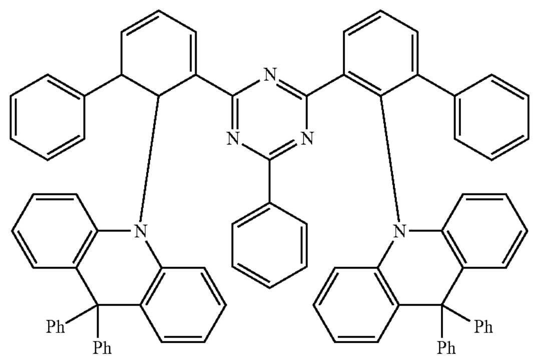
ETH59
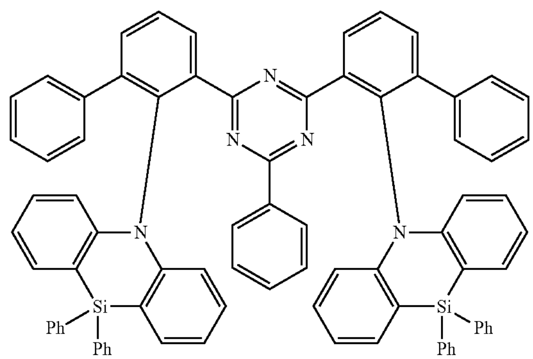

-continued
ETH60
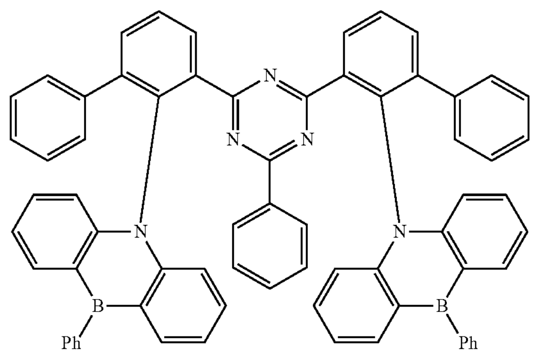
ETH61
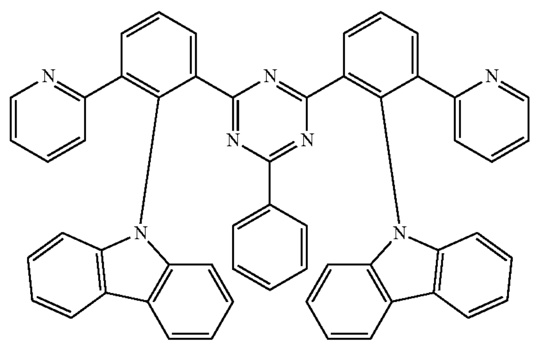
ETH62
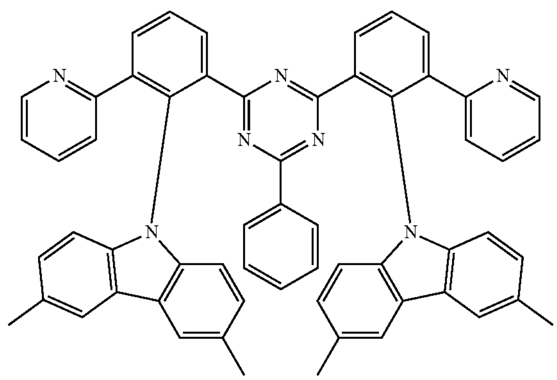
ETH63
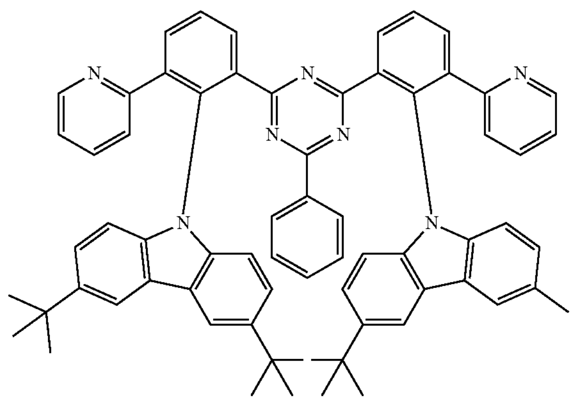
-continued
ETH64
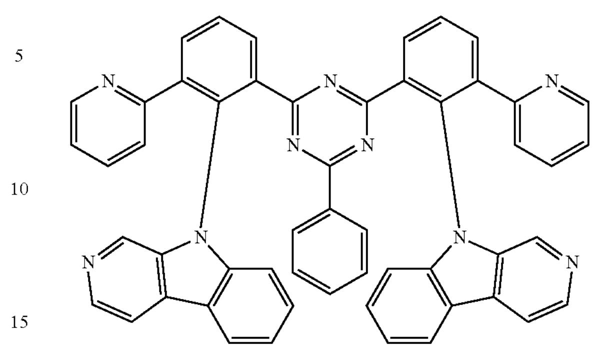
ETH65
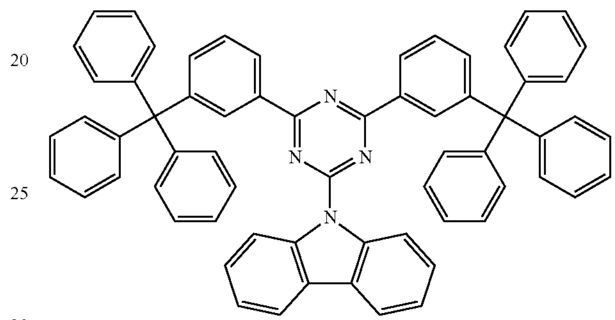
ETH66
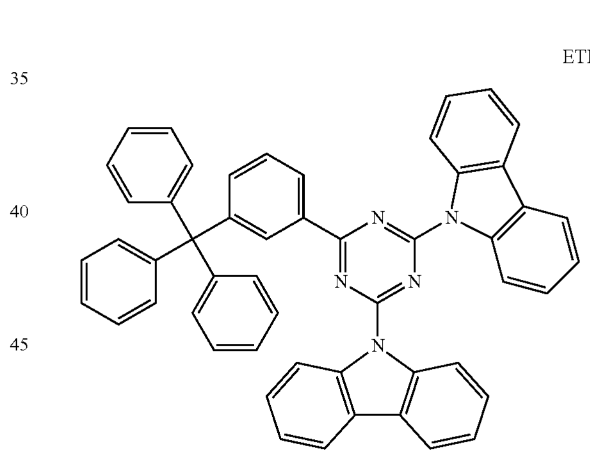
ETH67
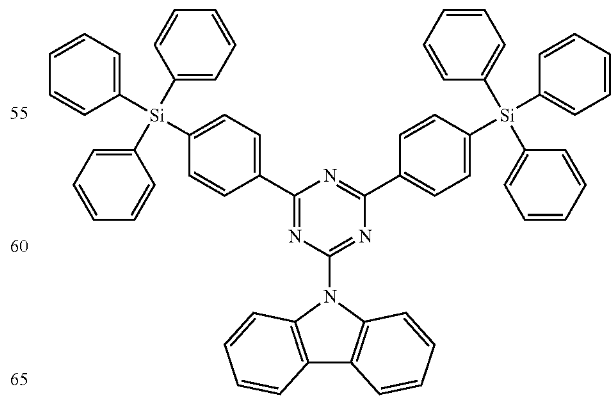

-continued
ETH68
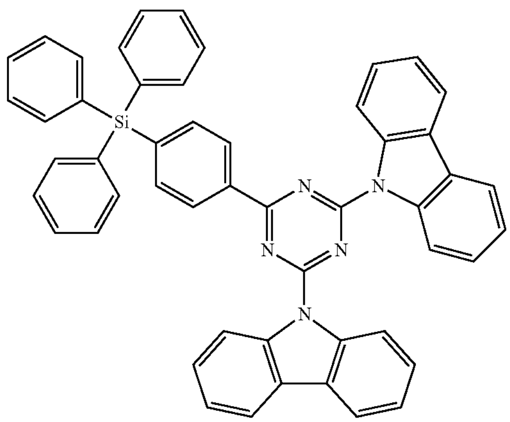
ETH69
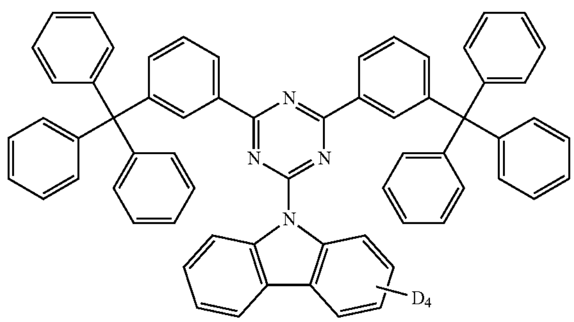
ETH70
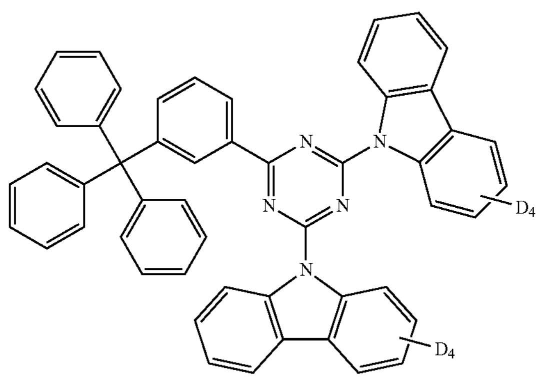
ETH71
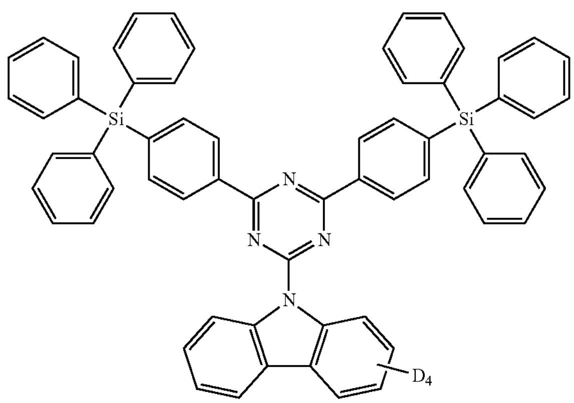
-continued
ETH72
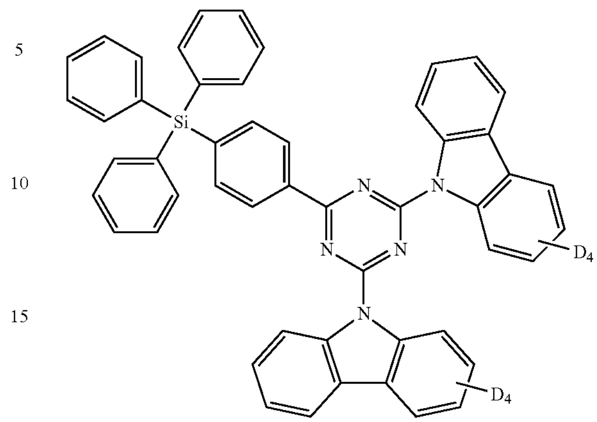
ETH73
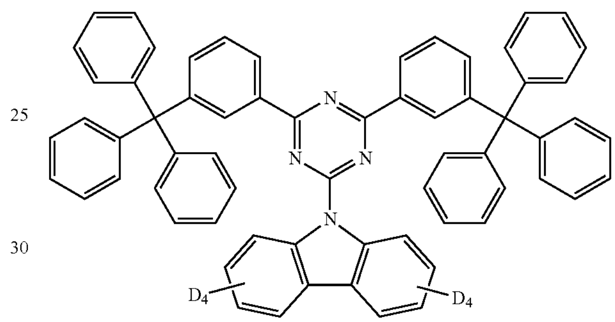
ETH74
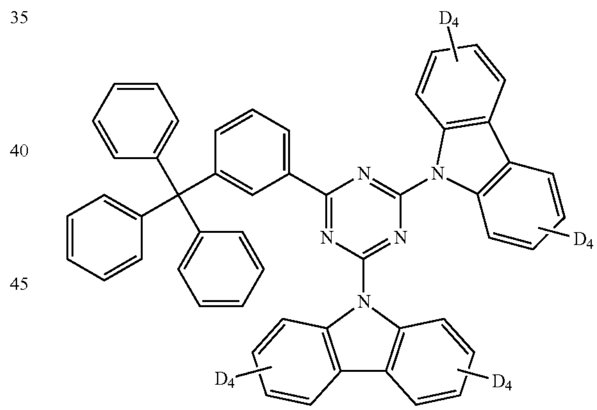
ETH75
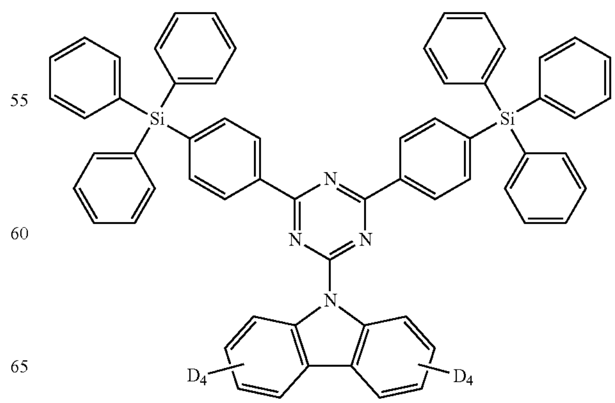

-continued
ETH76
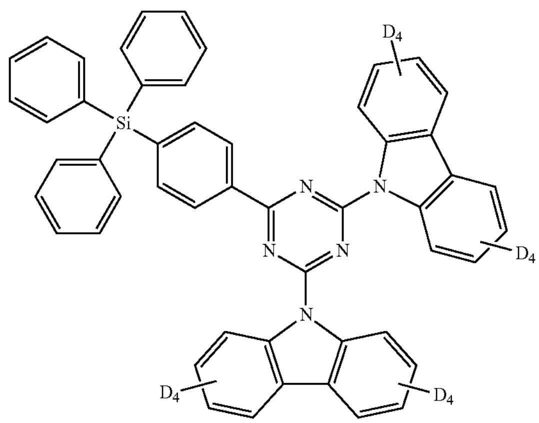
ETH77
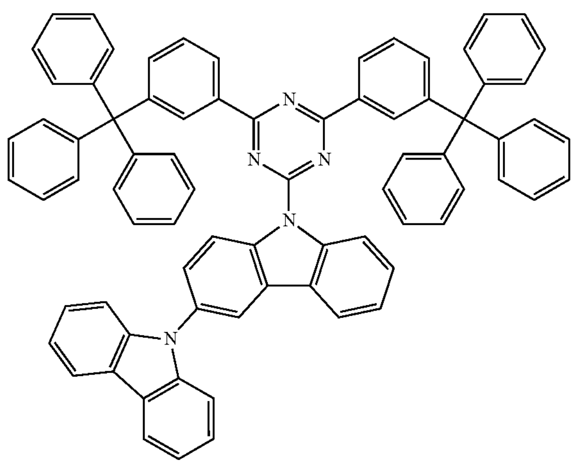
ETH78
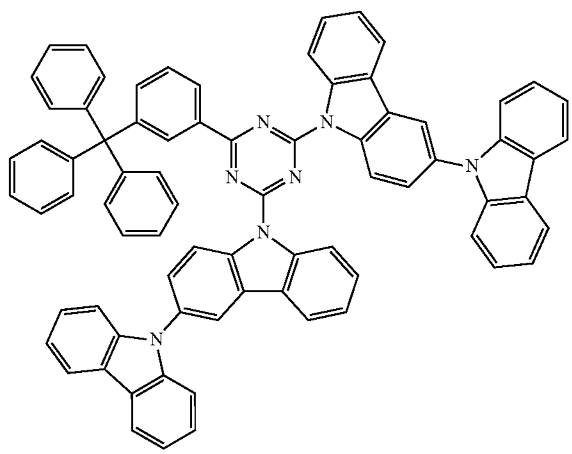
-continued
ETH79
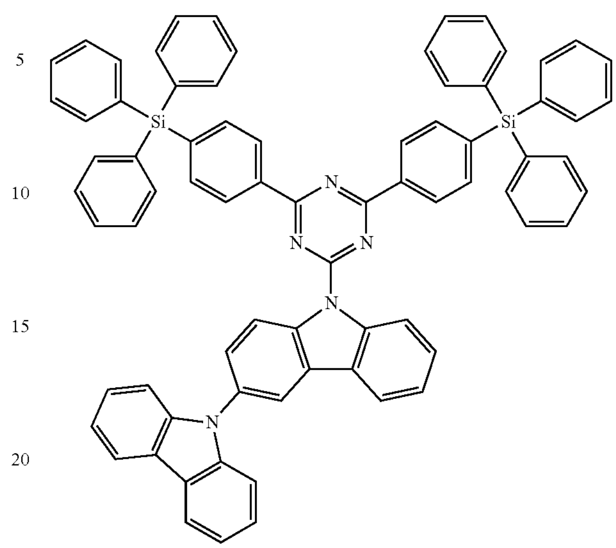
ETH80
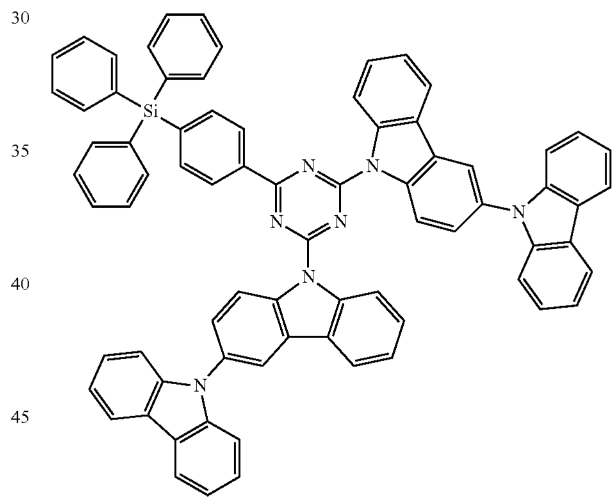
ETH81
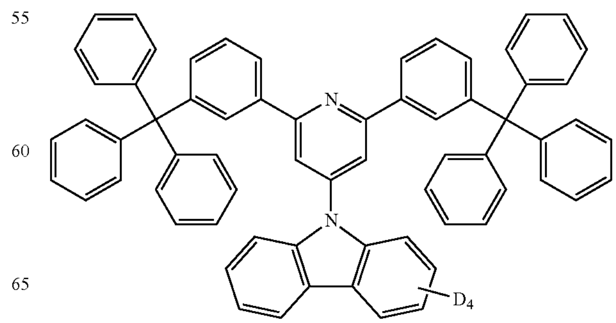

-continued
ETH82
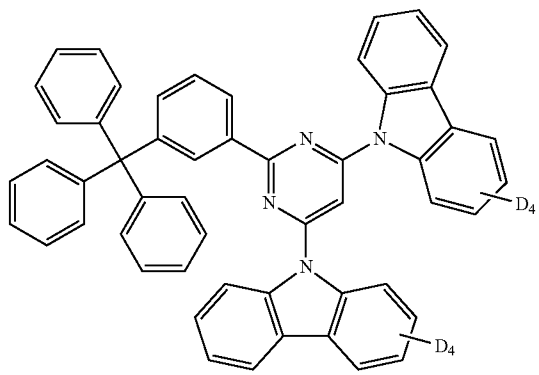
ETH83
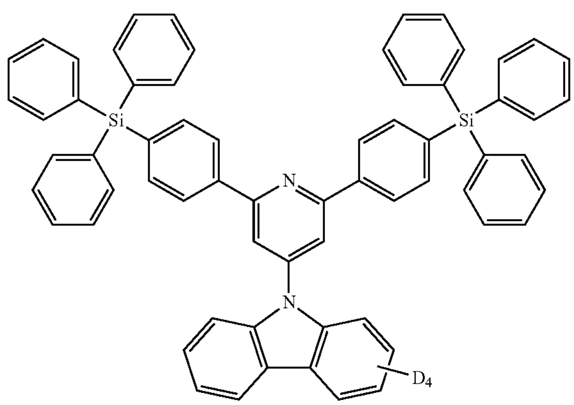
ETH84
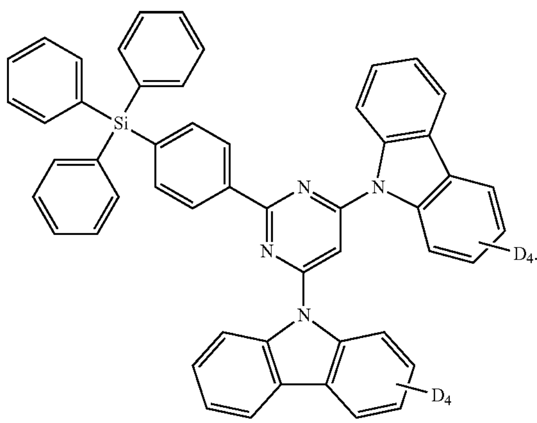
In an embodiment, the third compound may include at least one of Compounds HTH1 to HTH52:
HTH1
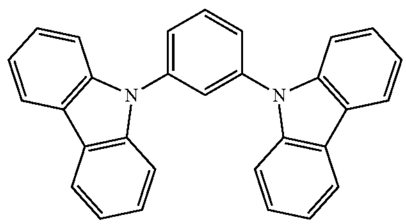
-continued
HTH2
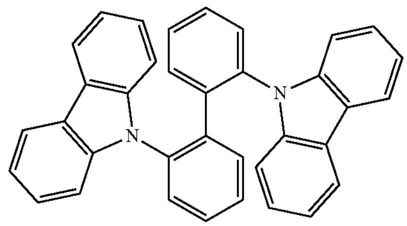
HTH3
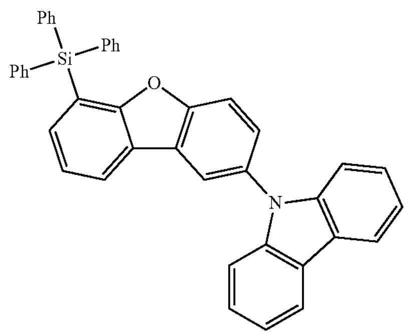
HTH4
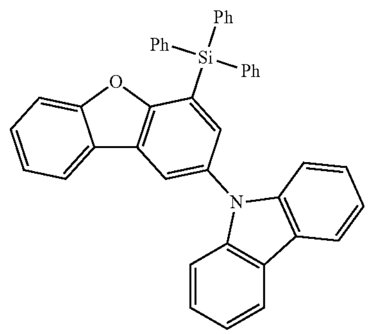
HTH5
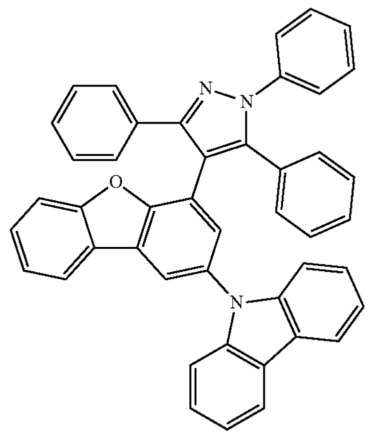

-continued
HTH6
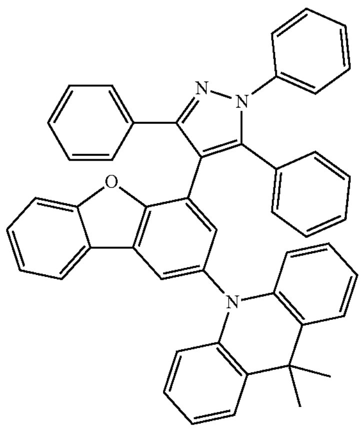
HTH7
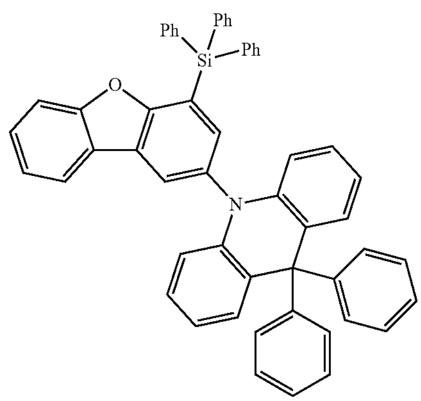
HTH8
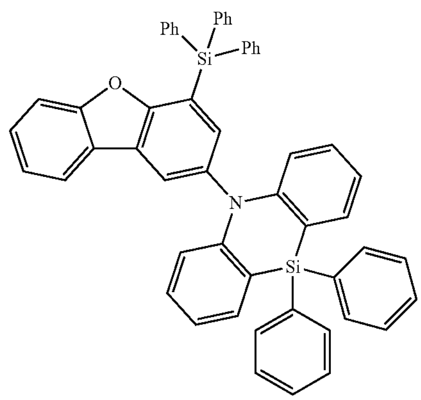
-continued
HTH9
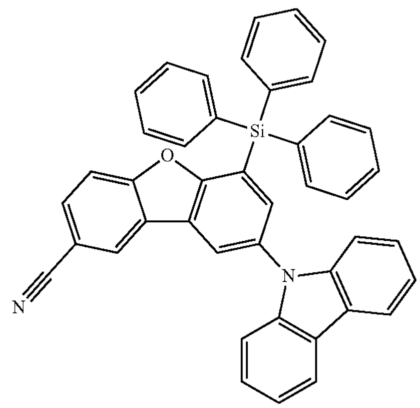
HTH10
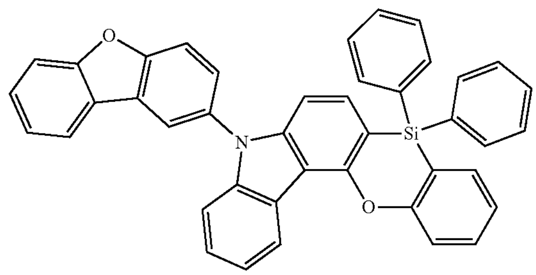
HTH11
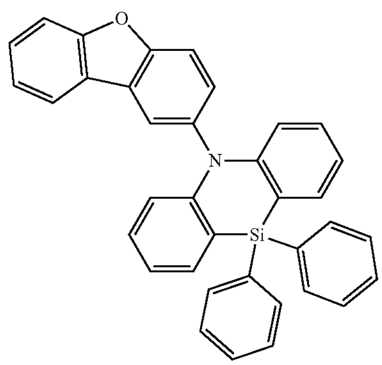
HTH12
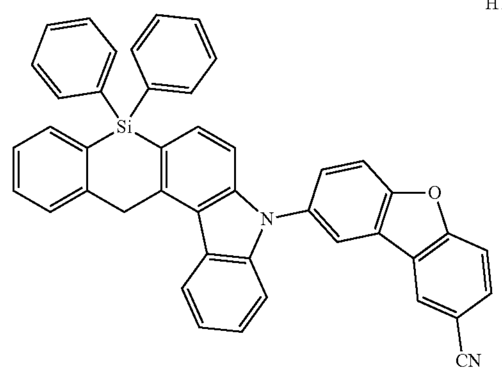

-continued
HTH13
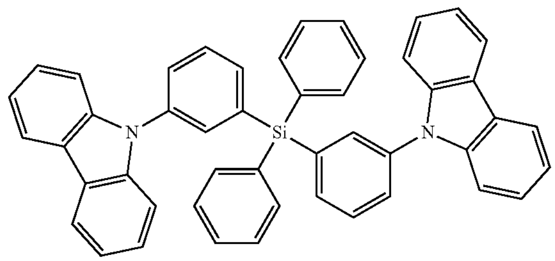
HTH14
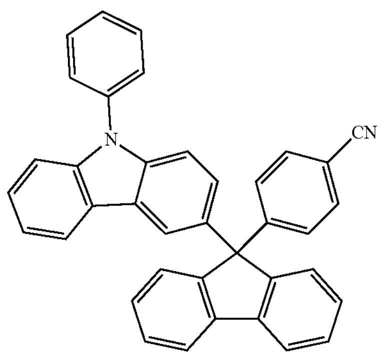
HTH15
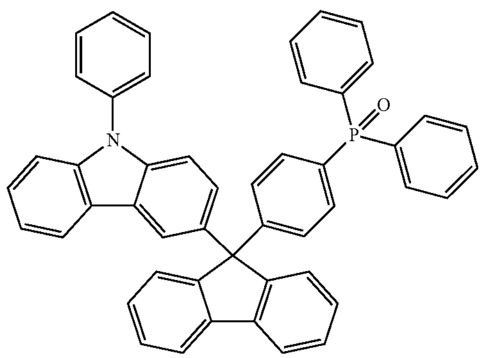
HTH16
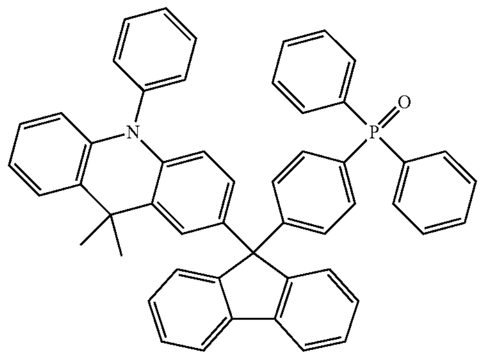
-continued
HTH17
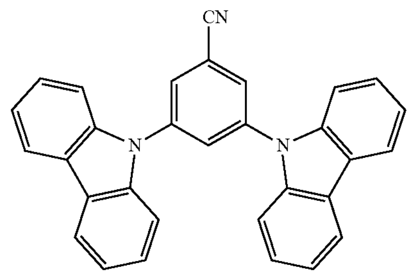
HTH18
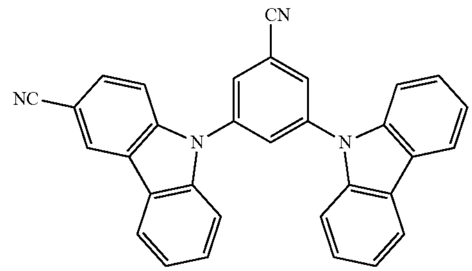
HTH19
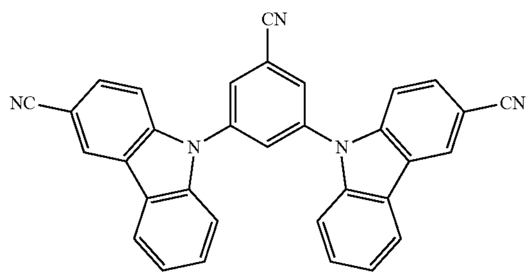
HTH20
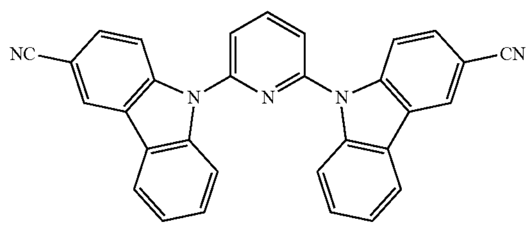
HTH21
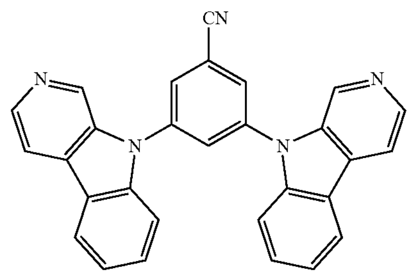
HTH22
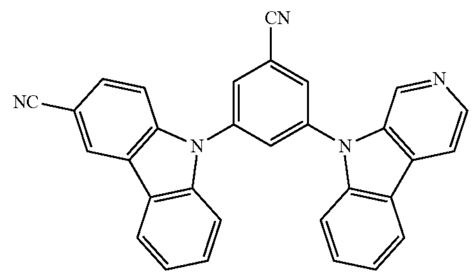

-continued
HTH23
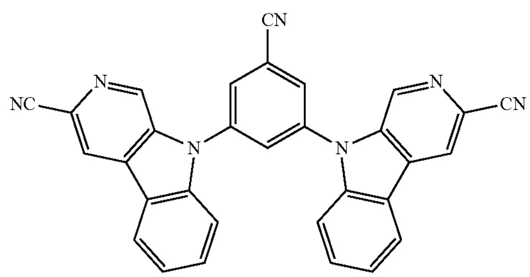
HTH24
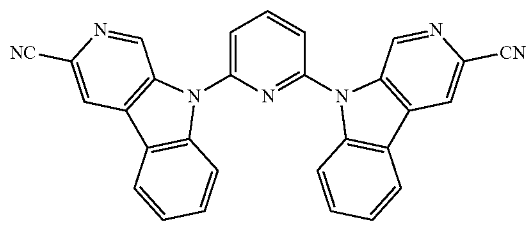
HTH25
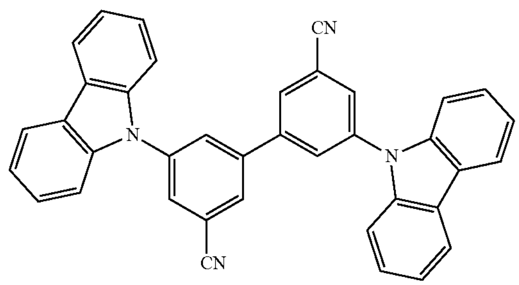
HTH26
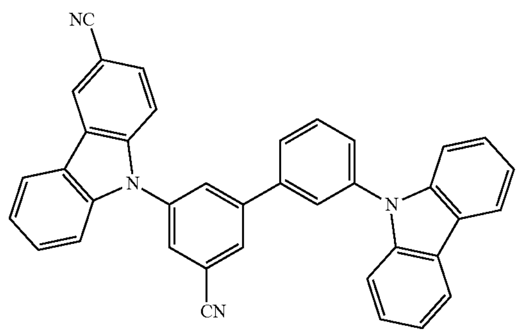
HTH27
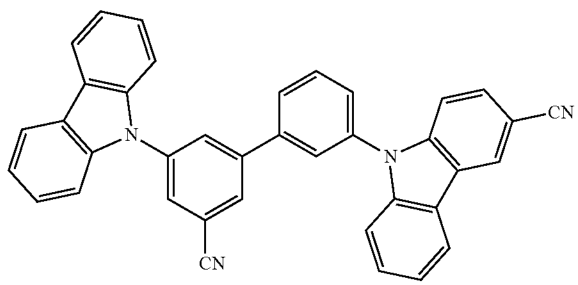
-continued
HTH28
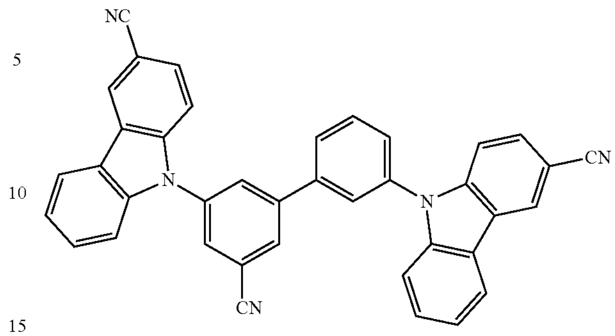
HTH29
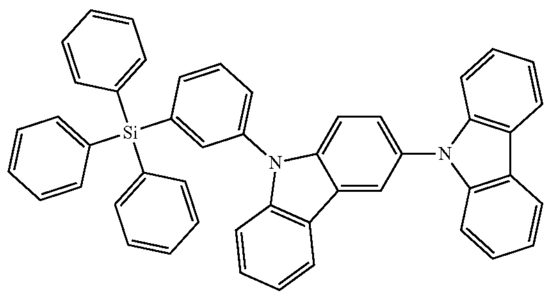
HTH30
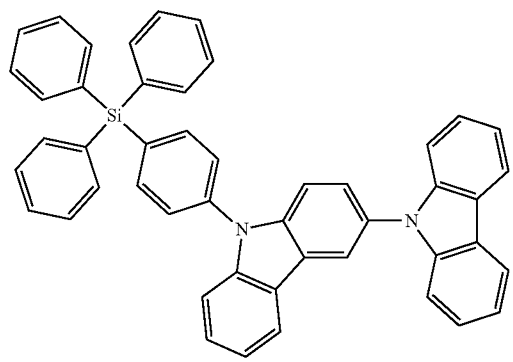
HTH31
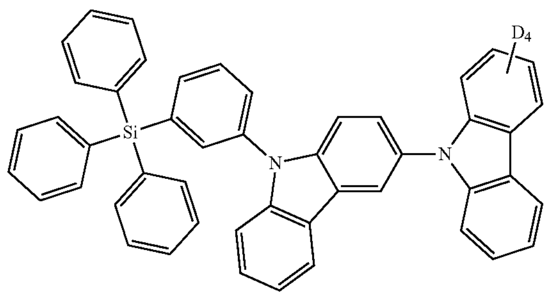

-continued
HTH32
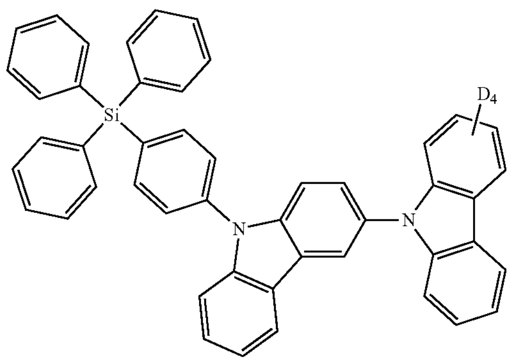
HTH33
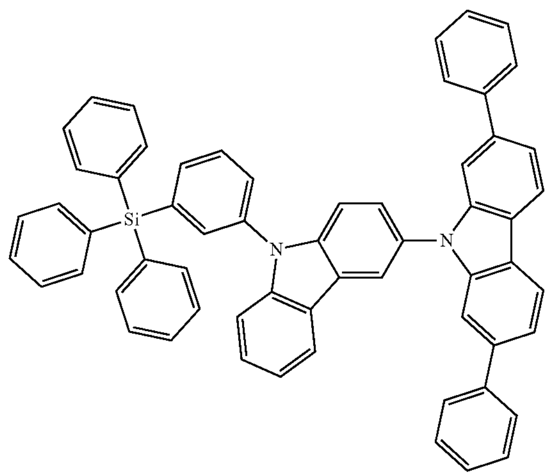
HTH34
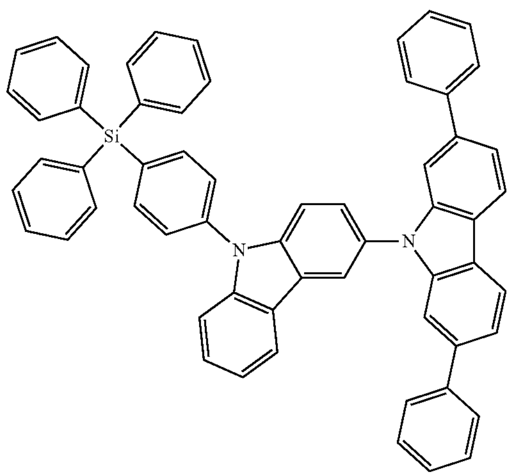
-continued
HTH35
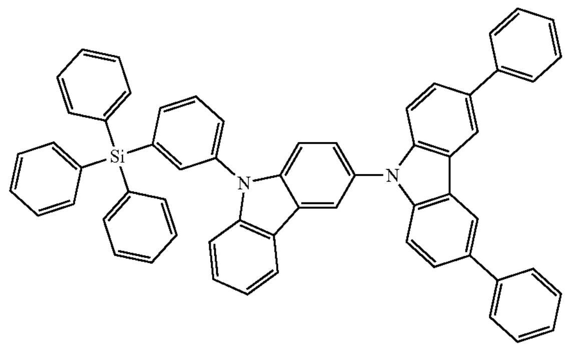
HTH36
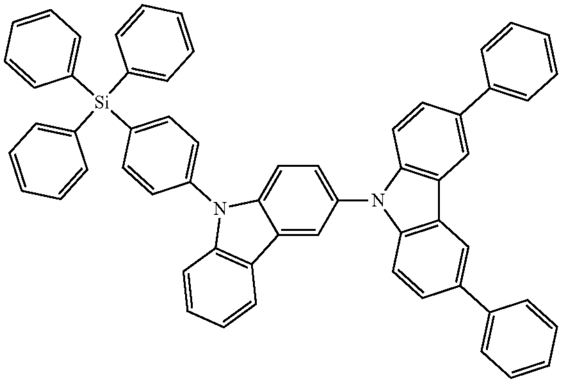
HTH37
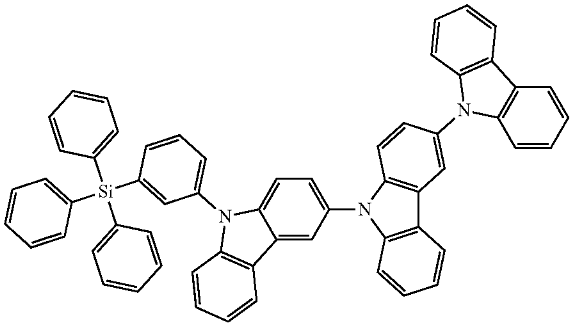
HTH38
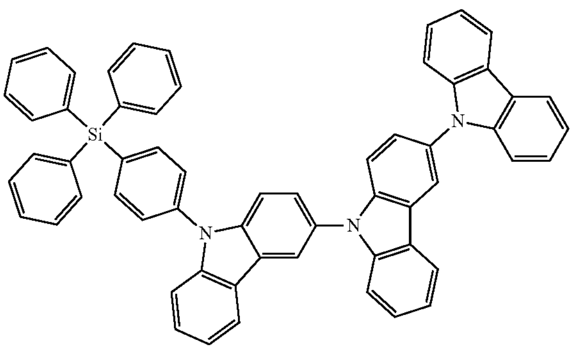

-continued
HTH39
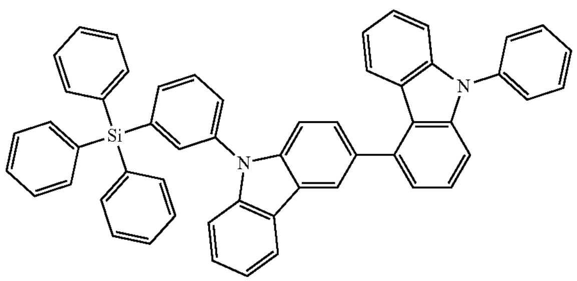
HTH40
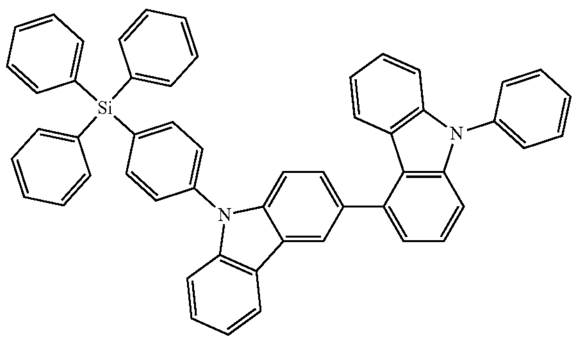
HTH41
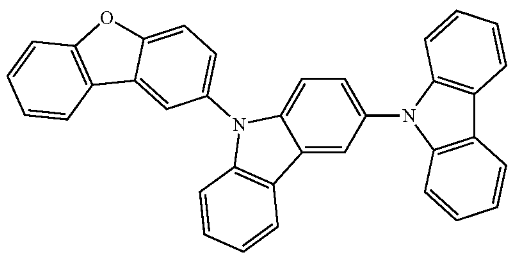
HTH42
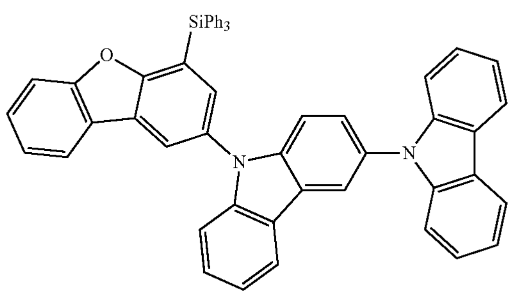
HTH43
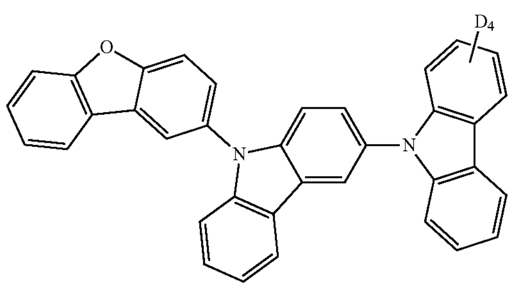
-continued
HTH44
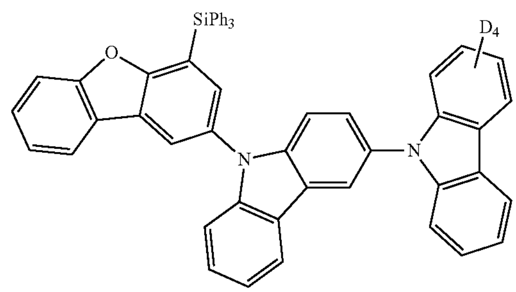
HTH45
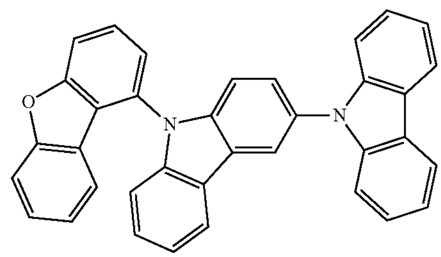
HTH46
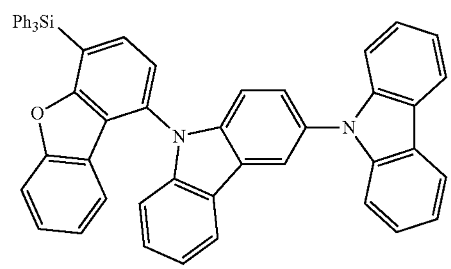
HTH47
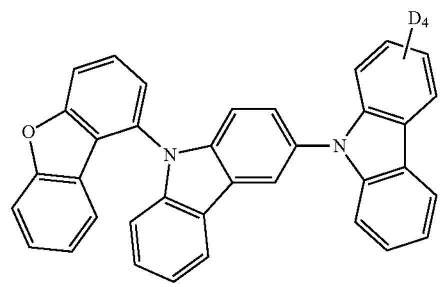
HTH48
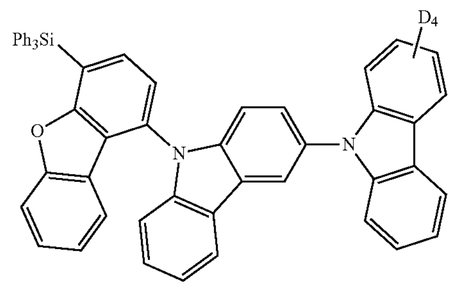

-continued
HTH49
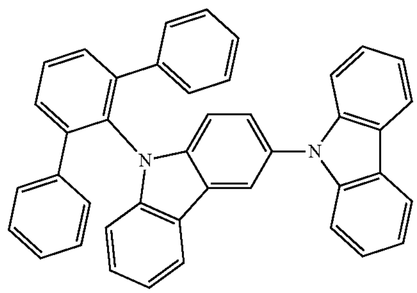
HTH50
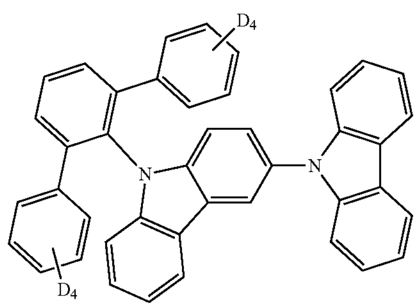
HTH51
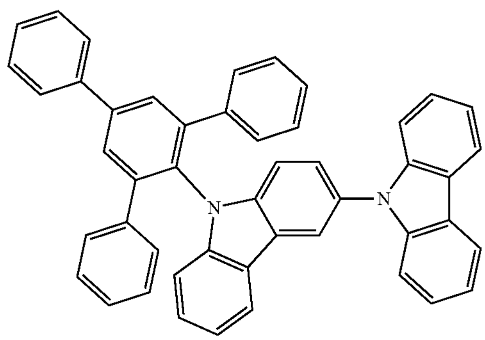
HTH52
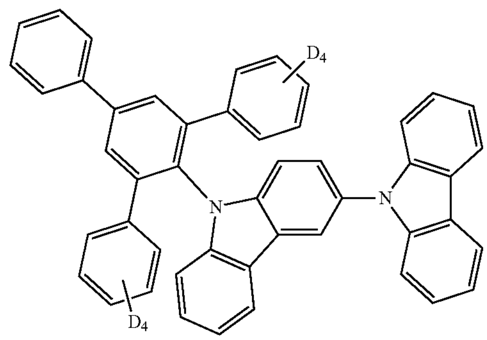
.
In an embodiment, the fourth compound may include at least one of Compounds DFD1 to DFD12:
DFD1
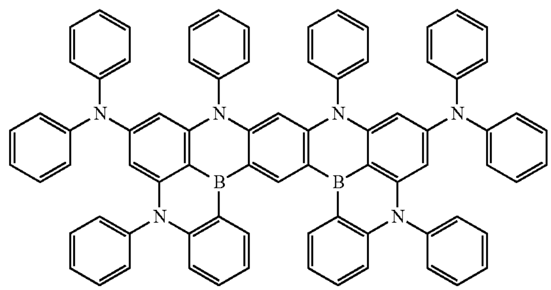
DFD2
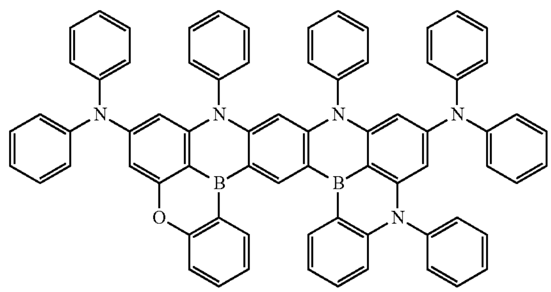
DFD3
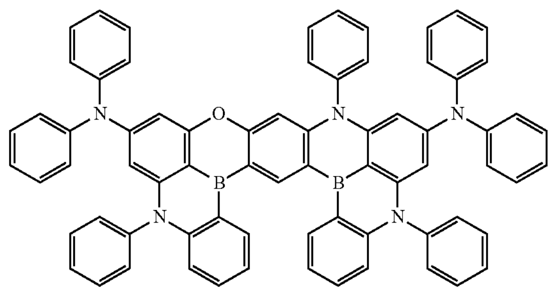
DFD4
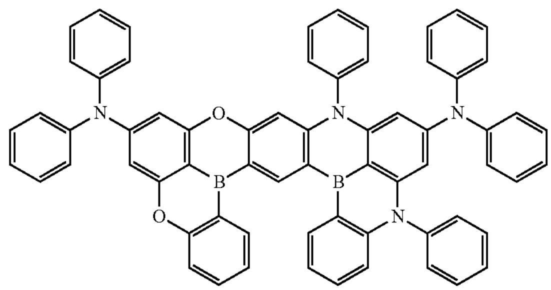
DFD5
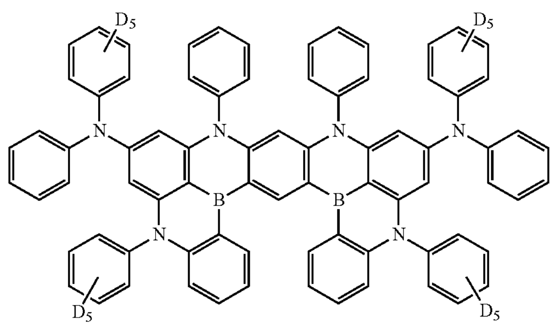

-continued

DFD6

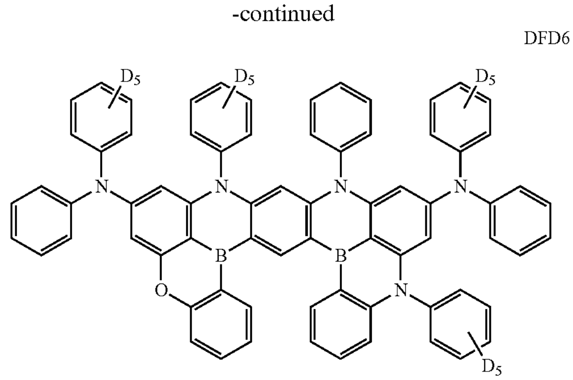

DFD7

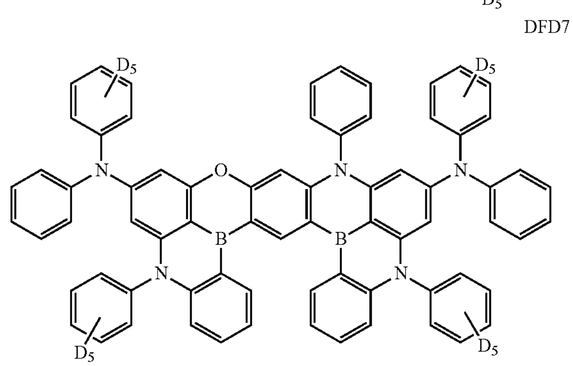

DFD8

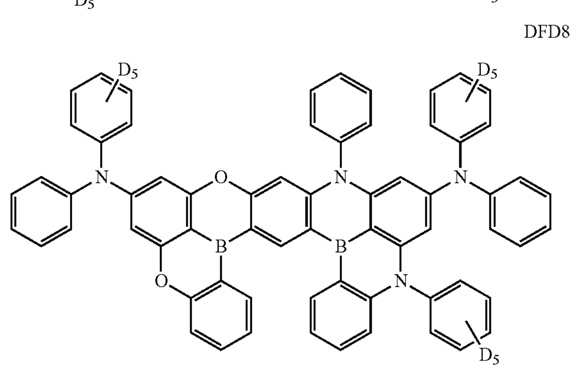

DFD9

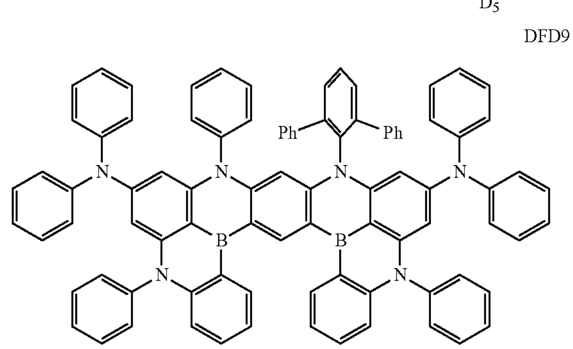

DFD10

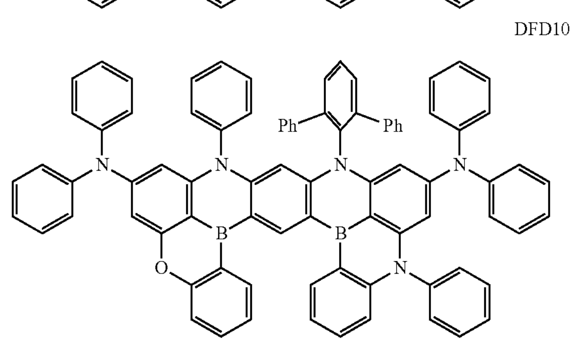

-continued

DFD11

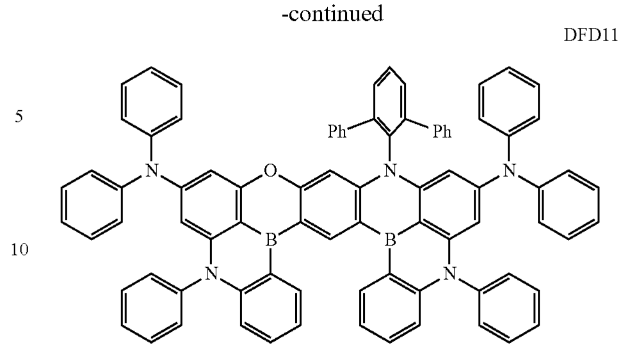

DFD12

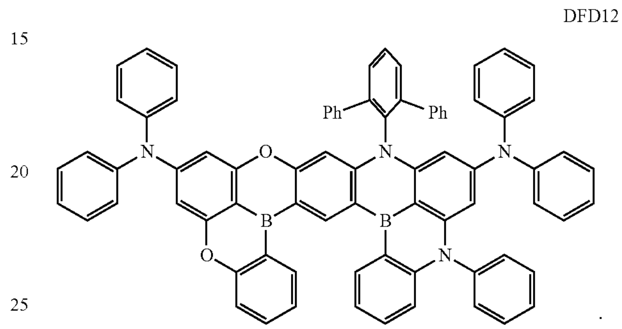

In the above Compounds, "Ph" represents a phenyl group, "$D_5$" represents substitution with five deuterium atoms, and "$D_4$" represents substitution with four deuterium atoms. For example, a group represented by

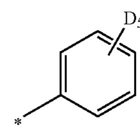

may be identical to a group represented by

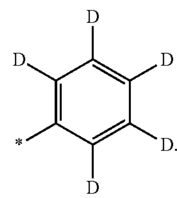

In some embodiments, the light-emitting device may satisfy at least one of Conditions 1 to 4:

Condition 1

Lowest unoccupied molecular orbital (LUMO) energy level (eV) of the third compound>LUMO energy level (eV) of the first compound Condition 2

LUMO energy level (eV) of the first compound>LUMO energy level (eV) of the second compound Condition 3

Highest occupied molecular orbital (HOMO) energy level (eV) of the first compound>HOMO energy level (eV) of the third compound Condition 4

HOMO energy level (eV) of the third compound>HOMO energy level (eV) of the second compound The HOMO and LUMO energy levels of the first compound, the second compound, and the third compound may each be a negative value, and the HOMO and LUMO energy levels may each be an actual measurement value; or a value evaluated according to a density functional theory (DFT) method.

In one or more embodiments, the absolute value of a difference between the LUMO energy level of the first compound and the LUMO energy level of the second compound may be about 0.1 eV or higher and about 1.0 eV or lower, the absolute value of a difference between the LUMO energy level of the first compound and the LUMO energy level of the third compound may be about 0.1 eV or higher and about 1.0 eV or lower, the absolute value of a difference between the HOMO energy level of the first compound and the HOMO energy level of the second compound may be 1.25 eV or lower (e.g., about 1.25 eV or lower and about 0.2 eV or higher), and the absolute value of a difference between the HOMO energy level of the first compound and the HOMO energy level of the third compound may be 1.25 eV or lower (e.g., about 1.25 eV or lower and about 0.2 eV or higher).

When the relationships between LUMO energy level and HOMO energy level satisfy the conditions as described above, the balance between holes and electrons injected into the emission layer may be achieved.

The light-emitting device may have a structure of a first embodiment or a second embodiment. The first embodiment or the second embodiment will now be described in more detail.

Descriptions of First Embodiment

According to the first embodiment, the first compound may be included in an emission layer in an interlayer of a light-emitting device, wherein the emission layer may further include a host, the first compound may be different from the host, and the emission layer may be to emit phosphorescence or fluorescence from the first compound. For example, according to the first embodiment, the first compound may be a dopant or an emitter. In some embodiments, the first compound may be a phosphorescent dopant or a phosphorescence emitter.

Phosphorescence or fluorescence emitted from the first compound may be blue light.

The emission layer may further include an ancillary dopant. The ancillary dopant may serve to improve luminescence efficiency from the first compound by effectively transferring energy to the first compound as a dopant or an emitter.

The ancillary dopant may be different from the first compound and the host.

In some embodiments, the ancillary dopant may be a delayed fluorescence-emitting compound.

In some embodiments, the ancillary dopant may be a compound including at least one cyclic group including boron (B) and nitrogen (N) as ring-forming atoms.

Descriptions of Second Embodiment

According to the second embodiment, the first compound may be included in an emission layer in an interlayer of a light-emitting device, wherein the emission layer may further include a host and a dopant, the first compound may be different from the host and the dopant, and the emission layer may be to emit phosphorescence or fluorescence (e.g., delayed fluorescence) from the dopant.

For example, the first compound in the second embodiment may serve as an ancillary dopant that transfers energy to a dopant (or an emitter), not as a dopant.

In some embodiments, the first compound in the second embodiment may serve as an emitter and as an ancillary dopant that transfers energy to a dopant (or an emitter).

For example, phosphorescence or fluorescence emitted from the dopant (or the emitter) in the second embodiment may be blue phosphorescence or blue fluorescence (e.g., blue delayed fluorescence).

The dopant (or the emitter) in the second embodiment may be any phosphorescent dopant material (e.g., the organometallic compound represented by Formula 1, the organometallic compound represented by Formula 401, or any combination thereof) or any fluorescent dopant material (e.g., the compound represented by Formula 501, the compound represented by Formula 502, the compound represented by Formula 503, or any combination thereof).

In the first embodiment and the second embodiment, the blue light may be blue light having a maximum emission wavelength in a range of about 430 nanometers (nm) to about 490 nm, about 430 nm to about 485 nm, about 440 nm to about 475 nm, or about 455 nm to about 470 nm.

The ancillary dopant in the first embodiment may include, e.g. the fourth compound represented by Formula 502 or Formula 503.

The host in the first embodiment and the second embodiment may be any host material (e.g., the compound represented by Formula 301, the compound represented by Formula 301-1, the compound represented by Formula 301-2, or any combination thereof).

In some embodiments, the host in the first embodiment and the second embodiment may be the second compound, the third compound, or any combination thereof.

In an embodiment, the light-emitting device may further include at least one of a first capping layer located outside the first electrode or a second capping layer located outside the second electrode, and the organometallic compound represented by Formula 1 may be included in at least one of the first capping layer or the second capping layer. More details for the first capping layer and/or second capping layer may each independently be the same as described in the present specification.

In an embodiment, the light-emitting device may further include:

a first capping layer located outside the first electrode and including the organometallic compound represented by Formula 1;

a second capping layer located outside the second electrode and including the organometallic compound represented by Formula 1; or the first capping layer and the second capping layer.

The wording "(interlayer and/or capping layer) includes an organometallic compound represented by Formula 1" as used herein may be understood as "(interlayer and/or capping layer) may include one kind of organometallic compound represented by Formula 1 or two or more different kinds of organometallic compounds, each represented by Formula 1."

For example, the interlayer and/or capping layer may include Compound 1 only as the organometallic compound. In this regard, Compound 1 may be present in the emission layer of the light-emitting device. In one or more embodiments, the interlayer may include, as the organometallic compound, Compound 1 and Compound 2. In this regard, Compound 1 and Compound 2 may be present in substantially the same layer (for example, both Compound 1 and Compound 2 may be present in the emission layer), or may be present in different layers (for example, Compound 1 may be present in the emission layer, and Compound 2 may be present in the electron transport region).

The term "interlayer" as used herein refers to a single layer and/or a plurality of layers located between the first electrode and the second electrode of the light-emitting device.

Description of FIG. 1

FIG. 1 is a schematic cross-sectional view of a light-emitting device 10 according to an embodiment. The light-emitting device 10 includes a first electrode 110, an interlayer 130, and a second electrode 150.

Hereinafter, the structure of the light-emitting device 10 according to an embodiment and a method of manufacturing the light-emitting device 10 will be described with reference to FIG. 1.

First Electrode 110

In FIG. 1, a substrate may be additionally located under the first electrode 110 and/or on the second electrode 150. As the substrate, a glass substrate and/or a plastic substrate may be utilized. In one or more embodiments, the substrate may be a flexible substrate, and may include plastics with excellent or suitable heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high-work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In one or more embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a single-layered structure consisting of a single layer or a multi-layered structure including a plurality of layers. For example, the first electrode 110 may have a three-layered structure of ITO/Ag/ITO.

Interlayer 130

The interlayer 130 may be located on the first electrode 110. The interlayer 130 may include an emission layer.

The interlayer 130 may further include a hole transport region located between the first electrode 110 and the emission layer, and an electron transport region located between the emission layer and the second electrode 150.

The interlayer 130 may further include, in addition to one or more suitable organic materials, a metal-containing compound such as an organometallic compound, an inorganic material such as quantum dots, and/or the like.

In one or more embodiments, the interlayer 130 may include, i) two or more emitting units sequentially stacked between the first electrode 110 and the second electrode 150, and ii) a charge generation layer located between the two or more emitting units. When the interlayer 130 includes two or more emitting units and the charge generation layer as described above, the light-emitting device 10 may be a tandem light-emitting device.

Hole Transport Region in Interlayer 130

The hole transport region may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The hole transport region may include a hole injection layer, a hole transport layer, an emission auxiliary layer, an electron-blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron-blocking layer structure, with the layers of each structure being stacked sequentially from the first electrode 110 in the respective stated order.

The hole transport region may include a compound represented by Formula 201, a compound represented by Formula 202, or any combination thereof:

Formula 201

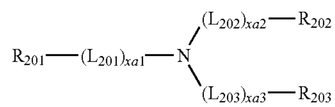

Formula 202

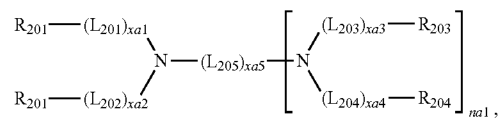

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer selected from 0 to 5, xa5 may be an integer selected from 1 to 10, $R_{201}$ to $R_{204}$ and $Q_{201}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group and/or the like) unsubstituted or substituted with at least one $R_{10a}$ (for example, Compound HT16), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer selected from 1 to 4.

For example, each of Formulae 201 and 202 may include at least one of the groups represented by Formulae $CY_{201}$ to $CY_{217}$.

CY201

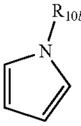

CY202

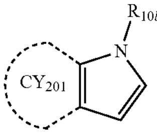

CY203

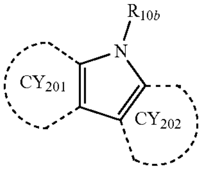

CY204

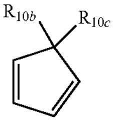

CY205

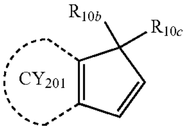

CY206

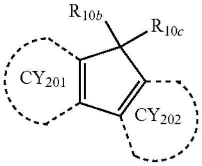

CY207

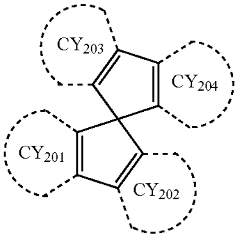

CY208

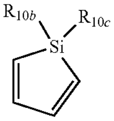

-continued

CY209

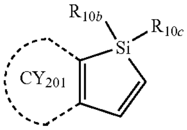

CY210

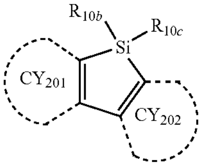

CY211

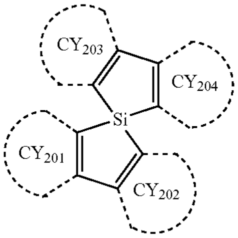

CY212

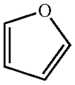

CY213

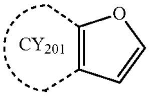

CY214

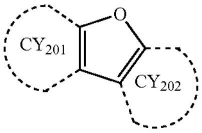

CY215

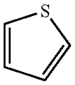

CY216

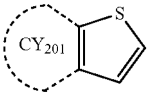

CY217

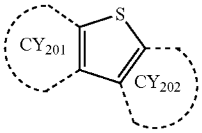

In Formulae $CY_{201}$ to $CY_{217}$, $R_{10b}$ and $R_{10c}$ may each independently be the same as described with respect to $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae $CY_{201}$ to $CY_{217}$ may be unsubstituted or substituted with $R_{10a}$ as described above.

In an embodiment, ring $CY_{201}$ to ring $CY_{204}$ in Formulae $CY_{201}$ to $CY_{217}$ may each independently be a benzene group, a naphthalene group, a phenanthrene group, or an anthracene group.

In one or more embodiments, each of Formulae 201 and 202 may include at least one of the groups represented by Formulae $CY_{201}$ to $CY_{203}$.

In one or more embodiments, Formula 201 may include at least one of the groups represented by Formulae $CY_{201}$ to $CY_{203}$ and at least one of the groups represented by Formulae $CY_{204}$ to $CY_{217}$.

In one or more embodiments, in Formula 201, xa1 may be 1, $R_{201}$ may be a group represented by one of Formulae $CY_{201}$ to $CY_{203}$, xa2 may be 0, and $R_{202}$ may be a group represented by one of Formulae $CY_{204}$ to $CY_{207}$.

In one or more embodiments, each of Formulae 201 and 202 may not include (e.g., may exclude) any of the groups represented by Formulae CY201 to CY203.

In one or more embodiments, each of Formulae 201 and 202 may not include (e.g., may exclude) any of the groups represented by Formulae CY201 to CY203, and may include at least one of the groups represented by Formulae CY204 to CY217.

In one or more embodiments, each of Formulae 201 and 202 may not include (e.g., may exclude) any of the groups represented by Formulae CY201 to CY217.

In an embodiment, the hole transport region may include at least one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris (N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1

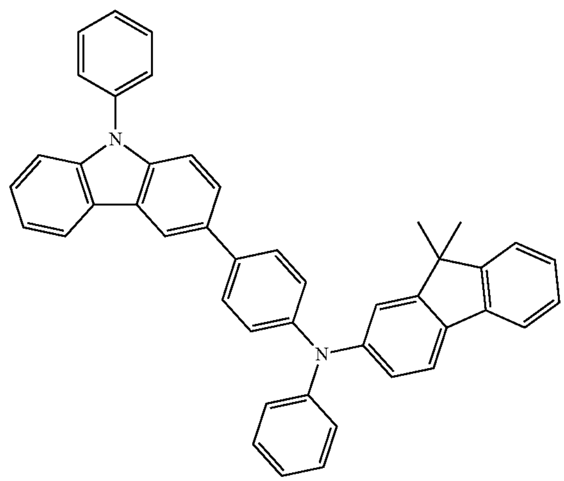

-continued

HT2

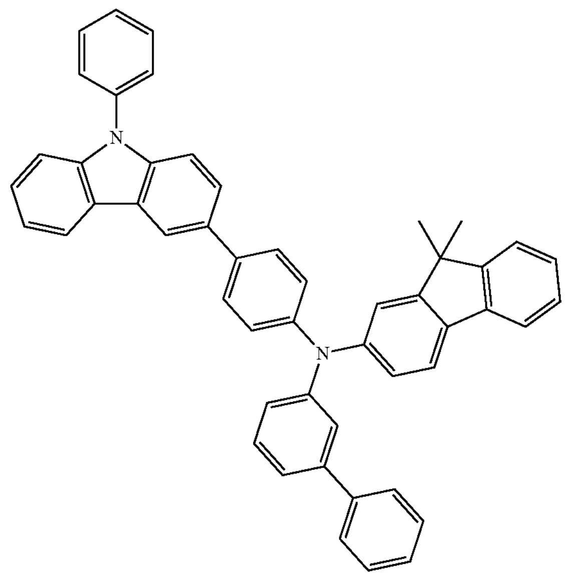

HT3

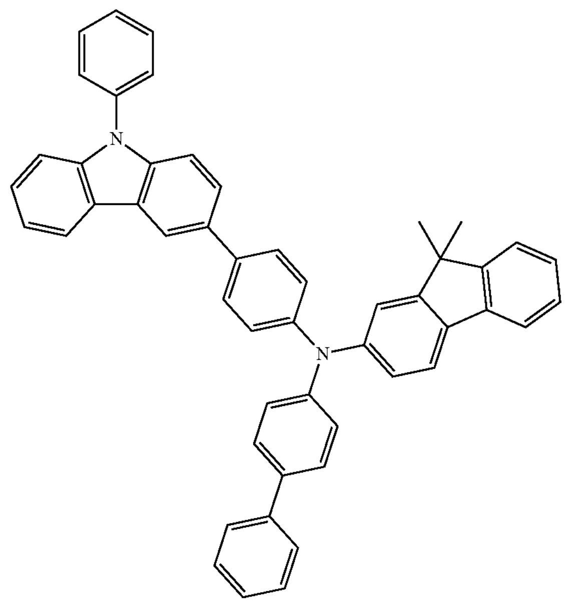

-continued
HT4
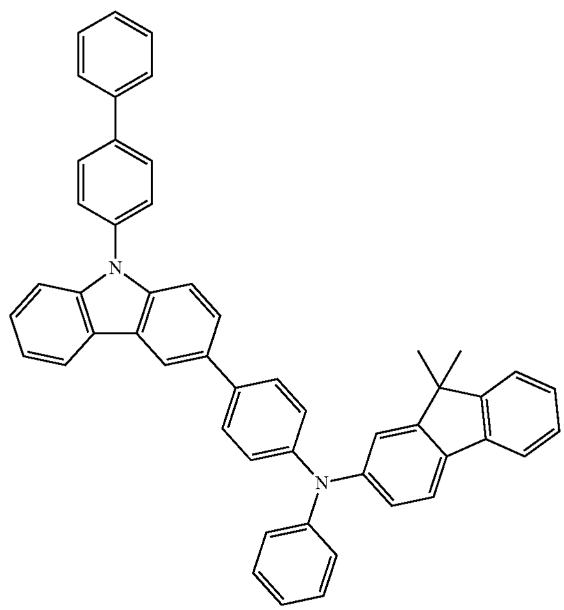
HT5
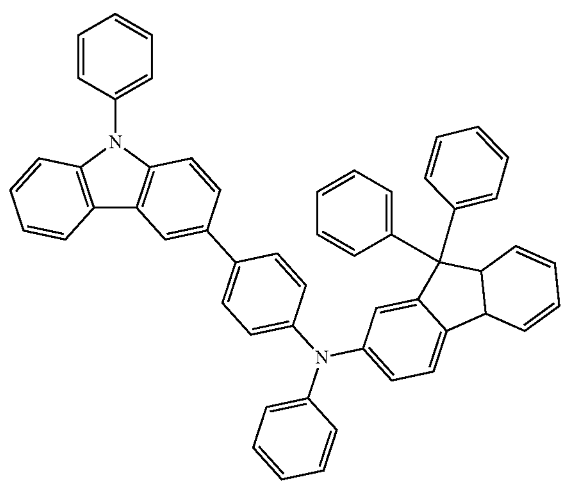
-continued
HT6
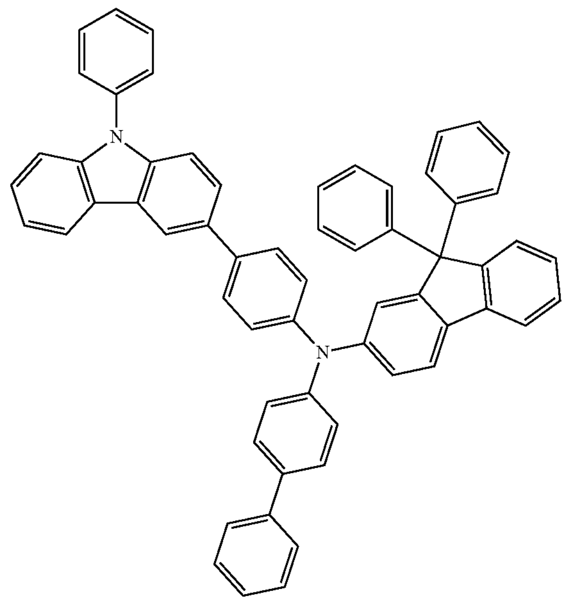
HT7
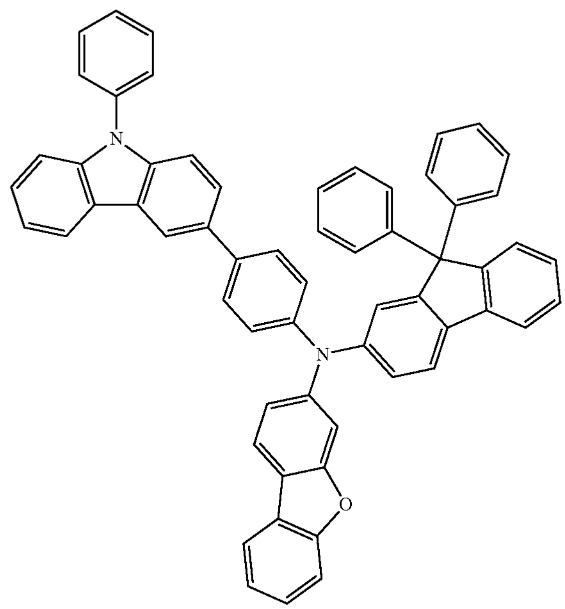

-continued
HT8
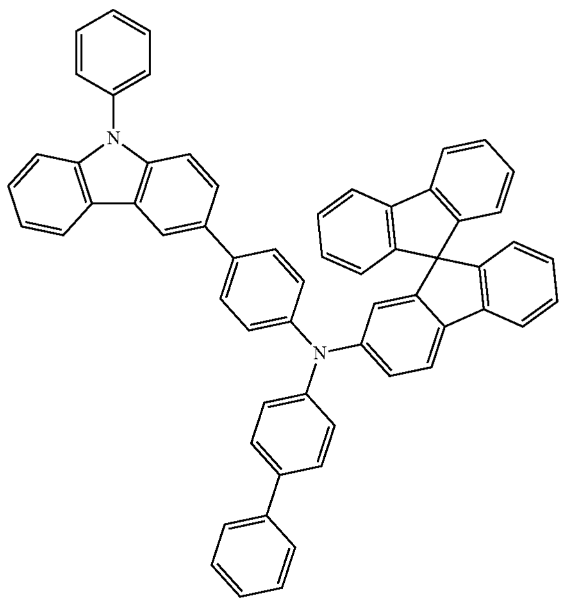
HT9
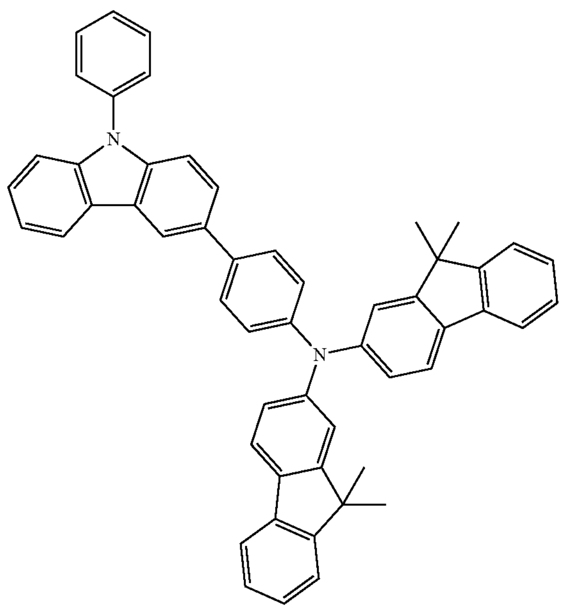
-continued
HT10
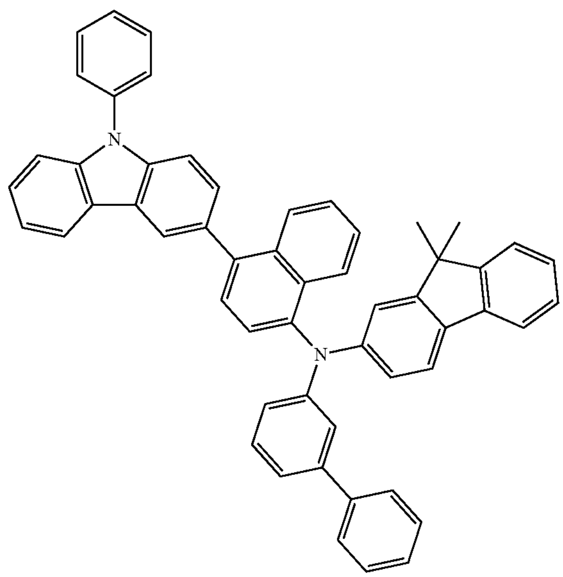
HT11
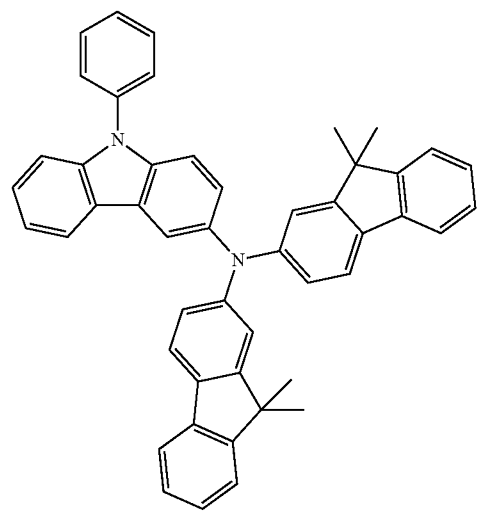
HT12
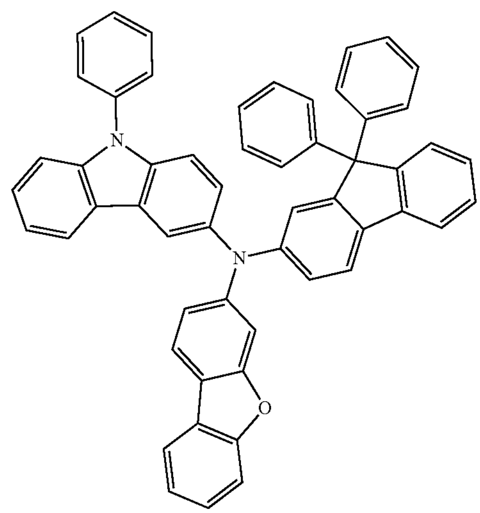

-continued
HT13
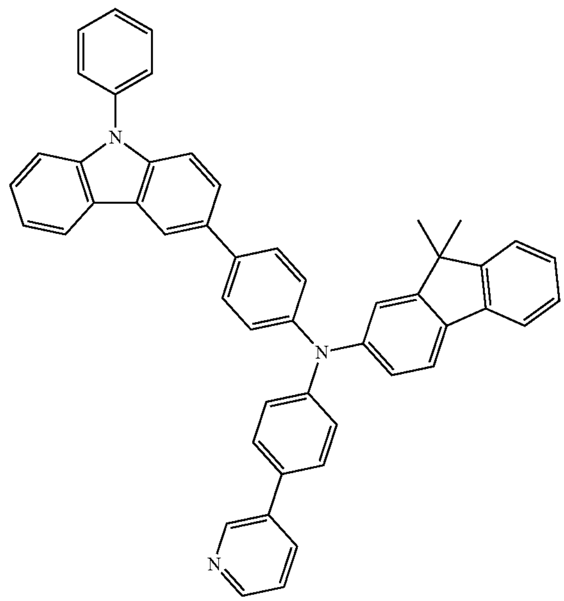
HT14
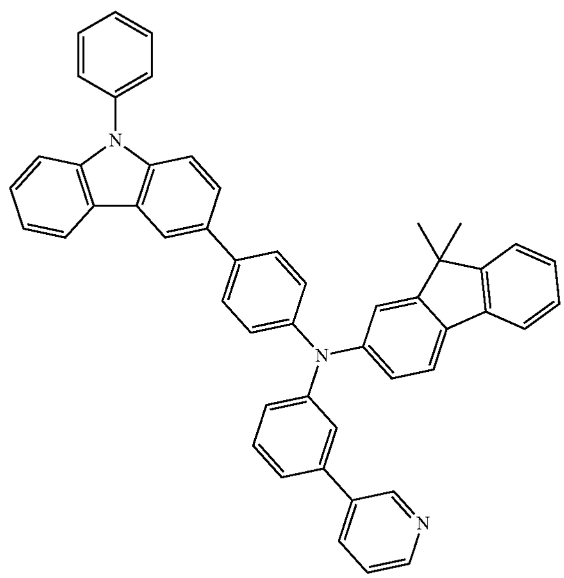
-continued
HT15
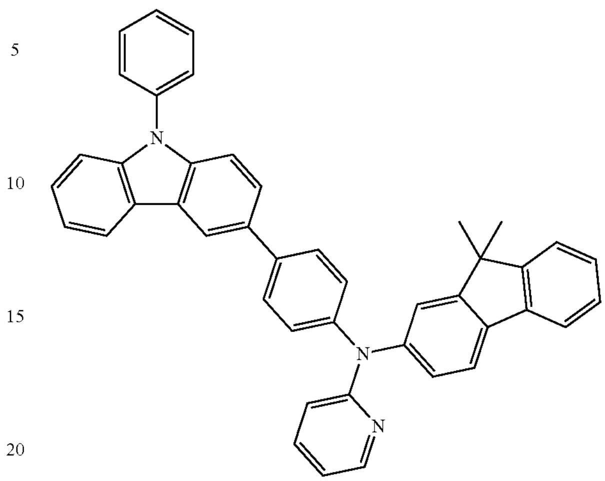
HT16
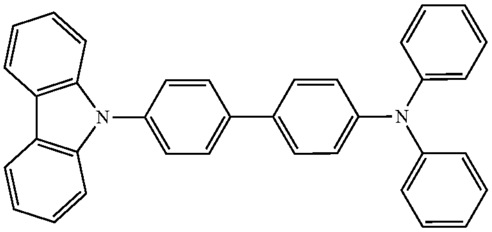
HT17
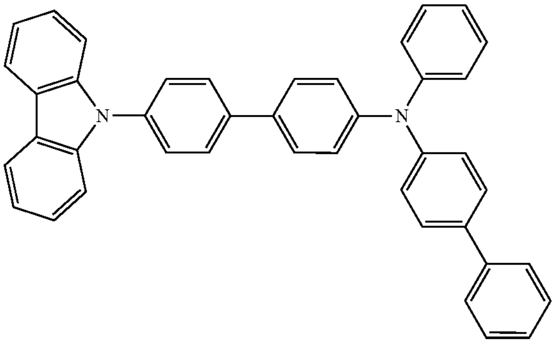
HT18
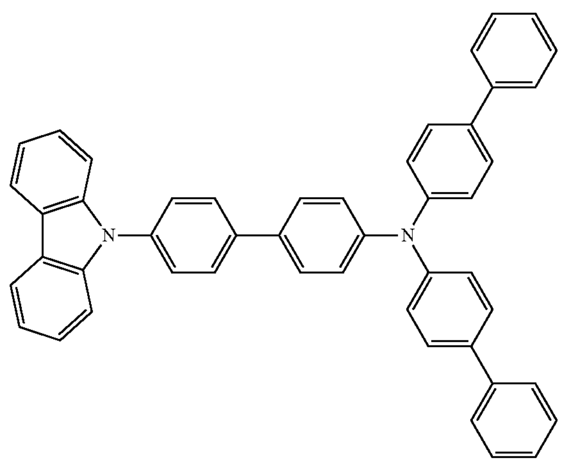

-continued
HT19
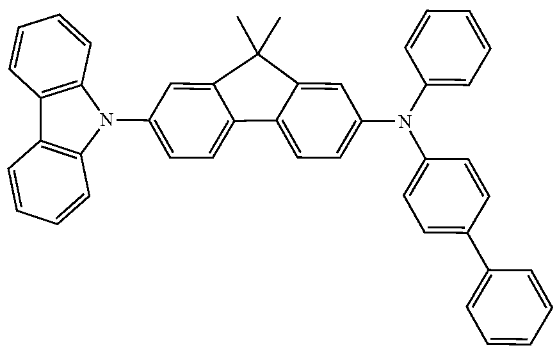
HT20
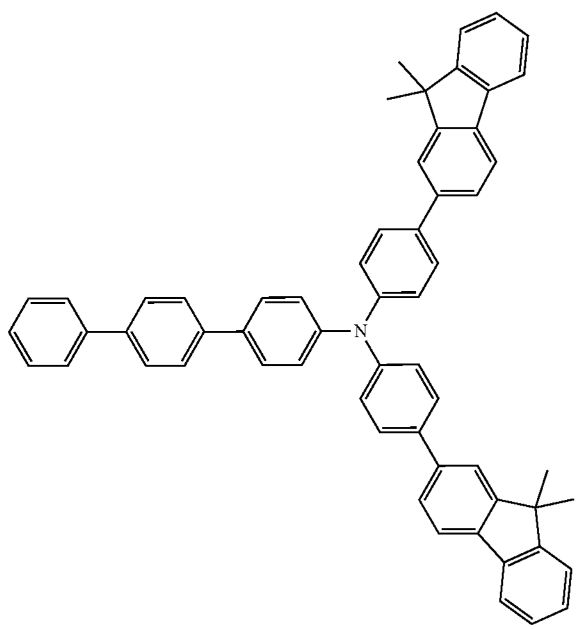
HT21
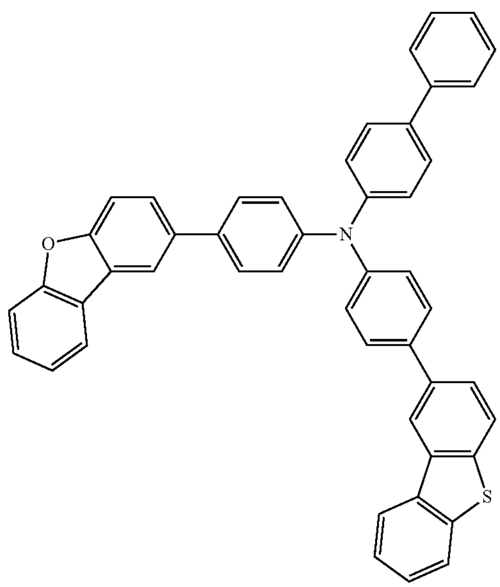
-continued
HT22
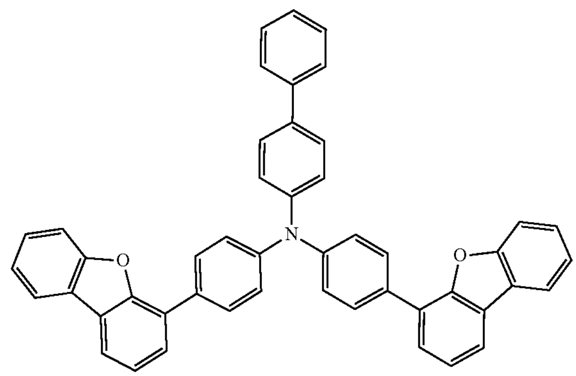
HT23
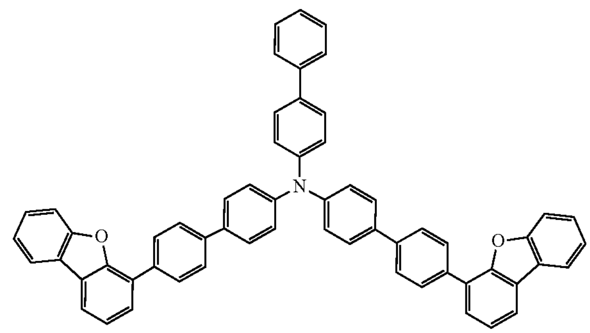
HT24
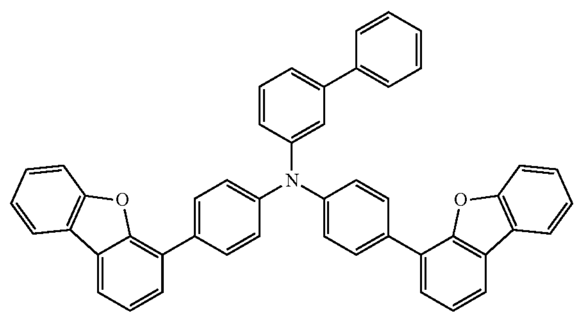

-continued
HT25
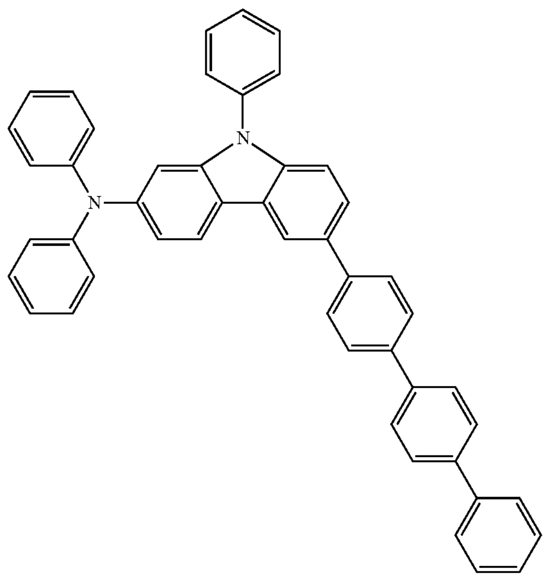
HT26
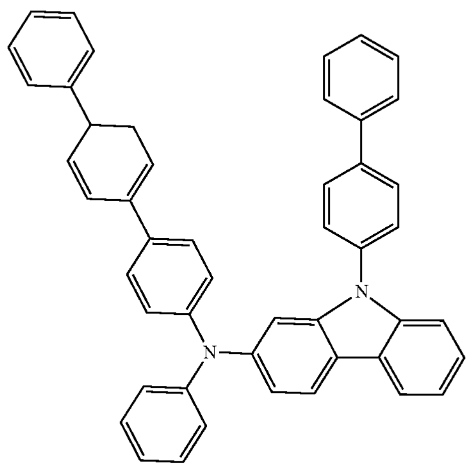
HT27
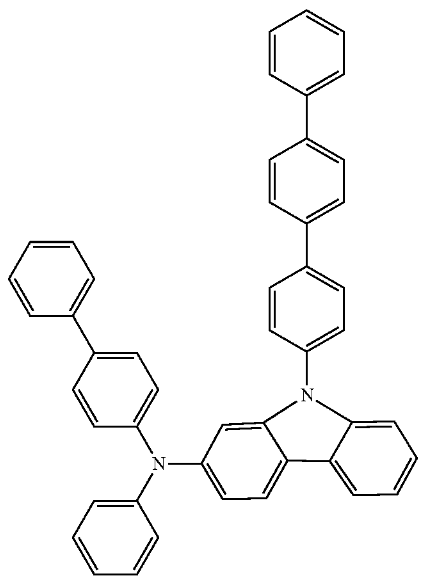
-continued
HT28
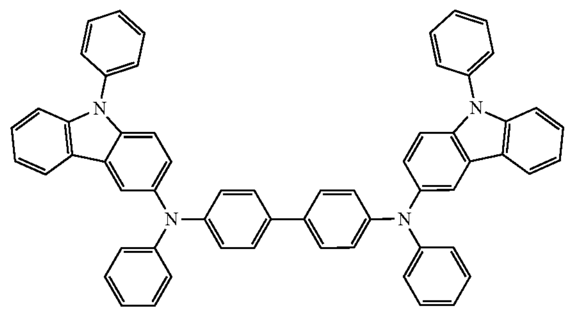
HT29
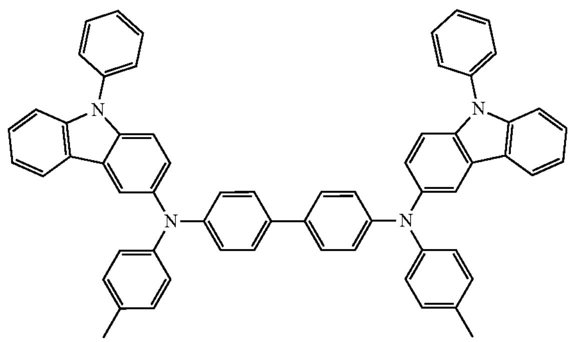
HT30
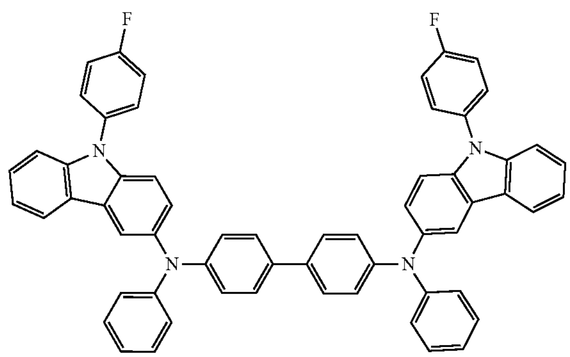
HT31
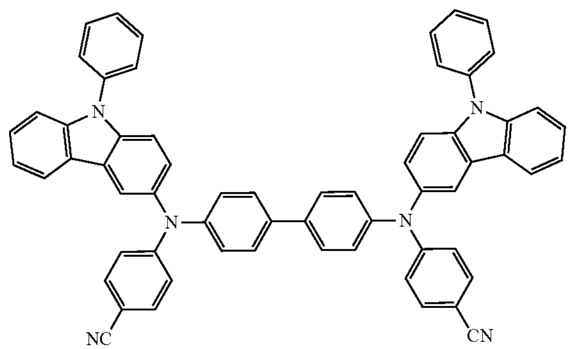

-continued
HT32
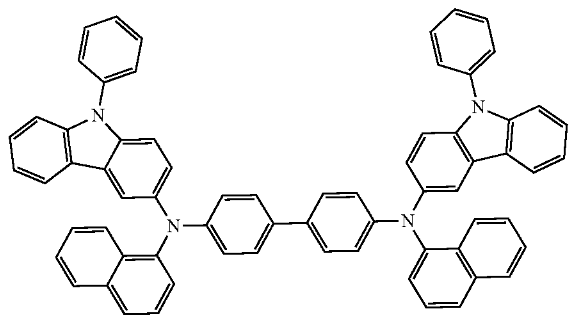
HT33
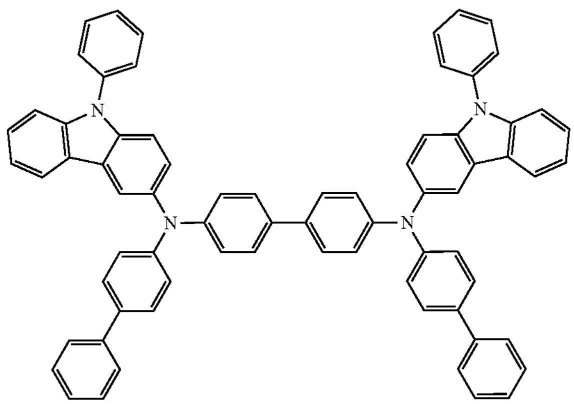
HT34
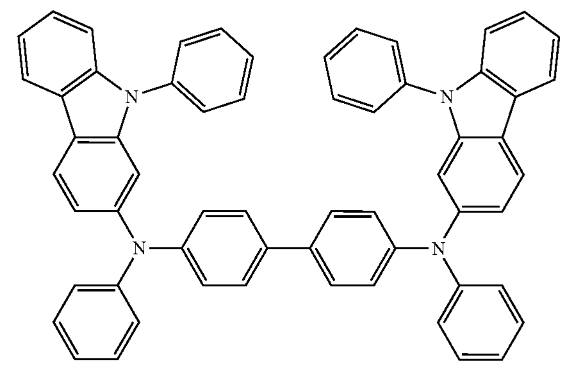
-continued
HT35
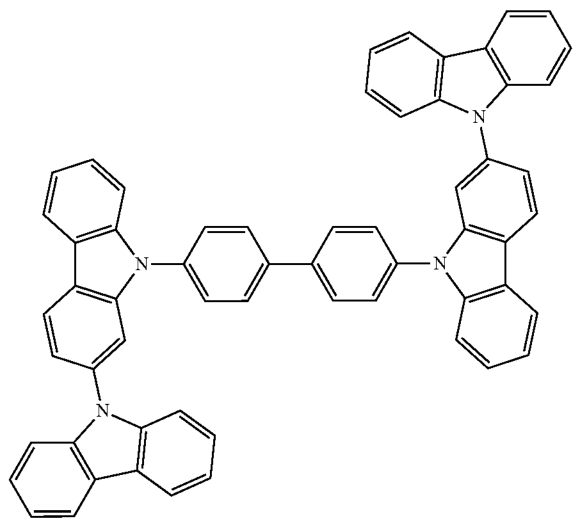
HT36
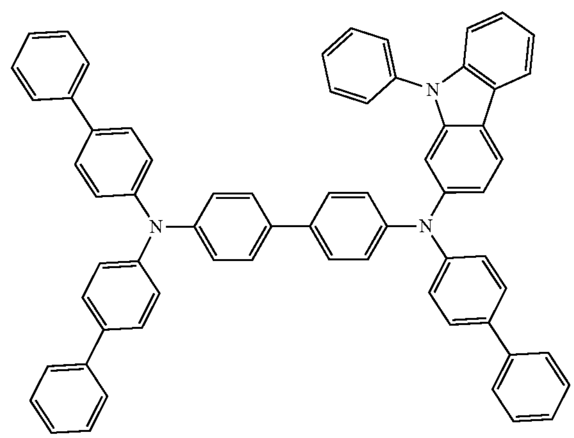
HT37
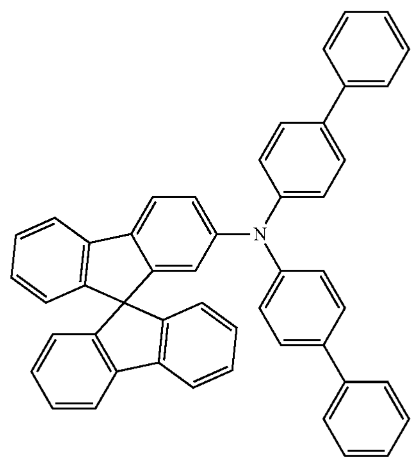

-continued
HT38
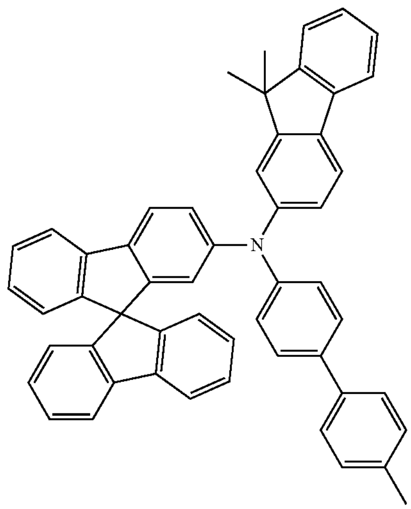
HT39
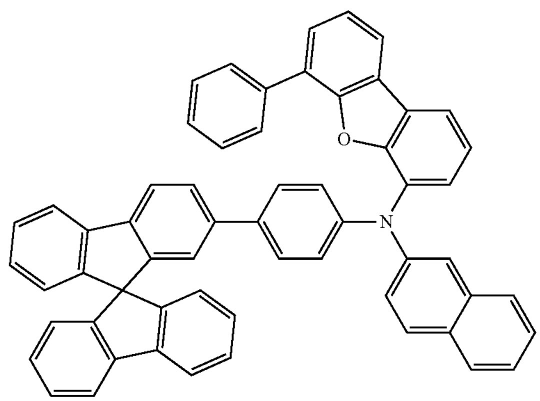
HT40
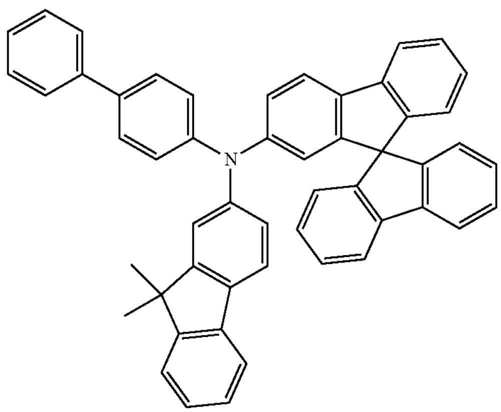
-continued
HT41
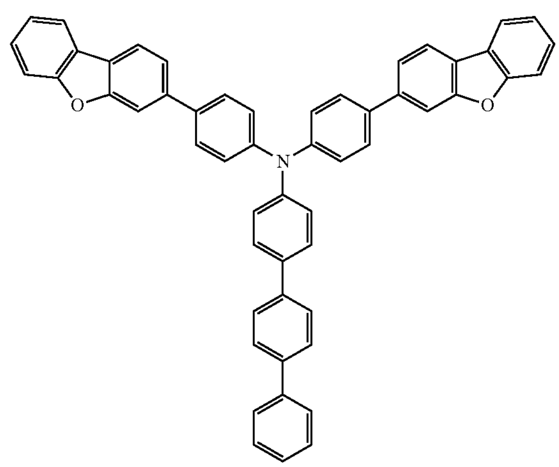
HT42
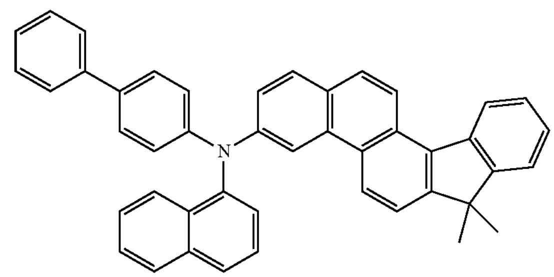
HT43
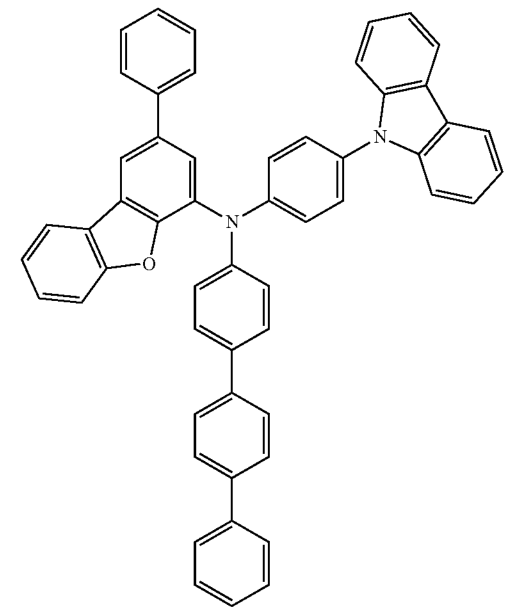

-continued
HT44
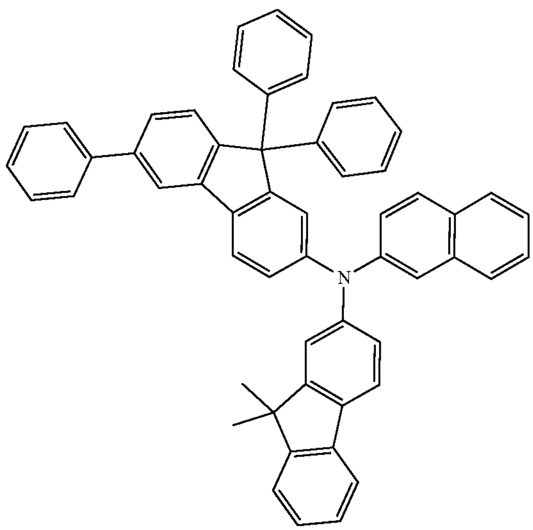
HT45
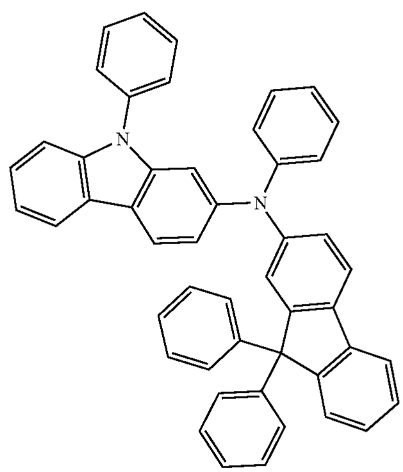
HT46
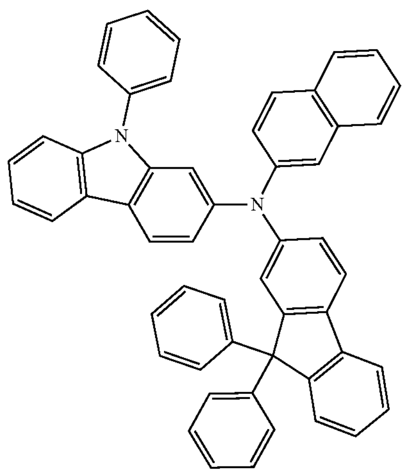
-continued
m-MTDATA
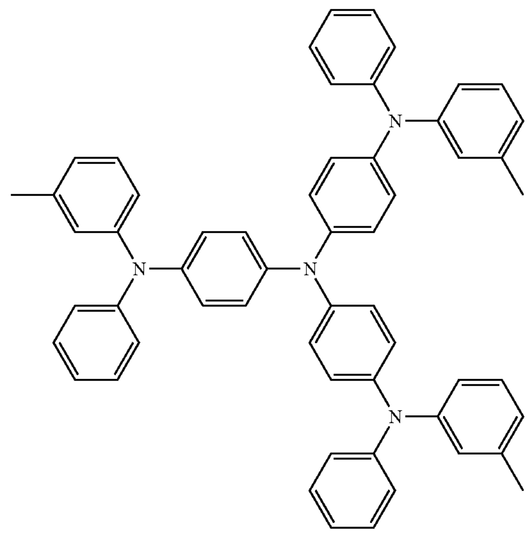
TDATA
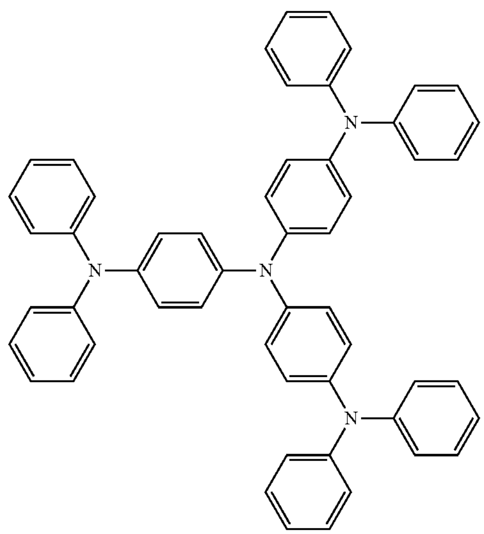
2-TNATA
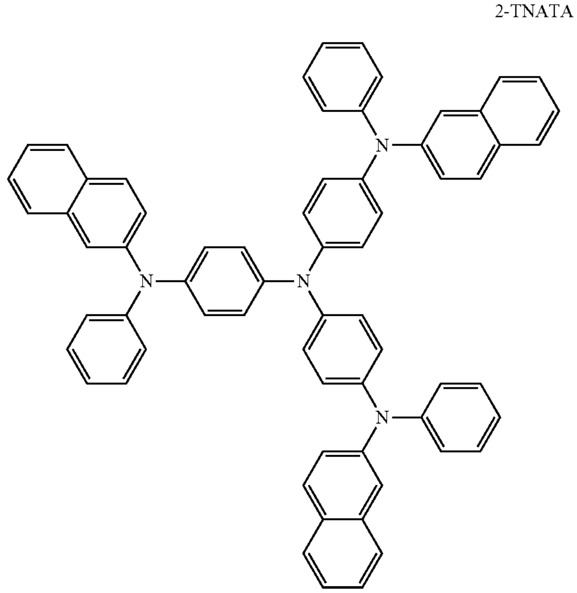

-continued

NPB

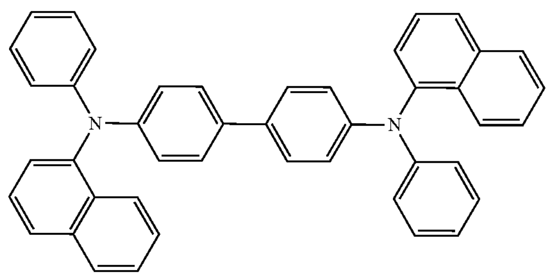

β-NPB

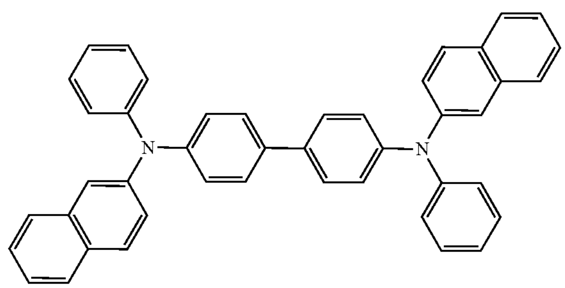

TPD

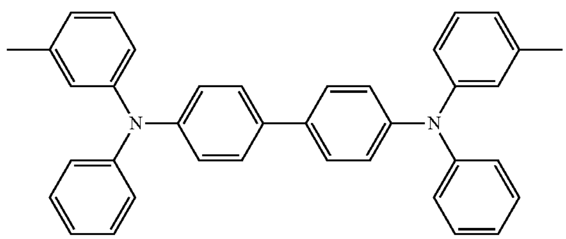

Spiro-TPD

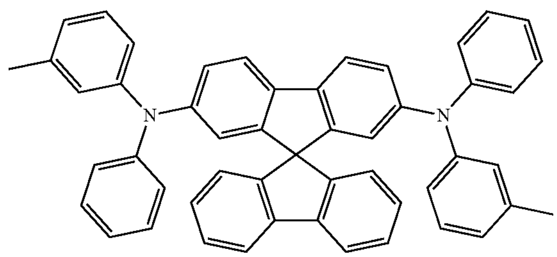

Spiro-NPB

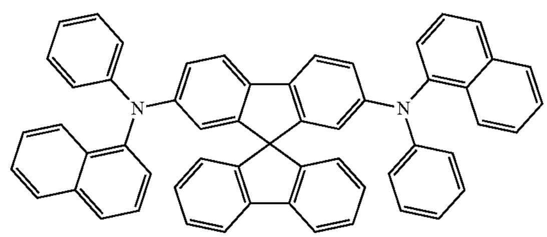

-continued methylated NPB

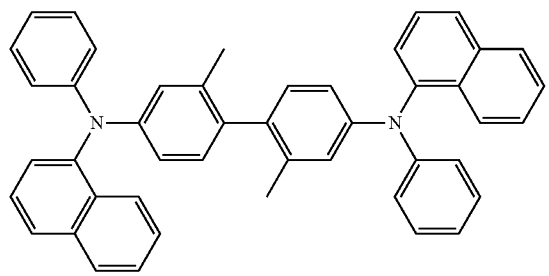

TAPC

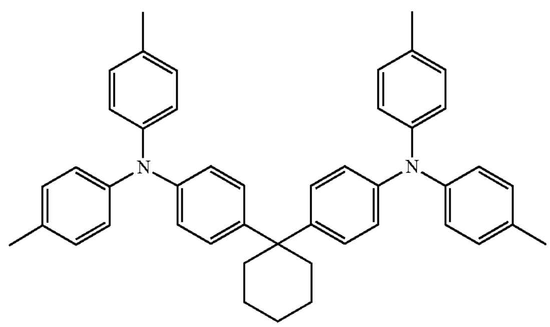

HMTPD

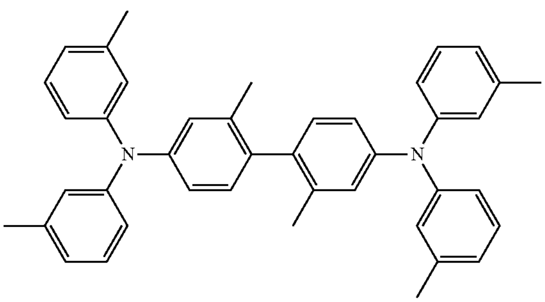

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by the emission layer, and the electron-blocking layer may block or reduce the leakage of electrons from the emission layer to a hole transport region. Materials that may be included in the hole transport region may be included in the emission auxiliary layer and the electron-blocking layer.

p-Dopant

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

For example, the lowest unoccupied molecular orbital (LUMO) energy level of the p-dopant may be −3.5 eV or less.

In one or more embodiments, the p-dopant may include a quinone derivative, a cyano group-containing compound, a compound including element EL1 and element EL2 (to be described in more detail below), or any combination thereof.

Examples of the quinone derivative may include (e.g., may be) TCNQ, F4-TCNQ, etc.

Examples of the cyano group-containing compound may include (e.g., may be) HAT-CN, and a compound represented by Formula 221.

Formula 221

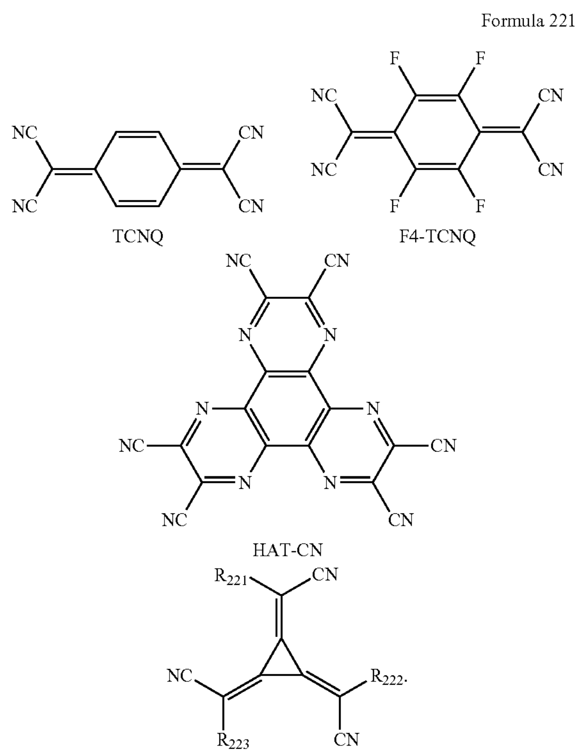

TCNQ

F4-TCNQ

HAT-CN

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be a metal, a metalloid, or any combination thereof, and element EL2 may be a non-metal, a metalloid, or any combination thereof.

Examples of the metal may include (e.g., may be) an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include (e.g., may be) silicon (Si), antimony (Sb), and tellurium (Te).

Examples of the non-metal may include (e.g., may be) oxygen (O) and halogen (for example, F, Cl, Br, I, etc.).

Examples of the compound including element EL1 and element EL2 may include (e.g., may be) a metal oxide, a metal halide (for example, a metal fluoride, a metal chloride, a metal bromide, and/or a metal iodide), a metalloid halide (for example, a metalloid fluoride, a metalloid chloride, a metalloid bromide, and/or a metalloid iodide), a metal telluride, or any combination thereof.

Examples of the metal oxide may include (e.g., may be) tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide may include (e.g., may be) an alkali metal halide, an alkaline earth metal halide, a transition metal halide, a post-transition metal halide, and a lanthanide metal halide.

Examples of the alkali metal halide may include (e.g., may be) LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include (e.g., may be) $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $Sr_{12}$, and $BaI_2$.

Examples of the transition metal halide may include (e.g., may be) titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), ferrous halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), cuprous halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Examples of the post-transition metal halide may include (e.g., may be) zinc halide (for example, $ZnF_2$, $ZnCl_2$, $ZnBr_2$, $ZnI_2$, etc.), indium halide (for example, $InI_3$, etc.), and tin halide (for example, $SnI_2$, etc.).

Examples of the lanthanide metal halide may include (e.g., may be) YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

An example of the metalloid halide may include (e.g., may be) antimony halide (for example, $SbCl_5$, etc.).

Examples of the metal telluride may include (e.g., may be) an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers of a red emission layer, a green emission layer, and a blue emission layer, in which the two or more layers contact each other or are separated from each other to emit white light. In one or more embodiments, the emission layer may include two or more materials of a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

The amount of the dopant in the emission layer may be from about 0.01 part by weight to about 15 parts by weight based on 100 parts by weight of the host.

In one or more embodiments, the emission layer may include a quantum dot.

In some embodiments, the emission layer may include a delayed fluorescence material. The delayed fluorescence material may act (e.g., serve) as a host or a dopant in the emission layer.

A thickness of the emission layer may be in a range of about 100 Å to about 1,000 Å, for example, about 200 Å to about 600 Å. When the thickness of the emission layer is within these ranges, excellent or suitable light-emission characteristics may be obtained without a substantial increase in driving voltage.

Host

In one or more embodiments, the host may include a compound represented by Formula 301:

Formula 301

$$[Ar_{301}]_{xb11}-[(L_{301})_{xb1}-R_{301}]_{xb21},$$

In Formula 301, $Ar_{301}$ and $L_{301}$ may each independently be a $C_3$-$C_{60}$ carbocyclic group unsubstituted or substituted with at least one $R_{10a}$ or a $C_1$-$C_6$ heterocyclic group unsubstituted or substituted with at least one $R_{10a}$, xb11 may be 1, 2, or 3, xb1 may be an integer selected from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer selected from 1 to 5, and $Q_{301}$ to $Q_{303}$ may each independently be the same as described herein with respect to $Q_1$.

For example, when xb11 in Formula 301 is 2 or more, two or more of $Ar_{301}$(s) may be linked to each other via a single bond.

In one or more embodiments, the host may include a compound represented by Formula 301-1, a compound represented by Formula 301-2, or any combination thereof:

Formula 301-1

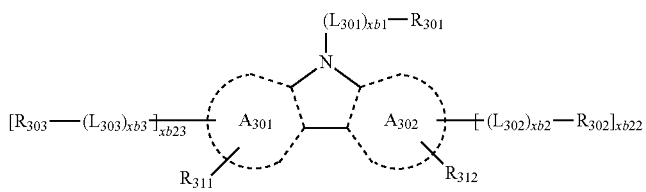

-continued

Formula 301-2

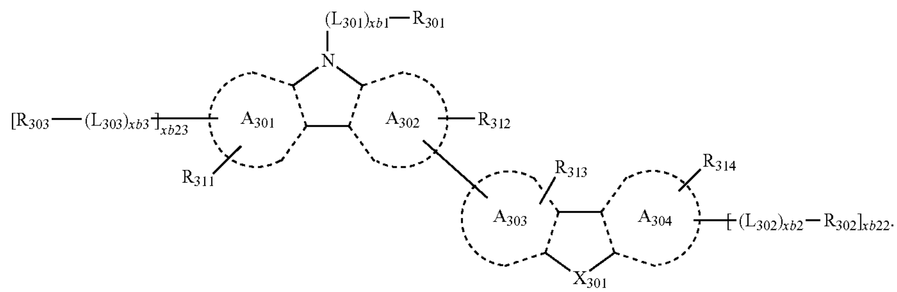

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, $N[(L_{304})_{xb4}$-$R_{304}]$, $C(R_{304})(R_{305})$, or $Si(R_{304})(R_{305})$, xb22 and xb23 may each independently be 0, 1, or 2, $L_{301}$, xb1, and $R_{301}$ may each be the same as described herein, $L_{302}$ to $L_{304}$ may each independently be the same as described herein with respect to with $L_{301}$, xb2 to xb4 may each independently be the same as described herein with respect to xb1, and $R_{302}$ to $R_{305}$ and $R_{311}$ to $R_{314}$ may each independently be the same as described herein with respect to $R_{301}$.

In one or more embodiments, the host may include an alkaline earth metal complex, a post-transition metal complex, or any combination thereof. For example, the host may include a Be complex (for example, Compound H55), an Mg complex, a Zn complex, or any combination thereof.

In an embodiment, the host may include at least one of Compounds H1 to H124, 9,10-di(2-naphthyl)anthracene (ADN), 2-methyl-9,10-bis(naphthalen-2-yl)anthracene (MADN), 9,10-di(2-naphthyl)-2-t-butyl-anthracene (TBADN), 4,4'-bis(N-carbazolyl)-1,1'-biphenyl (CBP), 1,3-di(9-carbazolyl)benzene (mCP), 1,3,5-tri(carbazol-9-yl) benzene (TCP), or any combination thereof:

H1

H2

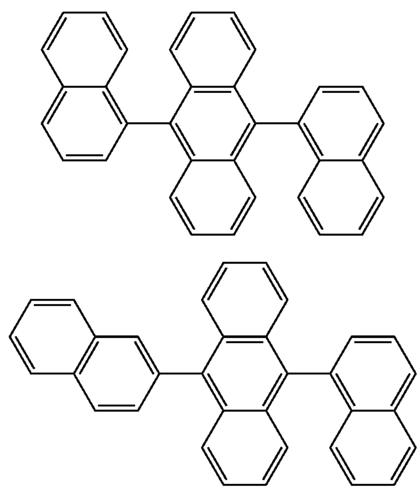

-continued

H3

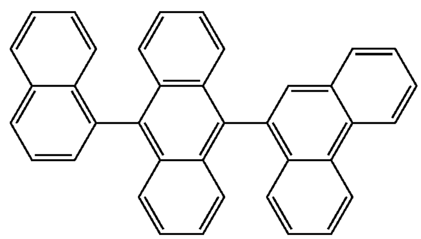

H4

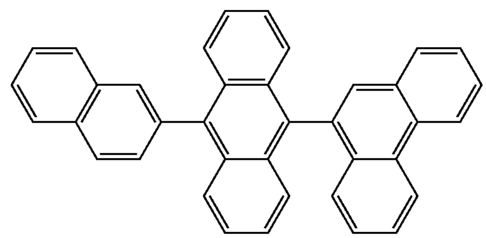

H5

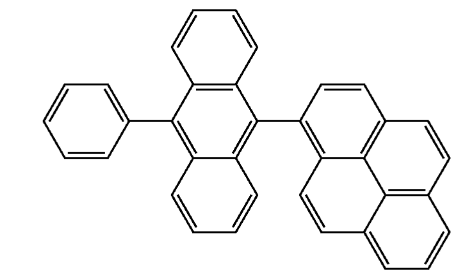

H6

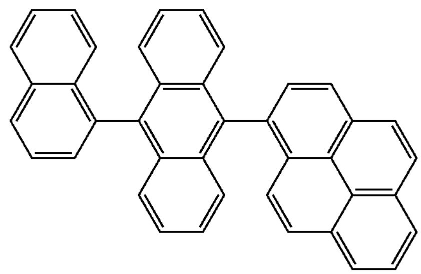

-continued
H7
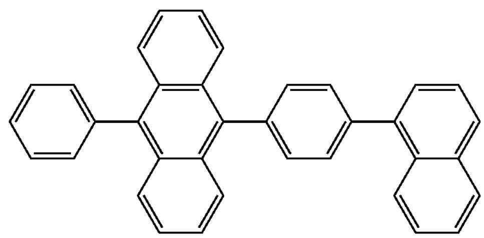
H8
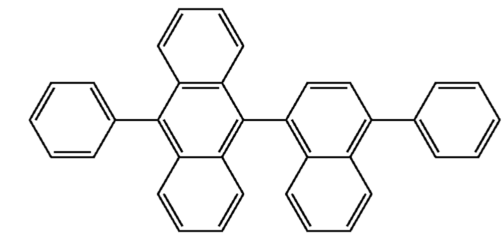
H9
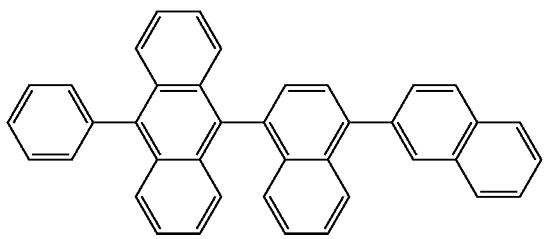
H10
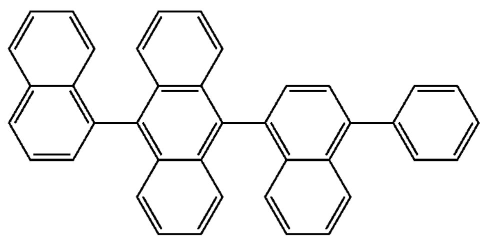
H11
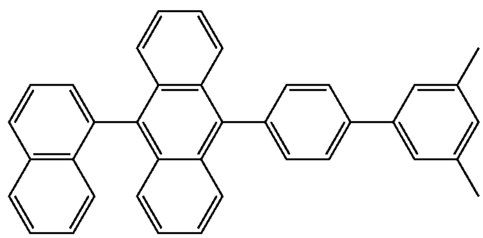
H12
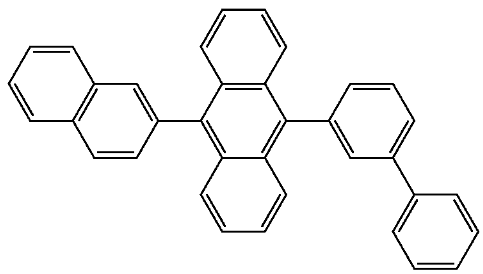
-continued
H13
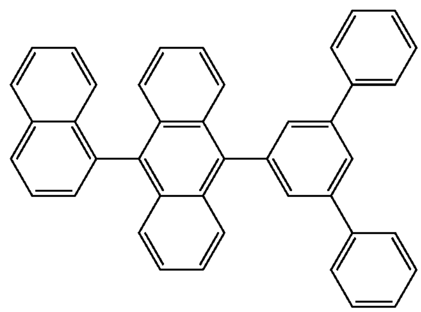
H14
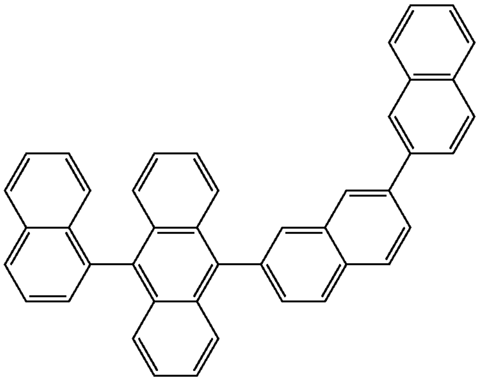
H15
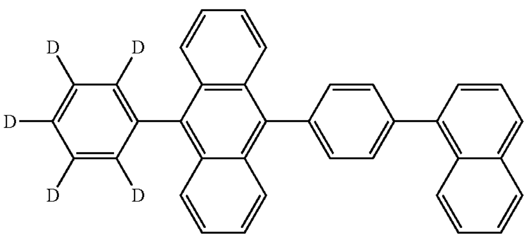
H16
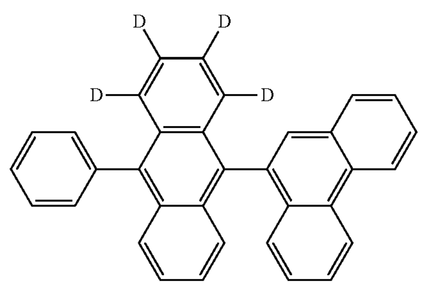
H17
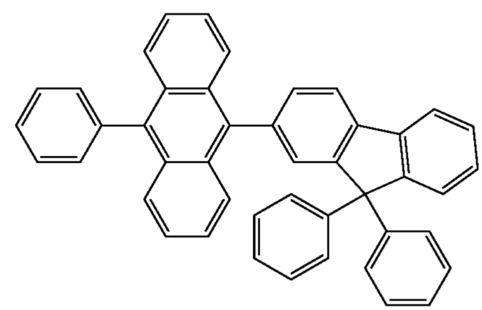

-continued
H18
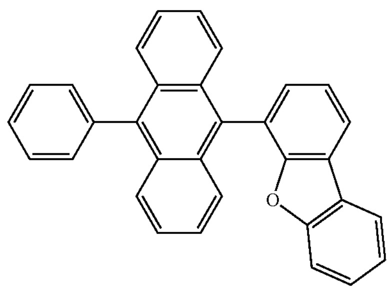
H19
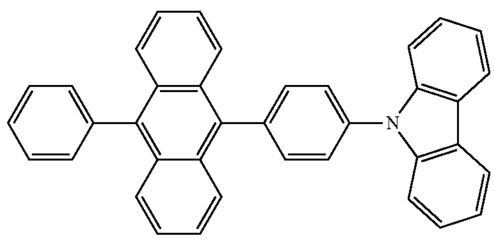
H20
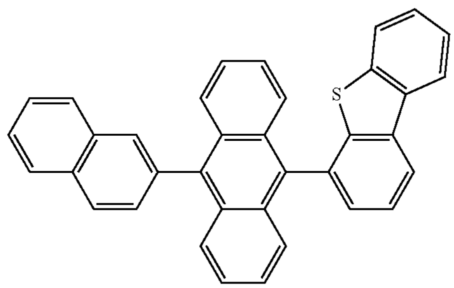
H21
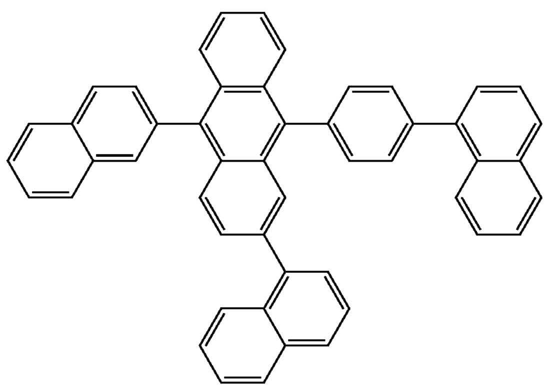
H22
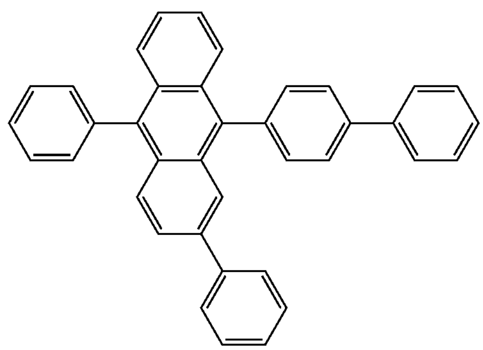
-continued
H23
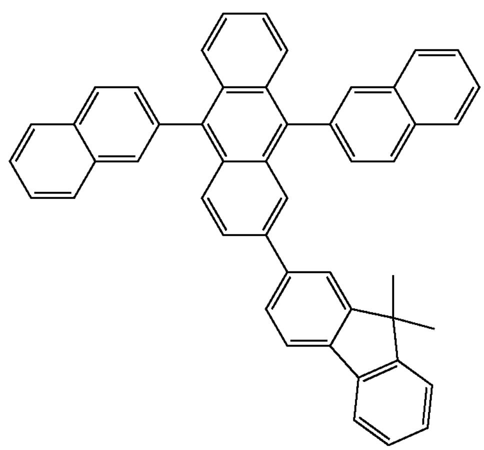
H24
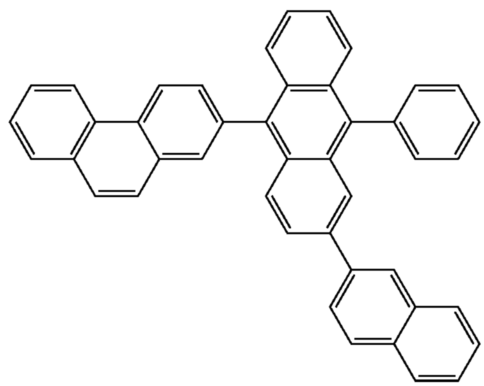
H25
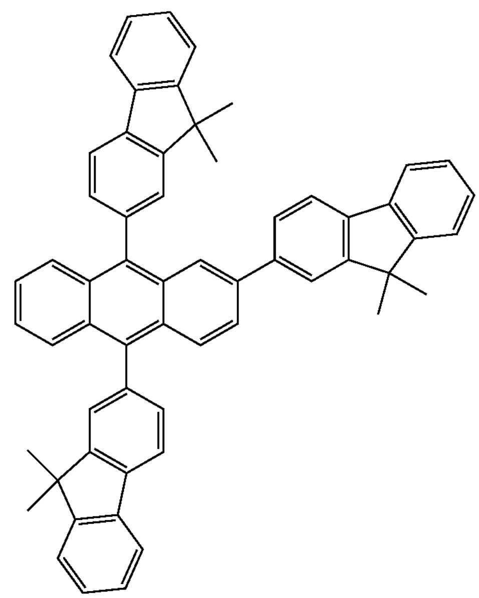

-continued
H26
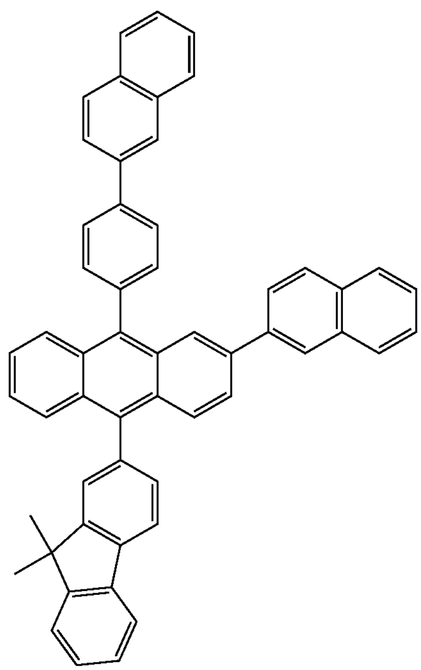
H27
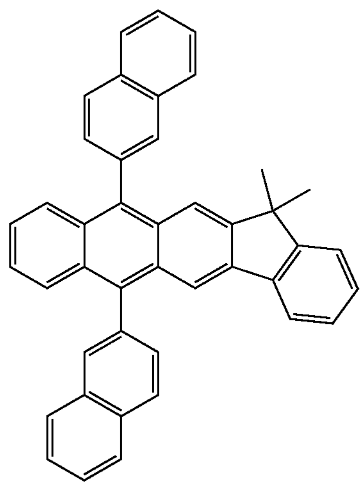
H28
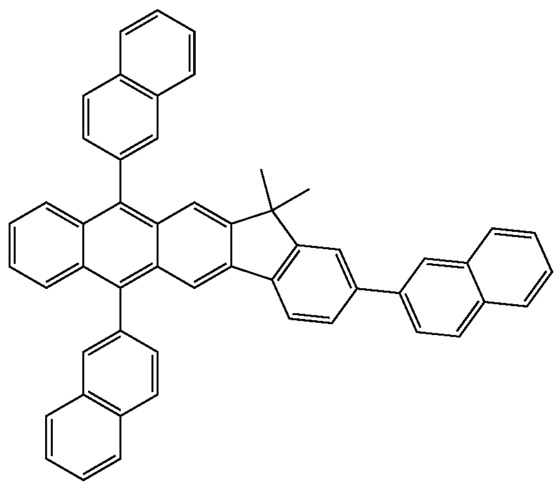
-continued
H29
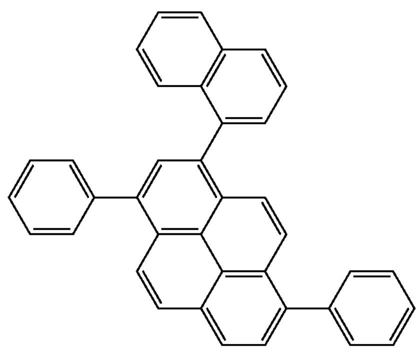
H30
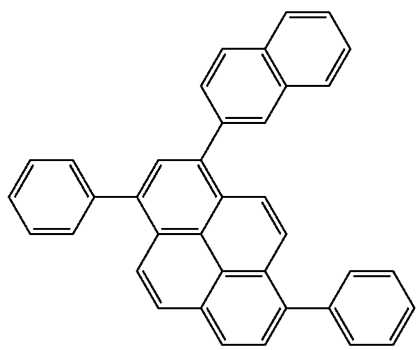
H31
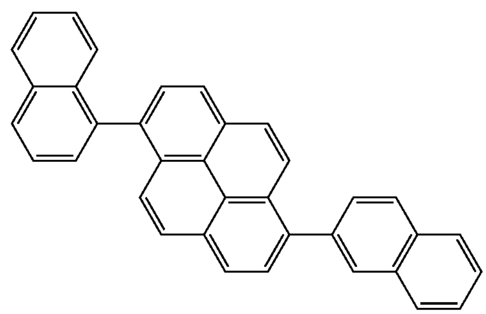
H32
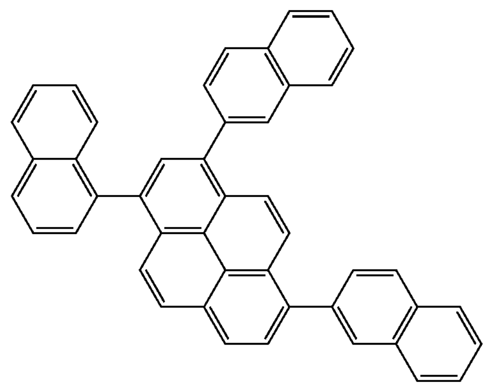

-continued
H33
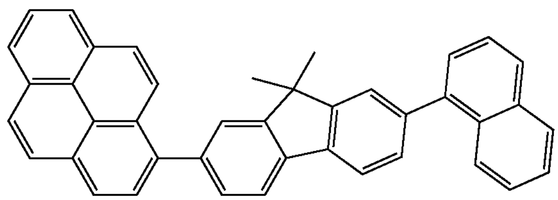
H34
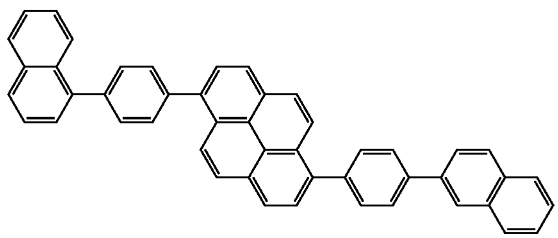
H35
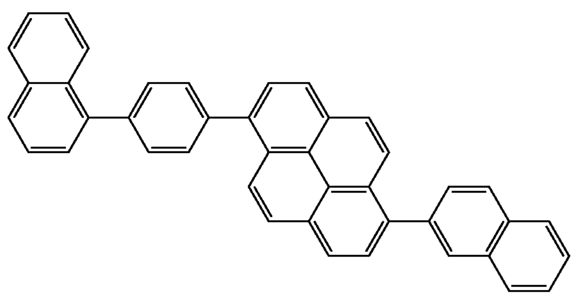
H36
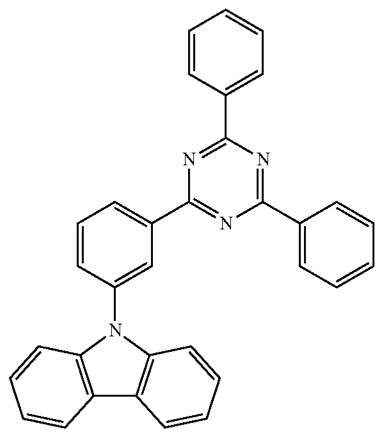
-continued
H37
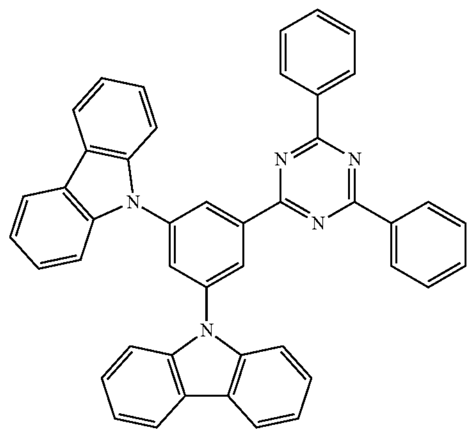
H38
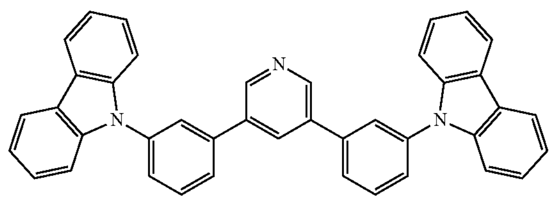
H39
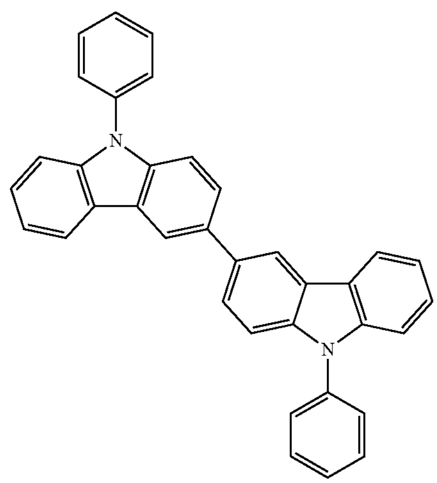

-continued
H40
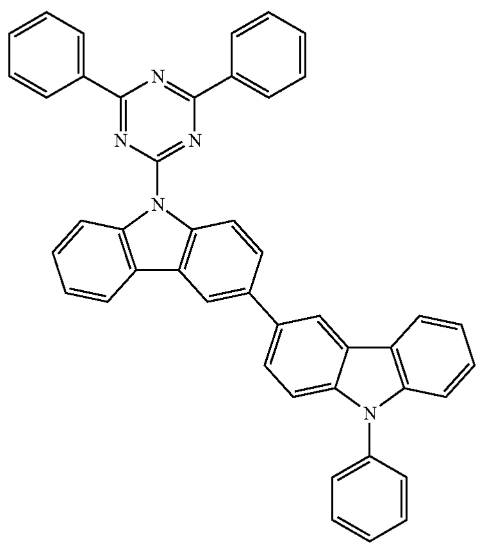
H41
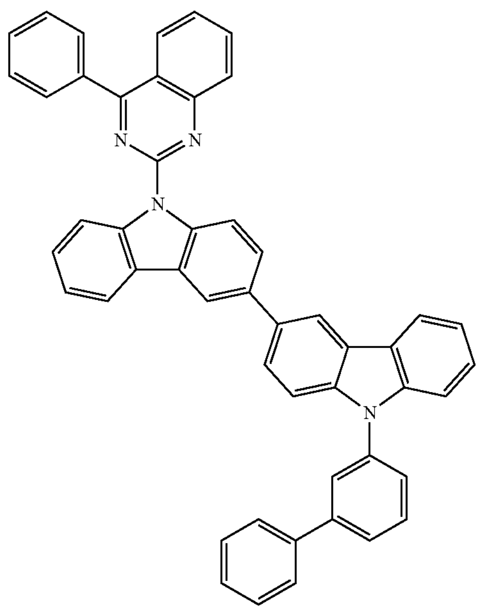
H42
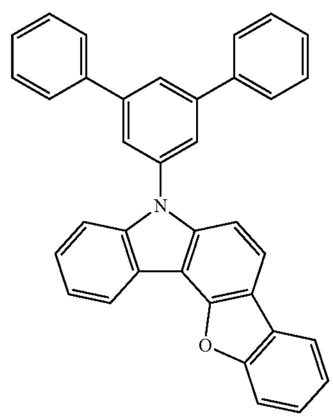
-continued
H43
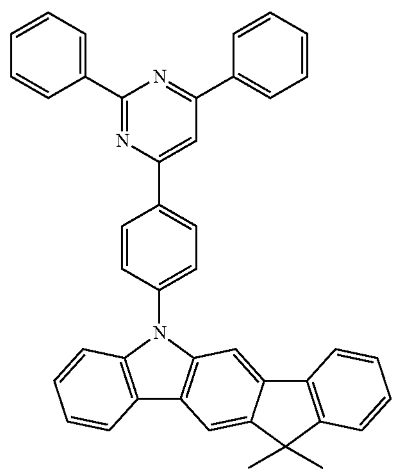
H44
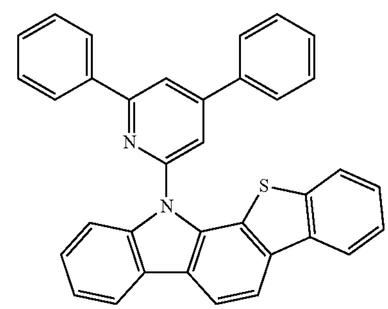
H45
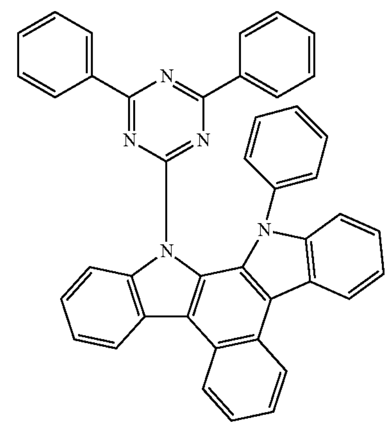
H46
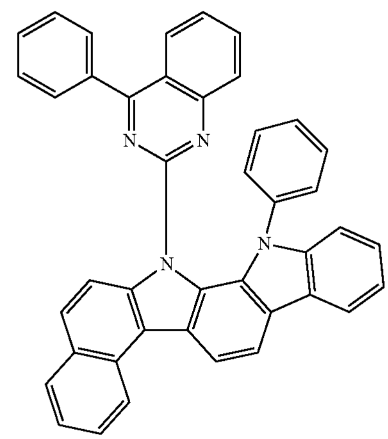

-continued
H47
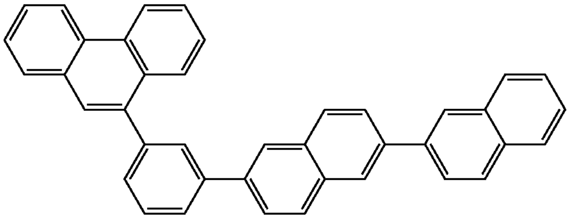
H48
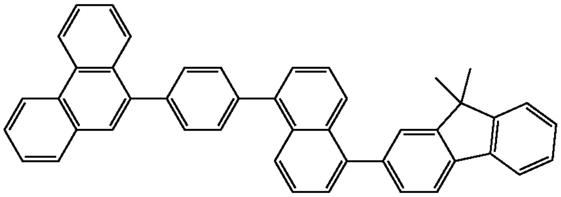
H49
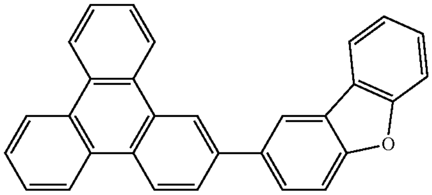
H50
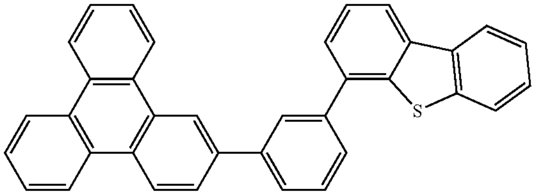
H51
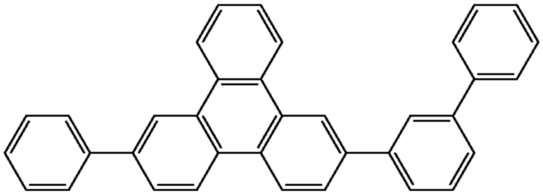
H52
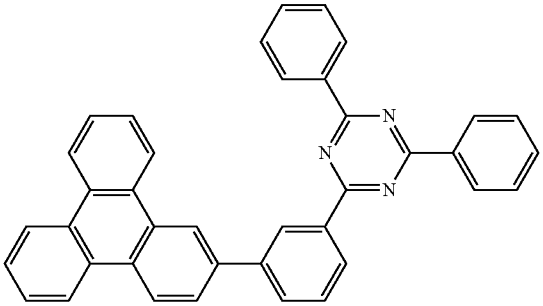
-continued
H53
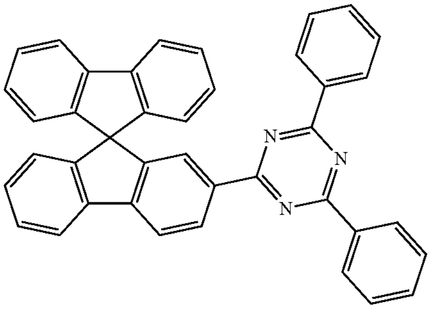
H54
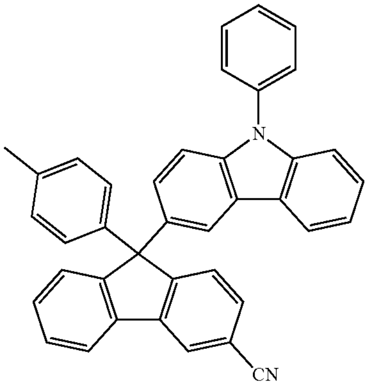
H55
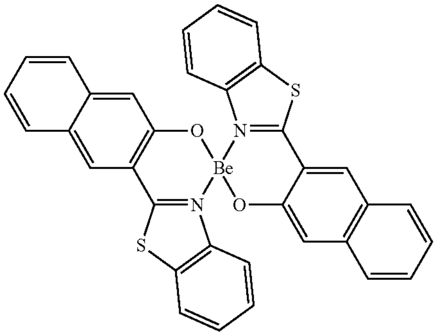
H56
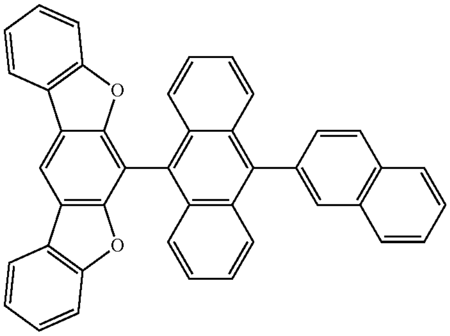

-continued
H57
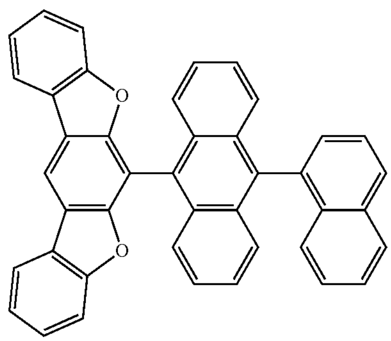
H58
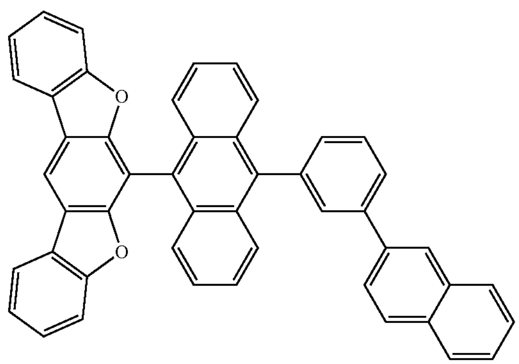
H59
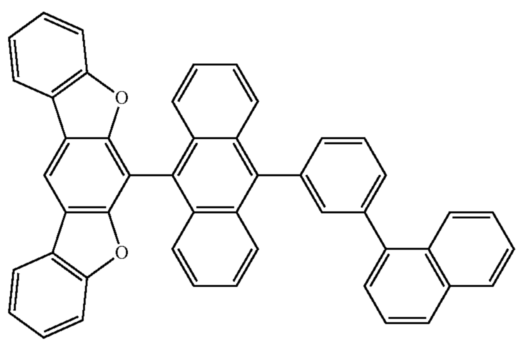
H60
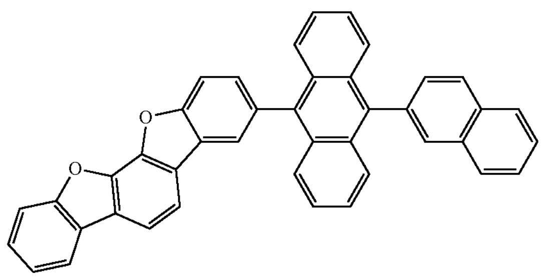
-continued
H61
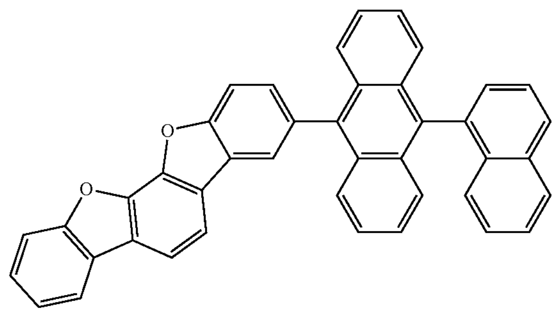
H62
H63
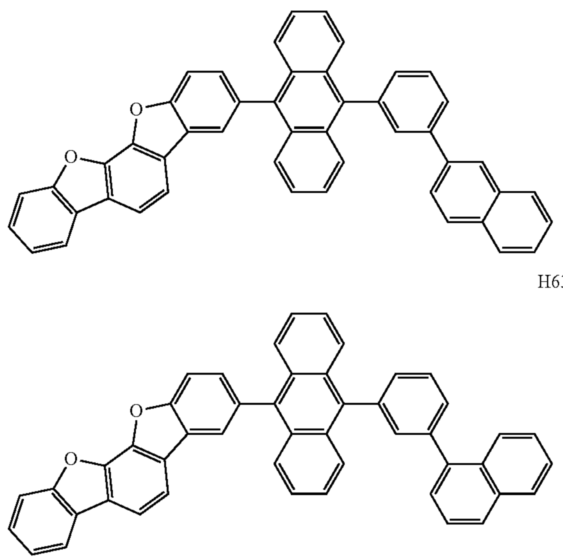
H64
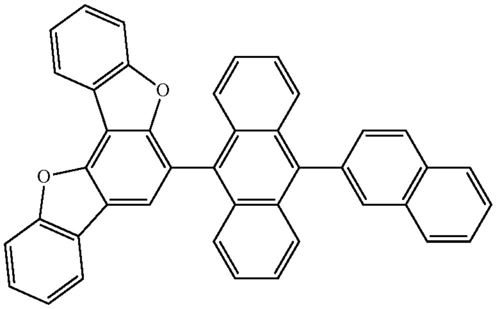
H65
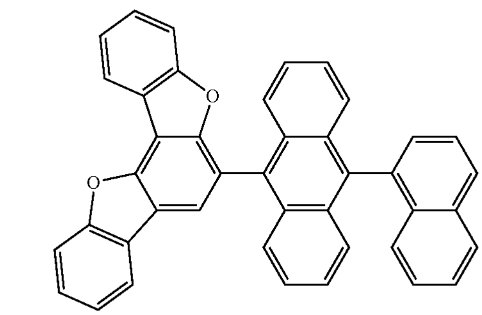

-continued
H66
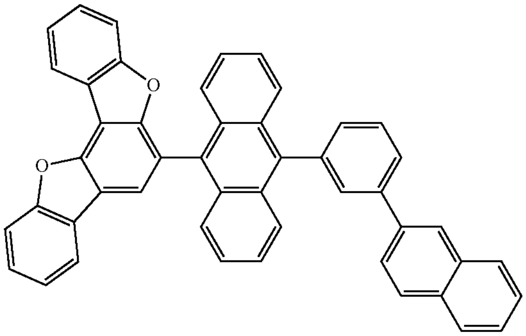
H67
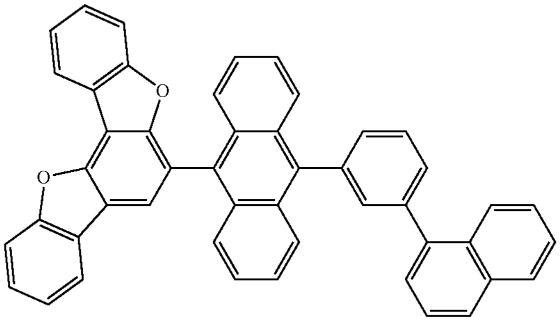
H68
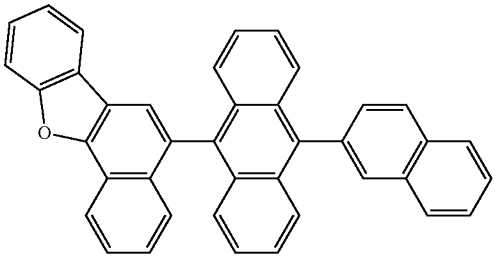
H69
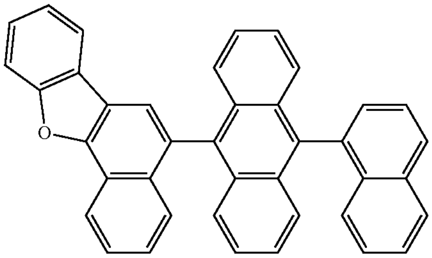
H70
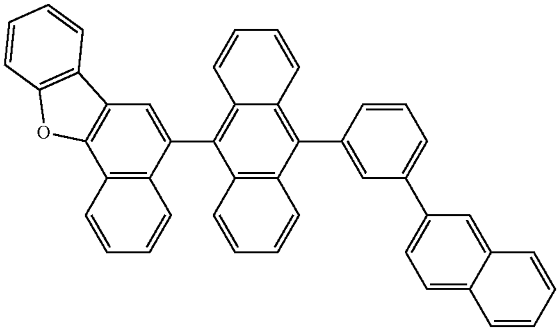
-continued
H71
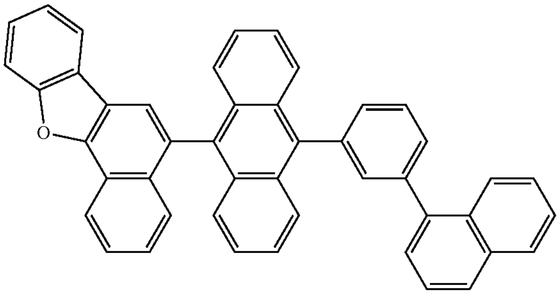
H72
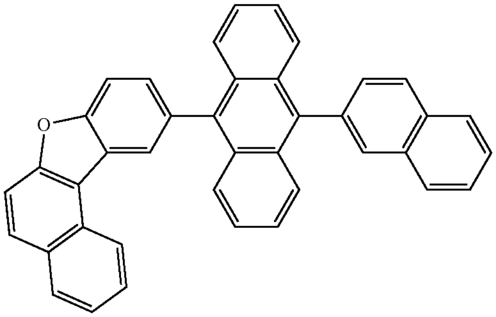
H73
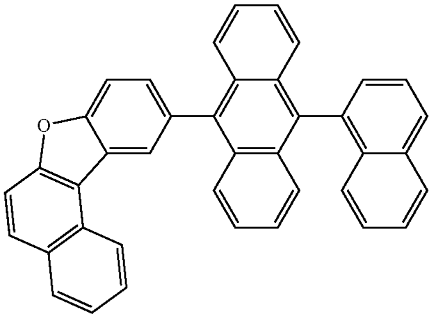
H74
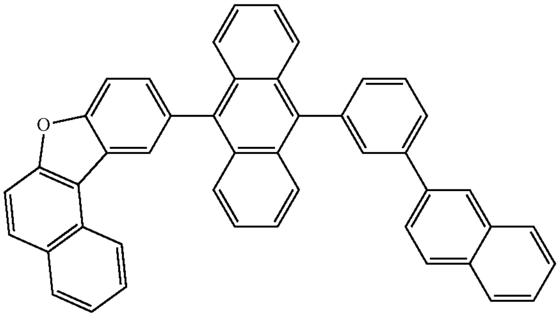
H75
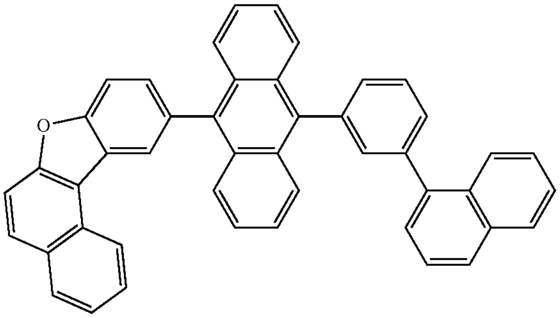

-continued
H76
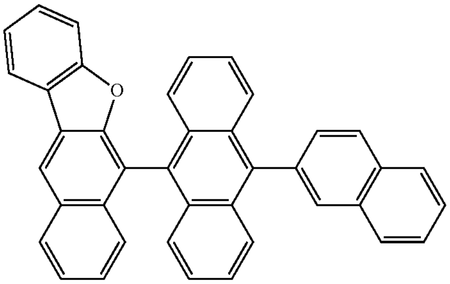
H77
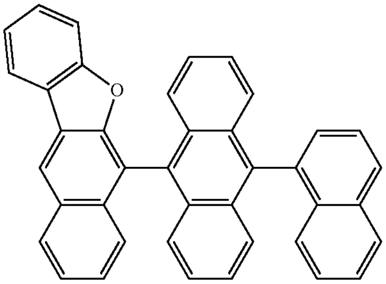
H78
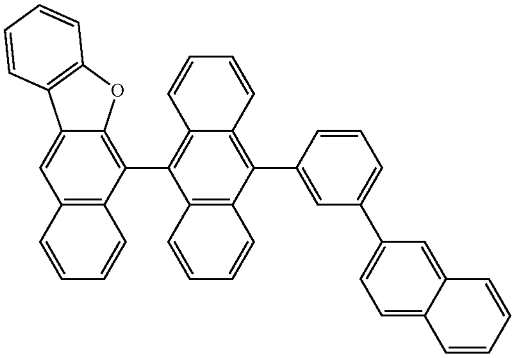
H79
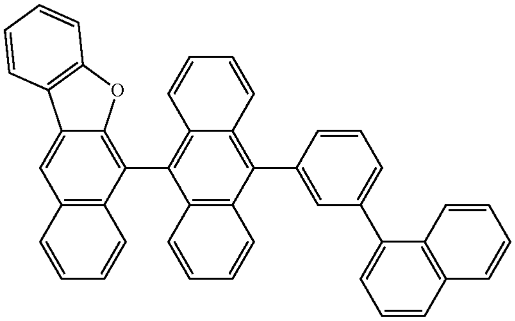
H80
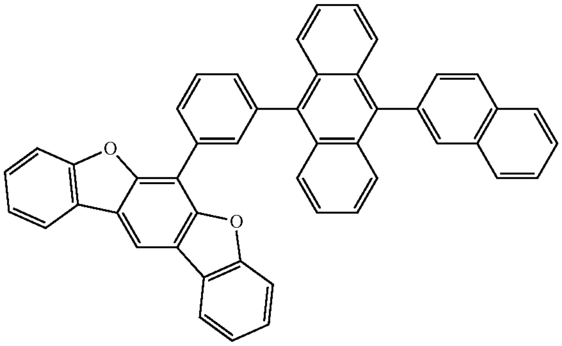
-continued
H81
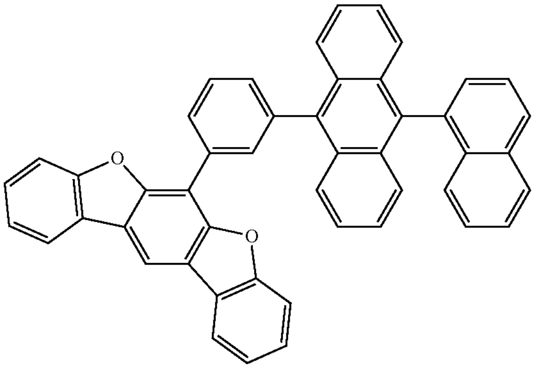
H82
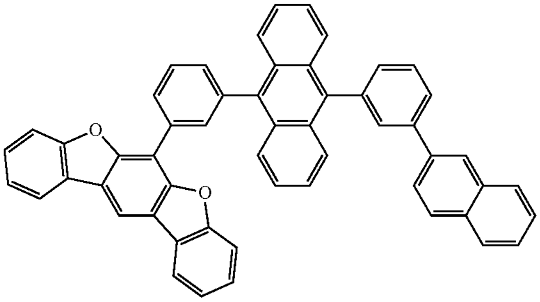
H83
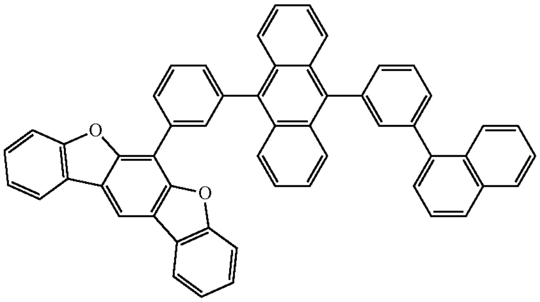
H84
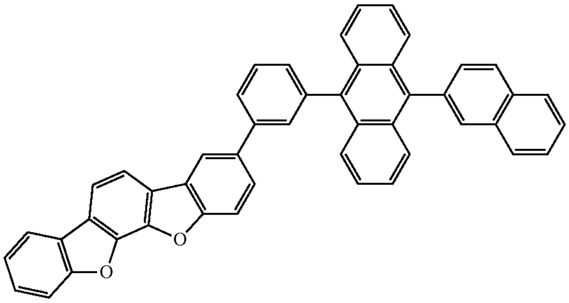

-continued
H85
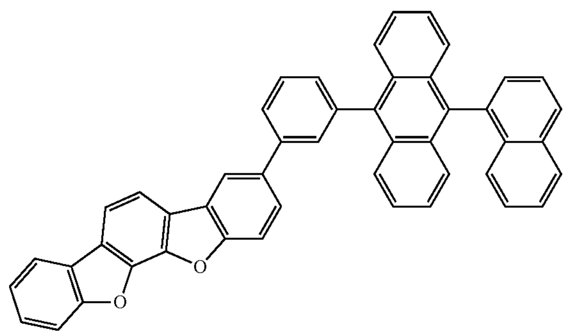
H86
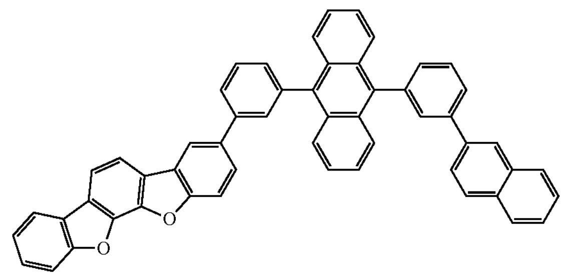
H87
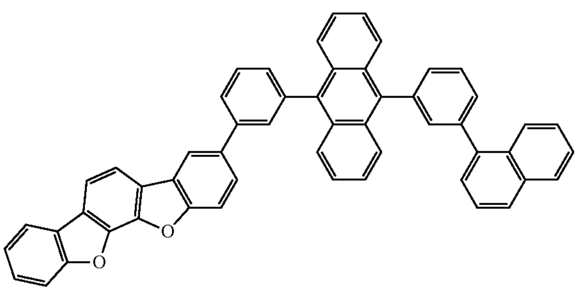
H88
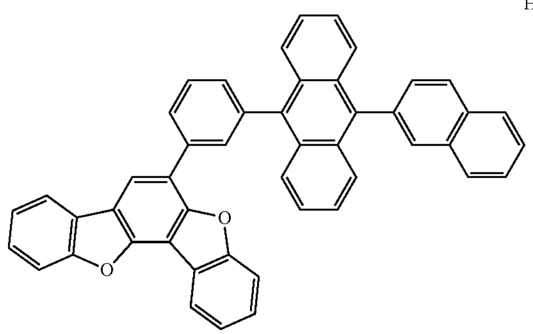
-continued
H89
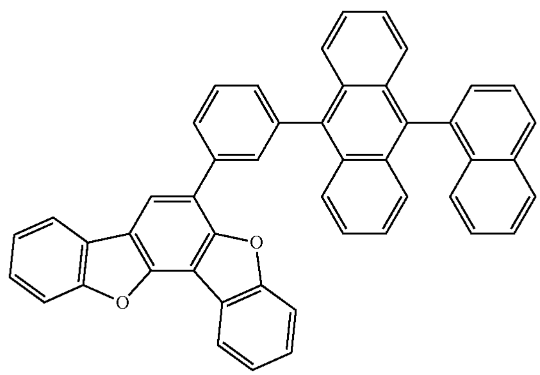
H90
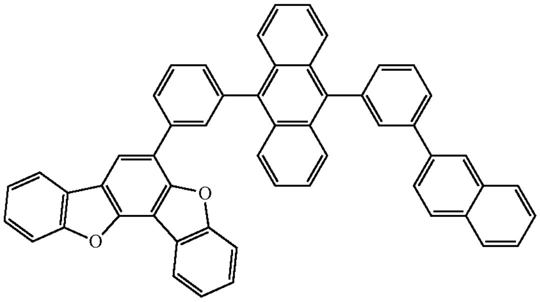
H91
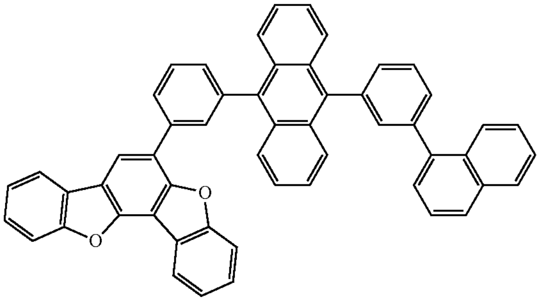
H92
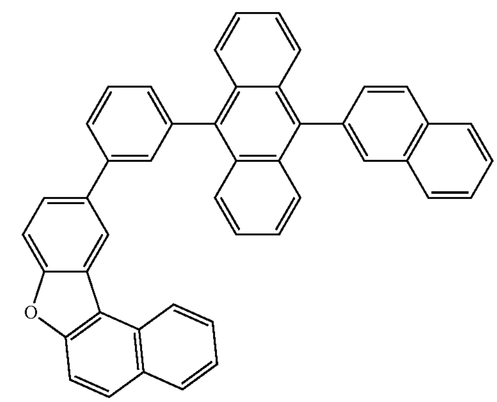

-continued
H93
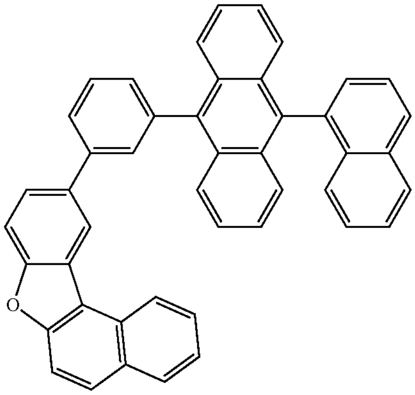
H94
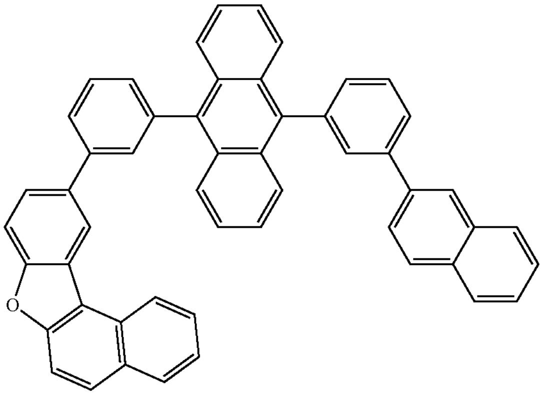
H95
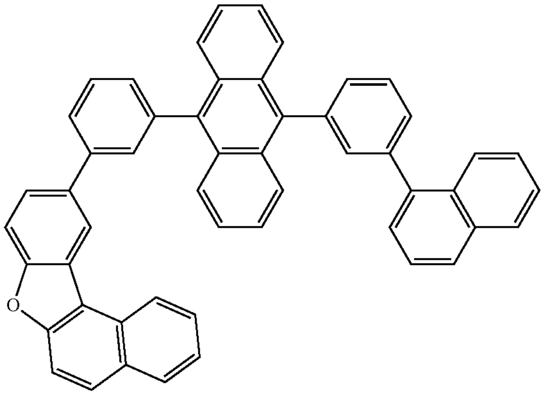
H96
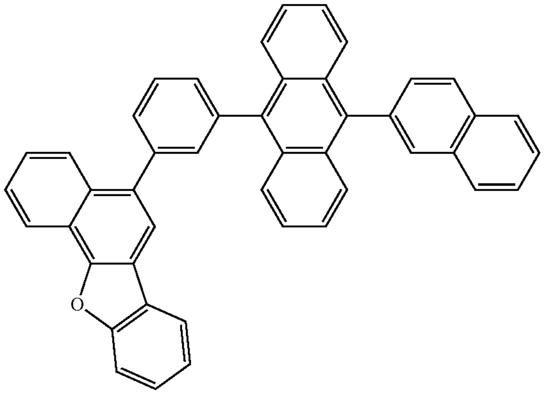
-continued
H97
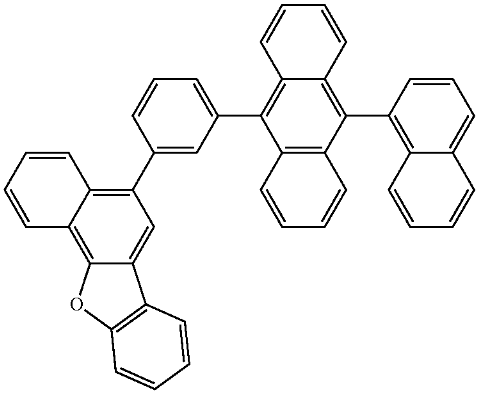
H98
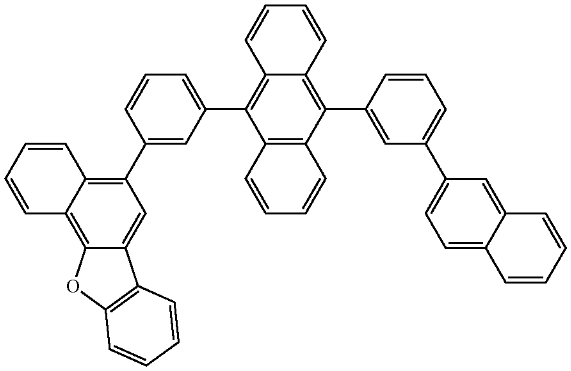
H99
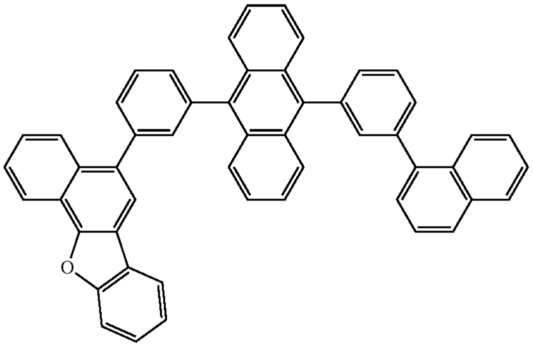
H100
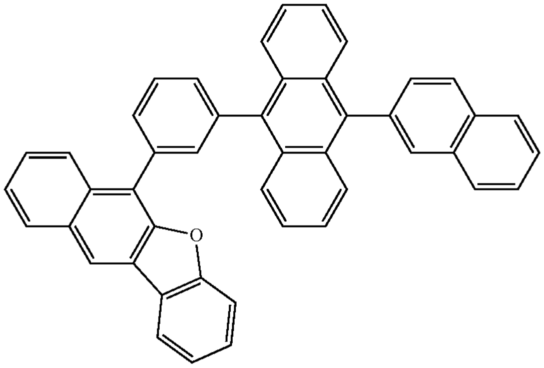

-continued
H101
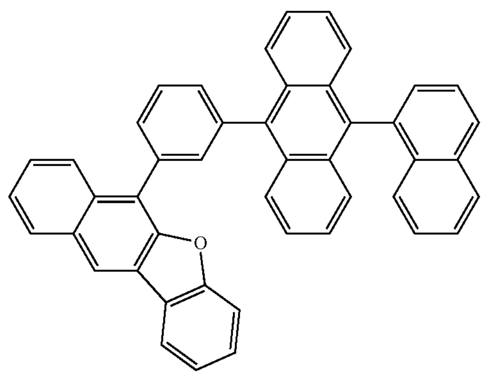
H102
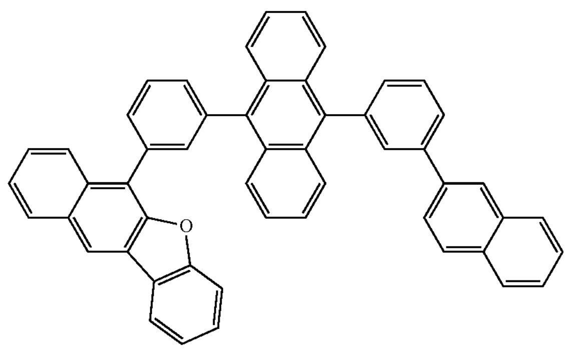
H103
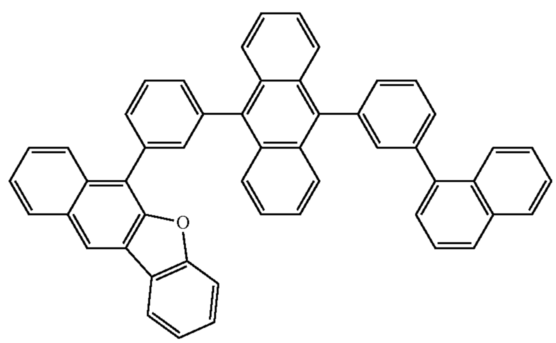
H104
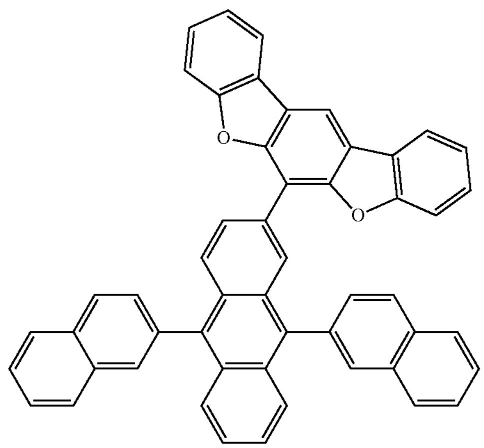
-continued
H105
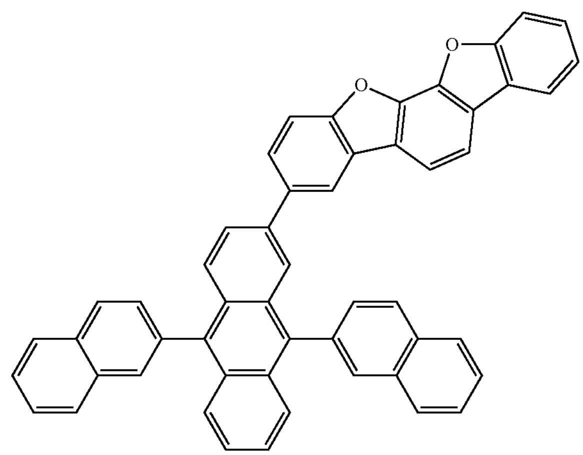
H106
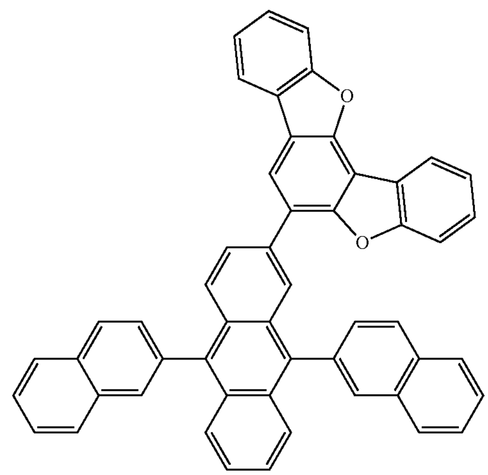
H107
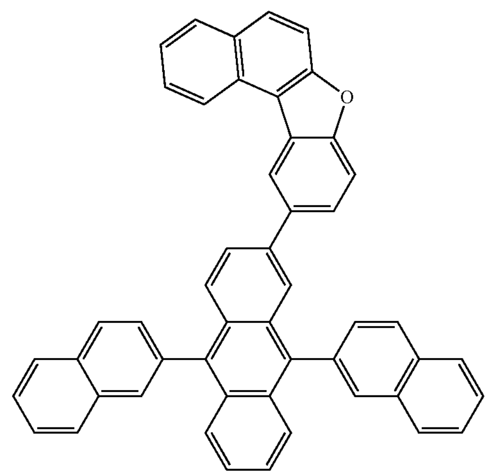

H108
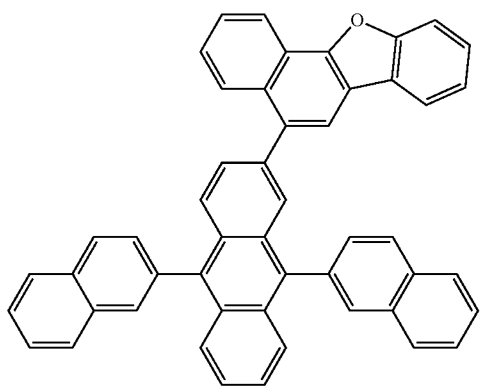
H109
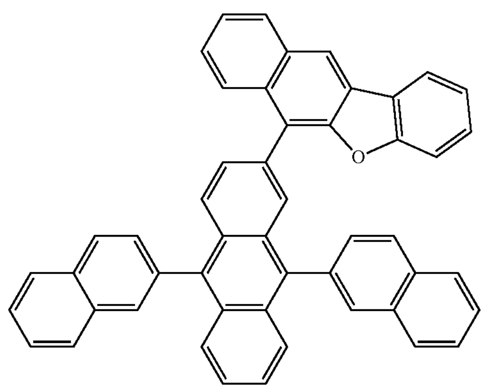
H110
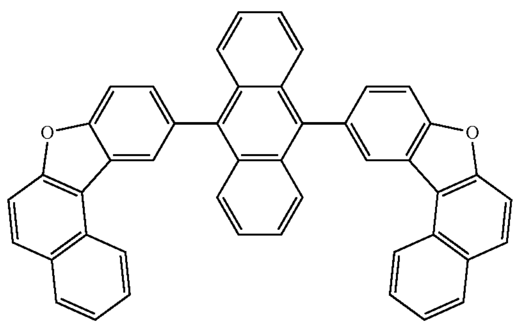
H111
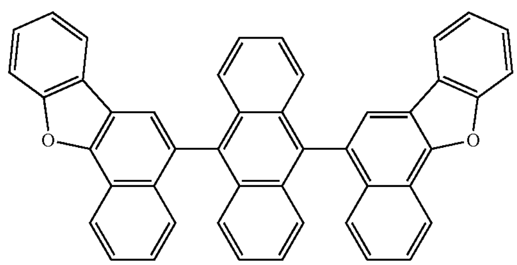
H112
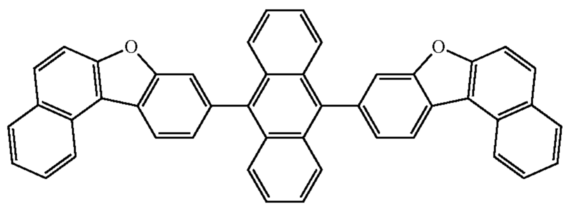
H113
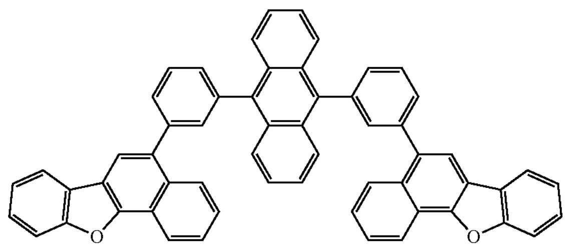
H114
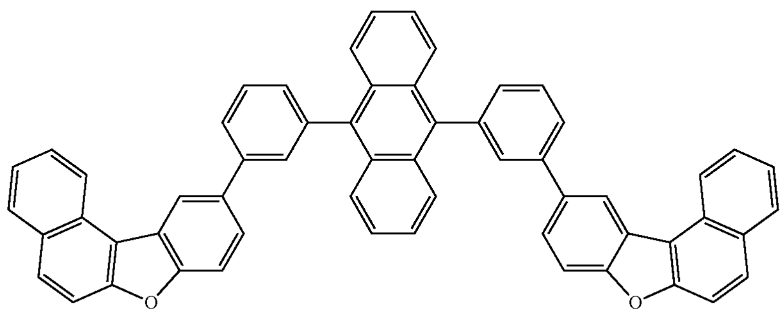

-continued
H115
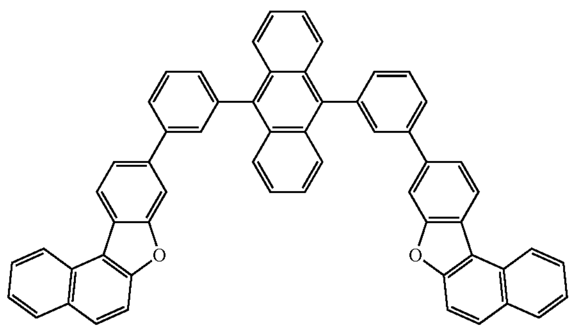
H116
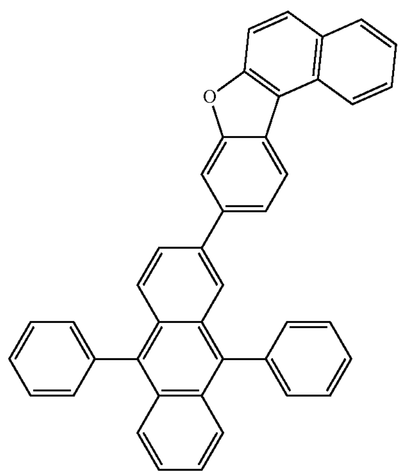
H117
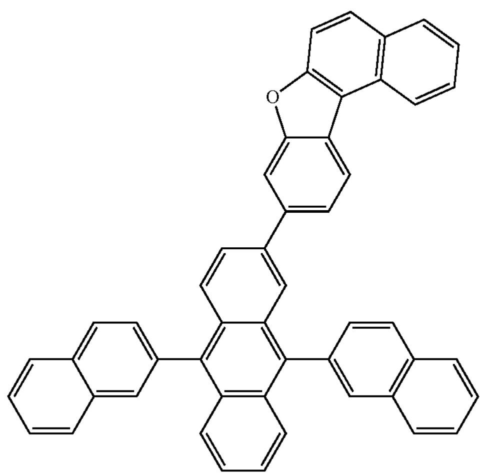
H118
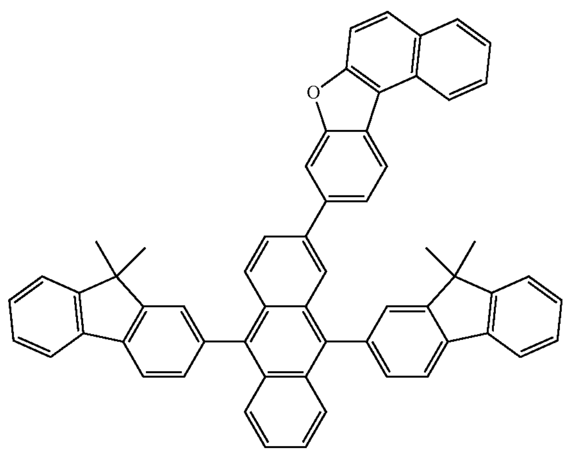
H119
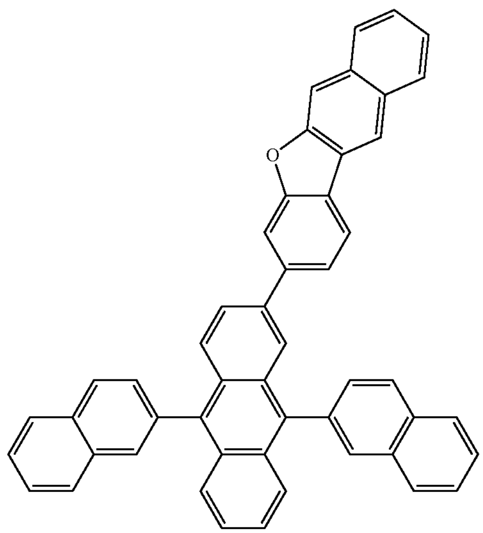
H120
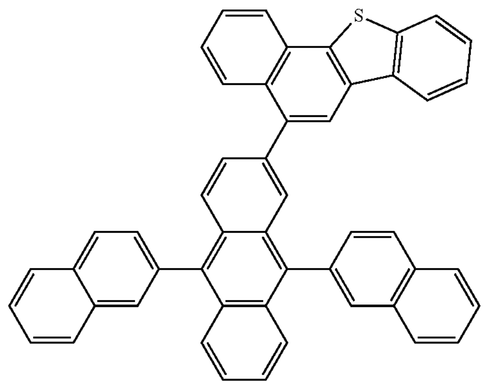

-continued

H121

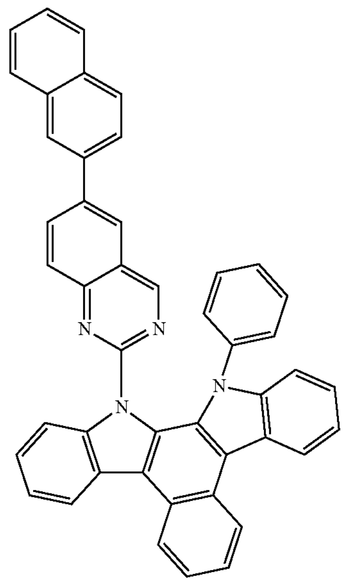

H122

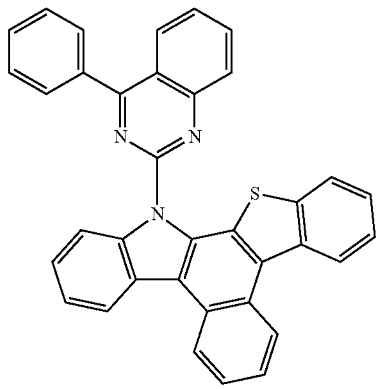

H123

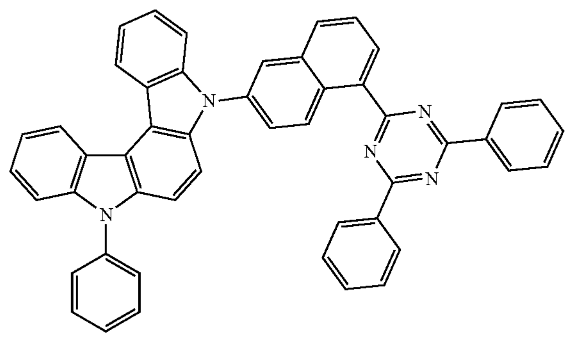

H124

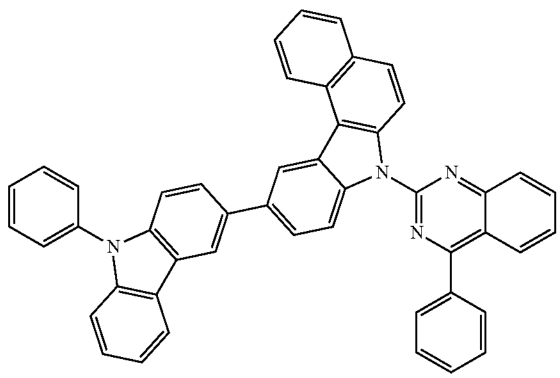

Phosphorescent Dopant

In one or more embodiments, the phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

For example, the phosphorescent dopant may include an organometallic compound represented by Formula 401:

Formula 401

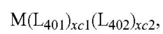

$M(L_{401})_{xc1}(L_{402})_{xc2}$,

Formula 402

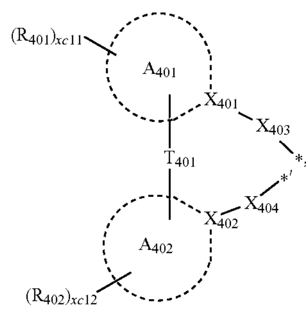

wherein, in Formula 401,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more of $L_{401}$(s) may be identical to or different from each other, $L_{402}$ may be an organic ligand, and xc2 may be 0, 1, 2, 3, or 4, and when xc2 is 2 or more, two or more of $L_{402}$(s) may be identical to or different from each other, in Formula 402, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*'*—C($Q_{411}$)($Q_{412}$)*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described herein with respect to $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described herein with respect to $Q_1$, xc11 and xc12 may each independently be an integer selected from 0 to 10, and

* and *' in Formula 402 each indicate a binding site to M in Formula 401.

For example, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 401 is 2 or more, two ring $A_{401}$(s) in two or more of $L_{401}$(s) may be optionally linked to each other via $T_{402}$, which is a linking group, and/or two ring $A_{402}$(s) may be optionally linked to each other via $T_{403}$, which is a linking group (see Compounds PD1 to PD4 and PD7). $T_{402}$ and $T_{403}$ may each independently be the same as described herein with respect to $T_{401}$.

$L_{402}$ in Formula 401 may be an organic ligand. For example, $L_{402}$ may include a halogen group, a diketone group (for example, an acetylacetonate group), a carboxylic acid group (for example, a picolinate group), —C(=O), an isonitrile group, —CN group, a phosphorus-containing group (for example, a phosphine group, a phosphite group, etc.), or any combination thereof.

The phosphorescent dopant may include, for example, at least one of compounds PD1 to PD39:

PD1

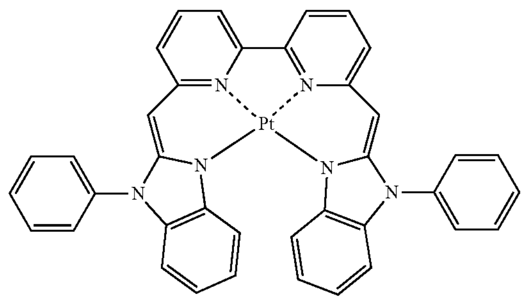

-continued

PD2

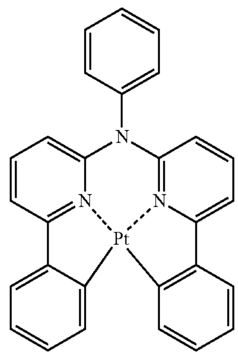

PD3

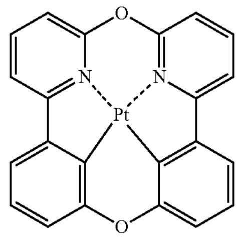

PD4

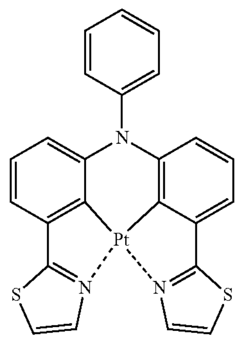

PD5

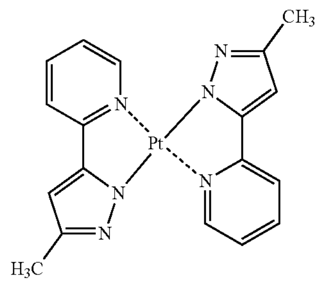

PD6

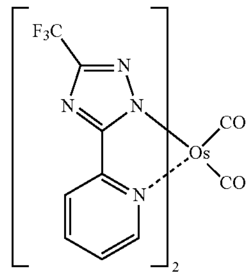

-continued
PD7
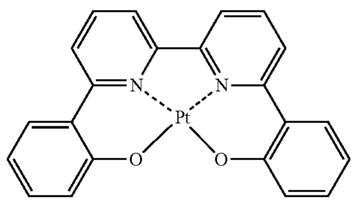
PD8
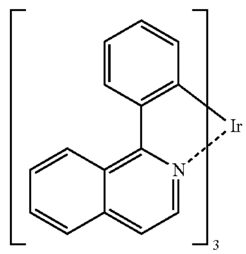
PD9
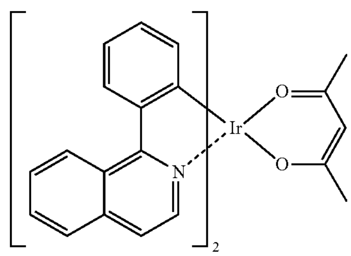
PD10
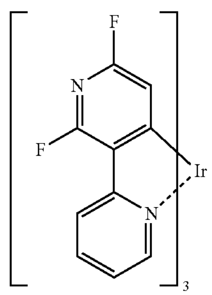
PD11
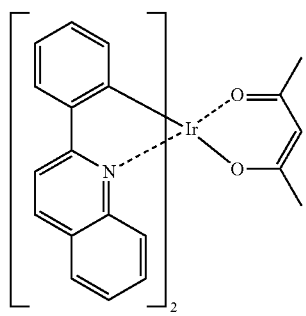
-continued
PD12
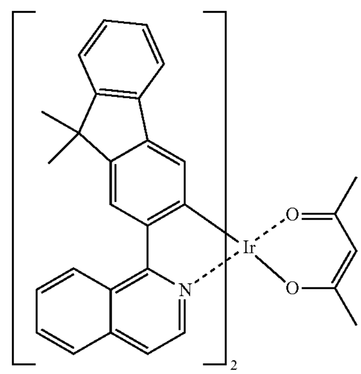
PD13
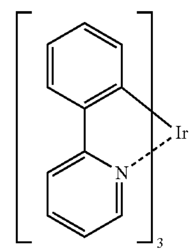
PD14
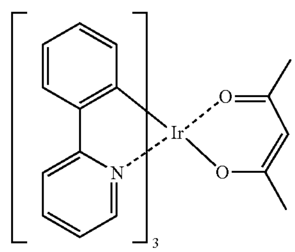
PD15
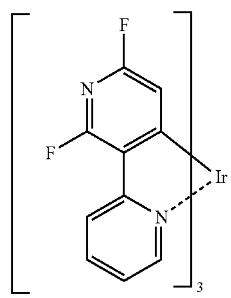
PD16
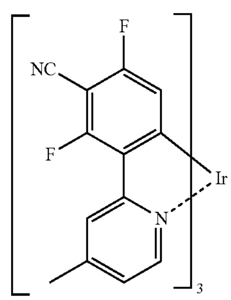

-continued
PD17
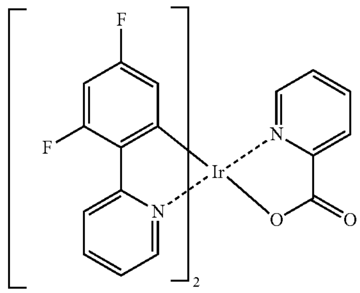
PD18
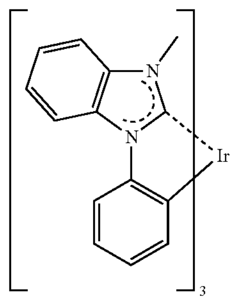
PD19
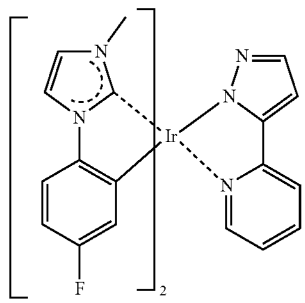
PD20
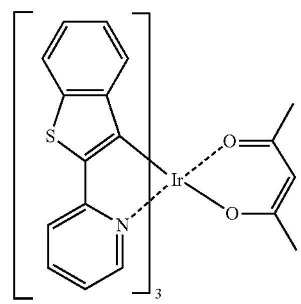
PD21
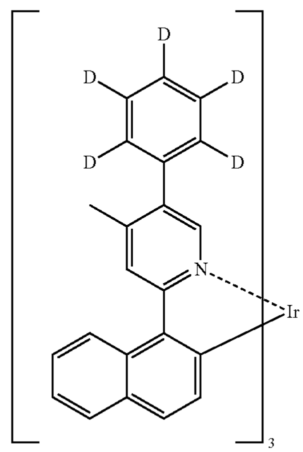
-continued
PD22
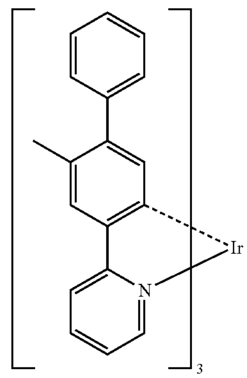
PD23
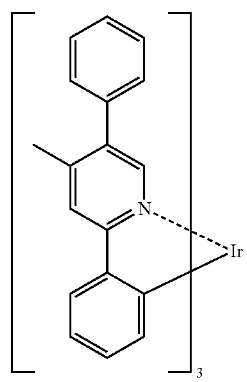
PD24
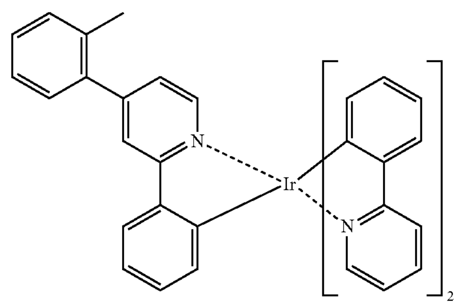
PD25
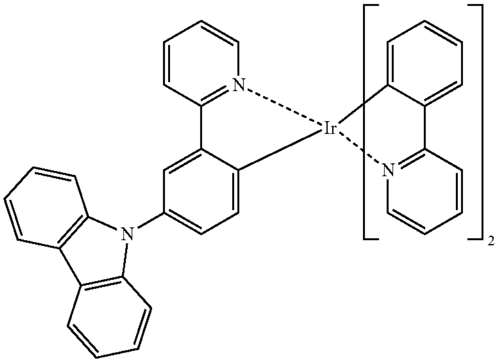

PD26
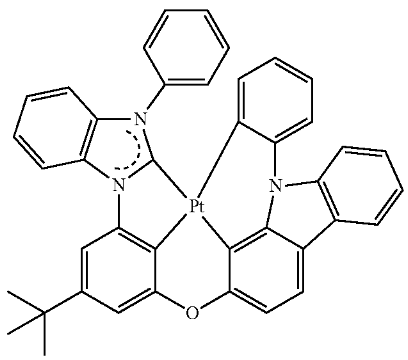
PD27
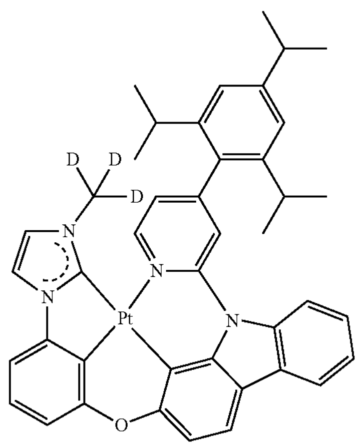
PD28
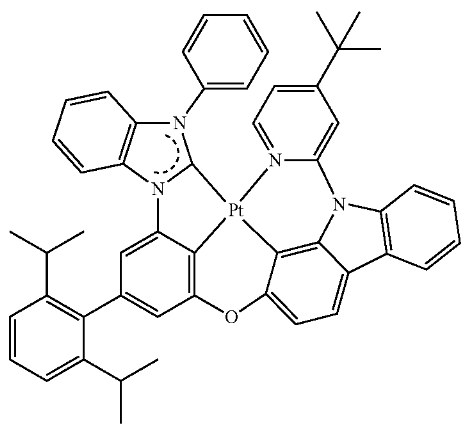
PD29
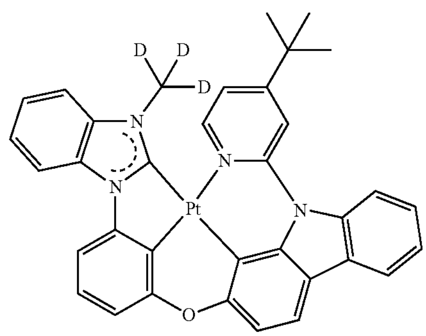
PD30
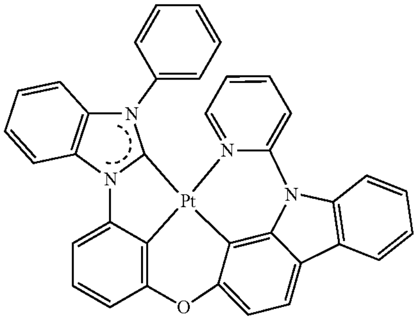
PD31
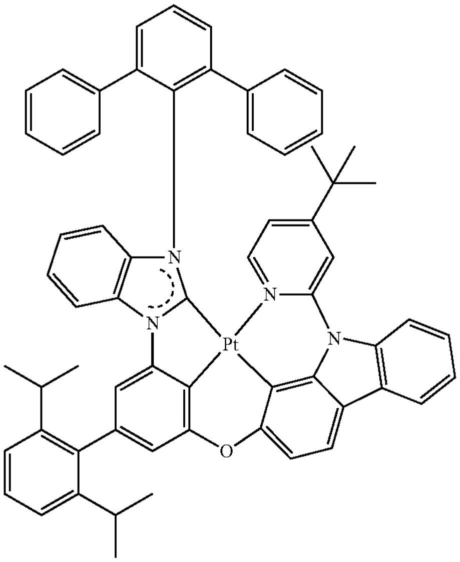
PD32
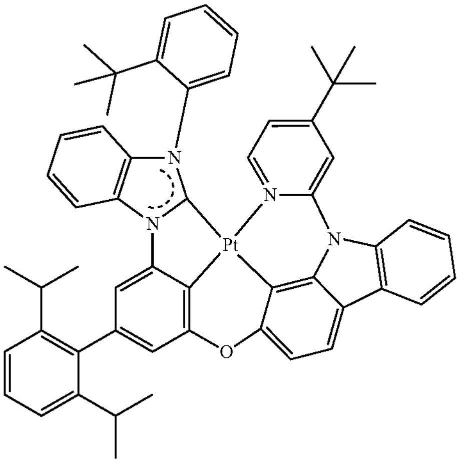

PD33
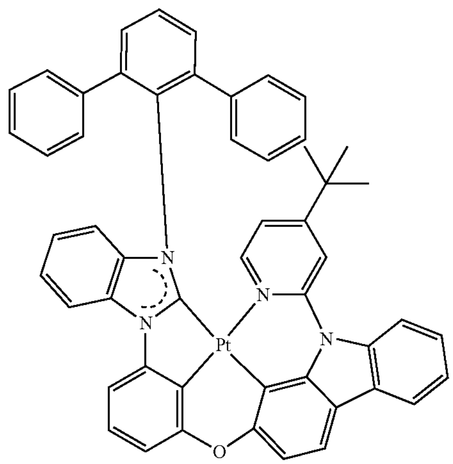
PD34
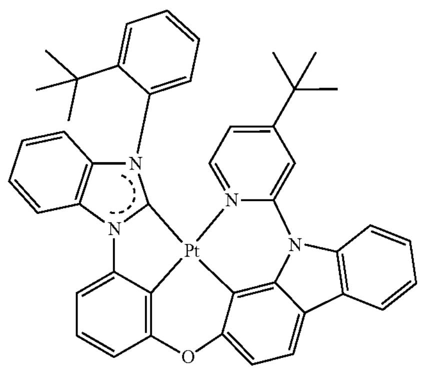
PD35
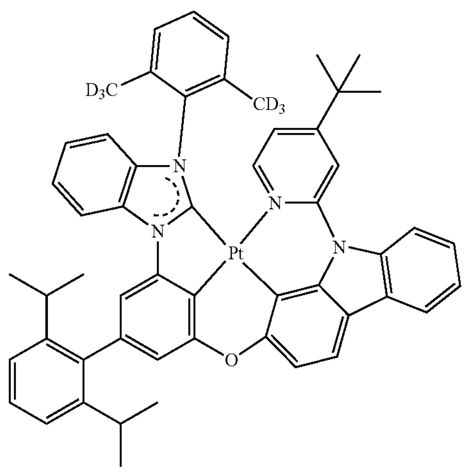
PD36
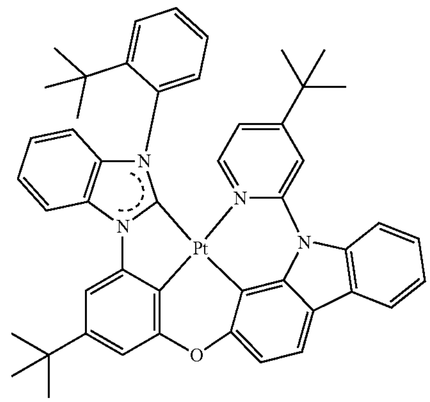
PD37
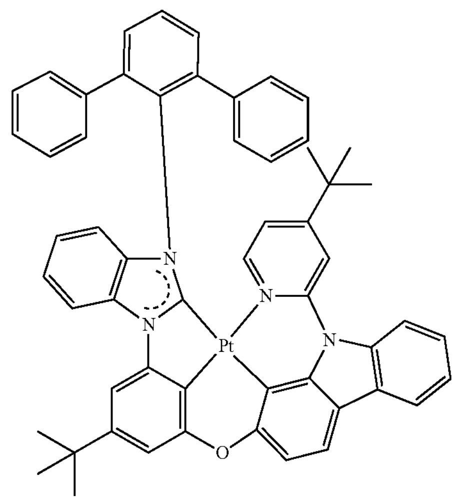
PD38
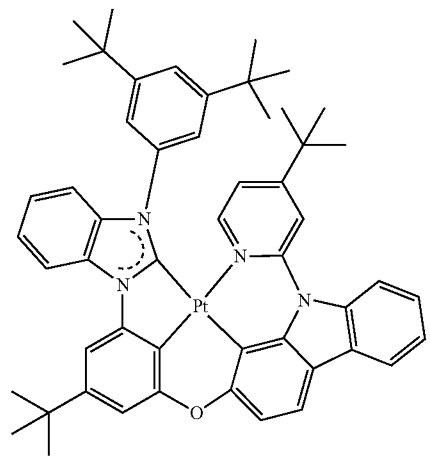

-continued

PD39

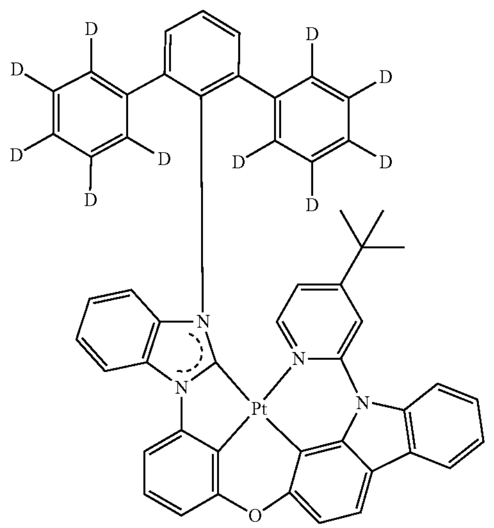

Fluorescent Dopant

The fluorescent dopant may include an amine group-containing compound, a styryl group-containing compound, a compound represented by Formula 501, or any combination thereof.

Formula 501

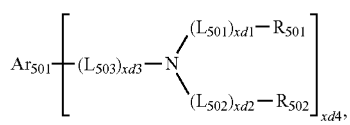

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

For example, $Ar_{501}$ in Formula 501 may be a condensed cyclic group (for example, an anthracene group, a chrysene group, or a pyrene group) in which three or more monocyclic groups are condensed together.

In one or more embodiments, xd4 in Formula 501 may be 2.

For example, the fluorescent dopant may include: at least one of Compounds FD1 to FD36; DPVBi; DPAVBi; or any combination thereof:

FD1

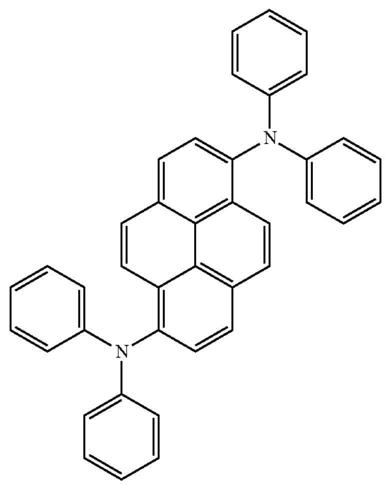

FD2

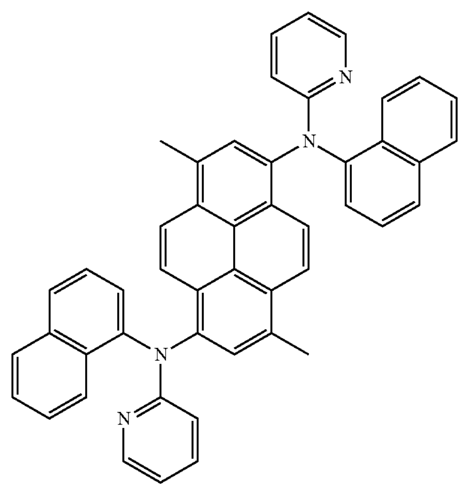

FD3

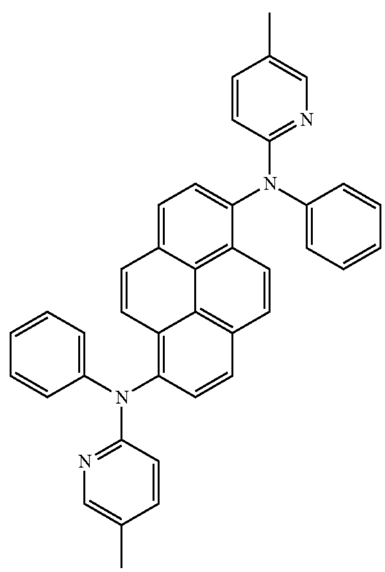

-continued
FD4
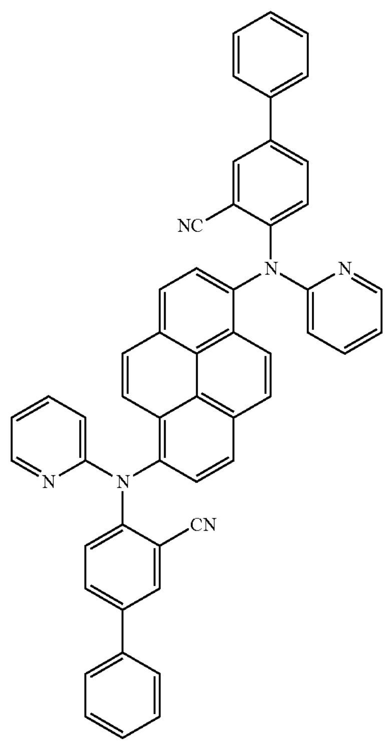
FD5
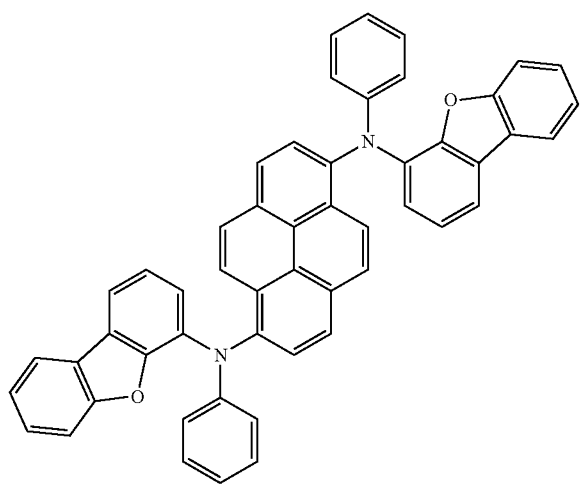
-continued
FD6
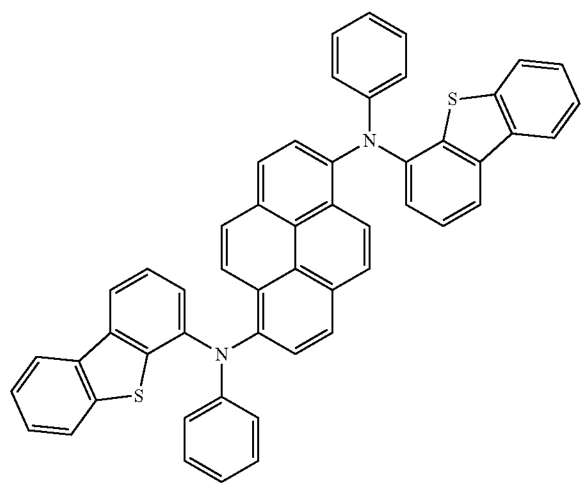
FD7
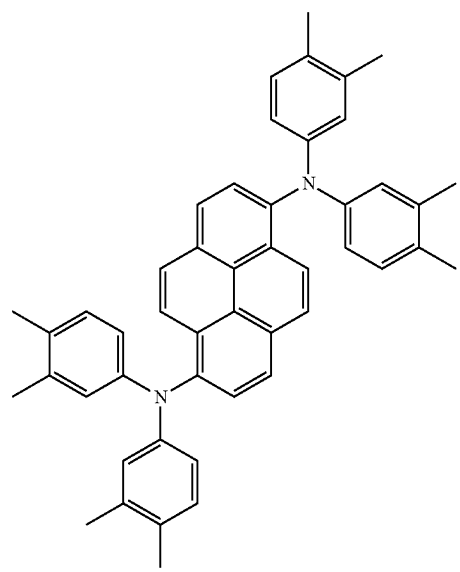
FD8
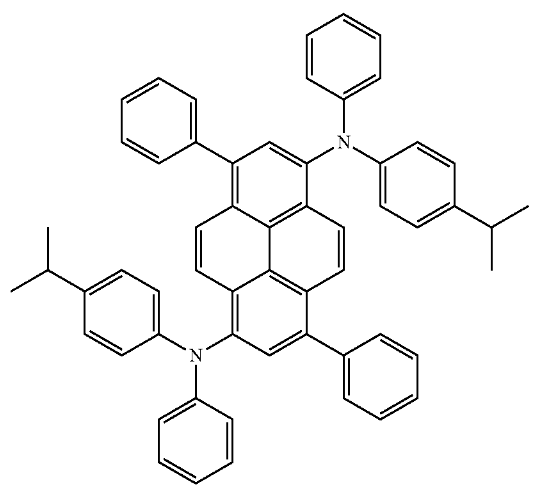

-continued
FD9
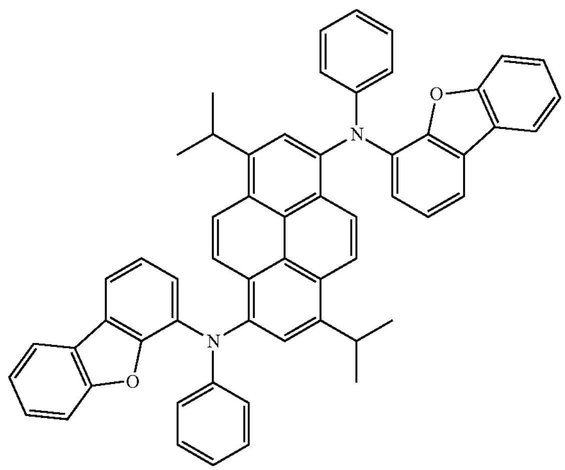
FD10
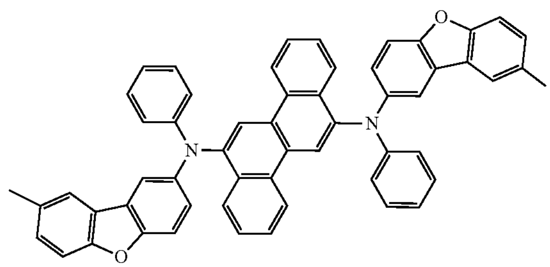
FD11
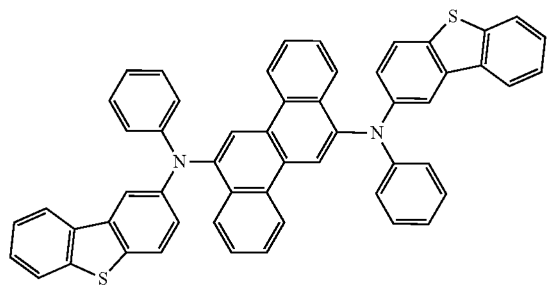
FD12
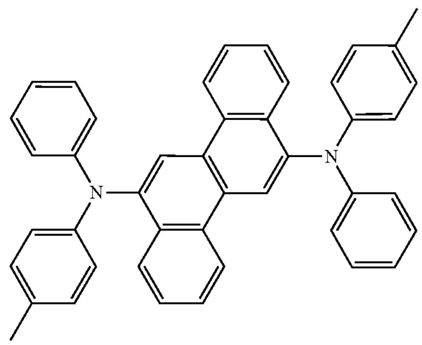
-continued
FD13
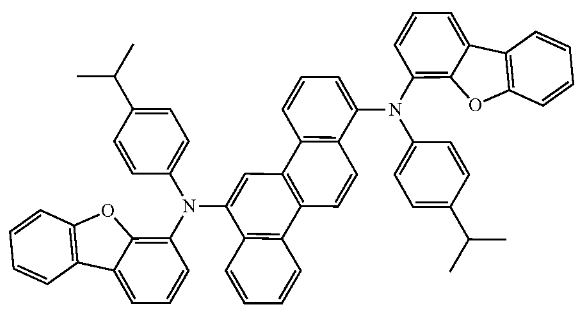
FD14
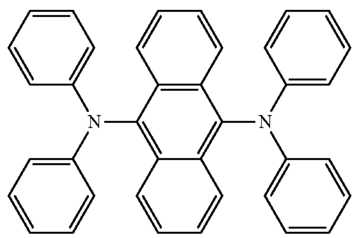
FD15
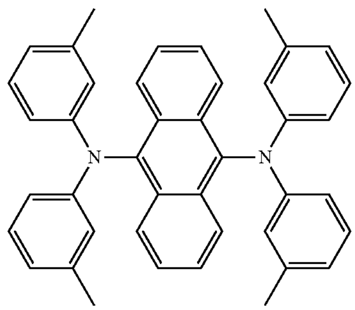
FD16
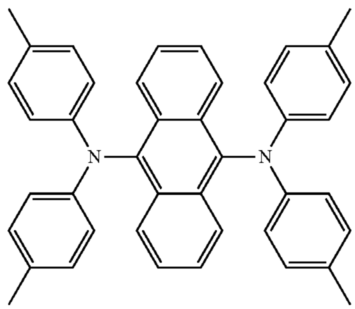
FD17
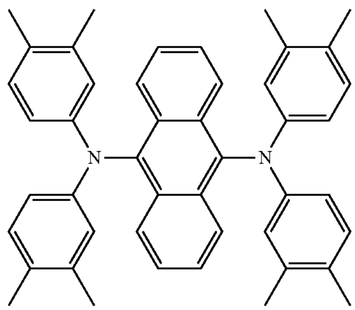

-continued
FD18
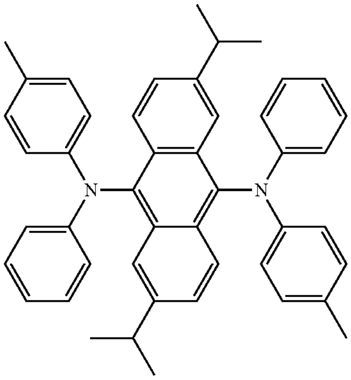
FD19
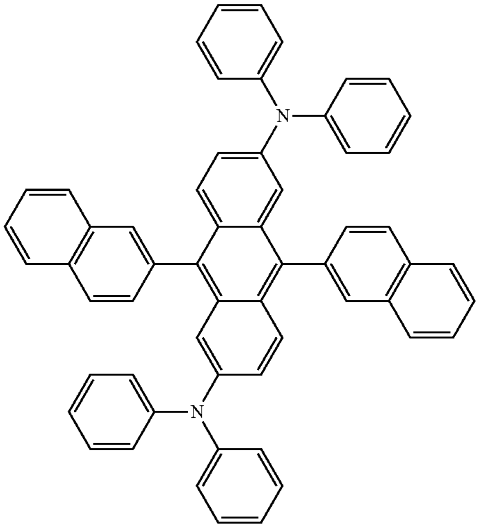
FD20
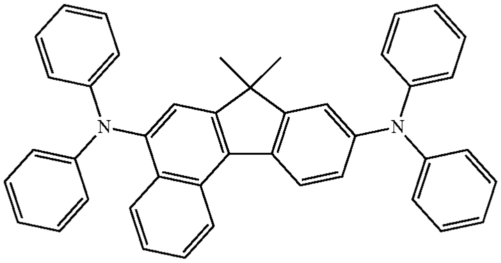
FD21
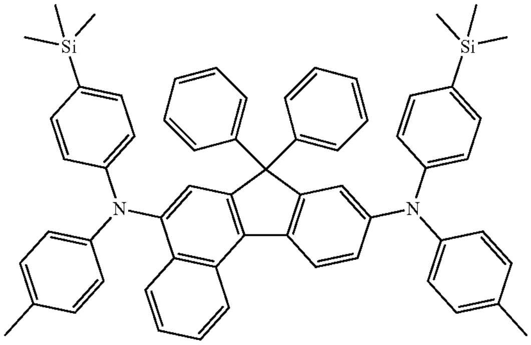
-continued
FD22
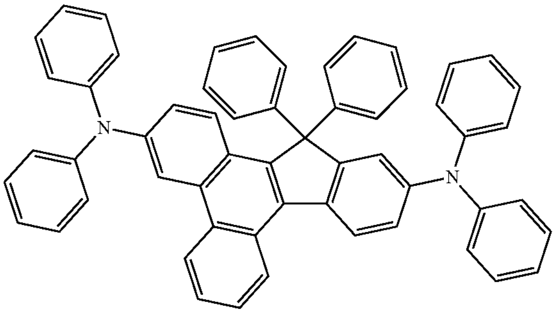
FD23
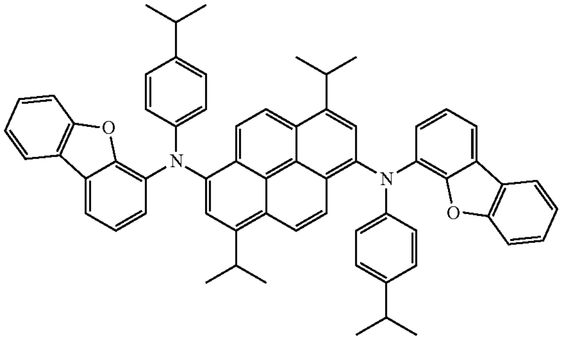
FD24
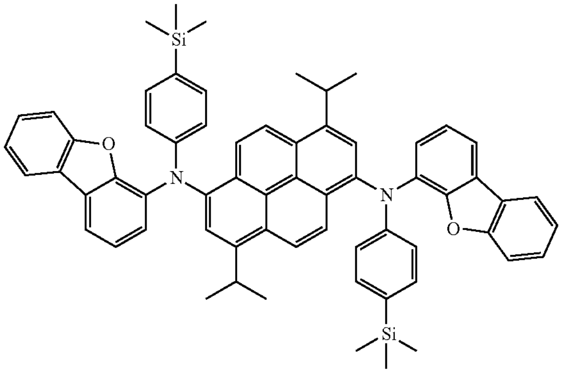
FD25
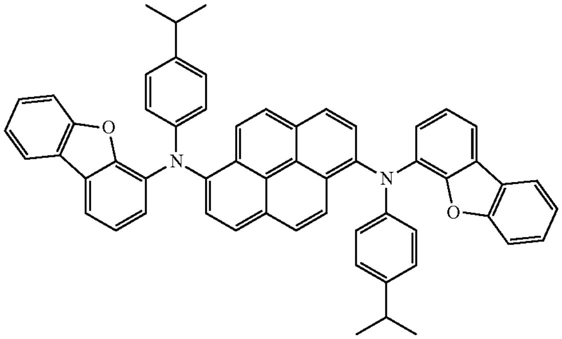

-continued
FD26
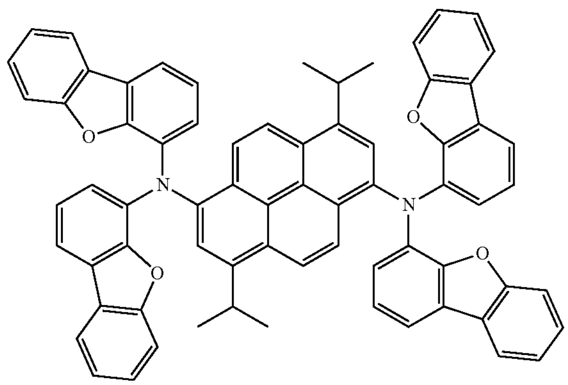
FD27
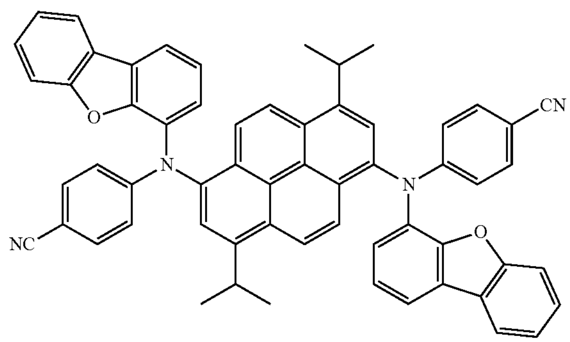
FD28
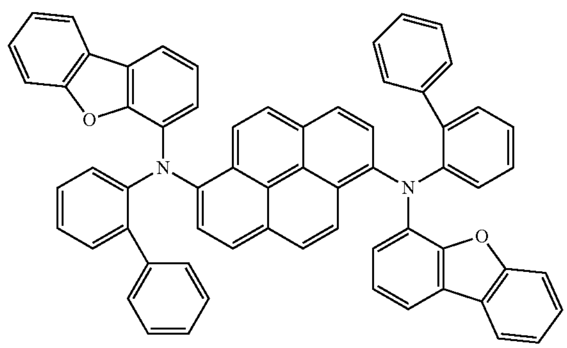
FD29
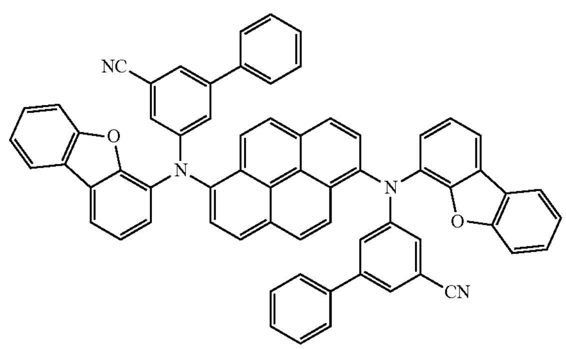
-continued
FD30
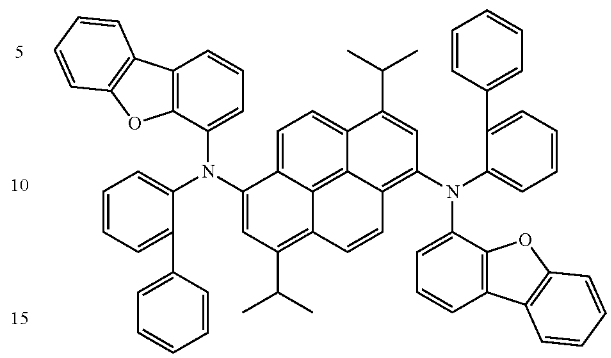
FD31
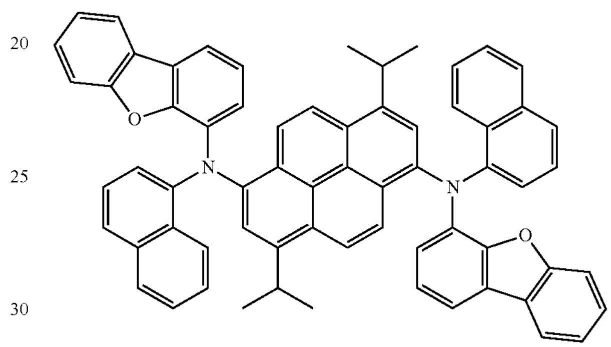
FD32
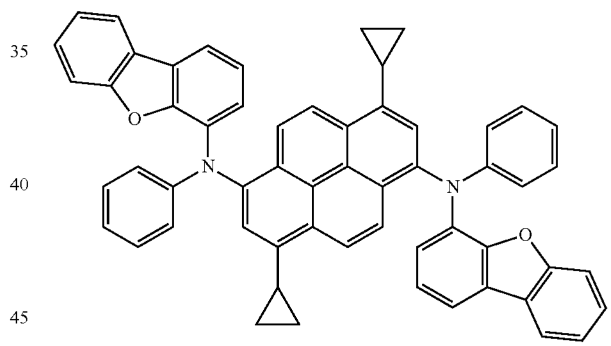
FD33
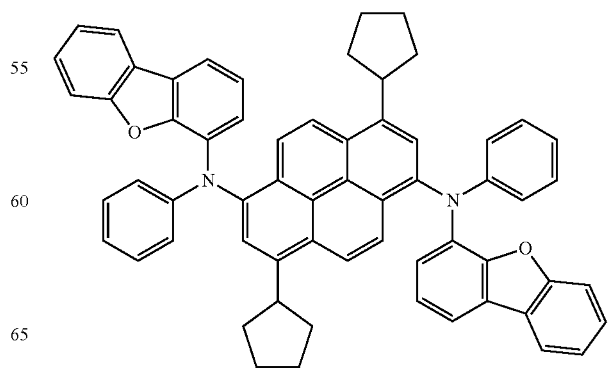

-continued

FD34

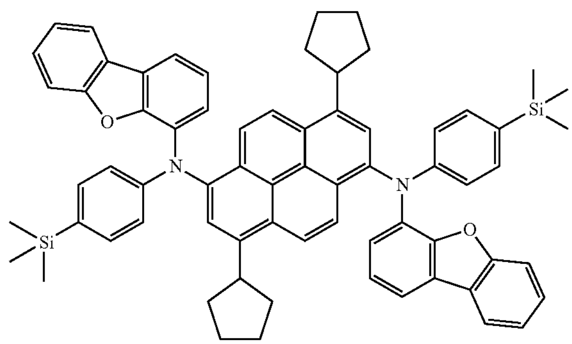

FD35

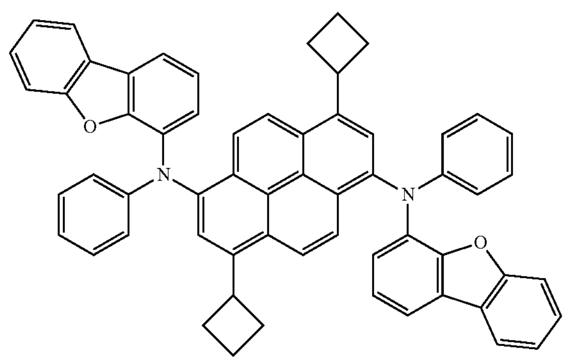

FD36

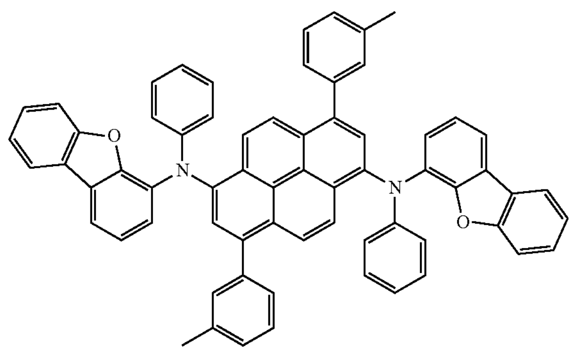

DPVBi

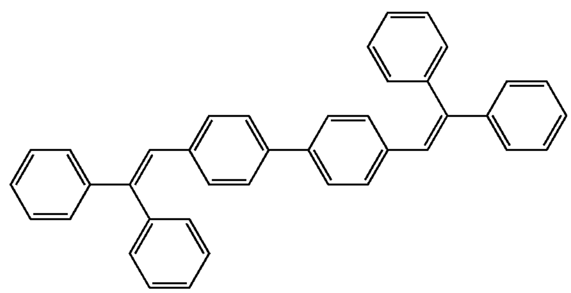

-continued

DPAVBi

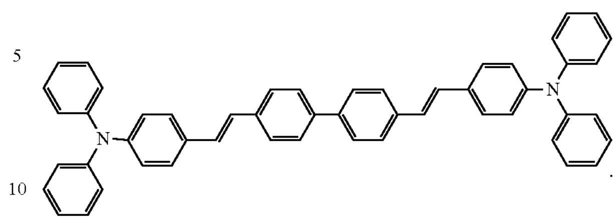

.

Delayed Fluorescence Material

The emission layer may include a delayed fluorescence material.

In the present specification, the delayed fluorescence material may be selected from compounds capable of emitting delayed fluorescent light based on a delayed fluorescence emission mechanism.

The delayed fluorescence material included in the emission layer may act (e.g., serve) as a host or a dopant depending on the type or kind of other materials included in the emission layer.

In one or more embodiments, the difference between the triplet energy level (eV) of the delayed fluorescence material and the singlet energy level (eV) of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 10 may be improved.

For example, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, and/or a π electron-deficient nitrogen-containing $C_1$-$C_{60}$ cyclic group), and/or ii) a material including a $C_8$-$C_{60}$ polycyclic group in which two or more cyclic groups are condensed while sharing boron (B).

Examples of the delayed fluorescence material may include at least one of the following compounds DF1 to DF9:

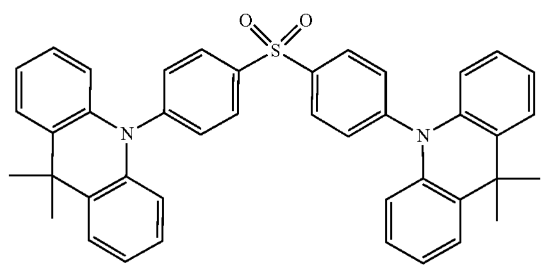

DF1(DMAC-DPS)

-continued
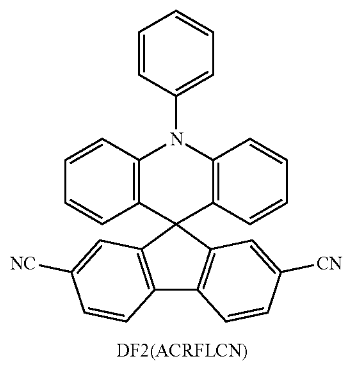
DF2(ACRFLCN)
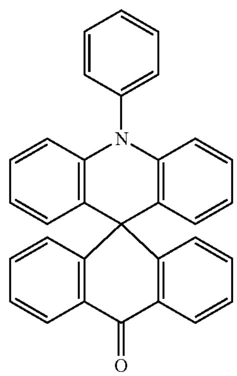
DF3(ACRSA)
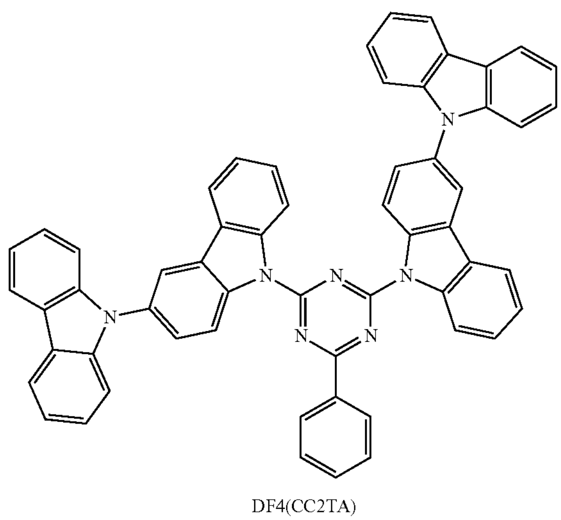
DF4(CC2TA)
-continued
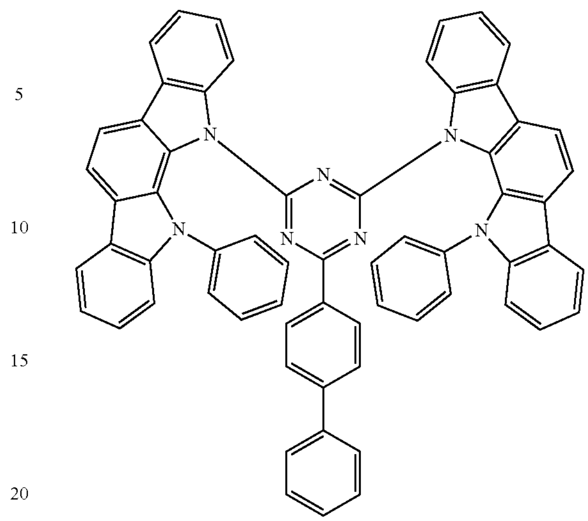
DF5(PIC-TRZ)
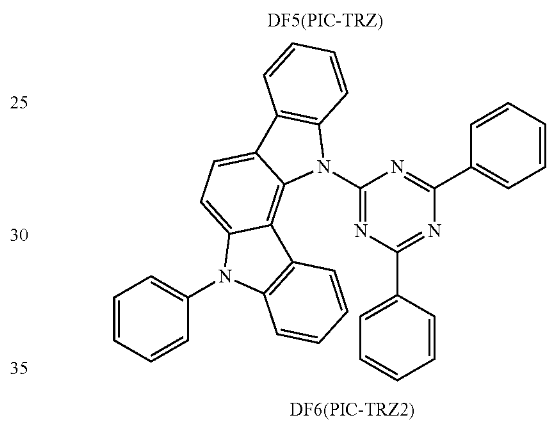
DF6(PIC-TRZ2)
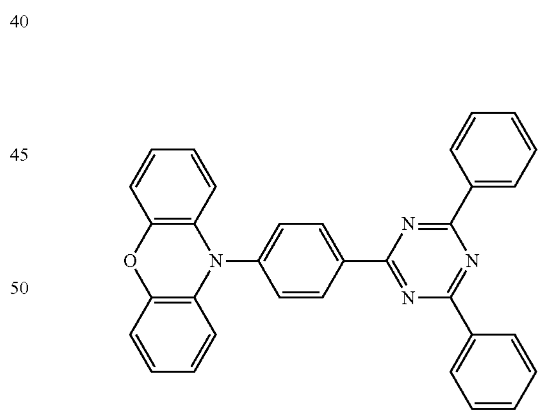
DF7(PXZ-TRZ)
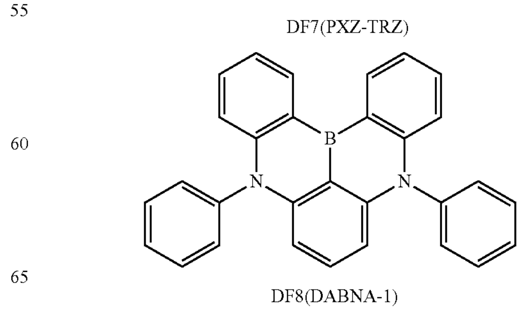
DF8(DABNA-1)

-continued

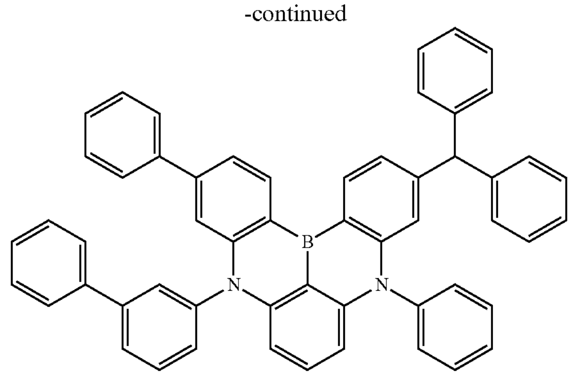

DF9(DABNA-2)

Quantum Dot

The emission layer may include a quantum dot.

The term "quantum dot" as used herein refers to a crystal of a semiconductor compound, and may include any material capable of emitting light of one or more suitable emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

The wet chemical process is a method including mixing a precursor material with an organic solvent and then growing a quantum dot particle crystal. When the crystal grows, the organic solvent naturally acts (e.g., serves) as a dispersant coordinated on the surface of the quantum dot particle crystal and controls the growth of the crystal so that the growth of quantum dot particle crystal can be controlled through a lower cost process, which is easier than vapor deposition methods, such as metal organic chemical vapor deposition (MOCVD) and/or molecular beam epitaxy (MBE).

The quantum dot may include one or more Group II-VI semiconductor compounds, Group III-V semiconductor compounds, Group III-VI semiconductor compounds, Group I-III-VI semiconductor compounds, Group IV-VI semiconductor compounds, a Group IV element or compound, or any combination thereof.

Examples of the Group II-VI semiconductor compound may include (e.g., may be) a binary compound, such as CdS, CdSe, CdTe, ZnS, ZnSe, ZnTe, ZnO, HgS, HgSe, HgTe, MgSe, and/or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound, such as CdZnSeS, CdZnSeTe, CdZnSTe, CdHgSeS, CdHgSeTe, CdHgSTe, HgZnSeS, HgZnSeTe, and/or HgZnSTe; or any combination thereof.

Examples of the Group III-V semiconductor compound may include: a binary compound, such as GaN, GaP, GaAs, GaSb, AlN, AlP, AlAs, AlSb, InN, InP, InAs, and/or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, and/or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb; or any combination thereof. In some embodiments, the Group III-V semiconductor compound may further include a Group II element. Examples of the Group III-V semiconductor compound further including a Group II element may include (e.g., may be) InZnP, InGaZnP, InAIZnP, etc.

Examples of the Group III-VI semiconductor compound may include (e.g., may be): a binary compound, such as GaS, GaSe, $Ga_2Se_3$, GaTe, InS, InSe, $In_2S_3$, $In_2Se_3$, and/or InTe; a ternary compound, such as $InGaS_3$, and/or $InGaSe_3$; and any combination thereof.

Examples of the Group I-III-VI semiconductor compound may include (e.g., may be): a ternary compound, such as AgInS, $AgInS_2$, CulnS, $CuInS_2$, $CuGaO_2$, $AgGaO_2$, and/or $AgAlO_2$; or any combination thereof.

Examples of the Group IV-VI semiconductor compound may include (e.g., may be): a binary compound, such as SnS, SnSe, SnTe, PbS, PbSe, and/or PbTe; a ternary compound, such as SnSeS, SnSeTe, SnSTe, PbSeS, PbSeTe, PbSTe, SnPbS, SnPbSe, and/or SnPbTe; a quaternary compound, such as SnPbSSe, SnPbSeTe, and/or SnPbSTe; or any combination thereof.

The Group IV element or compound may include: a single element, such as Si and/or Ge; a binary compound, such as SiC and/or SiGe; or any combination thereof.

Each element included in a multi-element compound such as the binary compound, the ternary compound, and the quaternary compound may be present at a substantially uniform concentration or non-substantially uniform concentration in a particle.

In some embodiments, the quantum dot may have a single structure in which the concentration of each element in the quantum dot is substantially uniform, or a core-shell dual structure. In some embodiments, in a quantum dot with a core-shell dual structure, the material included in the core and the material included in the shell may be different from each other.

The shell of the quantum dot may act (e.g., serve) as a protective layer that prevents or reduces chemical degeneration of the core to maintain semiconductor characteristics, and/or as a charging layer that imparts electrophoretic characteristics to the quantum dot. The shell may be a single layer or a multi-layer. The interface between the core and the shell may have a concentration gradient in which the concentration of an element existing in the shell decreases toward the center of the core.

Examples of the shell of the quantum dot may include (e.g., may be) an oxide of metal, metalloid, or non-metal, a semiconductor compound, and any combination thereof. Examples of the oxide of metal, metalloid, or non-metal may include (e.g., may be) a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; a ternary compound, such as $MgAl_2O_4$, $CoFe_2O_4$, $NiFe_2O_4$, and/or $CoMn_2O_4$; and any combination thereof. Examples of the semiconductor compound may include (e.g., may be), as described herein, a Group II-VI semiconductor compound; a Group III-V semiconductor compound; a Group III-VI semiconductor compound; a Group I-III-VI semiconductor compound; a Group IV-VI semiconductor compound; and any combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of the emission wavelength spectrum of the quantum dot may be about 45 nm or less, for example, about 40 nm or less, for example, about 30 nm or less, and within these ranges, color purity or color reproducibility may be increased. In addition, because the light emitted through the quantum dot is emitted in all directions, the wide viewing angle may be improved.

In some embodiments, the quantum dot may be in the form of a spherical nanoparticle, a pyramidal nanoparticle, a multi-arm nanoparticle, a cubic nanoparticle, a nanotube, a nanowire, a nanofiber, or a nanoplate.

Because the energy band gap may be adjusted by controlling the size of the quantum dot, light having one or more suitable wavelength bands may be obtained from the quantum dot emission layer. Accordingly, by utilizing quantum dots of different sizes, a light-emitting device that emits light of one or more suitable wavelengths may be implemented (e.g., achieved). In one or more embodiments, the size of the quantum dot may be selected to emit red, green and/or blue light. In some embodiments, the size of the quantum dot may be configured to emit white light by combination of light of one or more suitable colors.

Electron Transport Region in Interlayer 130

The electron transport region may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The electron transport region may include a buffer layer, a hole-blocking layer, an electron control layer, an electron transport layer, an electron injection layer, or any combination thereof.

For example, the electron transport region may have an electron transport layer/electron injection layer structure, a hole-blocking layer/electron transport layer/electron injection layer structure, an electron control layer/electron transport layer/electron injection layer structure, or a buffer layer/electron transport layer/electron injection layer structure, with the constituting layers of each structure being sequentially stacked from an emission layer in the respective stated order.

In an embodiment, the electron transport region (for example, the buffer layer, the hole-blocking layer, the electron control layer, and/or the electron transport layer in the electron transport region) may include a metal-free compound including at least one π electron-deficient nitrogen-containing $C_1$-$C_{60}$ cyclic group.

For example, the electron transport region may include a compound represented by Formula 601 below:

Formula 601

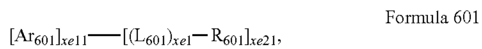

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_6$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each independently be the same as described herein with respect to $Q_1$, xe21 may be 1, 2, 3, 4, or 5, at least one selected from among $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$(s) may be linked to each other via a single bond.

In other embodiments, $Ar_{601}$ in Formula 601 may be a substituted or unsubstituted anthracene group.

In other embodiments, the electron transport region may include a compound represented by Formula 601-1:

Formula 601-1

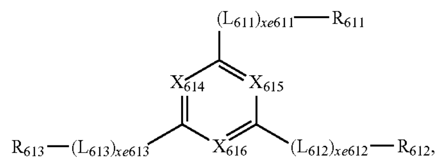

wherein, in Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ may each independently be the same as described herein with respect to $L_{601}$, xe611 to xe613 may each independently be the same as described herein with respect to xe1, $R_{611}$ to $R_{613}$ may each independently be the same as described herein with respect to $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include at least one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

-continued
ET1
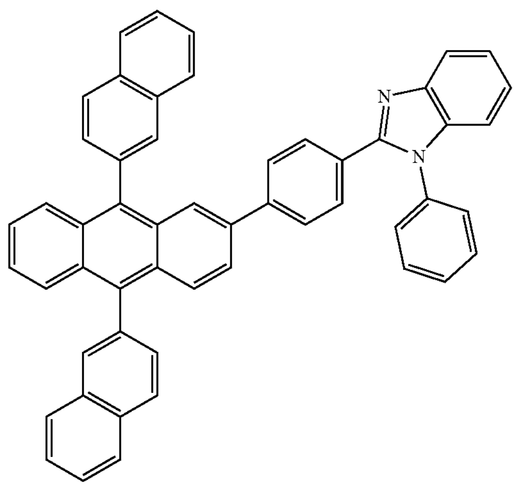
ET2
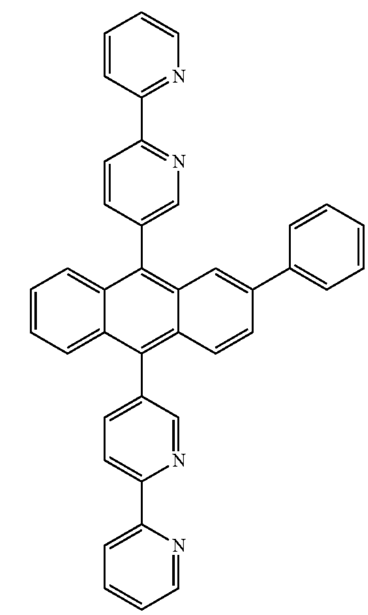
ET3
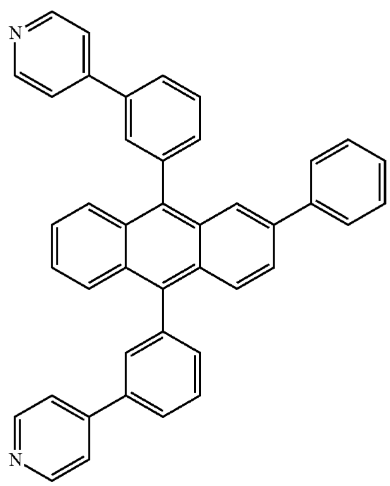
ET4
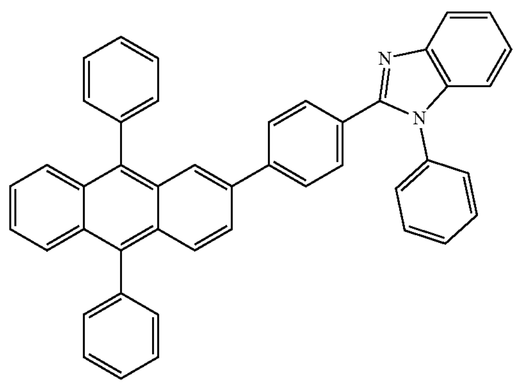
ET5
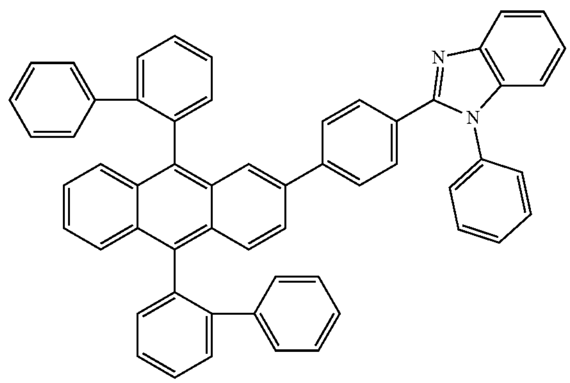
ET6
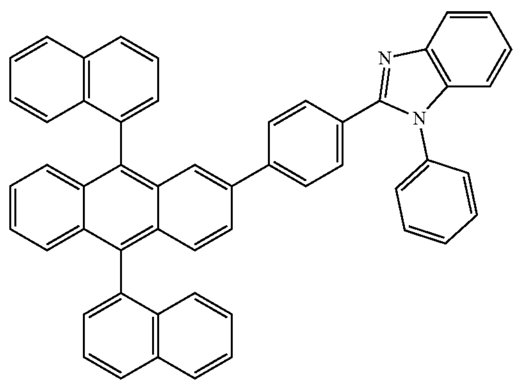

-continued
ET7
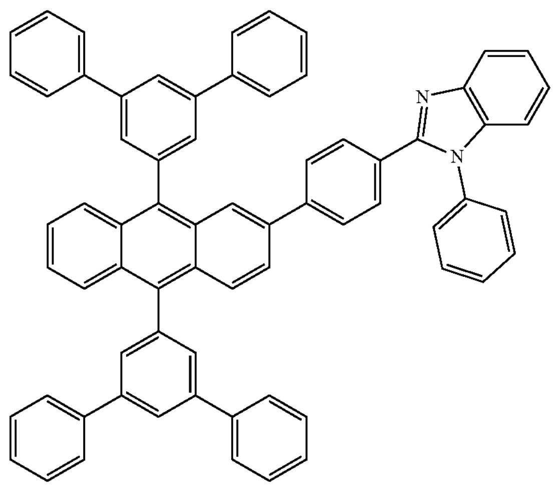
ET8
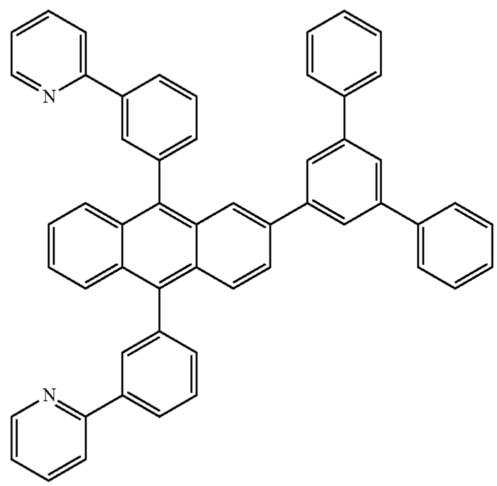
ET9
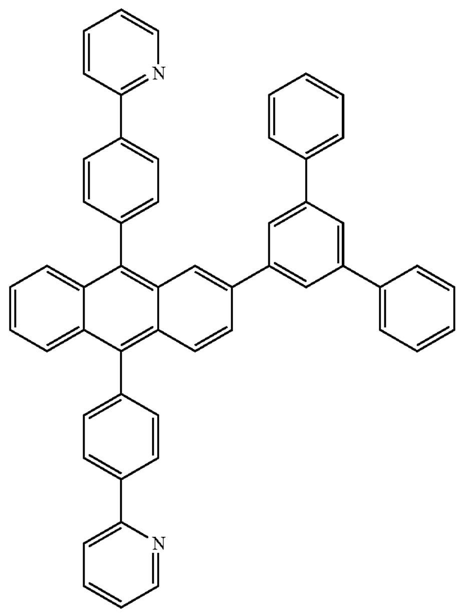
-continued
ET10
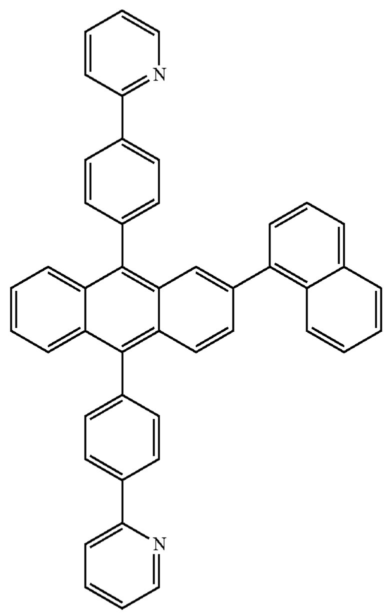
ET11
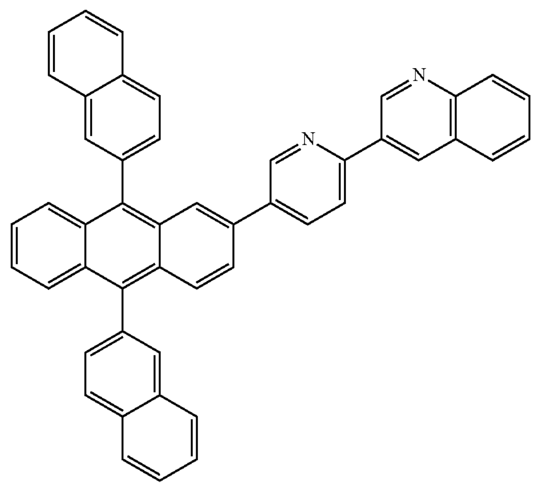
ET12
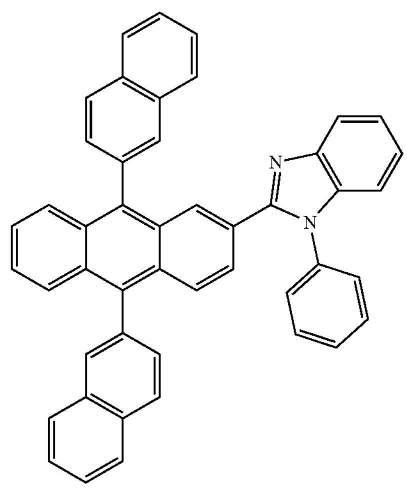

-continued
ET13
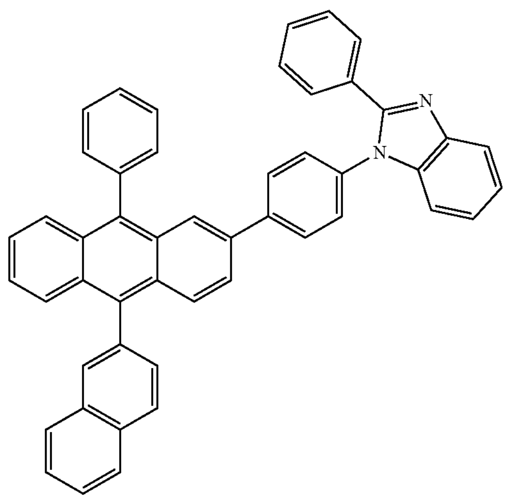
ET14
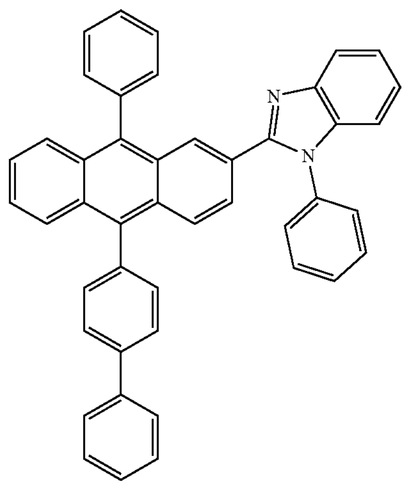
ET15
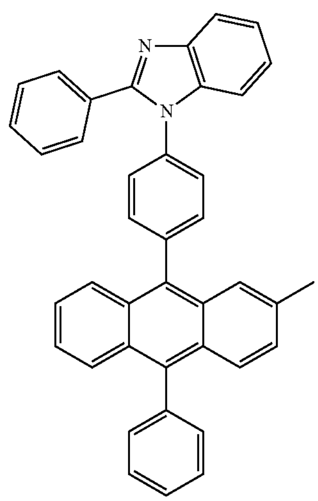
-continued
ET16
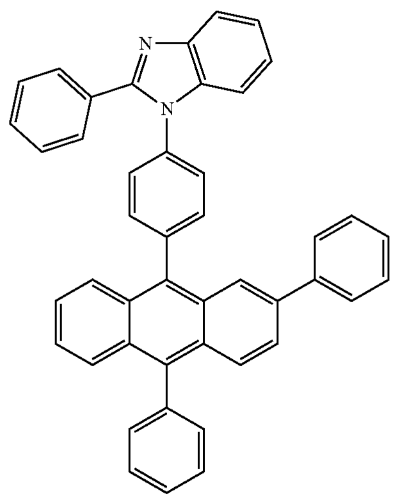
ET17
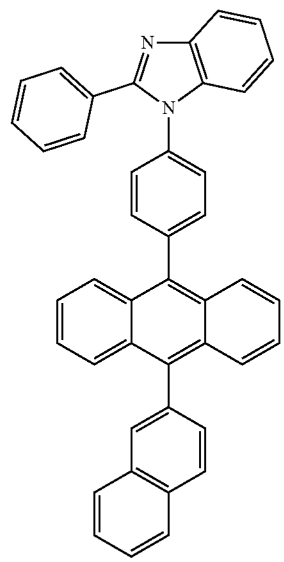
ET18
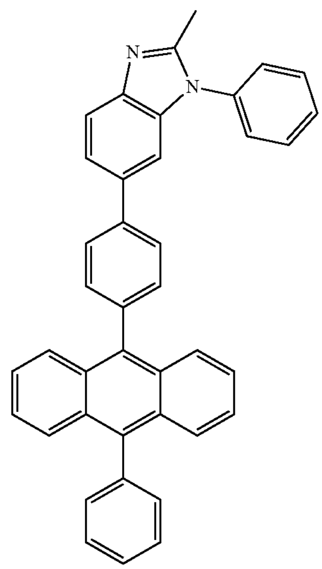

-continued
ET19
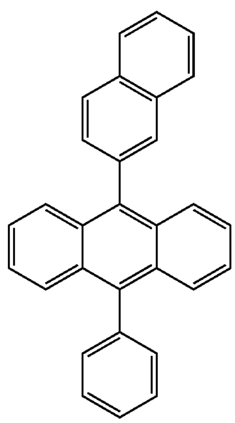
ET20
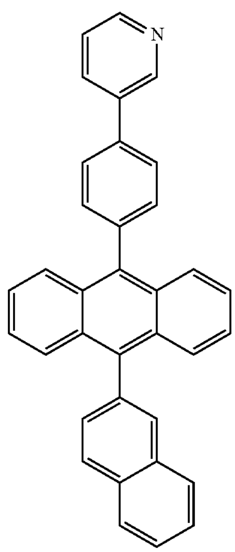
ET21
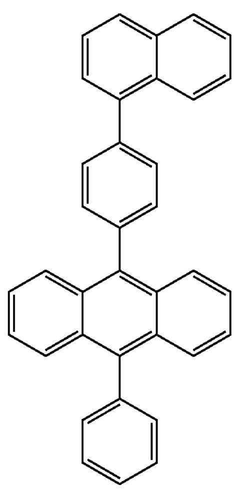
-continued
ET22
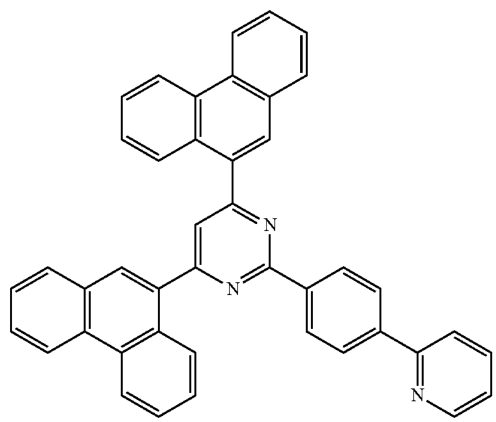
ET23
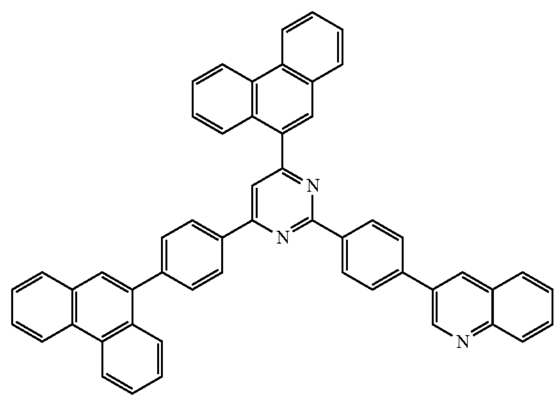
ET24
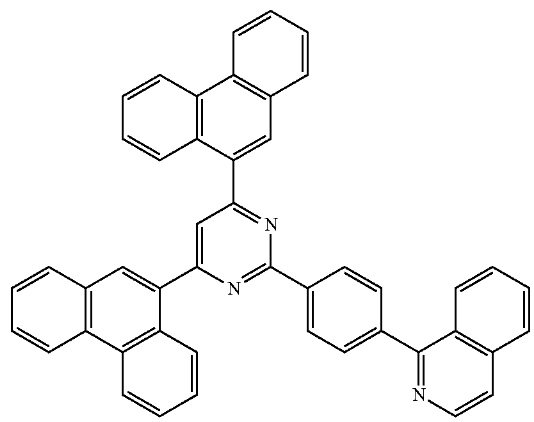

ET25
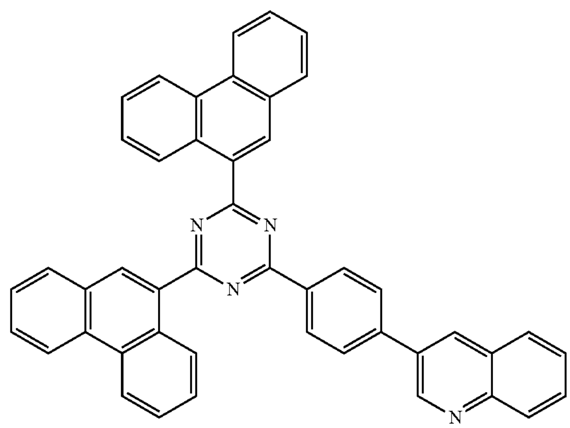
ET26
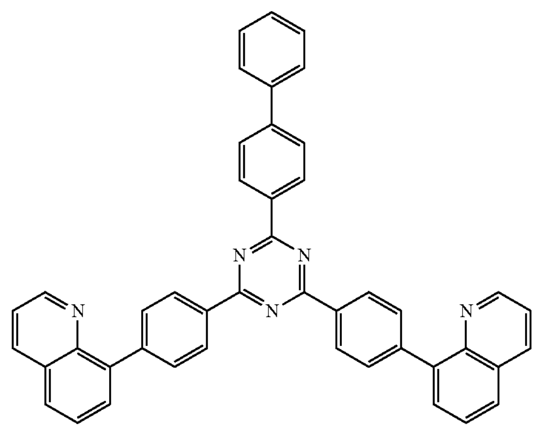
ET27
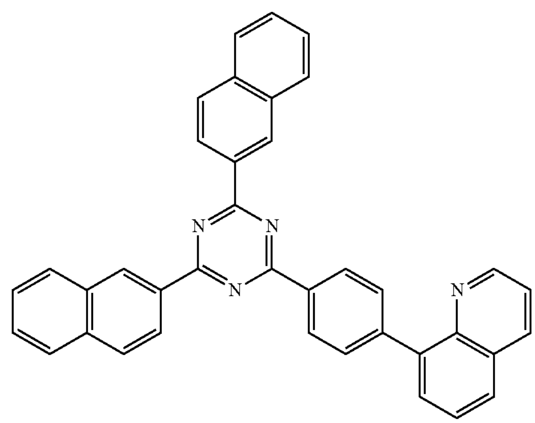
ET28
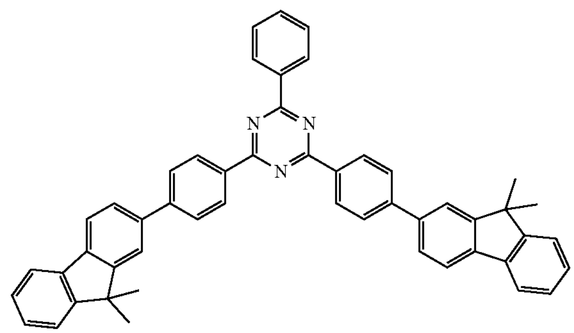
ET29
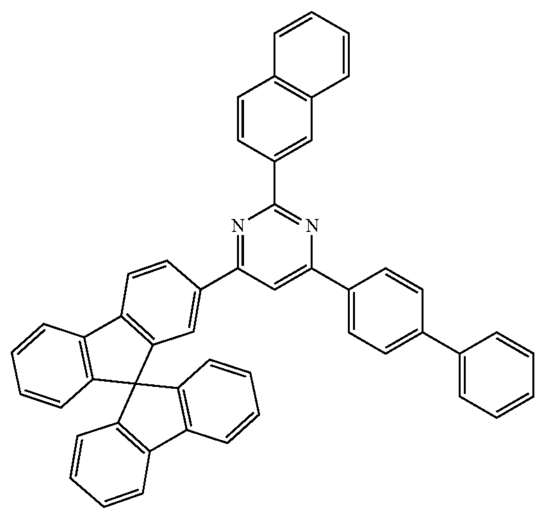
ET30
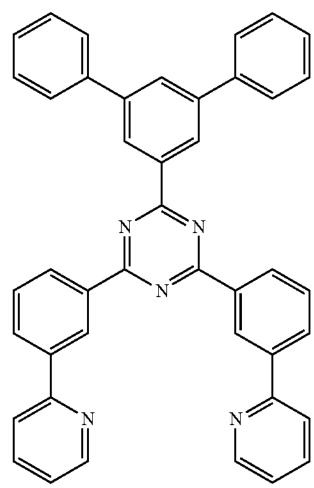

-continued
ET31
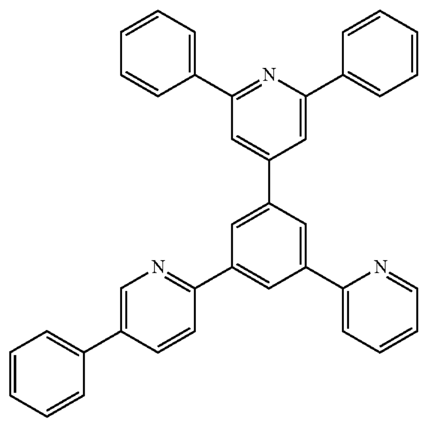
ET32
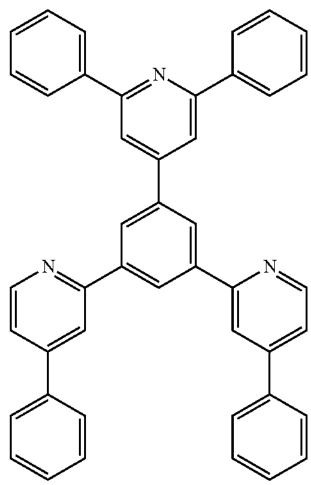
ET33
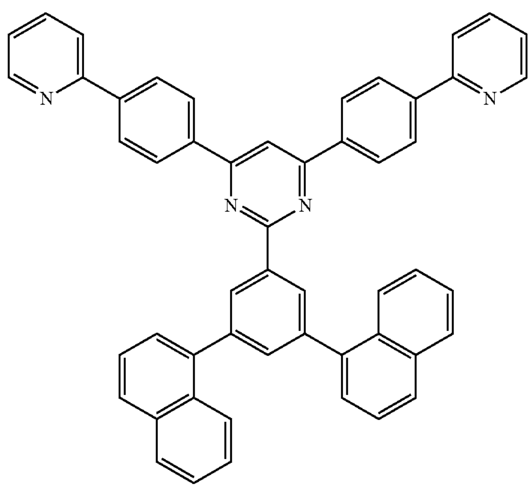
-continued
ET34
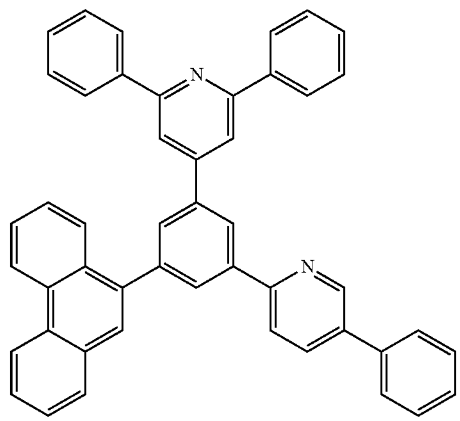
ET35
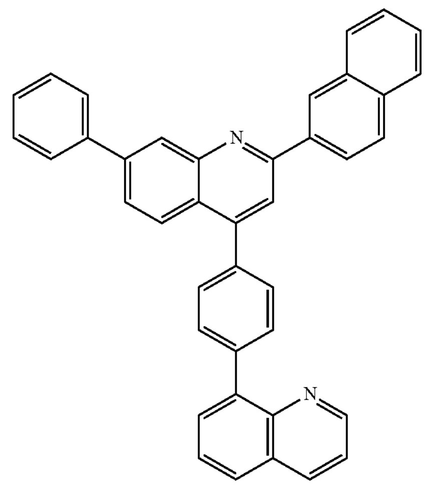
ET36
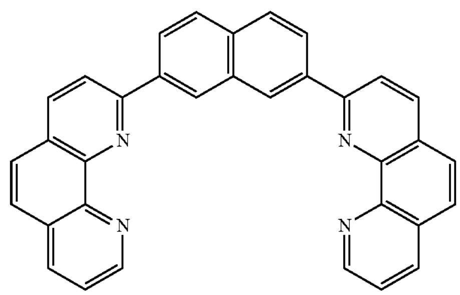
ET37
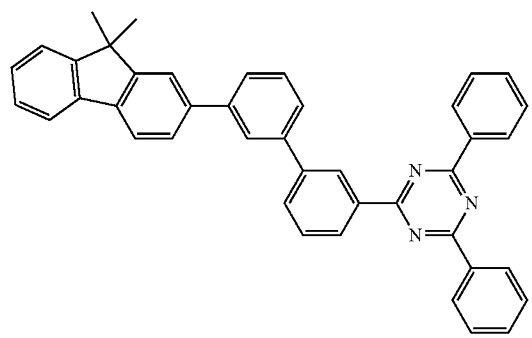

-continued
ET38
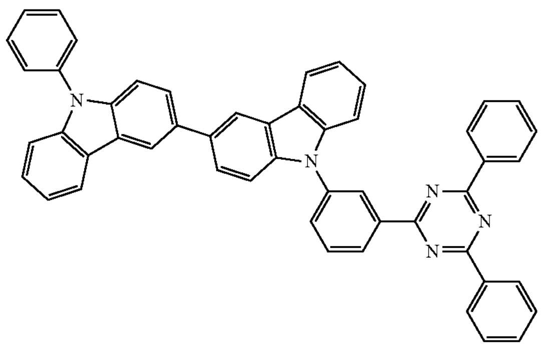
ET39
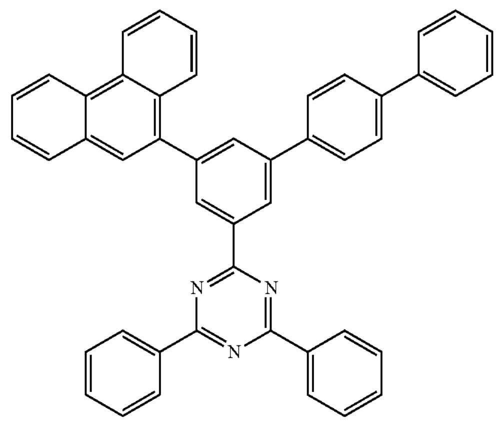
ET40
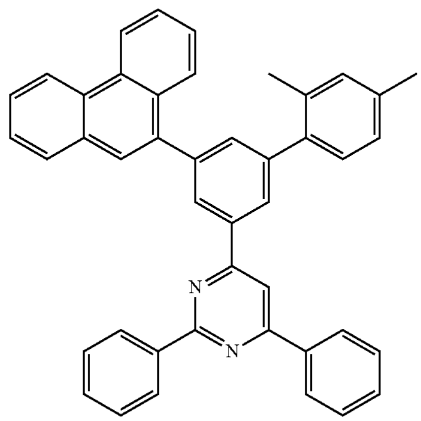
ET41
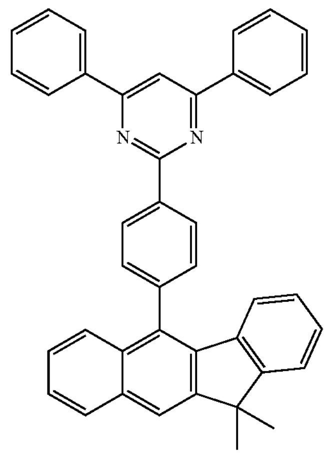
-continued
ET42
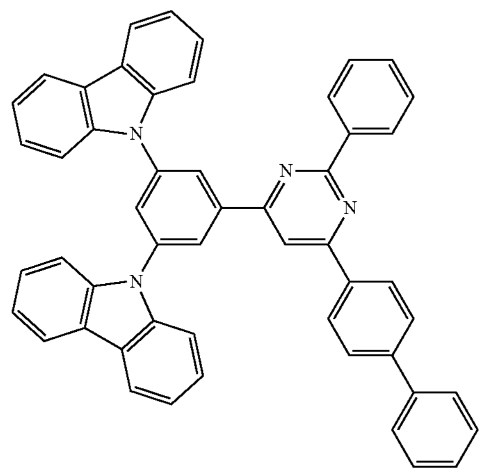
ET43
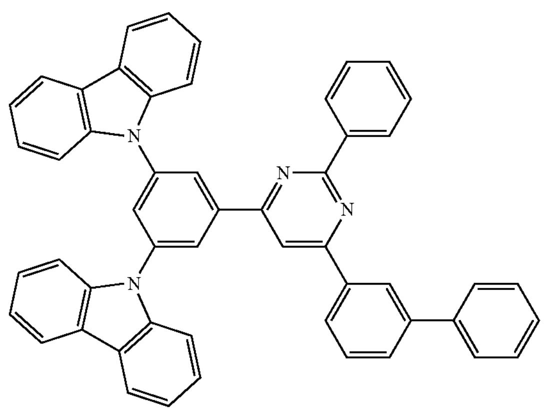
ET44
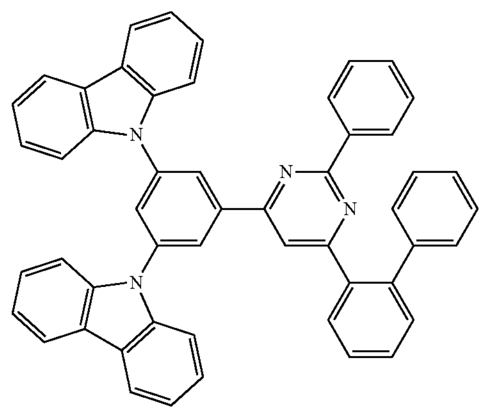
ET45
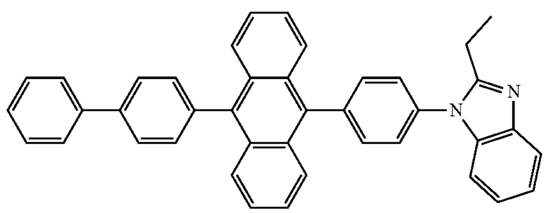

-continued

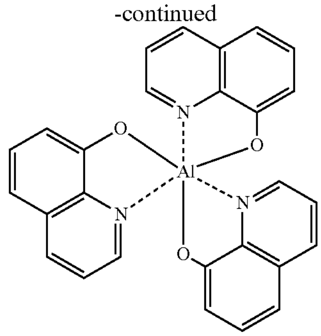

$Alq_3$

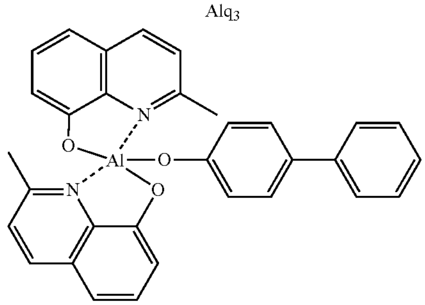

BAlq

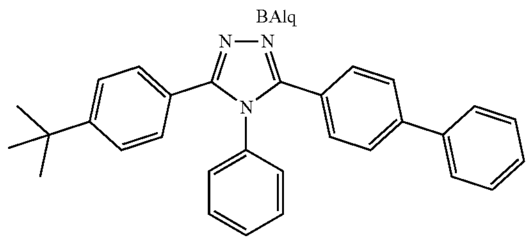

TAZ

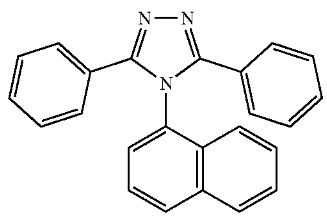

NTAZ

A thickness of the electron transport region may be from about 100 Å to about 5,000 Å, for example, about 160 Å to about 4,000 Å. When the electron transport region includes a buffer layer, a hole-blocking layer, an electron control layer, an electron transport layer, or any combination thereof, the thickness of the buffer layer, the hole-blocking layer, or the electron control layer may each independently be from about 20 Å to about 1,000 Å, for example, about 30 Å to about 300 Å, and the thickness of the electron transport layer may be from about 100 Å to about 1,000 Å, for example, about 150 Å to about 500 Å. When the thickness of the buffer layer, the hole-blocking layer, the electron control layer, the electron transport layer, and/or the electron transport region are within these ranges, satisfactory electron-transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. The metal ion of the alkali metal complex may be a Li ion, a Na ion, a K ion, a Rb ion, or a Cs ion, and the metal ion of the alkaline earth metal complex may be a Be ion, a Mg ion, a Ca ion, a Sr ion, or a Ba ion. A ligand coordinated with the metal ion of the alkali metal complex or the alkaline earth metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (Liq) or ET-D2:

ET-D1

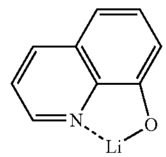

ET-D2

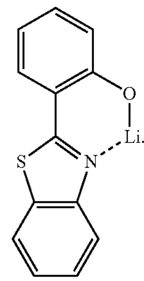

The electron transport region may include an electron injection layer that facilitates the injection of electrons from the second electrode 150. The electron injection layer may directly contact the second electrode 150.

The electron injection layer may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The electron injection layer may include an alkali metal, an alkaline earth metal, a rare earth metal, an alkali metal-containing compound, alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be one or more oxides, halides (for example, fluorides, chlorides, bromides, and/or iodides), and/or tellurides of the alkali metal, the alkaline earth metal, and/or the rare earth metal, or any combination thereof.

The alkali metal-containing compound may include: one or more alkali metal oxides, such as $Li_2O$, $Cs_2O$, and/or $K_2O$; alkali metal halides, such as LiF, NaF, CsF, KF, LiI, NaI, CsI, and/or KI; or any combination thereof. The alkaline earth metal-containing compound may include an alkaline earth metal oxide, such as BaO, SrO, CaO, $Ba_xSr_{1-x}O$ (wherein x is a real number satisfying the condition of $0<x<1$), $Ba_xCa_{1-x}O$ (wherein x is a real number satisfying the condition of $0<x<1$), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include lanthanide metal telluride. Examples of the lanthanide metal telluride may include (e.g., may be) LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth metal complex, and the rare earth metal complex may include i) one of the metal ions of the alkali metal, the alkaline earth metal, and the rare earth metal and ii), as a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In one or more embodiments, the electron injection layer may include (e.g., consist of): i) an alkali metal-containing compound (for example, an alkali metal halide); or ii) a) an alkali metal-containing compound (for example, an alkali metal halide), and b) an alkali metal, an alkaline earth metal, a rare earth metal, or any combination thereof. For example, the electron injection layer may be a KI:Yb co-deposited layer, an RbI:Yb co-deposited layer, a LiF:Yb co-deposited layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth metal complex, the rare earth metal complex, or any combination thereof may be uniformly or non-uniformly dispersed in a matrix including the organic material.

A thickness of the electron injection layer may be in a range of about 1 Å to about 100 Å, and, for example, about 3 Å to about 90 Å. When the thickness of the electron injection layer is within the ranges described above, satisfactory electron injection characteristics may be obtained without a substantial increase in driving voltage.

Second Electrode 150

The second electrode 150 may be located on the interlayer 130 having a structure as described above. The second electrode 150 may be a cathode, which is an electron injection electrode, and as the material for the second electrode 150, a metal, an alloy, an electrically conductive compound, or any combination thereof, each having a low-work function, may be utilized.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including a plurality of layers.

Capping Layer

A first capping layer may be located outside the first electrode 110 (e.g., on the side of the first electrode 110 facing oppositely away from the second electrode 150), and/or a second capping layer may be located outside the second electrode 150 (e.g., on the side of the second electrode 150 facing oppositely away from the first electrode 110). In one or more embodiments, the light-emitting device 10 may have a structure in which the first capping layer, the first electrode 110, the interlayer 130, and the second electrode 150 are sequentially stacked in the stated order, a structure in which the first electrode 110, the interlayer 130, the second electrode 150, and the second capping layer are sequentially stacked in the stated order, or a structure in which the first capping layer, the first electrode 110, the interlayer 130, the second electrode 150, and the second capping layer are sequentially stacked in the stated order.

Light generated in the emission layer of the interlayer 130 of the light-emitting device 10 may be extracted (e.g., emitted) toward the outside through the first electrode 110 which is a semi-transmissive electrode or a transmissive electrode, and the first capping layer, or light generated in an emission layer of the interlayer 130 of the light-emitting device 10 may be extracted (e.g., emitted) toward the outside through the second electrode 150 which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 is increased, so that the luminescence efficiency of the light-emitting device 10 may be improved.

Each of the first capping layer and the second capping layer may include a material having a refractive index of 1.6 or more (at a wavelength of 589 nm).

The first capping layer and the second capping layer may each independently be an organic capping layer including an organic material, an inorganic capping layer including an inorganic material, or an organic-inorganic composite capping layer including an organic material and an inorganic material.

At least one of the first capping layer or the second capping layer may each independently include one or more carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. Optionally, the carbocyclic compound, the heterocyclic compound, and the amine group-containing compound may be substituted with a substituent including O, N, S, Se, Si, F, Cl, Br, I, or any combination thereof.

In one or more embodiments, at least one of the first capping layer or the second capping layer may each independently include an amine group-containing compound.

For example, at least one of the first capping layer or the second capping layer may each independently include a compound represented by Formula 201, a compound represented by Formula 202, or any combination thereof.

In one or more embodiments, at least one of the first capping layer or the second capping layer may each independently include at least one of Compounds HT28 to HT33, at least one of Compounds CP1 to CP6, β-NPB, or any combination thereof:

CP1

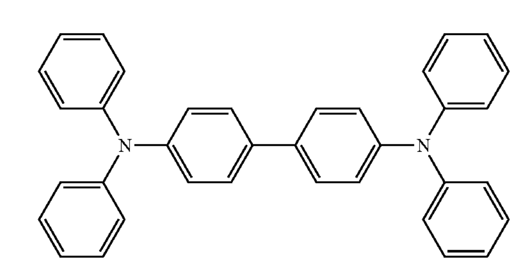

CP2

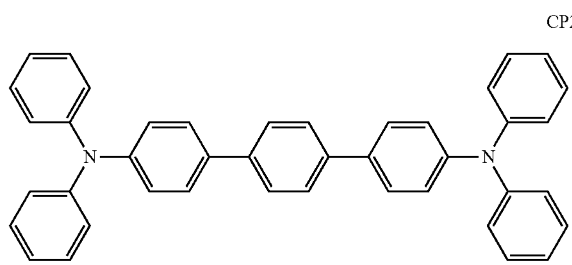

CP3

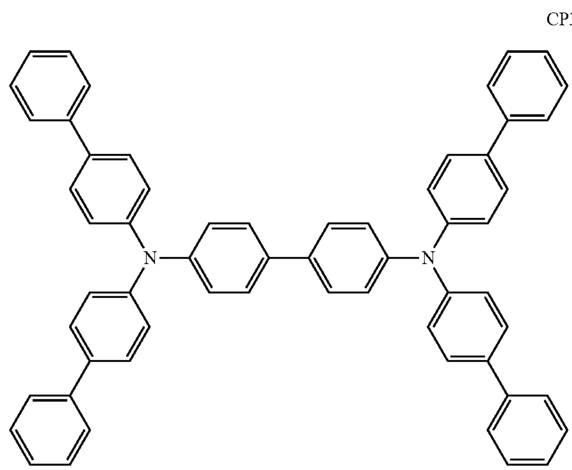

-continued

CP4

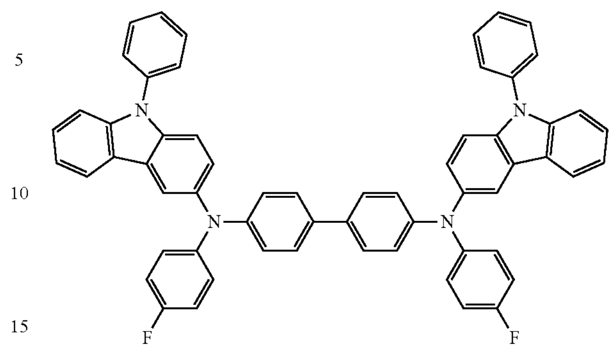

CP5

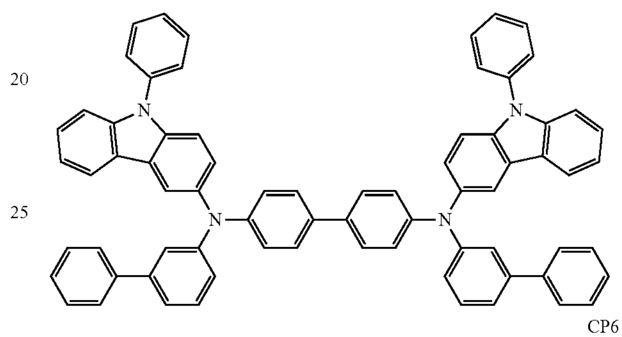

CP6

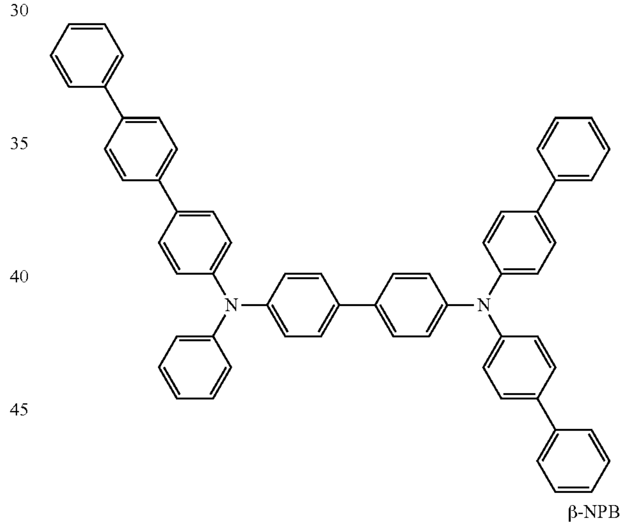

β-NPB

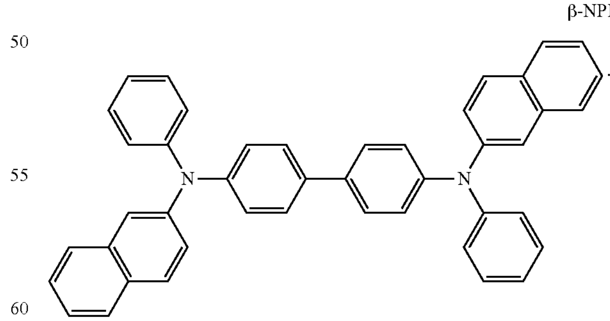

.

Film

The organometallic compound represented by Formula 1 may be included in one or more suitable films. Accordingly, another aspect provides a film including the organometallic compound represented by Formula 1. The film may be, for example, an optical member (or a light control means) (for example, a color filter, a color conversion member, a capping layer, a light extraction efficiency enhancement layer, a selective light absorbing layer, a polarizing layer, a quantum dot-containing layer, or like), a light-blocking member (for example, a light reflective layer, a light absorbing layer, and/or the like), a protective member (for example, an insulating layer, a dielectric layer, and/or the like), and/or the like.

Electronic Apparatus

The light-emitting device may be included in one or more suitable electronic apparatuses. For example, the electronic apparatus including the light-emitting device may be a light-emitting apparatus, an authentication apparatus, and/or the like.

The electronic apparatus (for example, a light-emitting apparatus) may further include, in addition to the light-emitting device, i) a color filter, ii) a color conversion layer, or iii) a color filter and a color conversion layer. The color filter and/or the color conversion layer may be located in at least one direction in which light emitted from the light-emitting device travels. For example, the light emitted from the light-emitting device may be blue light or white light. For details on the light-emitting device, related description provided above may be referred to. In one or more embodiments, the color conversion layer may include a quantum dot. The quantum dot may be, for example, a quantum dot as described herein.

The electronic apparatus may include a first substrate. The first substrate may include a plurality of subpixel areas, the color filter may include a plurality of color filter areas respectively corresponding to the plurality of subpixel areas, and the color conversion layer may include a plurality of color conversion areas respectively corresponding to the plurality of subpixel areas.

A pixel defining layer may be located among the plurality of subpixel areas to define each of the plurality of subpixel areas.

The color filter may further include a plurality of color filter areas and light-shielding patterns located among the plurality of color filter areas, and the color conversion layer may further include a plurality of color conversion areas and light-shielding patterns located among the plurality of color conversion areas.

The plurality of color filter areas (or the plurality of color conversion areas) may include a first area emitting a first color light, a second area emitting a second color light, and/or a third area emitting a third color light, wherein the first color light, the second color light, and/or the third color light may have different maximum emission wavelengths from one another. In one or more embodiments, the first color light may be red light, the second color light may be green light, and the third color light may be blue light. In one or more embodiments, the plurality of color filter areas (or the plurality of color conversion areas) may include quantum dots. For example, the first area may include a red quantum dot, the second area may include a green quantum dot, and the third area may not include (e.g., may exclude) a quantum dot. For details on the quantum dot, related descriptions provided herein may be referred to. The first area, the second area, and/or the third area may each include a scatterer.

In one or more embodiments, the light-emitting device may be to emit a first light, the first area may be to absorb the first light to emit a first-first color light, the second area may be to absorb the first light to emit a second-first color light, and the third area may be to absorb the first light to emit a third-first color light. In this regard, the first-first color light, the second-first color light, and the third-first color light may have different maximum emission wavelengths. In particular, the first light may be blue light, the first-first color light may be red light, the second-first color light may be green light, and the third-first color light may be blue light.

The electronic apparatus may further include a thin-film transistor, in addition to the light-emitting device as described above. The thin-film transistor may include a source electrode, a drain electrode, and an activation layer, wherein the source electrode or the drain electrode may be electrically connected to the first electrode or the second electrode of the light-emitting device.

The thin-film transistor may further include a gate electrode, a gate insulating film, and/or the like.

The activation layer may include crystalline silicon, amorphous silicon, an organic semiconductor, an oxide semiconductor, and/or the like.

The electronic apparatus may further include a sealing portion for sealing the light-emitting device. The sealing portion may be located between the color filter and/or the color conversion layer and the light-emitting device. The sealing portion allows light from the light-emitting device to be extracted to the outside, and concurrently (e.g., simultaneously) prevents or reduces penetration of ambient air and/or moisture into the light-emitting device. The sealing portion may be a sealing substrate including a transparent glass substrate and/or a plastic substrate. The sealing portion may be a thin-film encapsulation layer including at least one layer of an organic layer and an inorganic layer. When the sealing portion is a thin film encapsulation layer, the electronic apparatus may be flexible.

Various functional layers may be additionally located on the sealing portion, in addition to the color filter and/or the color conversion layer, according to the application of the electronic apparatus. Examples of the functional layers may include a touch screen layer, a polarizing layer, and/or the like. The touch screen layer may be a pressure-sensitive touch screen layer, a capacitive touch screen layer, or an infrared touch screen layer.

The authentication apparatus may further include, in addition to the light-emitting device as described above, a biometric information collector. The authentication apparatus may be, for example, a biometric authentication apparatus that authenticates an individual by utilizing biometric information of a living body (for example, fingertips, pupils, etc.).

The electronic apparatus may be applied to one or more suitable displays, light sources, lighting apparatuses, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, one or more suitable measuring instruments, meters (for example, meters for a vehicle, an aircraft, and/or a vessel), projectors, and/or the like.

Figure 2:
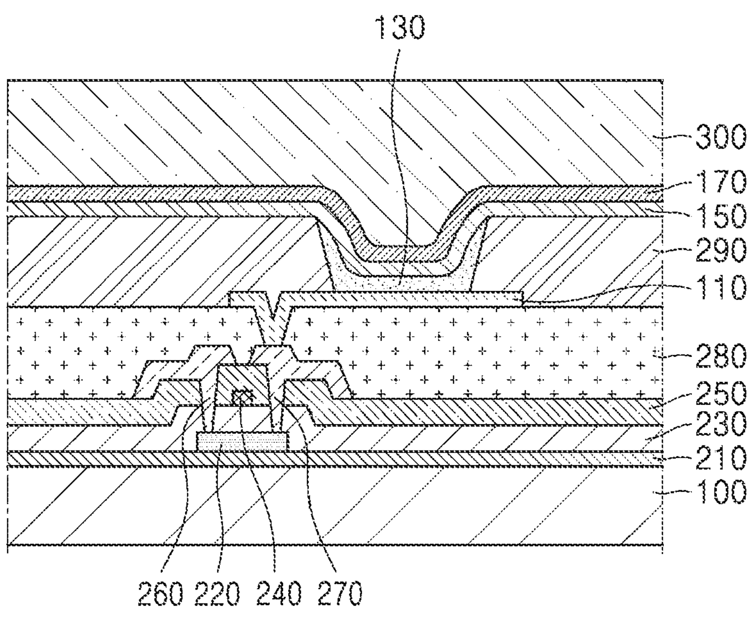
FIG. 2 shows a schematic cross-sectional view of an electronic apparatus according to an embodiment.
Figure 3:
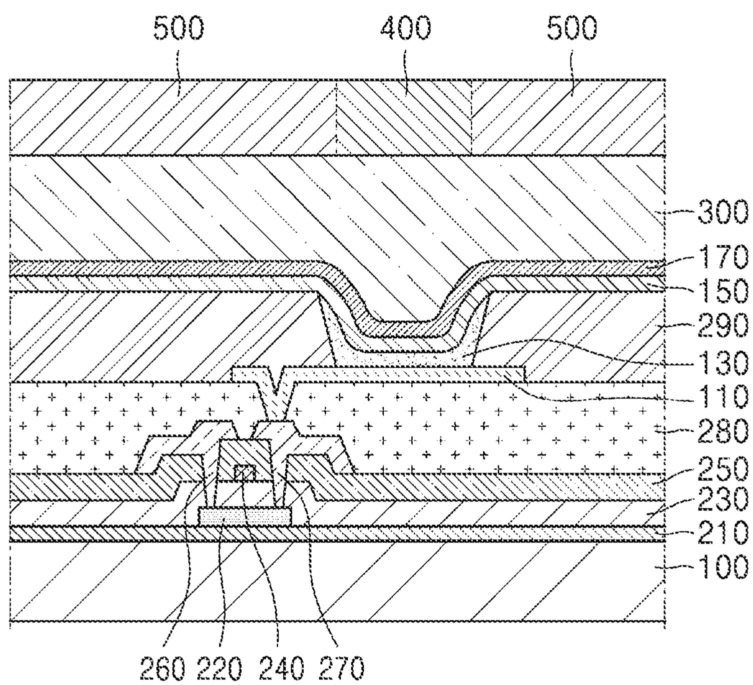
FIG. 3 shows a schematic cross-sectional view of an electronic apparatus according to an embodiment.

Description of FIGS. 2 and 3

FIG. 2 is a cross-sectional view showing an electronic apparatus according to an embodiment of the present disclosure.

The electronic apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be located on the substrate 100. The buffer layer 210 may prevent or reduce penetration of impurities through the substrate 100 and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor such as silicon or polysilicon, an organic semiconductor, and/or an oxide semiconductor, and may include a source region, a drain region, and a channel region.

A gate insulating film 230 for insulating the activation layer 220 from the gate electrode 240 may be located on the activation layer 220, and the gate electrode 240 may be located on the gate insulating film 230.

An interlayer insulating film 250 may be located on the gate electrode 240. The interlayer insulating film 250 may be located between the gate electrode 240 and the source electrode 260 to insulate the gate electrode 240 from the source electrode 260 and between the gate electrode 240 and the drain electrode 270, to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be located in contact with the exposed portions of the source region and the drain region of the activation layer 220.

The TFT is electrically connected to a light-emitting device to drive the light-emitting device, and is covered and protected by a passivation layer 280. The passivation layer 280 may include an inorganic insulating film, an organic insulating film, or any combination thereof. A light-emitting device is provided on the passivation layer 280. The light-emitting device may include a first electrode 110, an interlayer 130, and a second electrode 150.

The first electrode 110 may be located on the passivation layer 280. The passivation layer 280 may be located to expose a portion of the drain electrode 270, not fully covering the drain electrode 270, and the first electrode 110 may be located to be connected to the exposed portion of the drain electrode 270.

A pixel defining layer 290 including an insulating material may be located on the first electrode 110. The pixel defining layer 290 may expose a certain region of the first electrode 110, and an interlayer 130 may be formed in the exposed region of the first electrode 110. The pixel defining layer 290 may be a polyimide or polyacrylic organic film. In one embodiment, one or more layers of the interlayer 130 may extend beyond the upper portion of the pixel defining layer 290 in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture and/or oxygen. The encapsulation portion 300 may include: an inorganic film including silicon nitride ($SiN_x$), silicon oxide ($SiO_x$), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic-based resin (for example, polymethyl methacrylate, polyacrylic acid, and/or the like), an epoxy-based resin (for example, aliphatic glycidyl ether (AGE), and/or the like), or any combination thereof; or any combination of the inorganic films and the organic films.

FIG. 3 shows a cross-sectional view showing an electronic apparatus according to an embodiment of the present disclosure.

The electronic apparatus of FIG. 3 is substantially the same as the electronic apparatus of FIG. 2, except that a light-shielding pattern 500 and a functional region 400 are additionally located on the encapsulation portion 300. The functional region 400 may be i) a color filter area, ii) a color conversion area, or iii) a combination of the color filter area and the color conversion area. In an embodiment, the light-emitting device included in the electronic apparatus of FIG. 3 may be a tandem light-emitting device.

Manufacturing Method

The layers included in the hole transport region, the emission layer, and the layers included in the electron transport region may be formed in a certain region by utilizing one or more suitable methods such as vacuum deposition, spin coating, casting, Langmuir-Blodgett (LB) deposition, ink-jet printing, laser-printing, laser-induced thermal imaging, and/or the like.

When layers included in the hole transport region, an emission layer, and layers included in the electron transport region are formed by vacuum deposition, the vacuum deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definition of Terms

The term "$C_3$-$C_{60}$ carbocyclic group" as used herein refers to a cyclic group consisting of only carbon atoms as ring-forming atoms and having three to sixty carbon atoms, and the term "$C_1$-$C_{60}$ heterocyclic group" as used herein refers to a cyclic group that has, in addition to one to sixty carbon atoms, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the $C_1$-$C_6$ heterocyclic group has 3 to 61 ring-forming atoms.

The term "cyclic group" as used herein may include the $C_3$-$C_{60}$ carbocyclic group, and the $C_1$-$C_{60}$ heterocyclic group.

The term "Tr electron-rich $C_3$-$C_{60}$ cyclic group" as used herein refers to a cyclic group that has three to sixty carbon atoms and does not include *—N=*' as a ring-forming moiety, and the term "Tr electron-deficient nitrogen-containing $C_1$-$C_{60}$ cyclic group" as used herein refers to a heterocyclic group that has one to sixty carbon atoms and includes *—N=*' as a ring-forming moiety.

For example, the $C_3$-$C_{60}$ carbocyclic group may be i) group T1 or ii) a condensed cyclic group in which two or more groups T1 are condensed with each other (for example, the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) group T2, ii) a condensed cyclic group in which two or more groups T2 are condensed with each other, or iii) a condensed cyclic group in which at least one group T2 and at least one group T1 are condensed with each other (for example, the $C_1$-$C_{60}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) group T1, ii) a condensed cyclic group in which two or more groups T1 are condensed with each other, iii) group T3, iv) a condensed cyclic group in which two or more groups T3 are condensed with each other, or v) a condensed cyclic group in which at least one group T3 and at least one group T1 are condensed with each other (for example, the π electron-rich $C_3$-$C_{60}$ cyclic group may be the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) group T4, ii) a condensed cyclic group in which two or more groups T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with one another (for example, the π electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, group T3 may be a furan group, a thiophene group, a 1H-pyrrole group, a silole group, or a borole group, and group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group," "the $C_3$-$C_{60}$ carbocyclic group," "the $C_1$-$C_{60}$ heterocyclic group," "the Tr electron-rich $C_3$-$C_{60}$ cyclic group," or "the π electron-deficient nitrogen-containing $C_1$-$C_{60}$ cyclic group" as used herein each refer to a group condensed to any cyclic group, a monovalent group, or a polyvalent group (for example, a divalent group, a trivalent group, a tetravalent group, etc.) according to the structure of a formula for which the corresponding term is used. For example, the "benzene group" may be a benzo group, a phenyl group, a phenylene group, and/or the like, which may be easily understood by one of ordinary skill in the art according to the structure of a formula including the "benzene group."

Examples of the monovalent $C_3$-$C_{60}$ carbocyclic group and the monovalent $C_1$-$C_6$ heterocyclic group may include (e.g., may be) a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_{60}$ heterocyclic group may include (e.g., may be) a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and examples thereof may include (e.g., may be) a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having substantially the same structure as the $C_1$-$C_{60}$ alkyl group.

The term "$C_2$-$C_{60}$ alkenyl group" as used herein refers to a monovalent hydrocarbon group having at least one carbon-carbon double bond in the middle and/or at a terminal end (e.g., the terminus) of the $C_2$-$C_{60}$ alkyl group, and examples thereof may include (e.g., may be) an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle and/or at a terminal end (e.g., the terminus) of the $C_2$-$C_{60}$ alkyl group, and examples thereof may include an ethynyl group and a propynyl group.

The term "$C_2$-$C_{60}$ alkynylene group" as used herein refers to a divalent group having substantially the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof may include (e.g., may be) a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent saturated monocyclic group that includes, in addition to 1 to 10 carbon atoms, at least one heteroatom, as ring-forming atoms, and examples may include (e.g., may be) a 1,2,3,4-oxatriazolidinyl group, a tetrahydrofuranyl group, and a tetrahydrothienyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent cyclic group that has three to ten carbon atoms and at least one carbon-carbon double bond in the ring thereof and no aromaticity, and specific examples thereof may include (e.g., may be) a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent cyclic group that includes, in addition to 1 to 10 carbon atoms, at least one heteroatom, as a ring-forming atom, and having at least one double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothienyl group. The term "$C_1$-$C_{10}$ heterocycloalkenylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system of 6 to 60 carbon atoms, and the term "$C_6$-$C_{60}$ arylene group" as used herein refers to a divalent group having a carbocyclic aromatic system of 6 to 60 carbon atoms. Examples of the $C_6$-$C_{60}$ aryl group may include (e.g., may be) a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, a fluorenyl group, and an ovalenyl group. When the $C_6$-$C_{60}$ aryl group and the $C_6$-$C_{60}$ arylene group each independently include two or more rings, the two or more rings may be condensed with each other.

The term "$C_1$-$C_{60}$ heteroaryl group" as used herein refers to a monovalent group having a heterocyclic aromatic system that has, in addition to 1 to 60 carbon atoms, at least one heteroatom, as a ring-forming atom. The term "$C_1$-$C_{60}$ heteroarylene group" as used herein refers to a divalent group having a heterocyclic aromatic system that has, in addition to 1 to 60 carbon atoms, at least one heteroatom, as a ring-forming atom. Examples of the $C_1$-$C_{60}$ heteroaryl group may include (e.g., may be) a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a carbazolyl group, a dibenzofuranyl group, a dibenzothienyl group, and a naphthyridinyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as used herein refers to a monovalent group having two or more rings condensed to each other, only carbon atoms (for example, having 8 to 60 carbon atoms) as ring-forming atoms, and no aromaticity in its entire molecular structure (e.g., is not aromatic when considered as a whole). Examples of the monovalent non-aromatic condensed polycyclic group may include (e.g., may be) an indenyl group, a fluorenyl group, a spiro-bifluorenyl group, a benzofluorenyl group, an indenophenanthrenyl group, an adamantyl group, and an indeno anthracenyl group. The term "divalent non-aromatic condensed polycyclic group" as used herein refers to a divalent group having substantially the same structure as the monovalent non-aromatic condensed polycyclic group described above.

The term "monovalent non-aromatic condensed heteropolycyclic group" as used herein refers to a monovalent group having two or more rings condensed to each other, at least one heteroatom in addition to 1 to 60 carbon atoms, as ring-forming atoms, and having non-aromaticity in its entire molecular structure (e.g., is not aromatic when considered as a whole). Examples of the monovalent non-aromatic condensed heteropolycyclic group may include a pyrrolyl group, a thienyl group, a furanyl group, an indolyl group, a benzoindolyl group, a naphthoindolyl group, an isoindolyl group, a benzoisoindolyl group, a naphthoisoindolyl group, a benzosilolyl group, a benzothienyl group, a benzofuranyl group, a carbazolyl group, a dibenzosilolyl group, a dibenzothienyl group, a dibenzofuranyl group, an azacarbazolyl group, an azafluorenyl group, an azadibenzosilolyl group, an azadibenzothienyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothienyl group, a benzonaphtho silolyl group, a benzofurodibenzofuranyl group, a benzofurodibenzothienyl group, an azaadamantyl group, and a benzothienodibenzothienyl group. The term "divalent non-aromatic condensed heteropolycyclic group" as used herein refers to a divalent group having substantially the same structure as the monovalent non-aromatic condensed heteropolycyclic group described above.

The term "$C_6$-$C_{60}$ aryloxy group" as used herein refers to a monovalent group represented by —$OA_{102}$ (wherein $A_{102}$ is a $C_6$-$C_{60}$ aryl group), and the term "$C_6$-$C_{60}$ arylthio group" as used herein refers to a monovalent group represented by —$SA_{103}$ (wherein $A_{103}$ is a $C_6$-$C_{60}$ aryl group).

The term "$C_7$-$C_{60}$ aryl alkyl group" used herein refers to a monovalent group represented by -$A_{104}A_{105}$ (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" as used herein refers to a monovalent group represented by -$A_{106}A_{107}$ (where $A_{106}$ may be a $C_1$-$C_{59}$ alkylene group, and $A_{107}$ may be a $C_1$-$C_{59}$ heteroaryl group).

The term "$R_{10a}$" as used herein refers to:

deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof, a $C_3$-$C_{60}$ carbocyclic group, a $C_1$-$C_6$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ as used herein may each independently be: hydrogen; deuterium; —F; —Cl; —Br; —I; hydroxyl group; a cyano group; a nitro group; a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, a cyano group, or any combination thereof; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Examples of the heteroatom are O, S, N, P, Si, B, Ge, Se, and any combinations thereof.

The term "Ph" as used herein refers to a phenyl group, the term "Me" as used herein refers to a methyl group, the term "Et" as used herein refers to an ethyl group, the term "tert-Bu" or "$Bu^t$" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

*, *', *" and *'" as utilized herein, unless defined otherwise, each refer to a binding site to a neighboring atom in a corresponding formula or moiety.

Hereinafter, compounds according to embodiments and light-emitting devices according to embodiments will be described in more detail with reference to the following synthesis examples and examples. The wording "B was utilized instead of A" used in describing Synthesis Examples refers to that an identical molar equivalent of B was utilized in place of A.

EXAMPLES

Synthesis Example 1: Synthesis of Compound 1

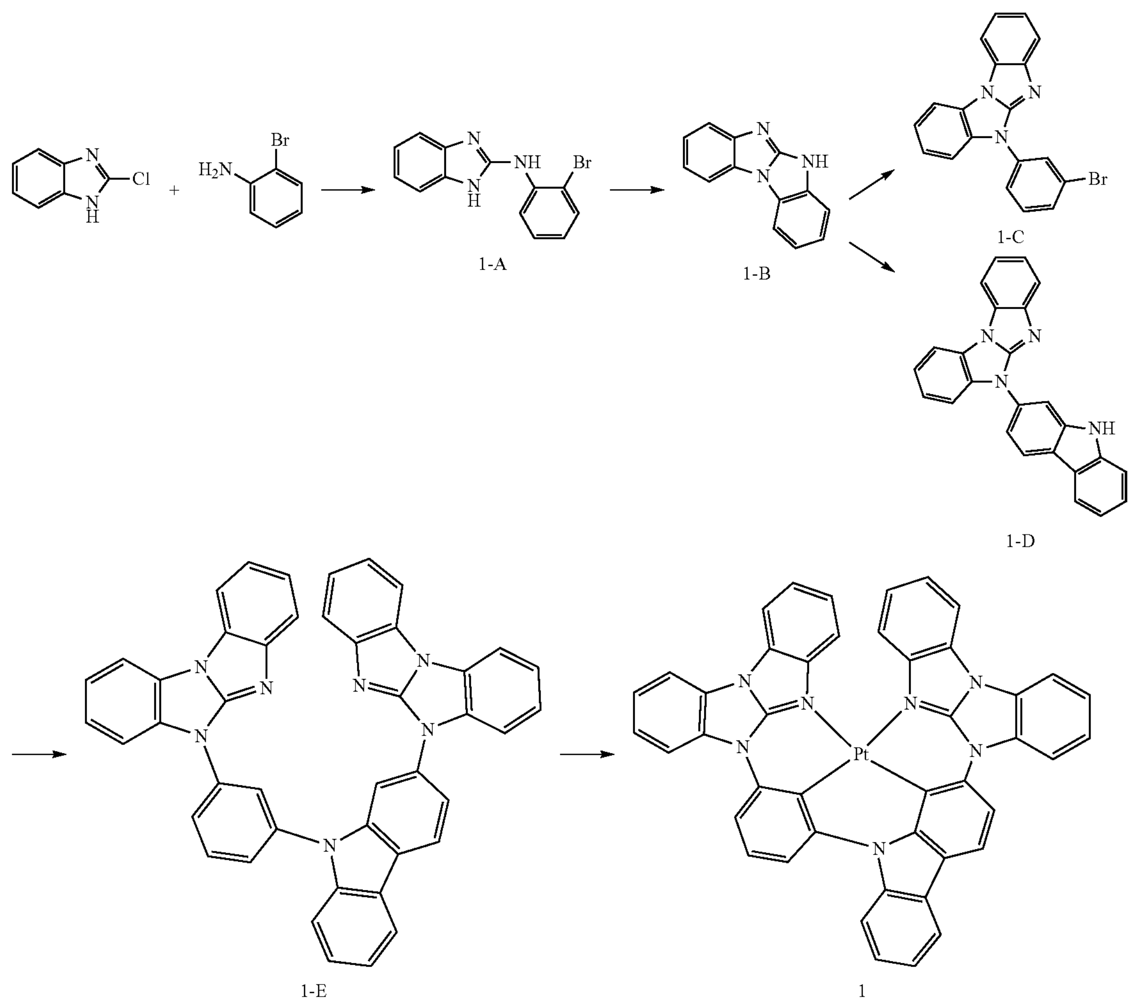

1-A

1-B

1-C

1-D

1-E

1

Synthesis of Intermediate compound 1-A

2-Chlorobenzimidazole (1.0 eq.) and 2-bromoaniline (1.1 eq.) were dissolved at room temperature in N-methyl-2-pyrrolidine (2.0 M), and then, methanesulfonic acid (1.1 eq.) was slowly added thereto for 0.5 hours. The reaction mixture was heated at 100° C. and stirred until the starting materials completely disappeared (e.g., were fully reacted). The reaction mixture was cooled to room temperature, diluted with distilled water, and neutralized with 30 wt % sodium hydroxide aqueous solution. The product precipitated as a solid was obtained through filtration, which was washed with water, and dried under vacuum to obtain Intermediate compound 1-A (yield of 90%).

Synthesis of Intermediate Compound 1-B

Intermediate compound 1-A (1.0 eq.), cesium carbonate (1.3 eq.), and copper(II) bromide (2.0 mol %) were dissolved in dimethyl formamide (1.0 M), and then, stirred at a temperature of 130° C. for 24 hours. The reaction mixture was cooled to room temperature and then diluted with water. The solid product generated by precipitation was obtained through filtration, which was washed with water, and dried in a vacuum condition to obtain Intermediate compound 1-B (yield of 93%).

Synthesis of Intermediate Compound 1-C

Intermediate compound 1-B (1.0 eq.), 1-bromo-3-iodobenzene (1.5 eq.), $Pd_2(dba)_3$ (0.2 eq.), Sphos (0.4 eq.), and $K_3PO_4$ (2.0 eq.) were dissolved in toluene (0.5 M), and then stirred at 120° C. for 12 hours. The reaction mixture was cooled at room temperature, and then subjected to an extraction process three times utilizing water to obtain an organic layer. The obtained organic layer was dried by utilizing magnesium sulfate and concentrated, and then subjected to column chromatography to obtain Intermediate compound 1-C(yield: 75%).

Synthesis of Intermediate Compound 1-D

Intermediate compound 1-B (1.0 eq.), 2-bromo-9H-carbazole (1.5 eq.), $Pd_2(dba)_3$ (0.2 eq.), Sphos (0.4 eq.), and $K_3PO_4$ (2.0 eq.) were dissolved in toluene (0.5 M), and then stirred at 120° C. for 12 hours. The reaction mixture was cooled at room temperature, and then subjected to an extraction process three times utilizing water to obtain an organic layer. The obtained organic layer was dried by utilizing magnesium sulfate and concentrated, and then subjected to column chromatography to obtain Intermediate compound 1-D (yield: 75%).

Synthesis of Intermediate Compound 1-E

Intermediate compound 1-C(1.0 eq.), Intermediate compound 1-D (1.2 eq.), copper(I) iodide (0.01 eq.), $K_2CO_3$ (2.0 eq.), and L-Proline (0.02 eq.) were dissolved in DMSO (0.1 M), and then stirred at a temperature of 130° C. for 24 hours. The resultant reaction mixture was cooled at room temperature, and an extraction process was performed thereon three times by utilizing dichloromethane and water to obtain an organic layer. The organic layer thus obtained was dried by utilizing magnesium sulfate, concentrated, and then subjected to column chromatography to synthesize Intermediate Compound 1-E (yield: 68%).

Synthesis of Compound 1

Intermediate compound 1-E (1.0 eq.) and $K_2PtCl_2$ (1.2 eq.) were dissolved in 2-ethoxyethanol (0.05 M) and stirred at 120° C. for 24 hours. The resultant reaction mixture was cooled at room temperature, and an extraction process was performed thereon three times by utilizing dichloromethane and water to obtain an organic layer. The organic layer thus obtained was dried by utilizing magnesium sulfate, concentrated, and then subjected to column chromatography to synthesize Compound 1 (yield: 24%).

Synthesis Example 2: Synthesis of Compound 4

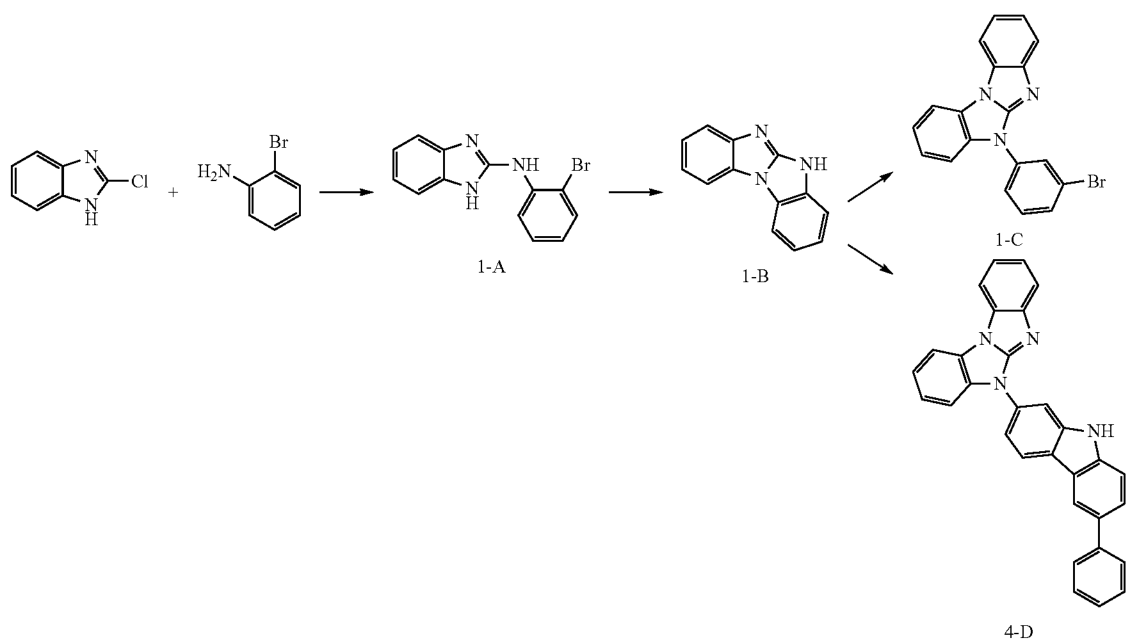

1-A

1-B

1-C

4-D

-continued

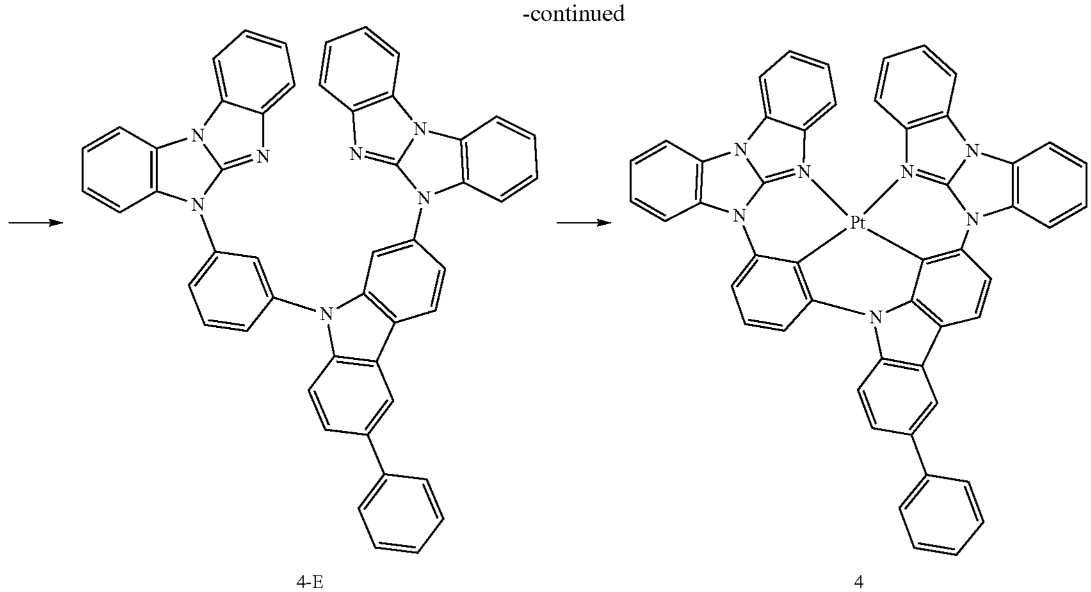

4-E

4

Synthesis of Intermediate Compound 4-D

Intermediate compound 4-D (yield: 55%) was synthesized in substantially the same manner as utilized to synthesize Intermediate compound 1-D, except that 2-bromo-6-phenyl-9H-carbazole was utilized instead of 2-bromo-9H-carbazole.

Synthesis of Intermediate Compound 4-E

Intermediate compound 4-E (yield: 66%) was synthesized in substantially the same manner as utilized to synthesize Intermediate compound 1-E, except that Intermediate compound 4-D was utilized instead of Intermediate compound 1-D.

Synthesis of Compound 4

Compound 4 (yield 27%) was synthesized in substantially the same manner as utilized to synthesize Compound 1, except that Intermediate compound 4-E was utilized instead of Intermediate compound 1-E.

Synthesis Example 3: Synthesis of Compound 31

-continued

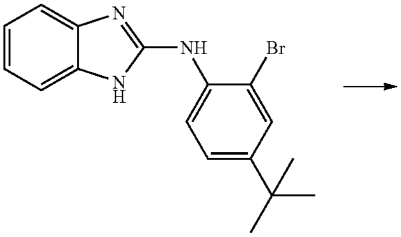

31-A

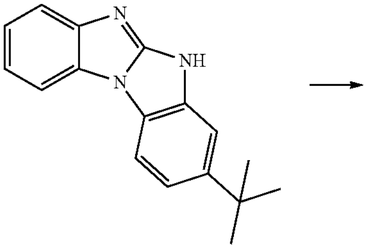

31-B

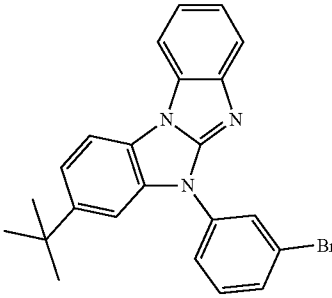

31-C

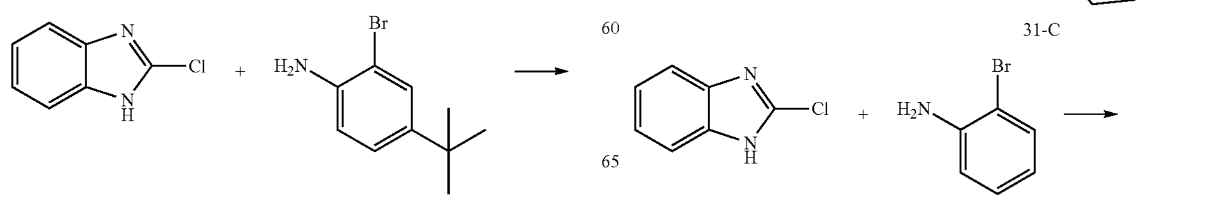

-continued

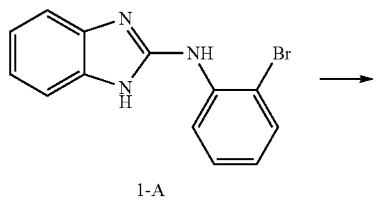

1-A

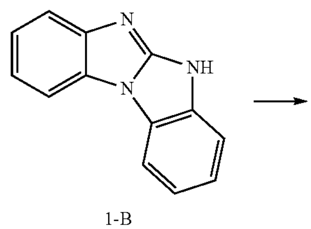

1-B

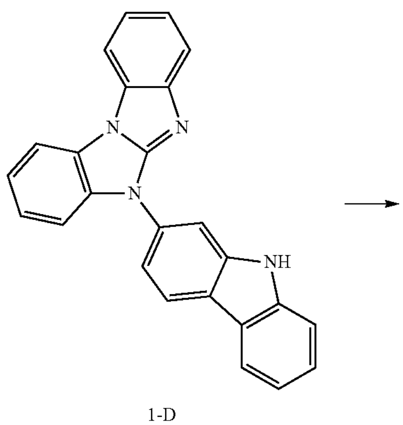

1-D

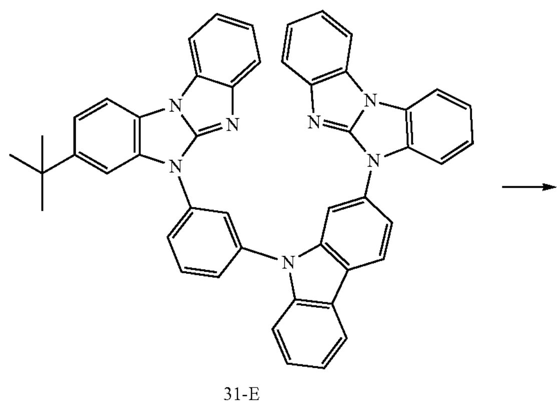

31-E

-continued

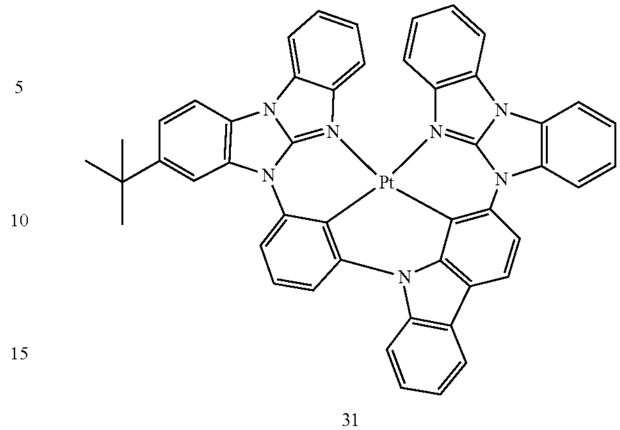

31

Synthesis of Intermediate Compound 31-A

Intermediate compound 31-A (yield: 87%) was synthesized in substantially the same manner as utilized to synthesize Intermediate compound 1-A, except that 2-bromo-4-(tert-butyl)aniline was utilized instead of 2-bromoaniline.

Synthesis of Intermediate Compound 31-B

Intermediate compound 31-B (yield: 91%) was synthesized in substantially the same manner as utilized to synthesize Intermediate compound 1-B, except that Intermediate compound 31-A was utilized instead of Intermediate compound 1-A.

Synthesis of Intermediate Compound 31-C

Intermediate compound 31-C(yield 76%) was synthesized in substantially the same manner as utilized to synthesize Intermediate compound 1-C, except that Intermediate compound 31-B was utilized instead of Intermediate compound 1-B.

Synthesis of Intermediate Compound 31-E

Intermediate compound 31-E (yield: 65%) was synthesized in substantially the same manner as utilized to synthesize Intermediate compound 1-E, except that Intermediate compound 31-C was utilized instead of Intermediate compound 1-C.

Synthesis of Compound 31

Compound 31 (yield: 23%) was obtained in substantially the same manner as utilized to synthesize Compound 1, except that Intermediate compound 31-E was utilized instead of Intermediate compound 1-E.

Synthesis Example 4: Synthesis of Compound 61

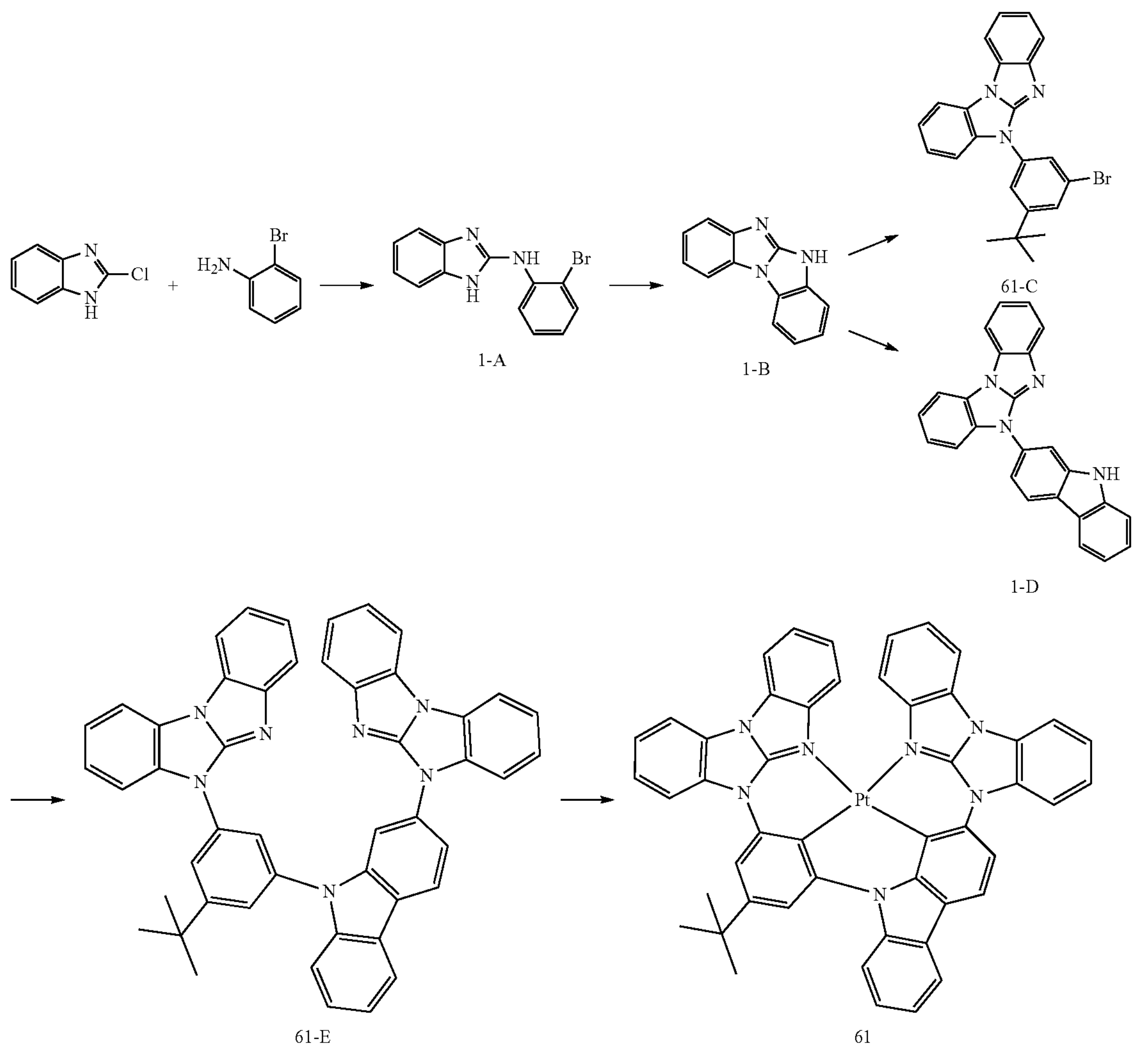

1-A

1-B

61-C

1-D

61-E

61

Synthesis of Intermediate Compound 61-C

Intermediate compound 61-C(yield: 69%) was synthesized in substantially the same manner as utilized to synthesize Compound 1-C, except that 1,3-dibromo-5-(tert-butyl)benzene was utilized instead of 1-bromo-3-iodobenzene.

Synthesis of Intermediate Compound 61-E

Intermediate compound 61-E (yield: 64%) was synthesized in substantially the same manner as utilized to synthesize Compound 1-E, except that Intermediate compound 61-C was utilized instead of Intermediate compound 1-C.

Synthesis of Compound 61

Compound 61 (yield: 25%) was obtained in substantially the same manner as utilized to synthesize Compound 1, except that Intermediate compound 61-E was utilized instead of Intermediate compound 1-E.

Synthesis Example 5: Synthesis of Compound 82

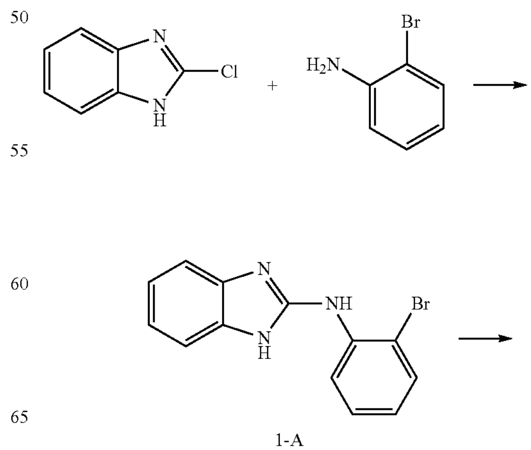

1-A

-continued

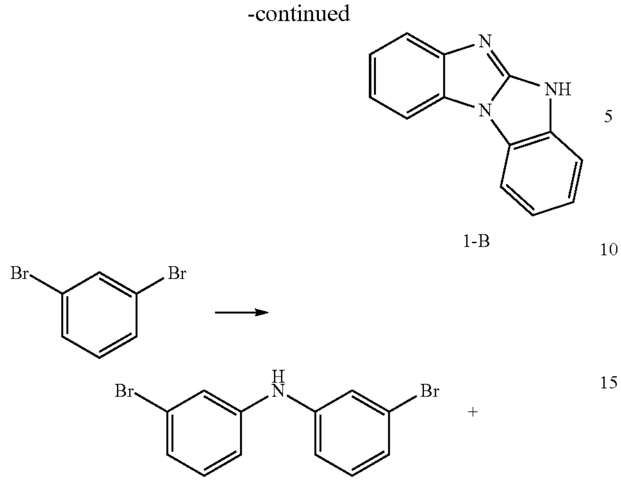

1-B

82-A

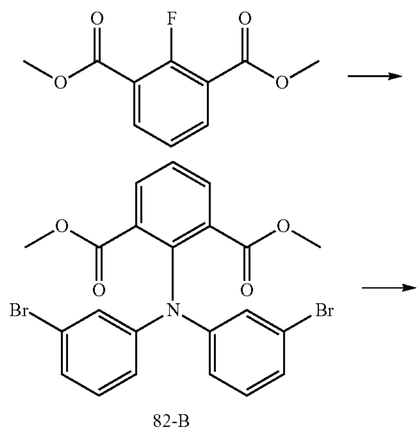

82-B

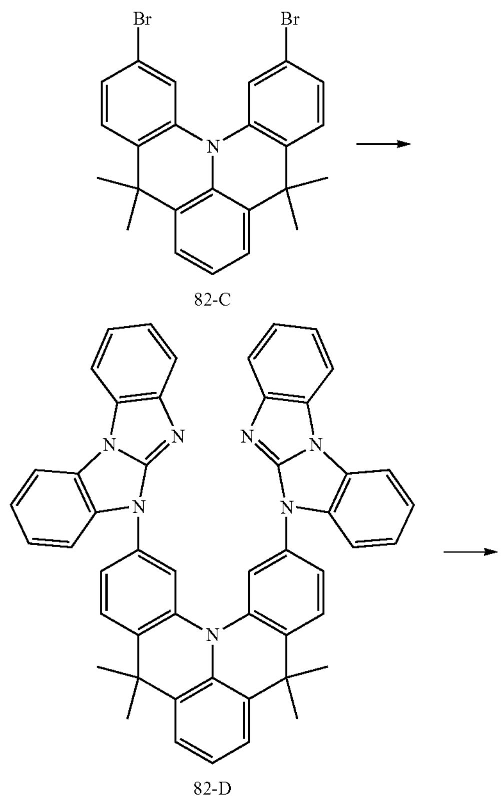

82-C

82-D

-continued

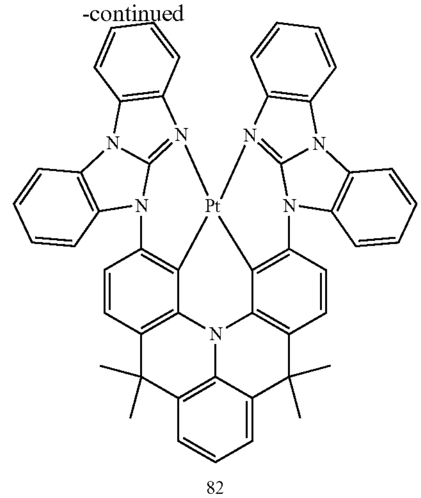

82

Synthesis of Intermediate Compound 82-A 1,3-Dibromobenzene (4.0 eq.), pivaloyl amide (1.0 eq.), $Cs_2CO_3$ (2.0 eq.), XanthPhos (0.04 eq.), and $Pd(OAc)_2$ (0.04 eq.) were dissolved in 1,4-dioxane (0.1 M), and then, stirred at a temperature of 100° C. for 8 hours. After cooling the reactants to room temperature, the filtrate obtained by filtering the settled salt was concentrated to obtain an organic layer. 500 mL of ethanol and HCl aqueous solution (5 N, 50 mL) were added to the obtained organic layer, and then, heated, and stirred under reflux for 16 hours. The reaction mixture was cooled at room temperature, and an extraction process was performed thereon three times by utilizing ethyl acetate and water to obtain an organic layer. The obtained organic layer was dried with magnesium sulfate, and then, the concentrated organic layer was recrystallized by utilizing methanol to synthesize Intermediate compound 82-A (yield: 80%).

Synthesis of Intermediate Compound 82-B

Intermediate compound 82-A (1.0 eq.), dimethyl-2-fluoroisophthalate (1.1 eq.), and potassium tert-butoxide (1.2 eq.) were dissolved in DMSO (0.3 M), and then, stirred at a temperature of 80° C. for 24 hours. The reactant was cooled at room temperature and then subjected to an extraction process three times utilizing dichloromethane and water, to thereby obtain an organic layer. The obtained organic layer was dried with magnesium sulfate, and then, the concentrated organic layer was recrystallized by utilizing a small amount of methanol to synthesize Intermediate compound 82-B (yield: 83%).

Synthesis of Intermediate Compound 82-C

Ce(III)$Cl_3$ (2.2 eq.) and glass beads (diameter of 5 mm, 200 wt %) were placed in THF (0.3 M) and stirred at room temperature for 1 hour. Intermediate compound 82-B (1.0 eq.) was slowly added thereto, and then, stirred for one hour at room temperature. The reaction mixture was cooled to 0° C., and then, methylmagnesium chloride (1 N in THF, 6.0 eq.) was slowly added thereto, and stirred at room temperature for 16 hours. After the reaction was completed, the reaction mixture was lowered to 0° C. again, acetic acid (1 N, 0.1 M) was carefully added thereto, and then, ethyl acetate (0.1 M) was further added. The organic layer was separated, and the water layer was extracted three times utilizing ethyl acetate to obtain an organic layer. All organic layers were collected, washed with water and brine, and concentrated by drying utilizing magnesium sulfate. The concentrated organic layer was dissolved in dichloromethane (0.3 M), and then, was slowly added to a reaction mixture in which polyphosphoric acid (200 wt %) and methanesulfonic acid (10 eq.) were dissolved in dichloromethane (0.5 M) at a temperature of 0° C. The reaction mixture was further stirred at room temperature for 2 hours, and then, washed several times with water and concentrated by drying utilizing magnesium sulfate. The concentrated organic material was recrystallized utilizing DMF to synthesize Intermediate compound 82-C(yield: 58%).

Synthesis of Intermediate Compound 82-D

Intermediate compound 1-B (1.3 eq.), Intermediate compound 82-C(1.0 eq.), $Pd_2(dba)_3$ (0.25 eq.), Sphos (0.5 eq.), and $K_3PO_4$ (2.5 eq.) were dissolved in toluene (0.75 M), and then, stirred at a temperature of 120° C. for 12 hours. The reaction mixture was cooled at room temperature, and then subjected to an extraction process three times utilizing water to obtain an organic layer. The obtained organic layer was dried by utilizing magnesium sulfate and concentrated, and then subjected to column chromatography to obtain Intermediate compound 82-D (yield: 53%).

Synthesis of Compound 82

Compound 82 (yield: 22%) was obtained in substantially the same manner as utilized to synthesize Compound 1, except that Intermediate compound 82-D was utilized instead of Intermediate compound 1-E. Table 1 lists the characterization results of the compounds.

TABLE 1

| Compound | $^1H$ NMR (δ) | MS/FAB Calc | MS/FAB found |
|---|---|---|---|
| 1 | 8.58-8.55(m, 7H), 8.10(d, 1H), 7.96(d, 1H), 7.73(d, 1H), 7.57-7.49(m, 4H), 7.28-7.16(m, 11H) | 846.18 | 846.2 |
| 4 | 8.58-8.55(m, 7H), 8.30(d, 1H), 8.13(d, 1H), 8.11(d, 1H), 7.89(s, 1H), 7.76-7, 73(m, 3H), 7.57-7.51(m, 7H), 7.28-7.18(m, 9H) | 922.21 | 922.2 |
| 31 | 8.58-8.55(m, 5H), 8.12(d, 1H), 7.94(d, 1H), 7.69(d, 1H), 7.73(d, 1H), 7.55-7.49(6H), 7.27-7.16(m, 9H), 1.38(s, 9H) | 902.24 | 902.2 |
| 61 | 8.58-8.54(m, 7H), 8.12(d, 1H), 7.94(d, 1H), 7.91(s, 1H), 7.75(s, 1H), 7.54(d, 2H), 7.37-7.21(m, 9H), 7.19-7.15(m, 2H), 1.32(s, 9H) | 902.24 | 902.2 |
| 82 | 8.57-8.54(m, 6H), 7.54(d, 2H), 7.30-7.14(13H), 7.04(d, 2H), 1.69(s, 12H) | 928.26 | 928.2 |

Evaluation Example 1

The LUMO and HOMO values of the compounds of Synthesis Examples were measured by utilizing the methods shown in Table 2, and then, the values of $T_1$, Dipole moment, and $^3$MLCT of the compounds of Synthesis Examples were calculated by utilizing the density functional theory (DFT) method of Gaussian 09 program (structurally optimized at the level of B3LYP, 6-311G(d,p)). The evaluation results are shown in Table 3.

TABLE 2

| | |
|---|---|
| HOMO energy level evaluation method | By utilizing cyclic voltammetry (CV) (electrolyte: 0.1M $Bu_4NPF_6$/solvent: dimethylforamide (DMF)/electrode: 3-electrode system (working electrode: GC, reference electrode: Ag/AgCl, and auxiliary electrode: Pt)), the potential (V)-current (A) graph of each compound was obtained, and then, from the oxidation onset of the graph, the HOMO energy level of each compound was calculated. |
| LUMO energy level evaluation method | By utilizing cyclic voltammetry (CV) (electrolyte: 0.1M $Bu_4NPF_6$/solvent: dimethylforamide (DMF)/electrode: 3-electrode system (working electrode: GC, reference electrode: Ag/AgCl, and auxiliary electrode: Pt)), the potential (V)-current (A) graph of each compound was obtained, and then, from the reduction onset of the graph, the LUMO energy level of each compound was calculated. |

TABLE 3

| Compound No. | HOMO (eV) | LUMO (eV) | $T_1$ (eV) | Dipole moment (debye) | $^3$MLCT (%) |
|---|---|---|---|---|---|
| 1 | −4.84 | −1.06 | 2.80 | 5.98 | 12.10 |
| 4 | −4.85 | −1.08 | 2.79 | 6.72 | 10.84 |
| 31 | −4.83 | −1.04 | 2.80 | 5.76 | 12.07 |
| 61 | −4.82 | −1.05 | 2.80 | 5.75 | 12.13 |
| 82 | −4.57 | −0.95 | 2.72 | 3.96 | 15.43 |

Example 1-1

A glass substrate (product of Corning Inc.) on which a 15 $\Omega/cm^2$ (1,200 Å) ITO anode was formed, was cut to a size of 50 mm×50 mm×0.7 mm, sonicated utilizing isopropyl alcohol and pure water for 5 minutes each, and then washed by irradiation of ultraviolet rays and exposure of ozone thereto for 30 minutes. Then, the glass substrate was mounted on a vacuum deposition apparatus.

2-TNATA, which is a suitable compound in the art, was vacuum-deposited on the substrate to form a hole injection layer having a thickness of 600 Å, and then, 4,4'-bis[N-(1-naphthyl)-N-phenylamino]biphenyl (hereinafter, referred to as NPB) as a hole transport compound was vacuum-deposited thereon to form a hole transport layer having a thickness of 300 Å.

Compound 1, Compound ETH2, and Compound HTH29 were co-deposited on the hole transport layer to form an emission layer having a thickness of 400 Å. In this regard, an amount of the dopant compound (e.g., Compound 1) was adjusted to be 10 wt % based on a total weight (100 wt %) of the emission layer, and a weight ratio of Compound ETH2 to Compound HTH29 was adjusted to 3:7.

Subsequently, ETH2 was vacuum-deposited thereon to form a hole-blocking layer having a thickness of 50 Å. Then, $Alq_3$ was deposited on the emission layer to form an electron transport layer having a thickness of 300 Å, and then, LiF, which is a halogenated alkali metal, was deposited on the electron transport layer to form an electron injection layer having a thickness of 10 Å and Al was vacuum-deposited thereon to form an Al electrode having a thickness of 3,000 Å(cathode) to form an LiF/Al electrode, thereby completing the manufacture of a light-emitting device.

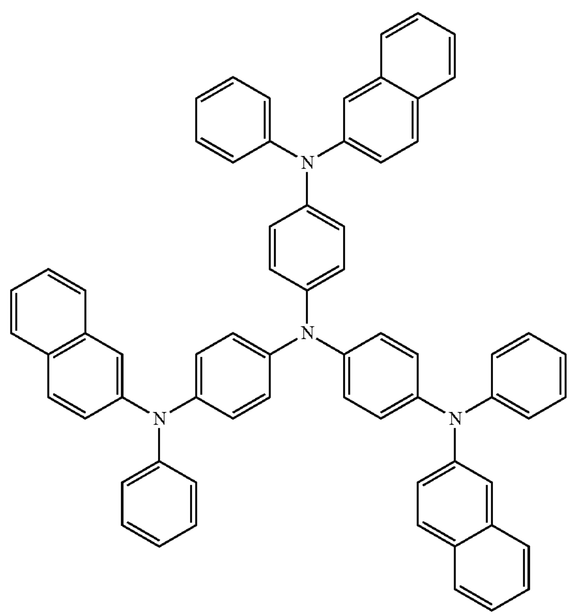

2-TNATA

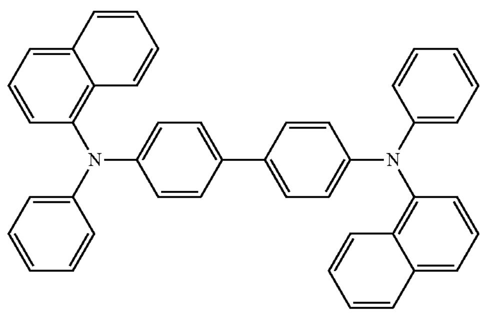

NPB

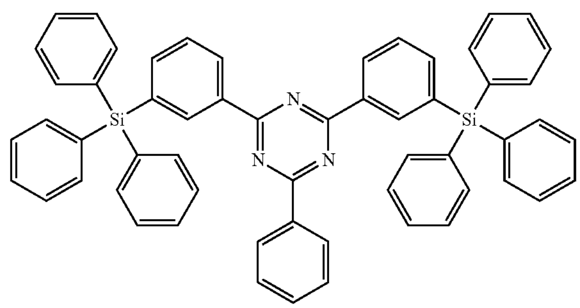

ETH2

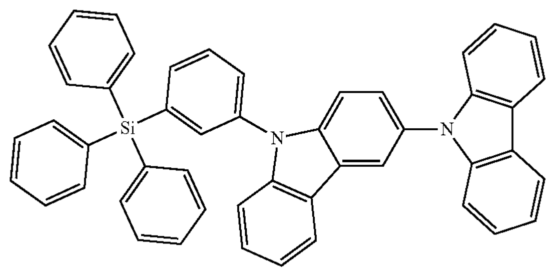

HTH29

Examples 1-2 to 1-5 and Comparative Examples 1-1 to 1-3

Light-emitting devices were manufactured utilizing substantially the same method as in Example 1-1, except that the compounds listed in Table 4 were utilized instead of Compound 1 as a dopant when forming the emission layer.

Evaluation Example 1

The device characteristics of the light-emitting device according to each of Examples 1-1 to 1-5 and Comparative Examples 1-1 to 1-3 was evaluated, and the results are shown in Table 4. In evaluating the light-emitting devices, the driving voltage and current efficiency (cd/A) at a current density of 10 mA/cm$^2$ were measured, and the time point at which the luminance was reduced to 90% of the initial luminance, which was 1,000 cd/m$^2$, was measured as the lifespan.

TABLE 4

| | Compound No. | Luminance (cd/m$^2$) | Driving Voltage (V) | Current efficiency (cd/A) | Maximum emission wavelength (nm) | Lifespan ($T_{90}$, h) |
|---|---|---|---|---|---|---|
| Example 1-1 | 1 | 1,000 | 4.5 | 22.7 | 449 | 57 |
| Example 1-2 | 4 | 1,000 | 4.3 | 22.1 | 451 | 52 |
| Example 1-3 | 31 | 1,000 | 4.5 | 21.8 | 448 | 56 |
| Example 1-4 | 61 | 1,000 | 4.6 | 22.4 | 452 | 55 |
| Example 1-5 | 82 | 1,000 | 4.9 | 21.1 | 456 | 59 |
| Comparative Example 1-1 | CE1 | 1,000 | 4.9 | 20.6 | 477 | 44 |
| Comparative Example 1-2 | CE2 | 1,000 | 5.0 | 20.3 | 459 | 41 |
| Comparative Example 1-3 | CE3 | 1,000 | 4.8 | 20.1 | 469 | 47 |

1

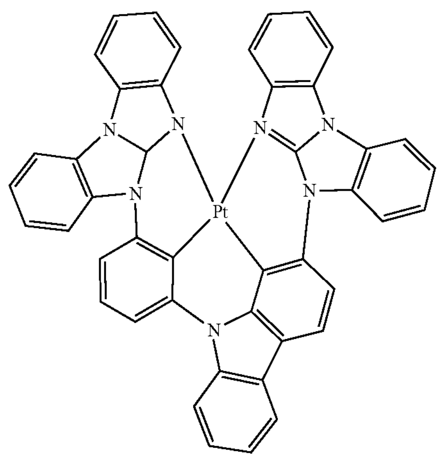

-continued
4
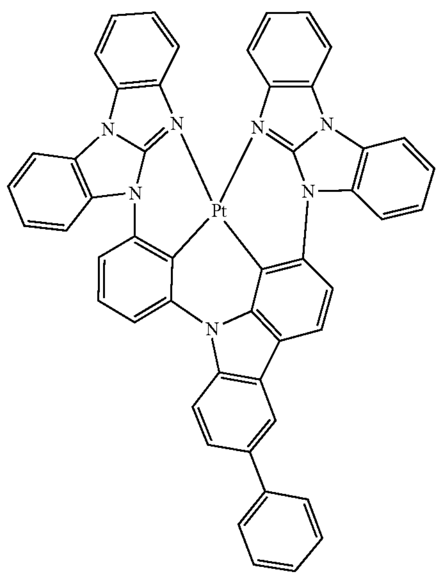
31
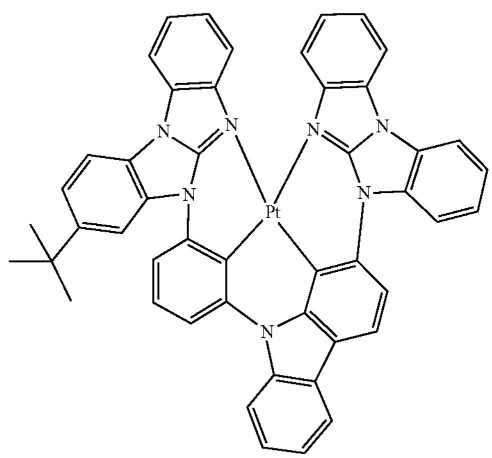
61
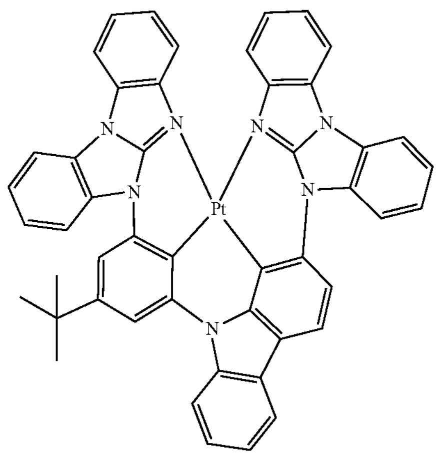
-continued
82
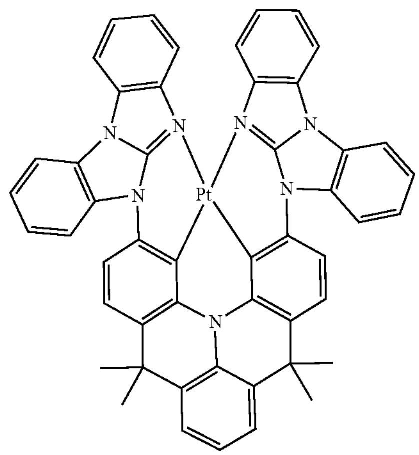
CE1
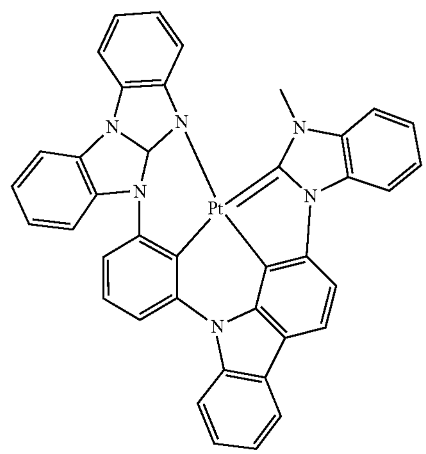
CE2
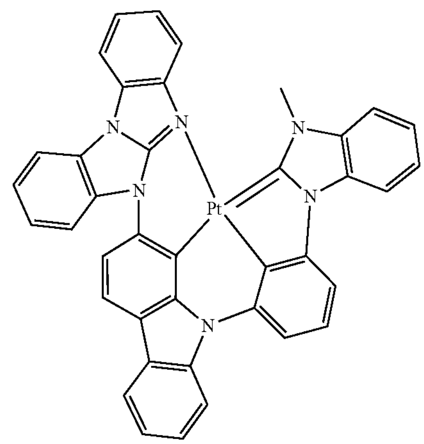

-continued

CE3

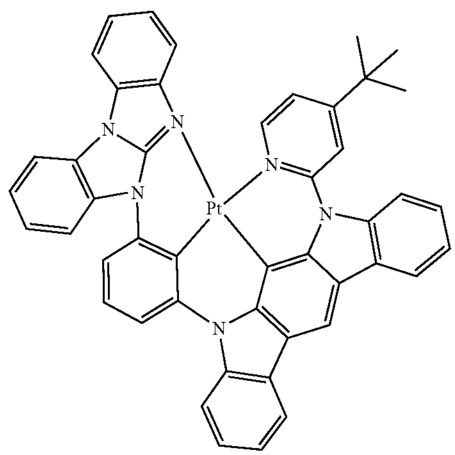

From Table 4, it was confirmed that the light-emitting devices according to Examples 1-1 to 1-5 each had lower driving voltage, higher luminescence efficiency, and longer lifespan than the light-emitting devices according to Comparative Examples 1-1 to 1-3 while maintaining the emission wavelength of blue light.

Example 2-1, Example 2-2. and Comparative Example 2-1

Light-emitting devices were manufactured in substantially the same manner as in Example 1-1, except that, in forming the emission layer, Compound 1, Compound ETH2, Compound HTH41, and Compound DFD1 were vacuum-deposited instead of Compound 1, Compound ETH2 and Compound HTH29, respectively. In this regard, the amount of Compound 1 was adjusted to be 10 wt % based on the total weight (100 wt %) of the emission layer, the amount of Compound DFD1 was adjusted to be 0.5 wt % based on the total weight (100 wt %) of the emission layer, and the weight ratio of Compound ETH2 and Compound HTH41 was adjusted to be 3:7.

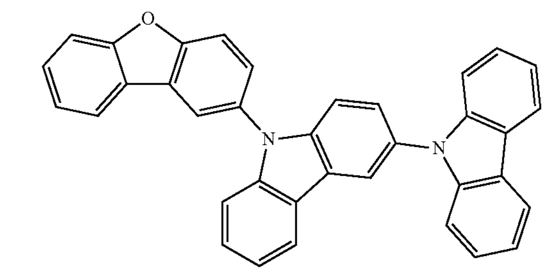

HTH41

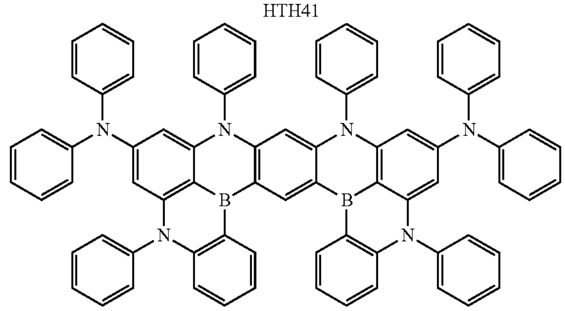

DFD1

Evaluation Example 2

The characteristics of the light-emitting devices according to Example 2-1, Example 2-2 and Comparative Example 2-1 were evaluated, and the results are shown in Table 5. In evaluating the light-emitting devices, the driving voltage and current efficiency (cd/A) at a current density of 10 $mA/cm^2$ were measured, and the time point at which the luminance was reduced to 90% of the initial luminance, which was 1,000 $cd/m^2$, was measured as the lifespan.

TABLE 5

| | Dopant Compound | Driving Luminance ($cd/m^2$) | Voltage Voltage (V) | Current efficiency (cd/A) | Maximum emission wavelength (nm) | Lifespan ($T^{90}$, h) |
|---|---|---|---|---|---|---|
| Example 2-1 | 1 | 1,000 | 4.3 | 21.5 | 460 | 63 |
| Example 2-2 | 4 | 1,000 | 4.3 | 20.6 | 460 | 58 |
| Comparative Example 2-1 | CE2 | 1,000 | 4.6 | 16.7 | 462 | 48 |

From Table 5, it can be seen that each of the light-emitting devices according to Examples 2-1 and 2-2 has lower driving voltages, better luminescence efficiency, and longer lifespan in the blue emission wavelength region, compared to the light-emitting device according to Comparative Example 2-1.

Hereinbefore, the examples of present disclosure have been described, but one of ordinary skill in in the technical field to which present disclosure belongs, would be able to understand that present disclosure could be implemented in other specific forms without changing its technical idea or essential features. Therefore, it should be understood that the examples described above are provided for illustrative purposes only in all respects and not restrictive ones.

According to the one or more embodiments, the usage of the organometallic compound may enable the manufacture of a light-emitting device (having high efficiency and a long lifespan) and a high-quality electronic apparatus including the light-emitting device.

The use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, or 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The electronic apparatus, the display device, and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), or a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the following claims and equivalents thereof.

What is claimed is:

1. A light-emitting device comprising:

a first electrode, a second electrode facing the first electrode, an interlayer between the first electrode and the second electrode and comprising an emission layer, and an organometallic compound represented by Formula 1:

Formula 1

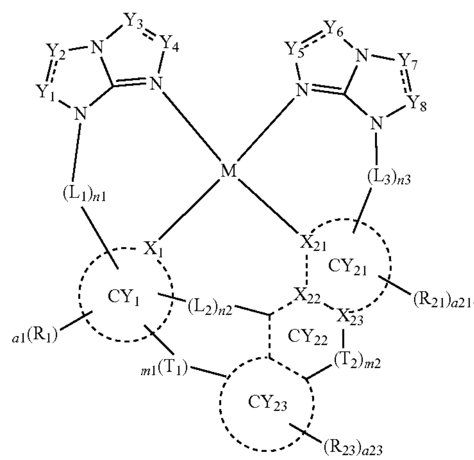

wherein, in Formula 1,

M is platinum, palladium, copper, silver, gold, rhodium, ruthenium, osmium, titanium, zirconium, hafnium, europium, terbium, or thulium, ring $CY_1$, ring $CY_{21}$, and ring $CY_{23}$ are each independently a $C_3$-$C_{30}$ carbocyclic group or a $C_1$-$C_{30}$ heterocyclic group, ring $CY_{22}$ is a $C_1$-$C_{30}$ heterocyclic group, $X_1$, and $X_{21}$ to $X_{23}$ are each independently C or N, $L_1$ to $L_3$ are each independently a single bond, $*—C(R_{1a})(R_{1b})—*'$, $*—C(R_{1a}){=}*'$, $*{=}C(R_{1a})—*'$, $*—C(R_{1a}){=}C(R_{1b})—*'$, $*—C({=}O)—*'$, $*—C({=}S)—*'$, $*—C{\equiv}C—*'$, $*—B(R_{1a})—*'$, $*—N(R_{1a})—*'$, $*\ O—*'$,

*—P($R_{1a}$)($R_{1b}$)—*', *—Si($R_{1a}$)($R_{1b}$)*', *—P(═O)($R_{1a}$)—*', *—S—*', *—S(═O)—*', *—S(═O)$_2$*', or *—Ge($R_{1a}$)($R_{1b}$)—*', $T_1$ is a single bond, *—C($R_{2a}$)($R_{2b}$)—*', *—C($R_{2a}$)═*', *═C($R_{2a}$)—*', *—C($R_{2a}$)═C($R_{2b}$)—*', *—C(═O)—*', *—C(═S)—*', *—C≡C—*', *—B($R_{2a}$)—*', *—N($R_{2a}$)—*', *—O—*', *—P($R_{2a}$)($R_{2b}$)—*', *—Si($R_{2a}$)($R_{2b}$)—*', *—P(═O)($R_{2a}$)—*', *—S—*', *—S(═O)—*', *—S(═O)$_2$—*', or *—Ge($R_{2a}$)($R_{2b}$)*', $T_2$ is a single bond, *—C($R_{3a}$)($R_{3b}$)—*', *—C($R_{3a}$)═*', *═C($R_{3a}$)—*', *—C($R_{3a}$)═C($R_{3b}$)—*', *—C(═O)—*', *—C(═S)—*', *—C≡C—*', *—B($R_{3a}$)—*', *—N($R_{3a}$)—*', *—O—*', *—P($R_{3a}$)($R_{3b}$)—*', *—Si($R_{3a}$)($R_{3b}$)—*', *—P(═O)($R_{3a}$)—*', *—S—*', *—S(═O)*', *—S(═O)$_2$—*', or *—Ge($R_{3a}$)($R_{3b}$)*',

* and *' each indicate a binding site to a neighboring atom, n1 to n3 are each independently an integer selected from 1 to 5, m1 is an integer selected from 0 to 2, wherein, when m1 is 0, $T_1$ does not exist and thus ring $CY_1$ and ring $CY_{23}$ are not bound to each other, m2 is 1 or 2, $Y_1$ is C($Z_1$) or N, $Y_2$ is C($Z_2$) or N, $Y_3$ is C($Z_3$) or N, $Y_4$ is C($Z_4$) or N, $Y_5$ is C($Z_5$) or N, $Y_6$ is C($Z_6$) or N, $Y_7$ is C($Z_7$) or N, $Y_8$ is C($Z_8$) or N, $R_1$, $R_{21}$, $R_{23}$, $Z_1$ to Za, $R_{1a}$, $R_{1b}$, $R_{2a}$, $R_{2b}$, $R_{3a}$, and $R_{3b}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(═O)($Q_1$), —S(═O)$_2$ ($Q_1$), or —P(═O)($Q_1$)($Q_2$), a1, a21 and a23 are each independently an integer selected from 0 to 10,

 in Formula 1 indicates a single bond or a double bond, $Z_1$ and $Z_2$ are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $Z_3$ and $Z_4$ are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $Z_5$ and $Z_6$ are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $Z_7$ and $Z_8$ are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{2a}$ and $R_{2b}$ are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{3a}$ and $R_{3b}$ are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, one selected from among $R_{2a}$ and $R_{2b}$ and one of $R_1$(s) in the number of a1 are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, one selected from among $R_{2a}$ and $R_{2b}$ and one of $R_{23}$(s) in the number of a23 are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, one selected from among $R_{3a}$ and $R_{3b}$ and one of $R_{21}$(s) in the number of a21 are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, one selected from among $R_{3a}$ and $R_{3b}$ and one of $R_{23}$(s) in the number of a23 are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ is:

deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —O($Q_{31}$), —S($Q_{31}$), —P($Q_{31}$)($Q_{32}$), —C(═O)($Q_{31}$), —S(═O)$_2$($Q_{31}$), or —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; hydroxyl group; cyano group; a nitro group; a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, a cyano group, a $C_1$-$C_{60}$ alkyl group, a phenyl group, a biphenyl group, a pyridinyl group, a pyrimidinyl group, a pyridazinyl group, a pyrazinyl group, a triazinyl group, or any combination thereof; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroaryl alkyl group, each unsubstituted or substituted with deuterium, —F, a cyano group, a $C_1$-$C_{60}$ alkyl group, a $C_1$-$C_{60}$ alkoxy group, a phenyl group, a biphenyl group, a pyridinyl group, a pyrimidinyl group, a pyridazinyl group, a pyrazinyl group, a triazinyl group, or any combination thereof.

2. The light-emitting device of claim 1, wherein the first electrode is an anode, the second electrode is a cathode, the interlayer comprises a hole transport region between the first electrode and the emission layer and an electron transport region between the emission layer and the second electrode, the hole transport region comprises a hole injection layer, a hole transport layer, an emission auxiliary layer, an electron-blocking layer, or any combination thereof, and the electron transport region comprises a buffer layer, a hole-blocking layer, an electron transport layer, an electron injection layer, an electron control layer, or any combination thereof.

3. The light-emitting device of claim 1, wherein the interlayer comprises:

i) a first compound which is the organometallic compound represented by Formula 1; and ii) a second compound comprising at least one π electron-deficient nitrogen-containing $C_1$-$C_{60}$ cyclic group, a third compound comprising a π electron-rich $C_3$-$C_{60}$ cyclic group or a pyridine group, a fourth compound capable of emitting delayed fluorescence, or any combination thereof, wherein the first compound, the second compound, the third compound, and the fourth compound are different from each other, and the third compound is not compound CBP or compound mCBP:

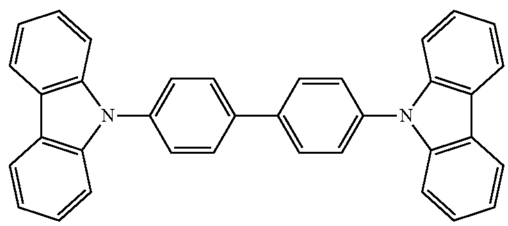

CBP

-continued

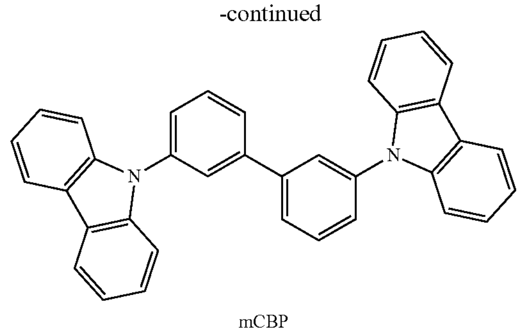

mCBP

4. The light-emitting device of claim 3, wherein the second compound is represented by Formula 2:

Formula 2

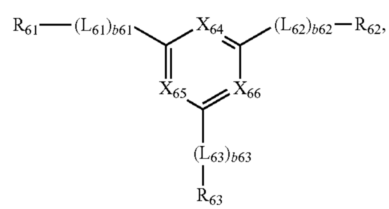

wherein, in Formula 2, $L_{61}$ to $L_{63}$ are each independently a single bond, a $C_3$-$C_{60}$ carbocyclic group unsubstituted or substituted with at least one $R_{10a}$, or a $C_1$-$C_6$ heterocyclic group unsubstituted or substituted with at least one $R_{10a}$, b61 to b63 are each independently an integer selected from 1 to 5, $X_{64}$ is N or $C(R_{64})$, $X_{65}$ is N or $C(R_{65})$, $X_{66}$ is N or $C(R_{66})$, and at least one of $X_{64}$ to $X_{66}$ is N, $R_{61}$ to $R_{66}$ are each independently hydrogen, deuterium, —F, —Cl, —Br, —I, a hydroxyl group, a cyano group, a nitro group, a $C_1$-$C_6$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, and $R_{10a}$ and $Q_1$ to $Q_3$ are the same as described in connection with Formula 1.

5. The light-emitting device of claim 3, wherein the third compound comprises a group represented by Formula 3:

Formula 3

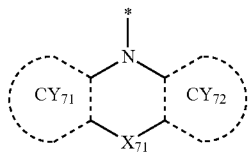

wherein, in Formula 3, ring $CY_{71}$ and ring $CY_{72}$ are each independently a π electron-rich $C_3$-$C_{60}$ cyclic group or a pyridine group, $X_{71}$ in Formula 3 is a single bond or a linking group comprising O, S, N, B, C, Si, or any combination thereof, and

* in Formula 3 indicates a binding site to a neighboring atom in the third compound.

6. The light-emitting device of claim 3, wherein the fourth compound comprises at least one cyclic group comprising both boron and nitrogen as ring-forming atoms.

7. The light-emitting device of claim 1, wherein the emission layer is to emit light having a maximum emission wavelength of 410 nm to 500 nm.

8. The light-emitting device of claim 1, wherein the organometallic compound represented by Formula 1 has a triplet metal-to-ligand charge transfer state value of 10% or more.

9. An electronic apparatus comprising the light-emitting device of claim 1.

10. The electronic apparatus of claim 9, further comprising a thin-film transistor, wherein the thin-film transistor comprises a source electrode and a drain electrode, and the first electrode of the light-emitting device is electrically connected to the source electrode or the drain electrode of the thin-film transistor.

11. An organometallic compound represented by Formula 1:

Formula 1

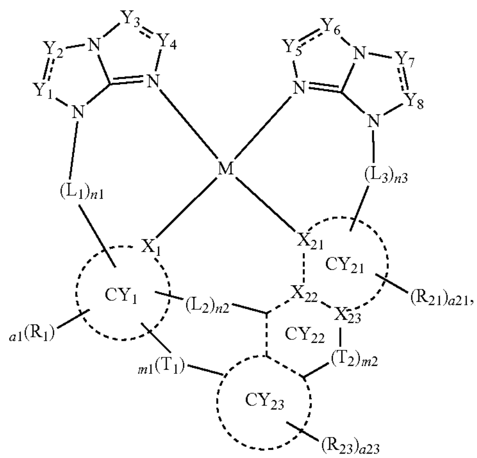

wherein, in Formula 1,

M is platinum, palladium, copper, silver, gold, rhodium, ruthenium, osmium, titanium, zirconium, hafnium, europium, terbium, or thulium, ring $CY_1$, ring $CY_{21}$, and ring $CY_{23}$ are each independently a $C_3$-$C_{30}$ carbocyclic group or a $C_1$-$C_{30}$ heterocyclic group, ring $CY_{22}$ is a $C_1$-$C_{30}$ heterocyclic group, $X_1$, and $X_{21}$ to $X_{23}$ are each independently C or N, $L_1$ to $L_3$ are each independently a single bond, $*-C(R_{1a})(R_{1b})-*'$, $*-C(R_{1a})=*'$, $*=C(R_{1a})-*'$, $*-C(R_{1a})=C(R_{1b})-*'$, $*-C(=O)-*'$, $*-C(=S)-*'$, $*-C\equiv C-*'$, $*-B(R_{1a})-*'$, $*-N(R_{1a})-*'$, $*-O-*'$, $*-P(R_{1a})(R_{1b})-*'$, $*-Si(R_{1a})(R_{1b})*'$, $*-P(=O)(R_{1a})-*'$, $*-S-*'$, $*-S(=O)-*'$, $*-S(=O)_2*'$, or $*-Ge(R_{1a})(R_{1b})-*'$, $T_1$ is a single bond, $*-C(R_{2a})(R_{2b})-*'$, $*-C(R_{2a})=*'$, $*=C(R_{2a})-*'$, $*-C(R_{2a})=C(R_{2b})-*'$, $*-C(=O)-*'$, $*-C(=S)-*'$, $*-C\equiv C-*'$, $*-B(R_{2a})-*'$, $*-N(R_{2a})-*'$, $*-O-*'$, $*-P(R_{2a})(R_{2b})-*'$, $*-Si(R_{2a})(R_{2b})-*'$, $*-P(=O)(R_{2a})-*'$, $*-S-*'$, $*-S(=O)-*'$, $*-S(=O)_2-*'$, or $*-Ge(R_{2a})(R_{2b})*'$, $T_2$ is a single bond, $*-C(R_{3a})(R_{3b})-*'$, $*-C(R_{3a})=*'$, $*=C(R_{3a})-*'$, $*-C(R_{3a})=C(R_{3b})-*'$, $*-C(=O)-*'$, $*-C(=S)-*'$, $*-C\equiv C-*'$, $*-B(R_{3a})-*'$, $*-N(R_{3a})-*'$, $*-O-*'$, $*-P(R_{3a})(R_{3b})-*'$, $*-Si(R_{3a})(R_{3b})-*'$, $*-P(=O)(R_{3a})-*'$, $*-S-*'$, $*-S(=O)*'$, $*-S(=O)_2-*'$, or $*-Ge(R_{3a})(R_{3b})*'$,

* and *' each indicate a binding site to a neighboring atom, n1 to n3 are each independently an integer selected from 1 to 5, m1 is an integer selected from 0 to 2, wherein, when m1 is 0, $T_1$ does not exist and thus ring $CY_1$ and ring $CY_{23}$ are not bound to each other, m2 is 1 or 2, $Y_1$ is $C(Z_1)$ or N, $Y_2$ is $C(Z_2)$ or N, $Y_3$ is $C(Z_3)$ or N, $Y_4$ is $C(Z_4)$ or N, $Y_5$ is $C(Z_5)$ or N, $Y_6$ is $C(Z_6)$ or N, $Y_7$ is $C(Z_7)$ or N, $Y_8$ is $C(Z_8)$ or N, $R_1$, $R_{21}$, $R_{23}$, $Z_1$ to $Z_8$, $R_{1a}$, $R_{1b}$, $R_{2a}$, $R_{2b}$, $R_{3a}$, and $R_{3b}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $-C(Q_1)(Q_2)(Q_3)$, $-Si(Q_1)(Q_2)(Q_3)$, $-N(Q_1)(Q_2)$, $-B(Q_1)(Q_2)$, $-C(=O)(Q_1)$, $-S(=O)_2(Q_1)$, or $-P(=O)(Q_1)(Q_2)$, a1, a21 and a23 are each independently an integer selected from 0 to 10,

 in Formula 1 indicates a single bond or a double bond, $Z_1$ and $Z_2$ are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $Z_3$ and $Z_4$ are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $Z_5$ and $Z_6$ are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $Z_7$ and $Z_8$ are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{2a}$ and $R_{2b}$ are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{3a}$ and $R_{3b}$ are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, one selected from among $R_{2a}$ and $R_{2b}$ and one of $R_1$(s) in the number of a1 are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, one selected from among $R_{2a}$ and $R_{2b}$ and one of $R_{23}$(s) in the number of a23 are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, one selected from among $R_{3a}$ and $R_{3b}$ and one of $R_{21}$(s) in the number of a21 are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, one selected from among $R_{3a}$ and $R_{3b}$ and one of $R_{23}$(s) in the number of a23 are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ is:

deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —O($Q_{31}$), —S($Q_{31}$), —P($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently:

hydrogen; deuterium; —F; —Cl; —Br; —I; hydroxyl group; cyano group; a nitro group; a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, a cyano group, a $C_1$-$C_{60}$ alkyl group, a phenyl group, a biphenyl group, a pyridinyl group, a pyrimidinyl group, a pyridazinyl group, a pyrazinyl group, a triazinyl group, or any combination thereof; or a $C_3$-$C_{60}$ carbocyclic group, a $C_1$-$C_{60}$ heterocyclic group, a $C_7$-$C_{60}$ arylalkyl group, or a $C_2$-$C_{00}$ heteroaryl alkyl group, each unsubstituted or substituted with deuterium, —F, a cyano group, a $C_1$-$C_6$ alkyl group, a $C_1$-$C_{60}$ alkoxy group, a phenyl group, a biphenyl group, a pyridinyl group, a pyrimidinyl group, a pyridazinyl group, a pyrazinyl group, a triazinyl group, or any combination thereof.

12. The organometallic compound of claim 11, wherein a moiety represented by

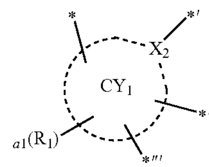

in Formula 1 is i), when m1 is 0, a group represented by one of Formulae CY1(1) to CY1(20), and ii), when m1 is 1, a group represented by one of Formulae CY1(21) to $CY_1$(23) and CY1(25) to CY1(29):

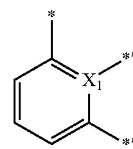

CY1(1)

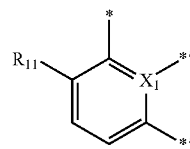

CY1(2)

-continued
CY1(3)
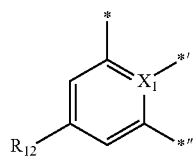
CY1(4)
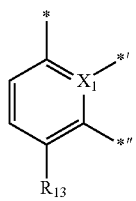
CY1(5)
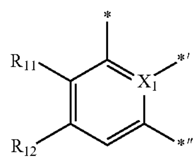
CY1(6)
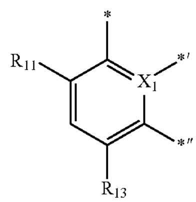
CY1(7)
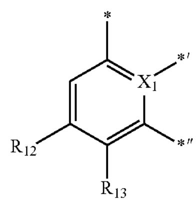
CY1(8)
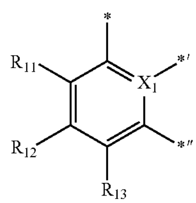
CY1(9)
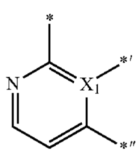
CY1(10)
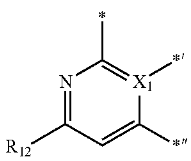
-continued
CY1(11)
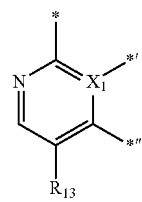
CY1(12)
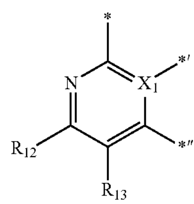
CY1(13)
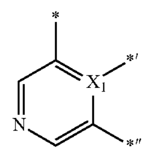
CY1(14)
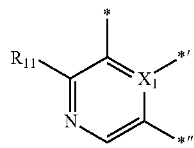
CY1(15)
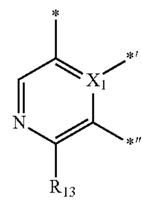
CY1(16)
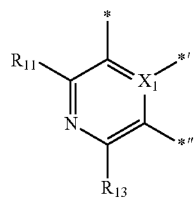
CY1(17)
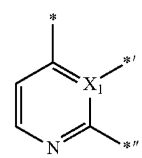
CY1(18)
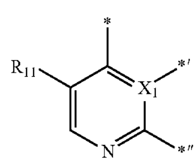
CY1(19)
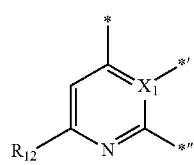

-continued

CY1(20)

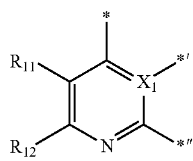

CY1(21)

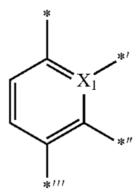

CY1(22)

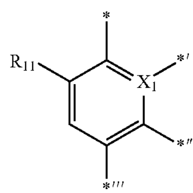

CY1(23)

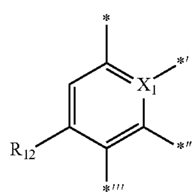

CY1(25)

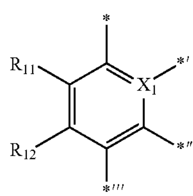

CY1(26)

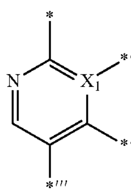

CY1(27)

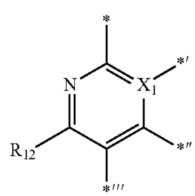

CY1(28)

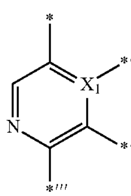

-continued

CY1(29)

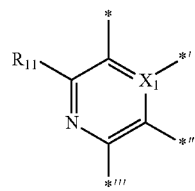

wherein, in Formulae CY1(1) to CY1(23) and CY1(25) to CY1(29), $R_{11}$ to $R_{13}$ are each independently deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$),

*, *', *", and *''' each indicate a binding site to a neighboring atom, and $X_1$, $R_{10a}$, and $Q_1$ to $Q_3$ are each the same as respectively described in connection with Formula 1.

13. The organometallic compound of claim 11, wherein $L_1$ to $L_3$ are each a single bond.

14. The organometallic compound of claim 11, wherein $T_1$ is a single bond, *—C($R_{2a}$)($R_{2b}$)—*', *—B($R_{2a}$)—*', *—N($R_{2a}$)—*', *—O—*', *—P($R_{2a}$)($R_{2b}$)—*' *—Si($R_{2a}$)($R_{2b}$)—*', or *—S—*', m1 is 0 or 1, and

* and *' each indicate a binding site to a neighboring atom.

15. The organometallic compound of claim 11, wherein $T_2$ is a single bond, *—C($R_{3a}$)($R_{3b}$)—*', *—B($R_{3a}$)—*', *—N($R_{3a}$)—*', *—O—*', *—P($R_{3a}$)($R_{3b}$)—*' *—Si($R_{3a}$)($R_{3b}$)—*', or *—S—*', m2 is 1, and

* and *' each indicate a binding site to a neighboring atom.

16. The organometallic compound of claim 11, wherein a moiety represented by

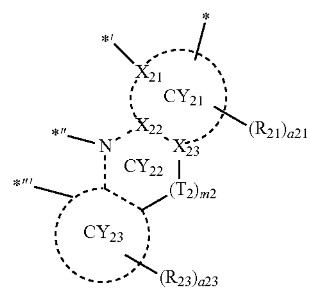

in Formula 1 is
i), when m1 is 0, a group represented by one of Formulae CY2(1) to CY2(10), and
ii), when m1 is 1, a group represented by one of Formulae CY2(11) to CY2(18):
CY2(1)
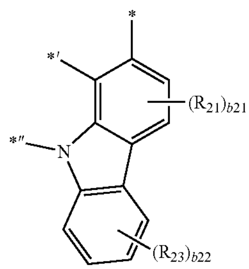
CY2(2)
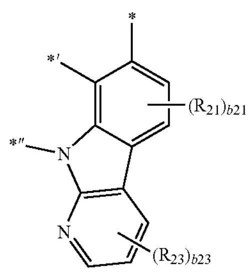
CY2(3)
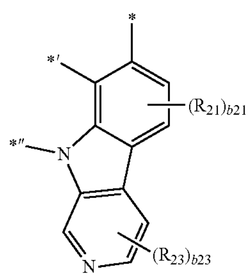
CY2(4)
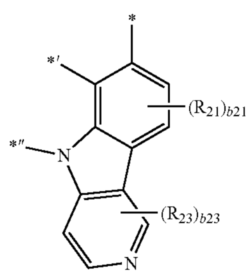
CY2(5)
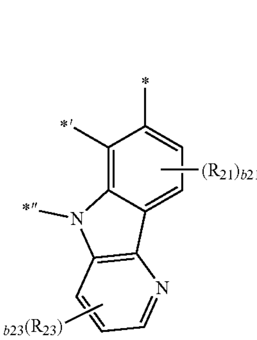
-continued
CY2(6)
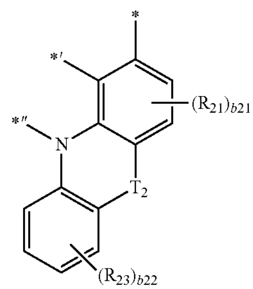
CY2(7)
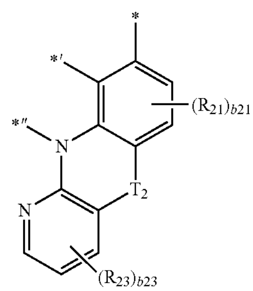
CY2(8)
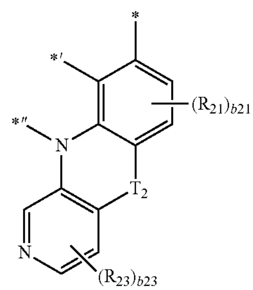
CY2(9)
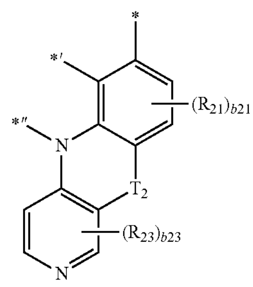
CY2(10)
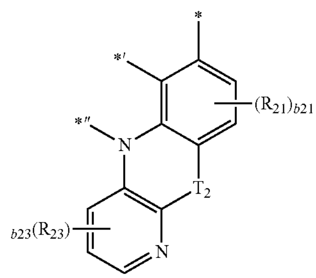

-continued

CY2(11)

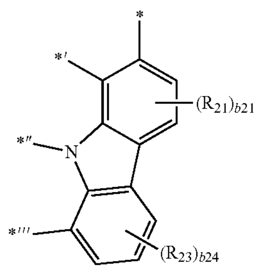

CY2(12)

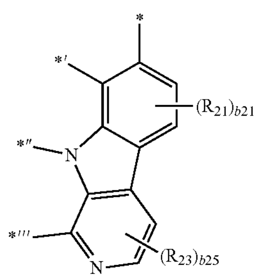

CY2(13)

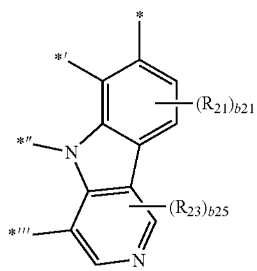

CY2(14)

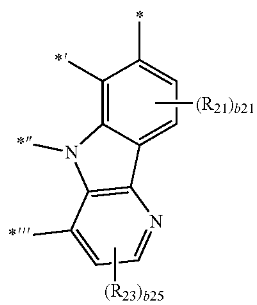

CY2(15)

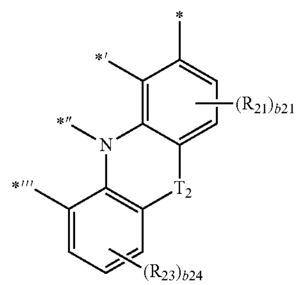

-continued

CY2(16)

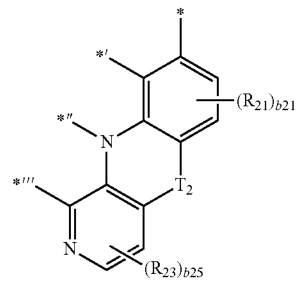

CY2(17)

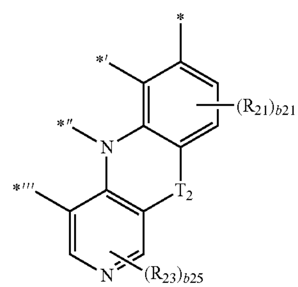

CY2(18)

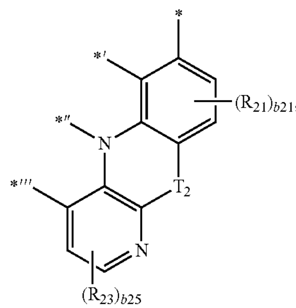

wherein, in Formulae CY2(1) to CY2(18), b21 and b25 are each independently an integer selected from 0 to 2, b22 is an integer selected from 0 to 4, b23 and b24 are each independently an integer selected from 0 to 3,

*, *', *", and *"' each indicate a binding site to a neighboring atom, and $R_{21}$, $R_{23}$, and $T_2$ are the same as respectively described in connection with Formula 1.

17. The organometallic compound of claim 11, wherein a group represented by

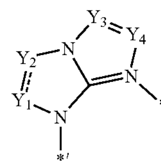

and a group represented by
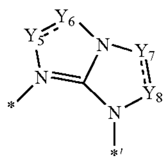
in Formula 1 are each independently a group represented by any one of Formulae CYN(1) to CYN(21):
CYN(1)
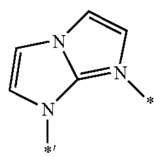
CYN(2)
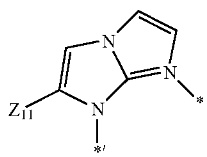
CYN(3)
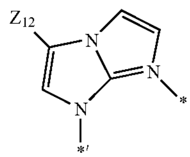
CYN(4)
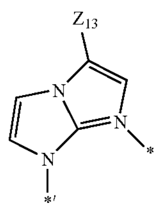
CYN(5)
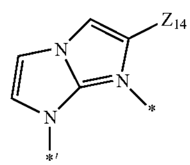
CYN(6)
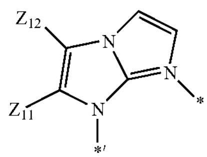
CYN(7)
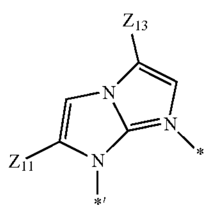
-continued
CYN(8)
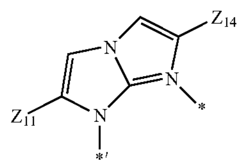
CYN(9)
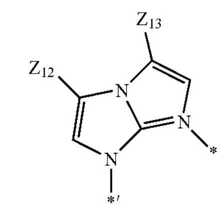
CYN(10)
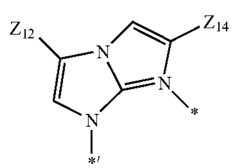
CYN(11)
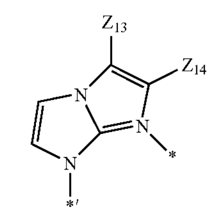
CYN(12)
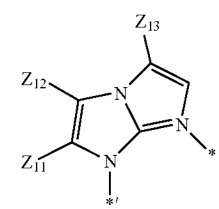
CYN(13)
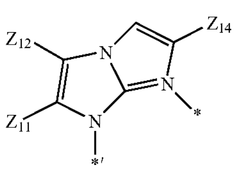
CYN(14)
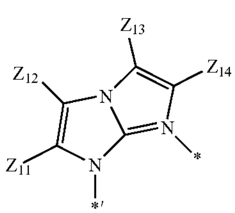
CYN(15)
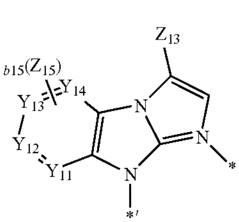

-continued

CYN(16)

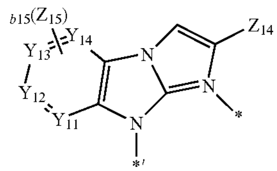

CYN(17)

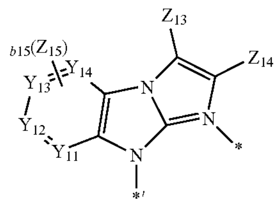

CYN(18)

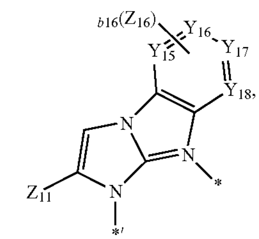

CYN(19)

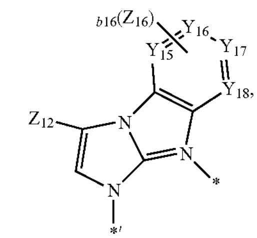

CYN(20)

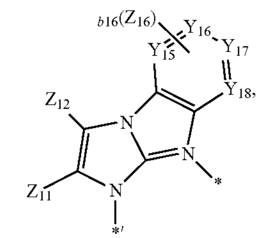

CYN(21)

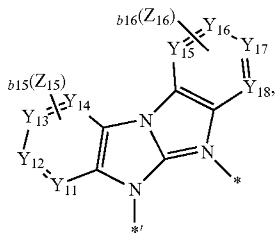

wherein, in Formulae CYN(1) to CYN(21), $Z_{11}$ to $Z_{16}$ are each independently deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, b15 and b16 are each independently an integer selected from 0 to 4, $Y_{11}$ to $Y_{18}$ are each independently C or N,

* and *' each indicate a binding site to an adjacent atom, and $R_{10a}$, and $Q_1$ to $Q_3$ are each the same as respectively described in connection with Formula 1.

18. The organometallic compound of claim 11, wherein when components of each pair of $Z_1$ and $Z_2$, $Z_3$ and $Z_4$, $Z_5$ and $Z_6$, and/or $Z_7$ and $Z_8$ are bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, the $C_3$-$C_{60}$ carbocyclic group and the $C_1$-$C_{60}$ heterocyclic group each comprise a 6-membered ring.

19. The organometallic compound of claim 11, wherein a value of a triplet energy level of the organometallic compound represented by Formula 1 is 2.6 eV or greater.

20. The organometallic compound of claim 11, wherein the organometallic compound represented by Formula 1 is one of Compounds 1 to 90:

1

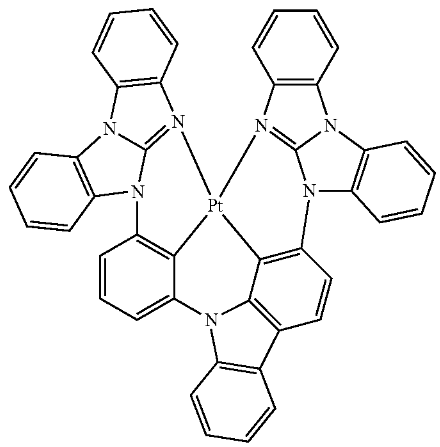

-continued
2
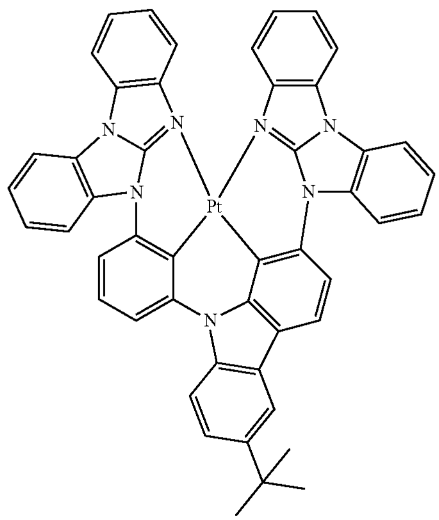
3
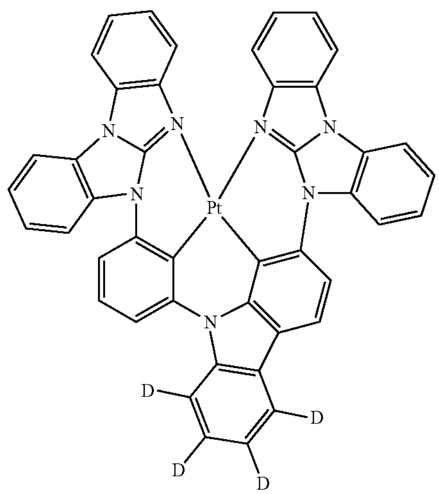
4
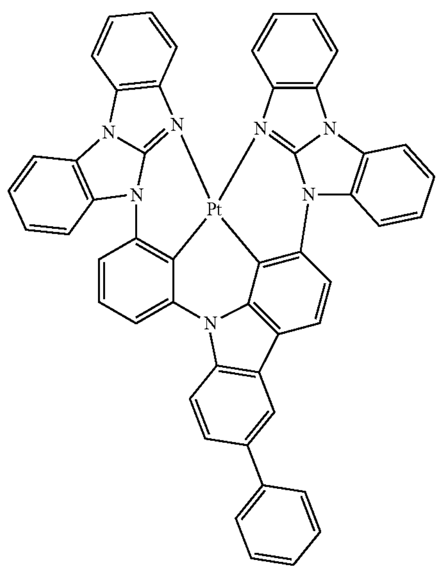
-continued
5
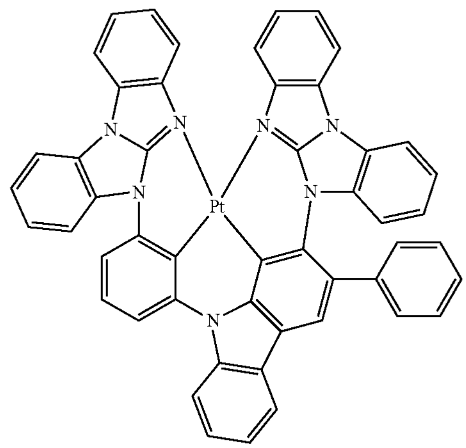
6
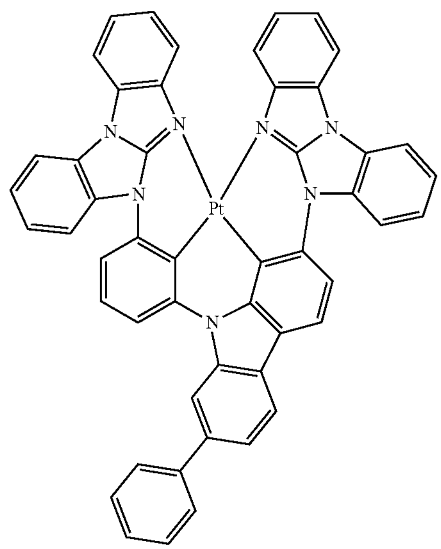
7
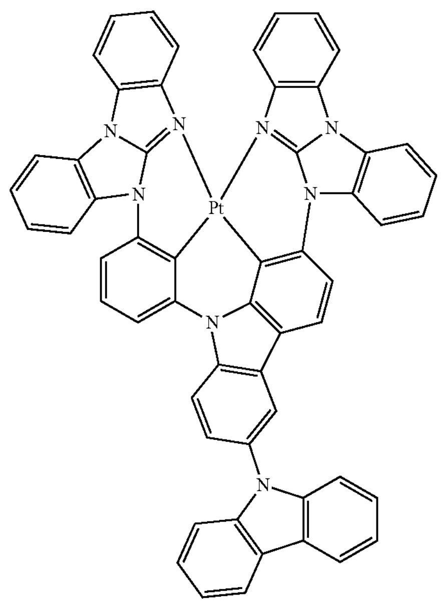

-continued
8
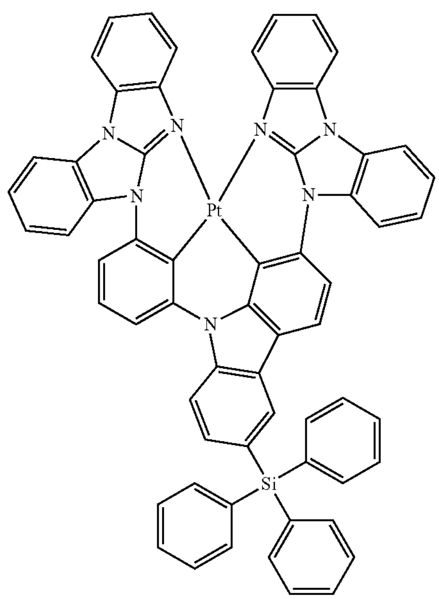
9
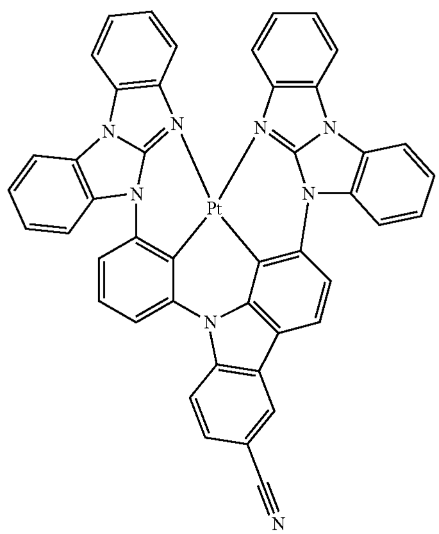
-continued
10
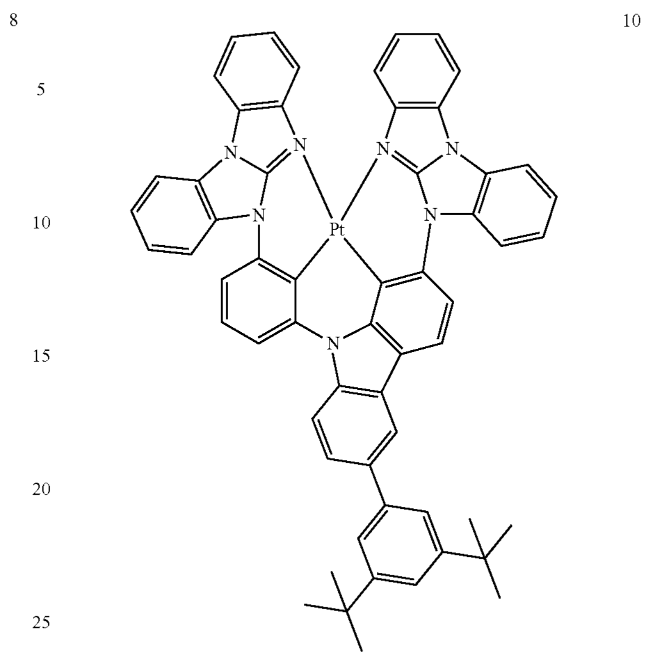
11
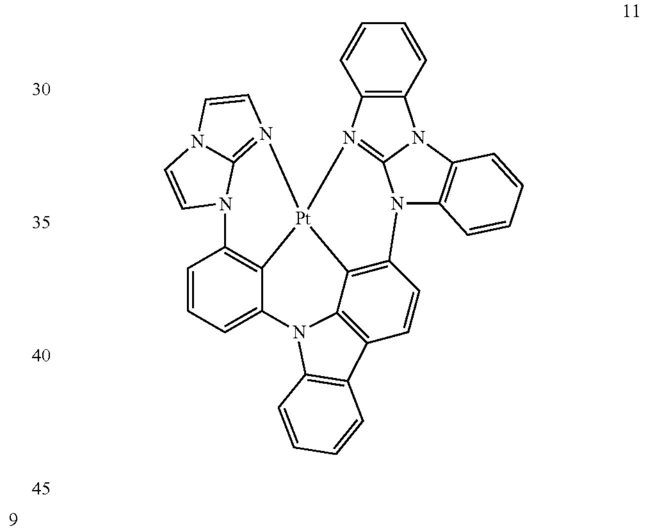
12
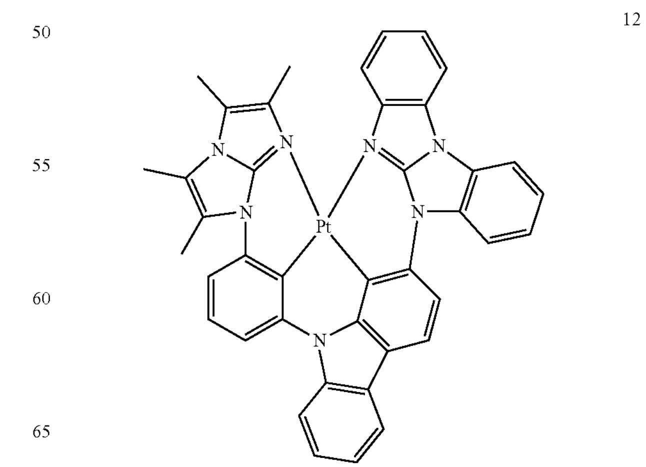

-continued
13
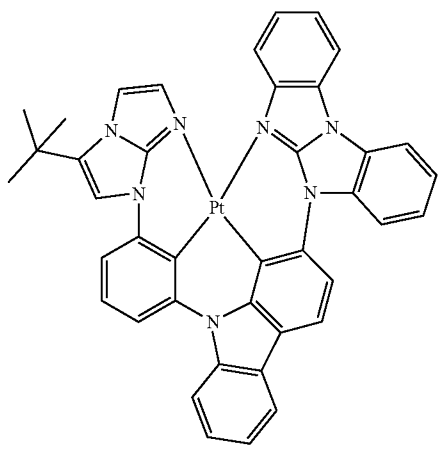
14
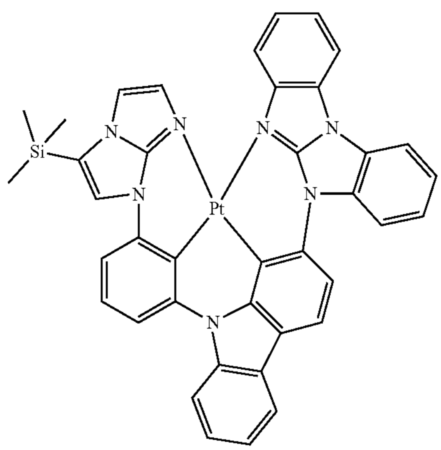
15
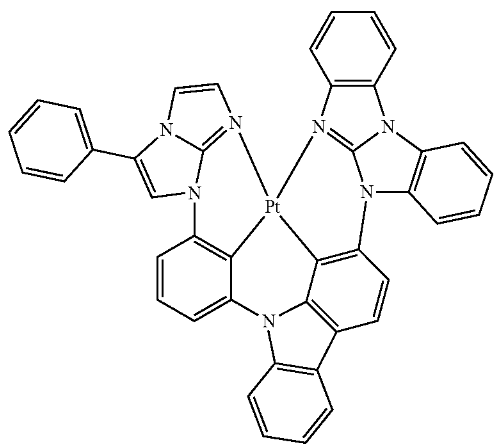
-continued
16
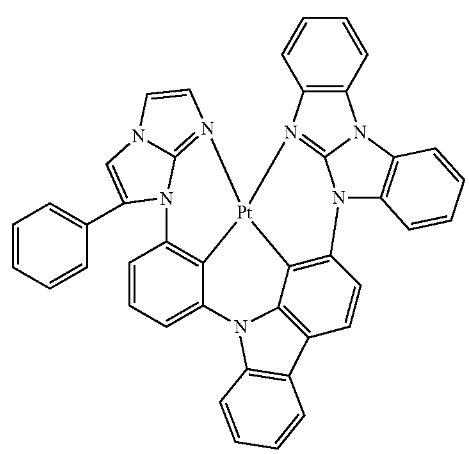
17
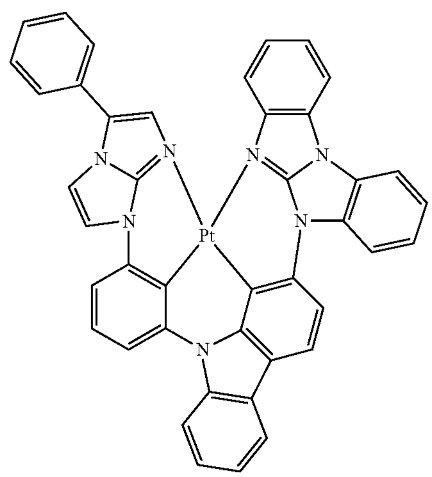
18
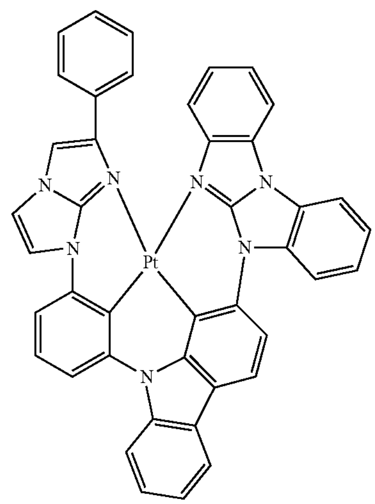

-continued
19
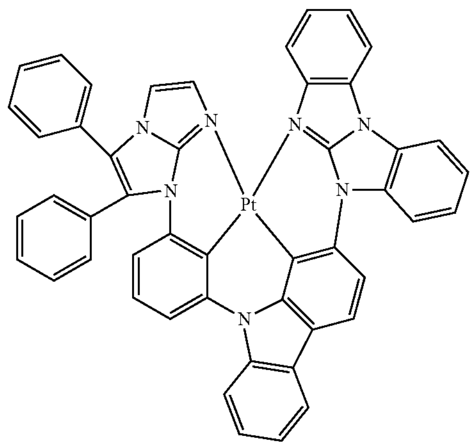
20
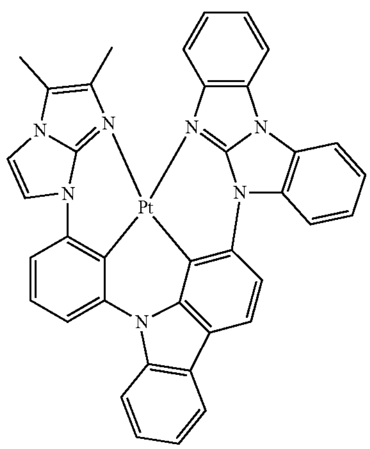
21
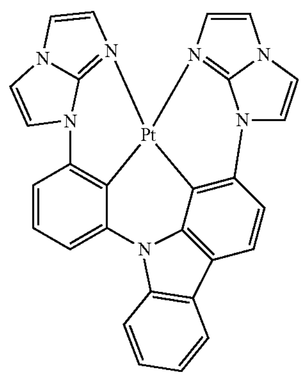
-continued
22
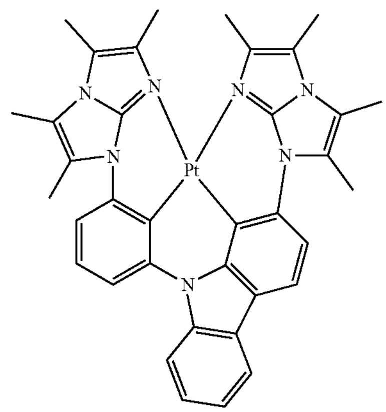
23
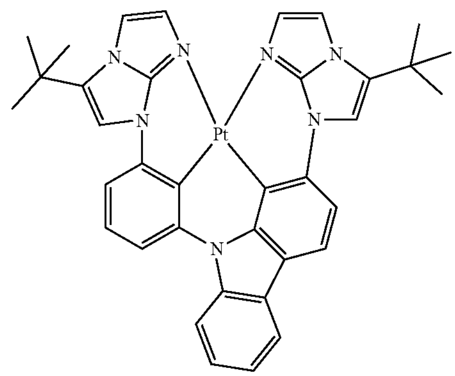
24
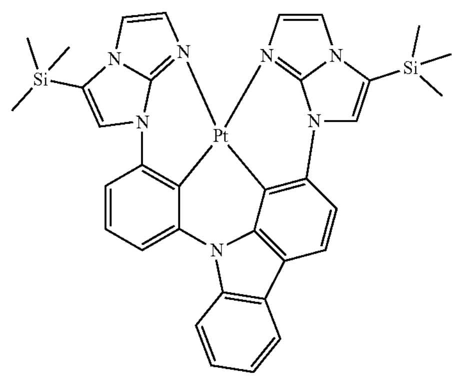
25
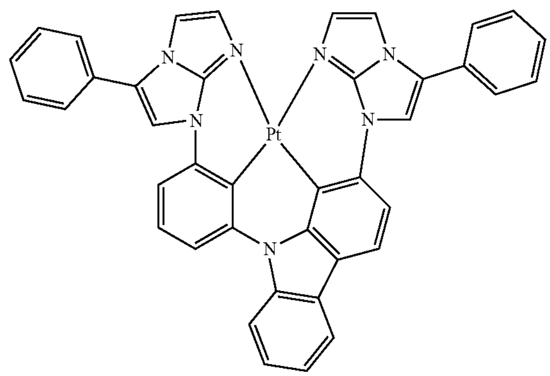

-continued
26
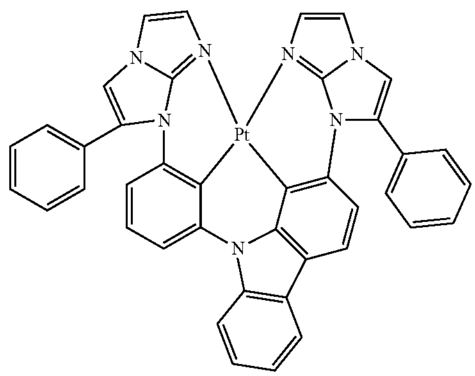
27
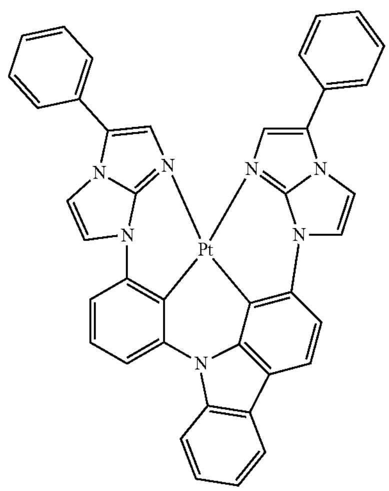
28
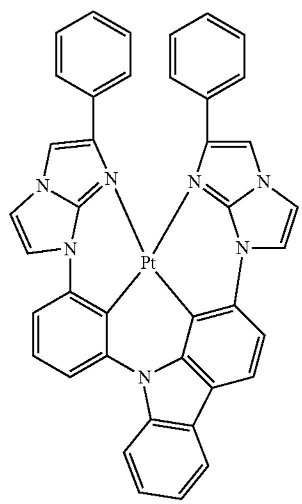
-continued
29
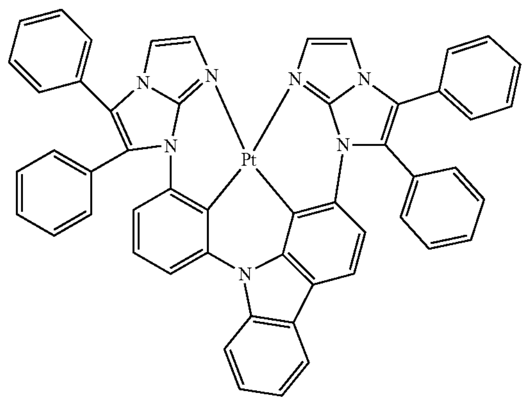
30
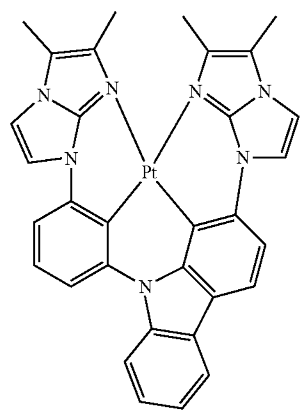
31
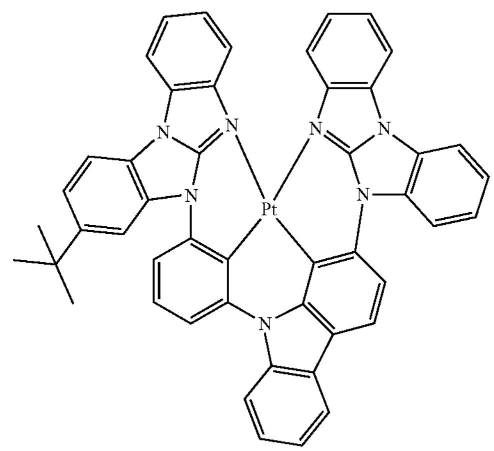

-continued
32
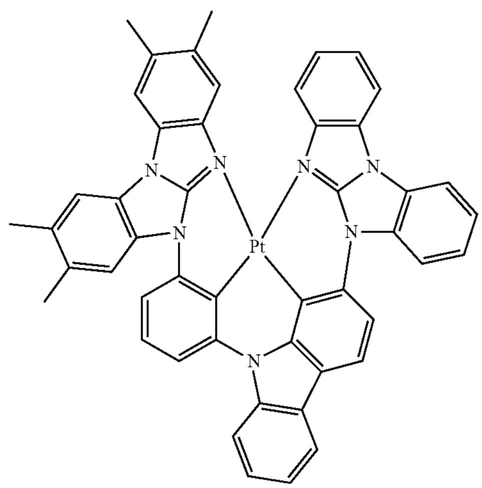
33
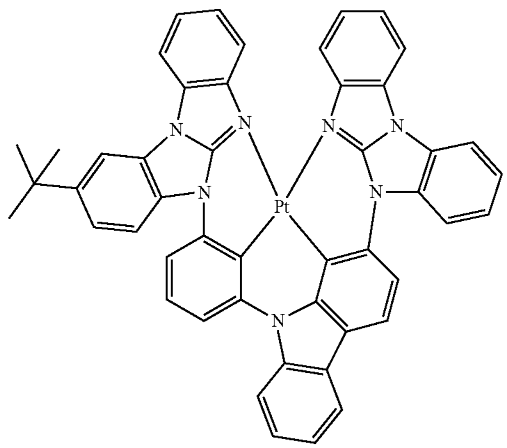
34
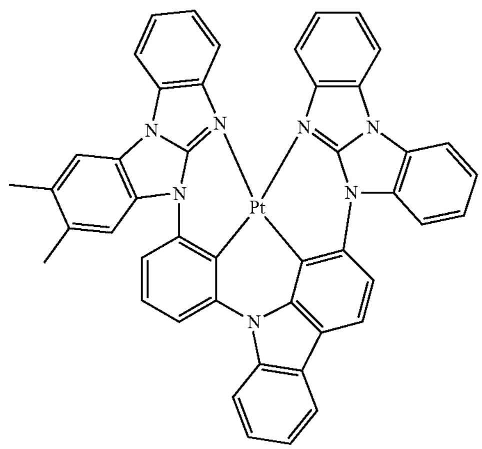
-continued
35
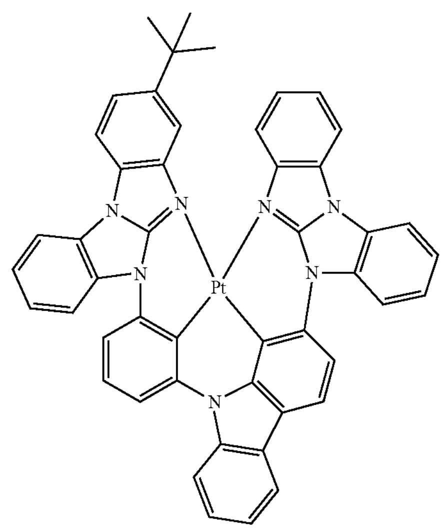
36
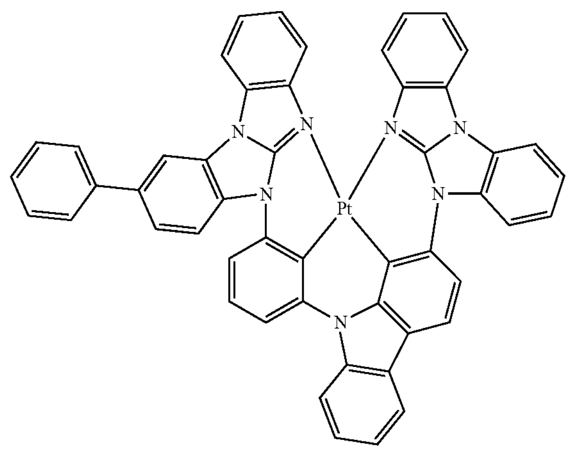
37
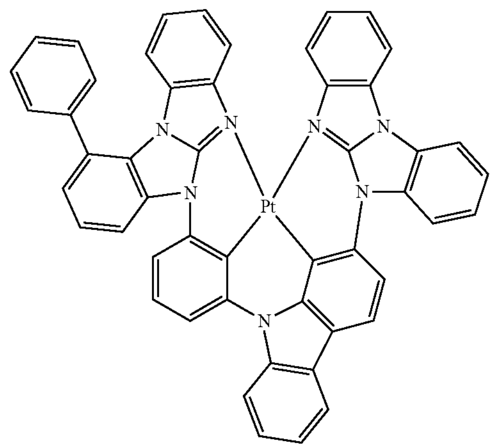

-continued
38
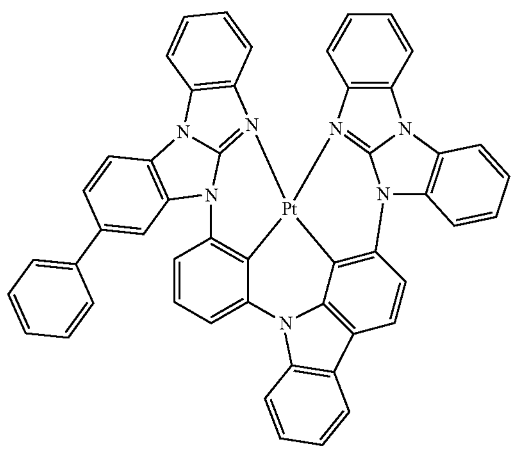
39
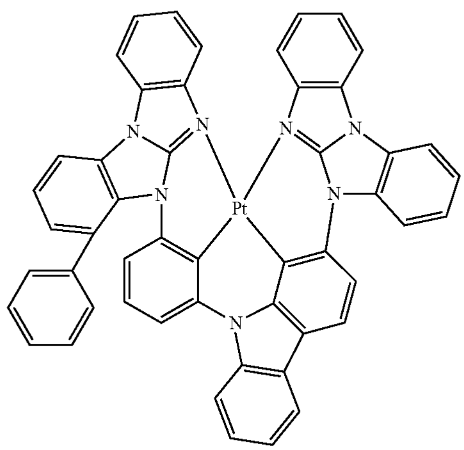
40
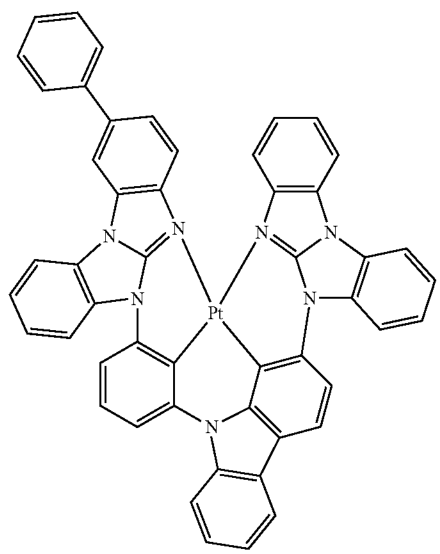
-continued
41
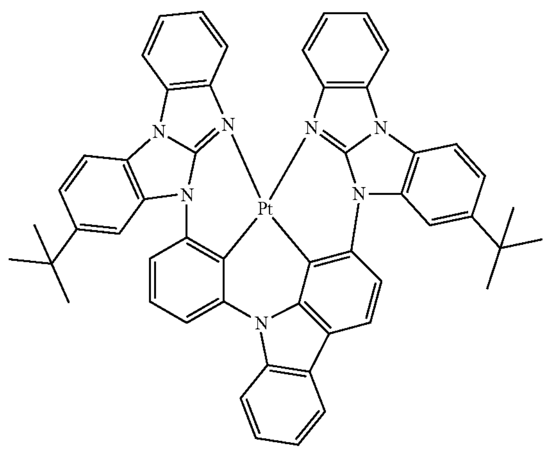
42
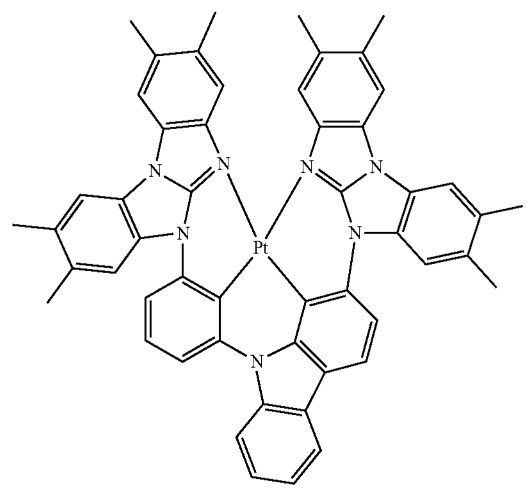
43
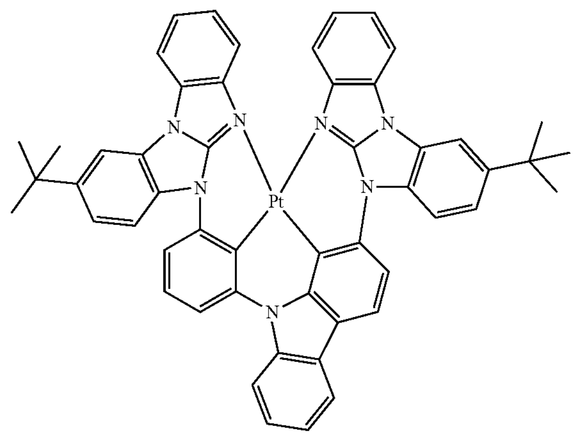

-continued
44
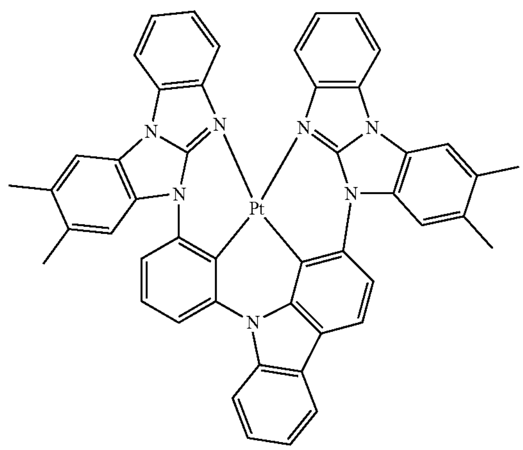
45
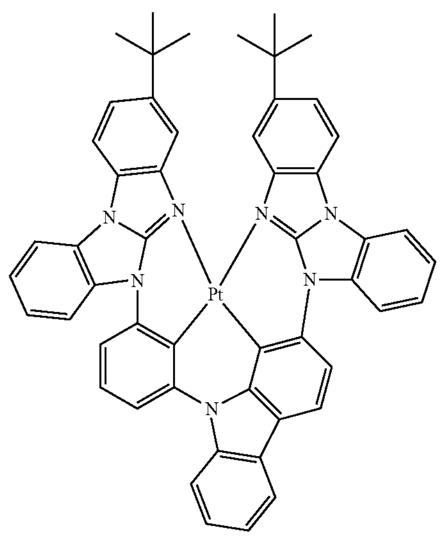
46
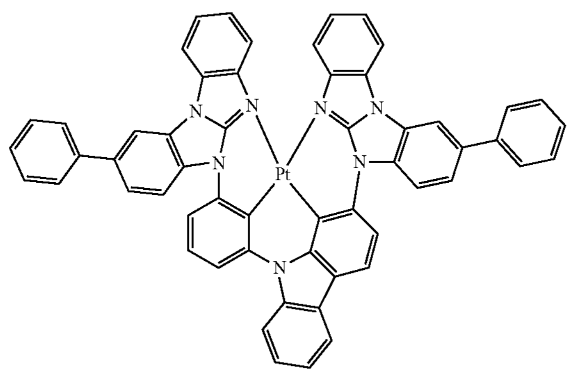
-continued
47
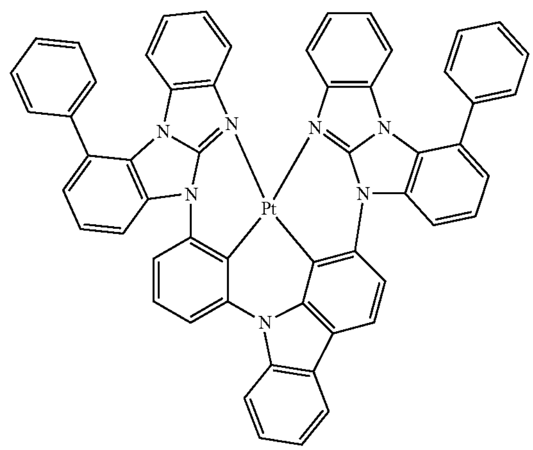
48
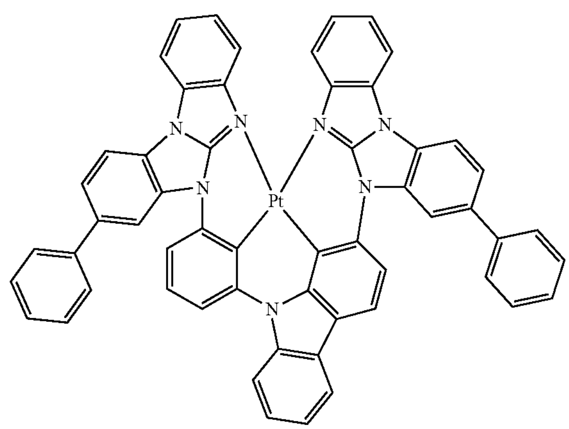
49
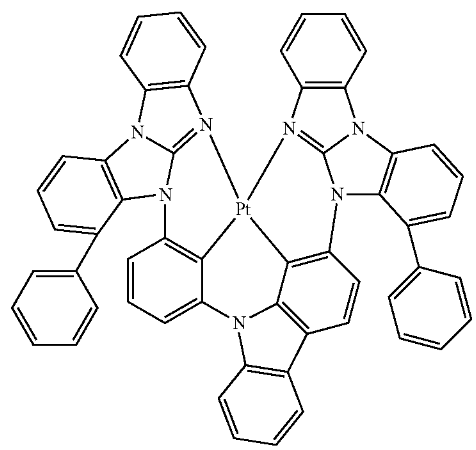

-continued
50
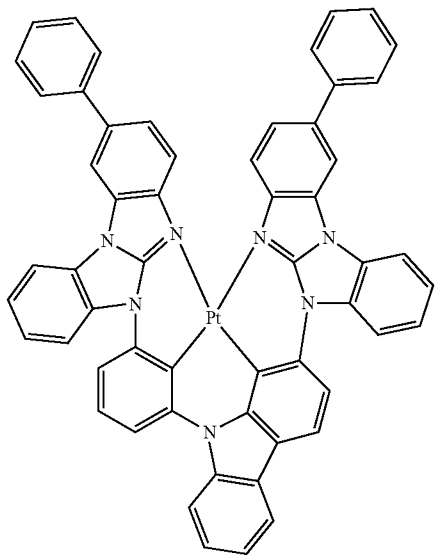
51
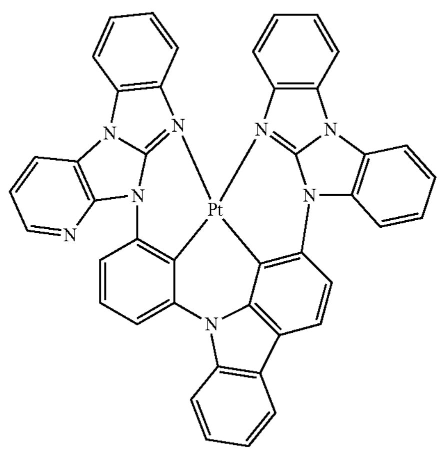
52
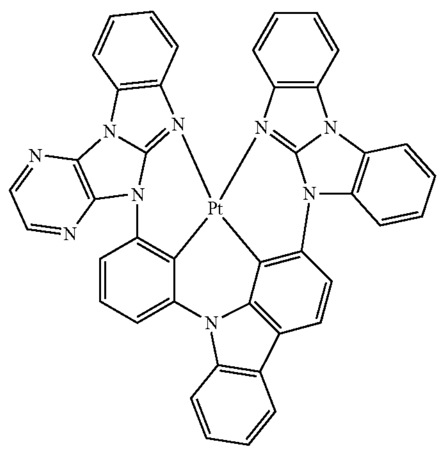
-continued
53
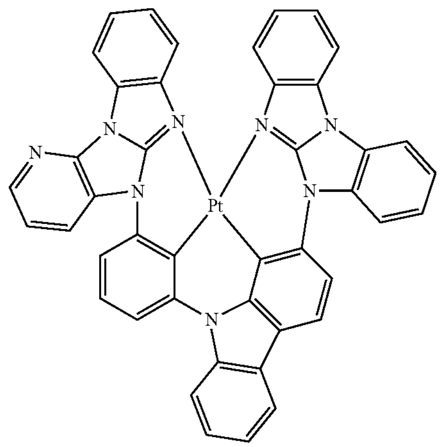
54
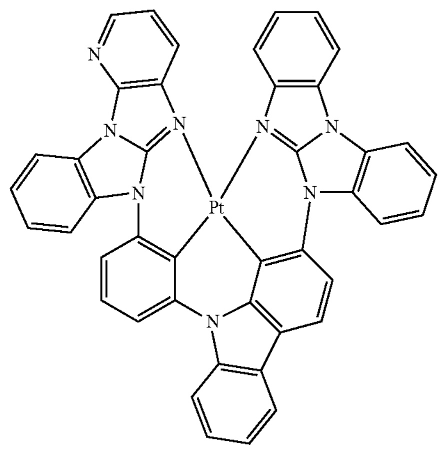
55
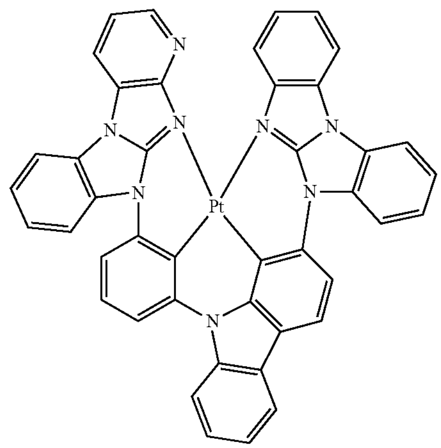

56
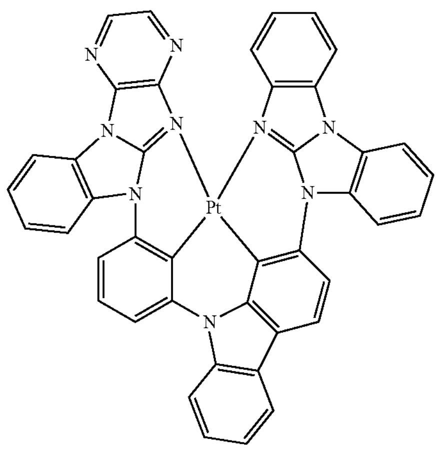
57
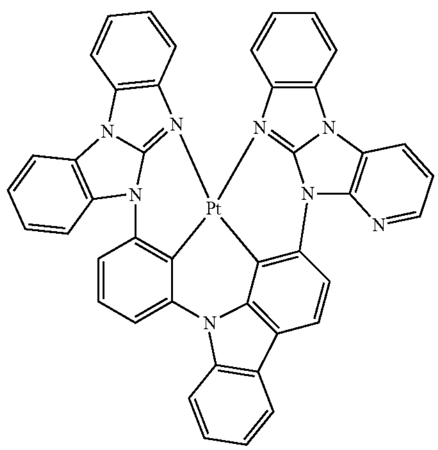
58
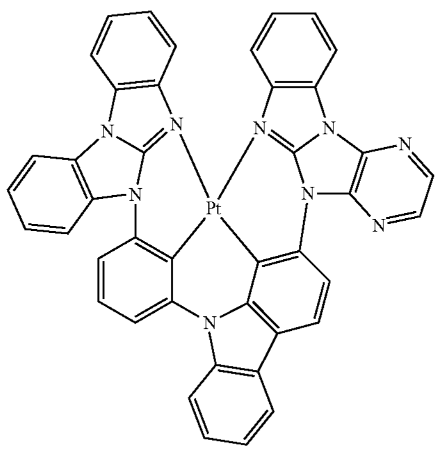
59
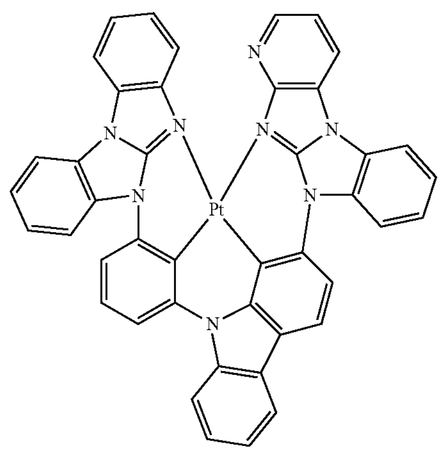
60
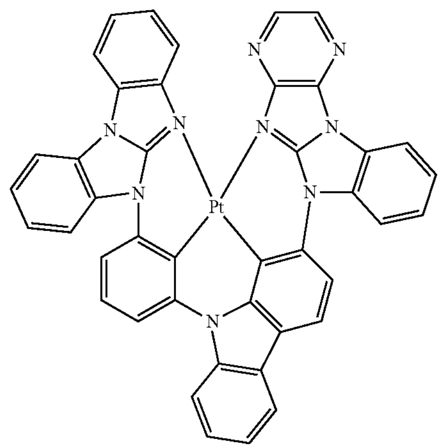
61
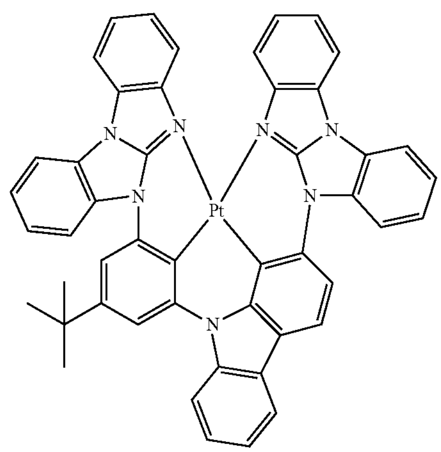

-continued
62
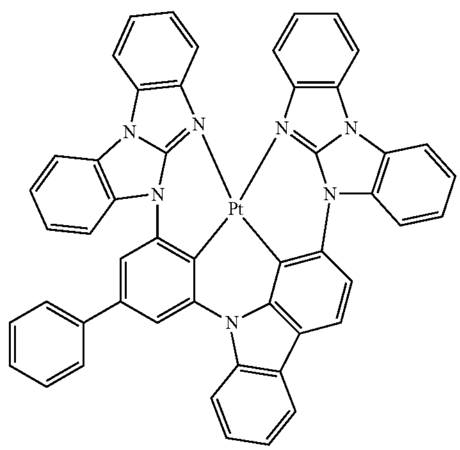
63
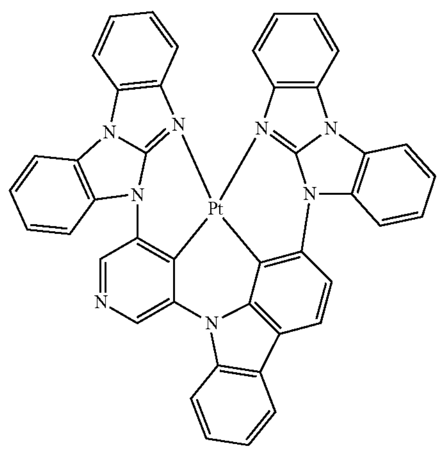
64
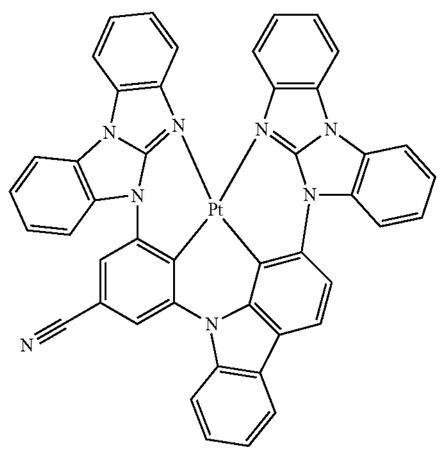
-continued
65
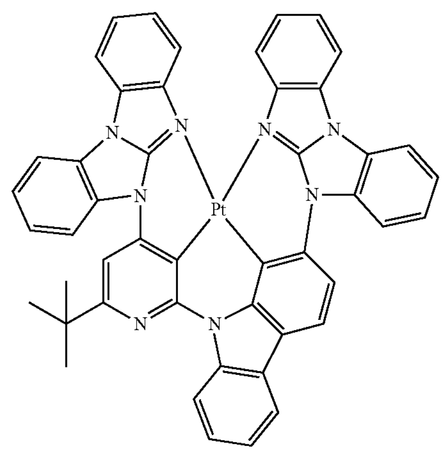
66
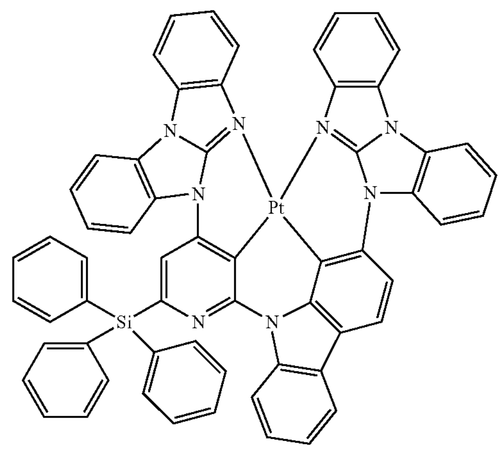
67
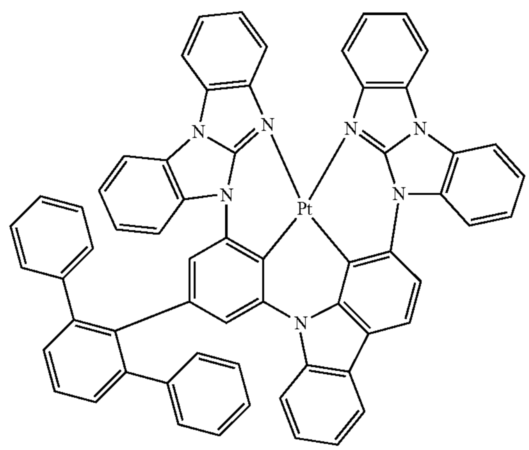

-continued
68
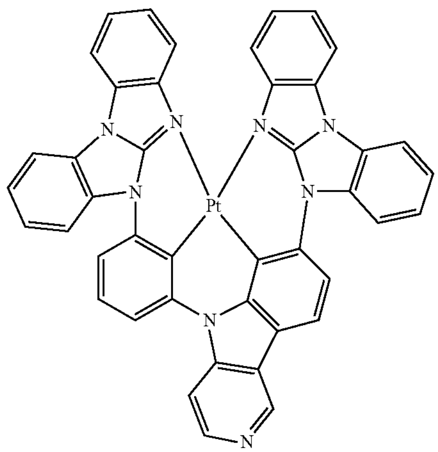
69
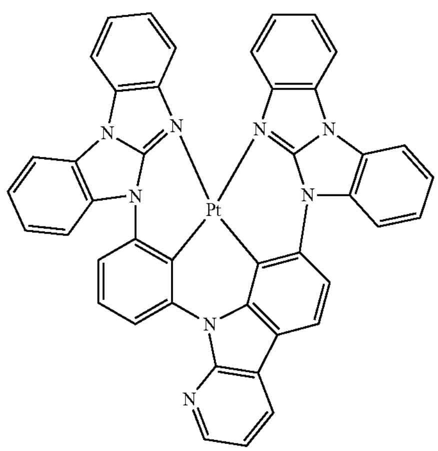
70
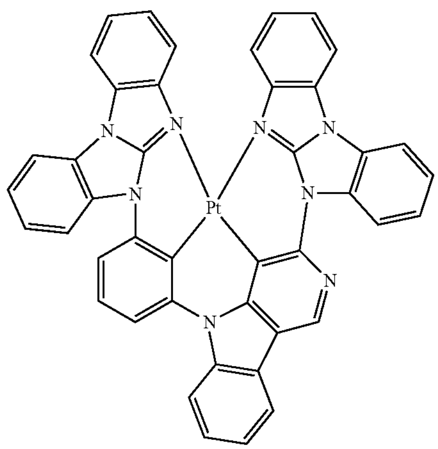
-continued
71
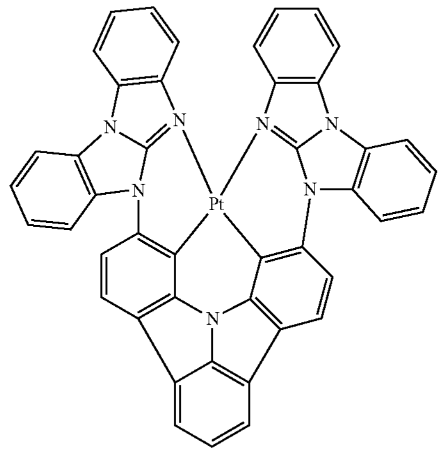
72
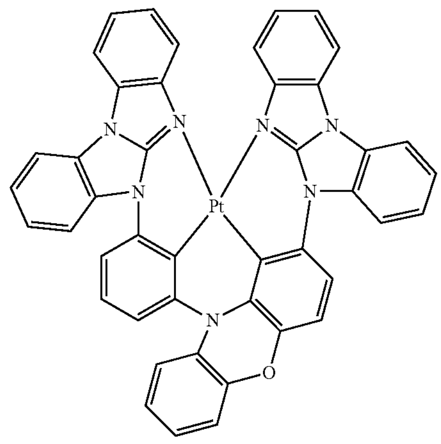
73
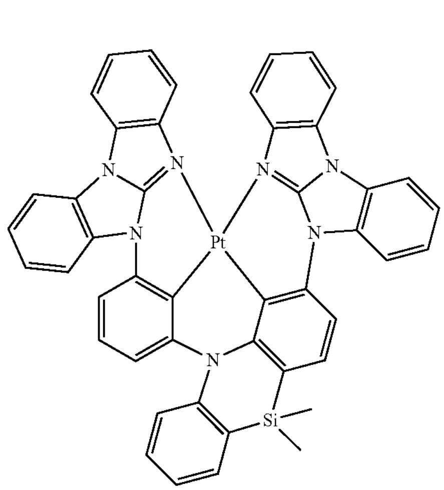

-continued
74
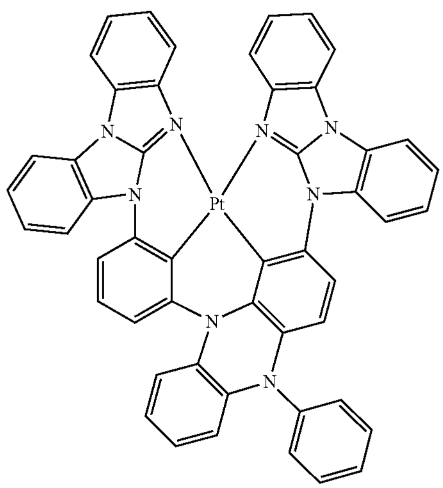
75
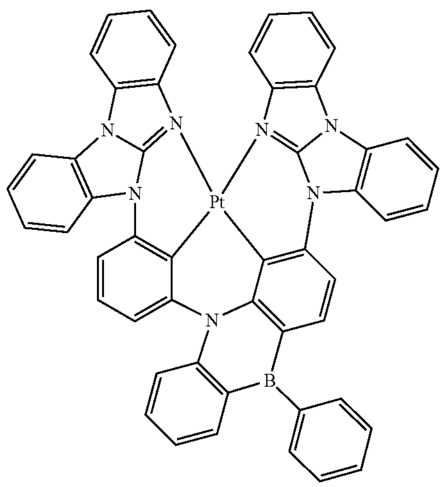
76
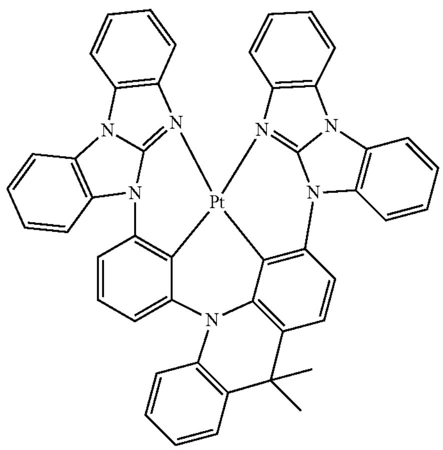
-continued
77
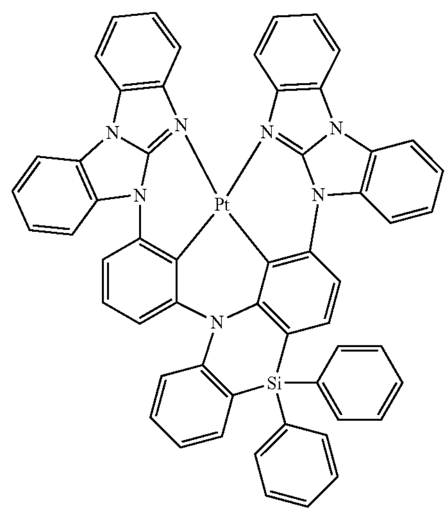
78
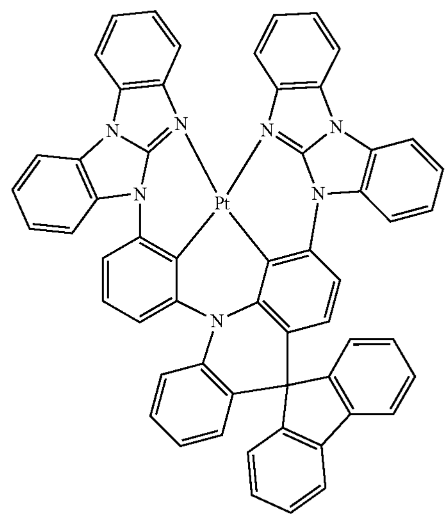
79
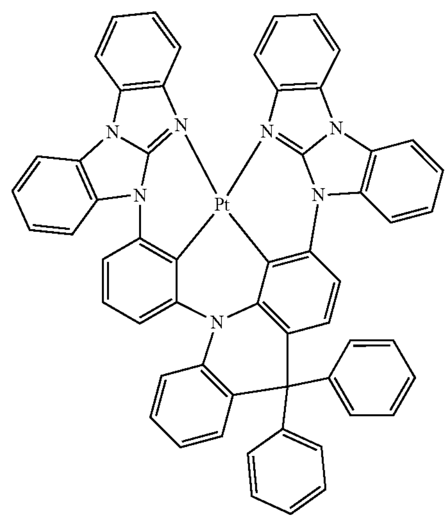

80
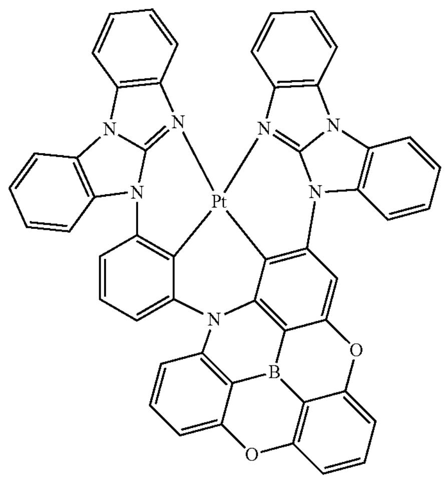
81
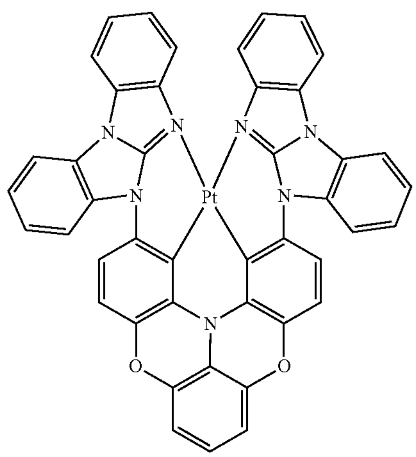
82
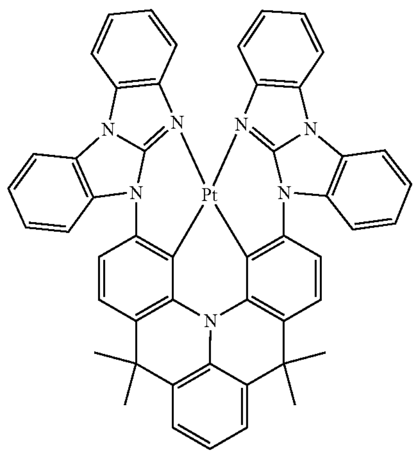
83
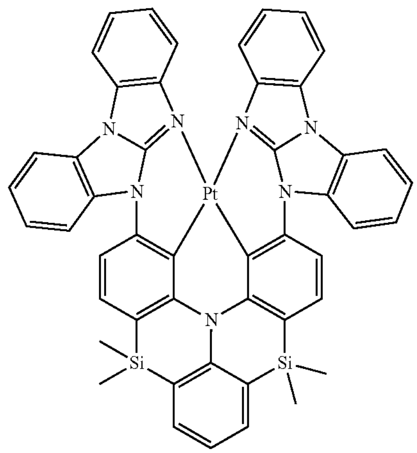
84
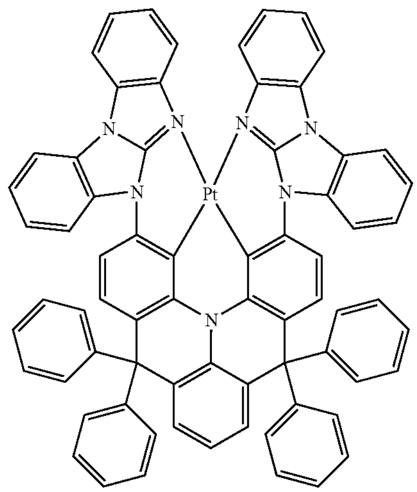
85
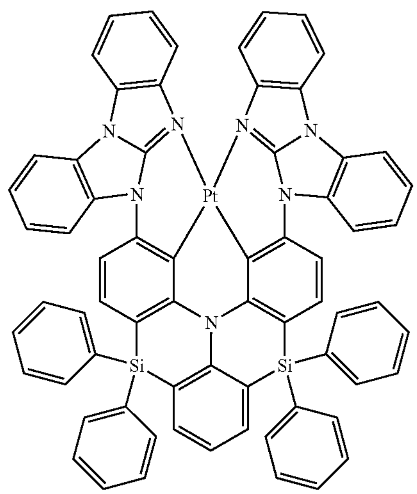

-continued
86
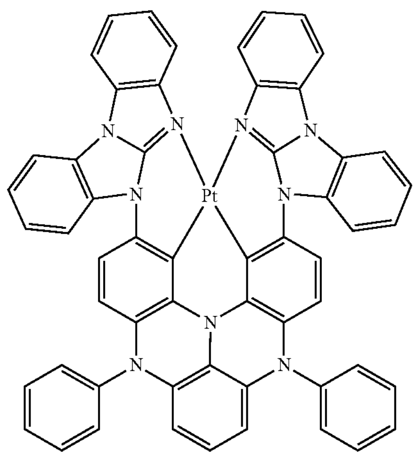
87
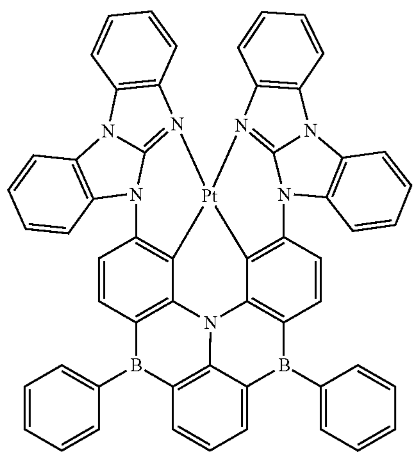
88
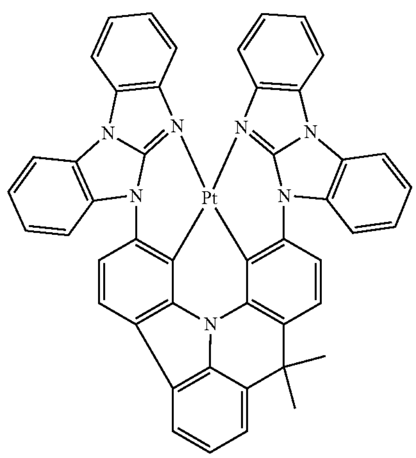
-continued
89
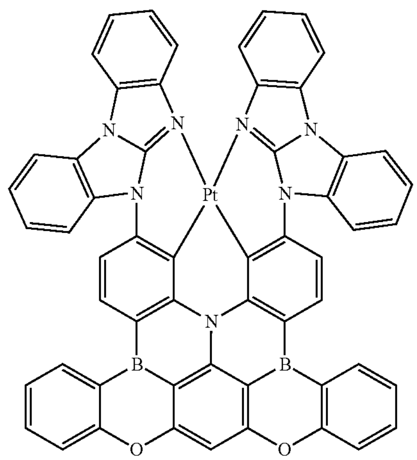
90
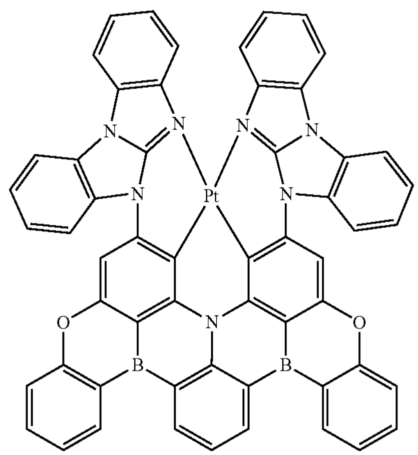
.
* * * * *